US012787620B2

(12) United States Patent
Helander et al.

(10) Patent No.: US 12,787,620 B2
(45) Date of Patent: Nov. 3, 2026

(54) OPTO-ELECTRONIC DEVICE WITH TRANSPARENT APERTURES IN NON-UNIFORM LAYOUT

(71) Applicant: OTI LUMIONICS INC., Mississauga (CA)

(72) Inventors: Michael Helander, Mississauga (CA); Zhibin Wang, Mississauga (CA)

(73) Assignee: OTI Lumionics Inc., Mississauga (CA)

(*) Notice: Subject to any disclaimer, the term of this patent is extended or adjusted under 35 U.S.C. 154(b) by 0 days.

(21) Appl. No.: 18/869,222

(22) PCT Filed: May 15, 2024

(86) PCT No.: PCT/IB2024/054685
§ 371 (c)(1),
(2) Date: Nov. 25, 2024

(87) PCT Pub. No.: WO2024/236480
PCT Pub. Date: Nov. 21, 2024

(65) Prior Publication Data

US 2026/0059990 A1 Feb. 26, 2026

Related U.S. Application Data

(60) Provisional application No. 63/502,317, filed on May 15, 2023.

(51) Int. Cl.
*H10K 59/80* (2023.01)
*H10K 59/122* (2023.01)

(52) U.S. Cl.
CPC ....... *H10K 59/8792* (2023.02); *H10K 59/122* (2023.02); *H10K 59/805* (2023.02)

(58) Field of Classification Search
CPC ............. H10K 50/805; H10K 59/8792; H10K 59/122; H10K 59/80521; H10K 59/21; H10K 59/805
See application file for complete search history.

(56) References Cited

U.S. PATENT DOCUMENTS 3,928,480 A 12/1975 Tabushi et al.
4,022,928 A 5/1977 Piwcyzk
(Continued)

FOREIGN PATENT DOCUMENTS

CA 2890253 A1 5/2014
CN 101299419 A 11/2008
(Continued)

OTHER PUBLICATIONS

Abroshan, H. et al. "66-3: Active Learning for the Design of Novel OLED Materials." SID Symposium Digest of Technical Papers. 53.1 (2022).

(Continued)

*Primary Examiner* — Alonzo Chambliss
(74) *Attorney, Agent, or Firm* — Foley & Lardner LLP

(57) ABSTRACT

An opto-electronic device comprises first and second laterally extending defining layers deposited on a substrate. The first and second defining layers reduce EM transmission therethrough in corresponding wavelength range(s) and comprises respective first and second layer aperture(s) therein defined by corresponding first and second layer laterally extending aperture(s). A geometric intersection of the first and second layer apertures substantially defines a corresponding aperture(s) of corresponding transmissive region(s). The first and second defining layers are disposed in respective lateral patterns in which at least one of a: location, shape, spacing, size, orientation, and position, of the corresponding layer aperture boundary, is respectively substantially, regular, and non-uniform. Signal(s) passing through the transmissive region(s) are impacted by a diffraction characteristic of the corresponding aperture(s) of the corresponding transmissive region(s).

24 Claims, 23 Drawing Sheets

FIG. 5A

(56) References Cited

U.S. PATENT DOCUMENTS

| | | | |
|---|---|---|---|
| 4,832,983 | A | 5/1989 | Nagatomi et al. |
| 5,015,758 | A | 5/1991 | Pilgrim et al. |
| 5,399,936 | A | 3/1995 | Namiki et al. |
| 6,016,033 | A | 1/2000 | Jones et al. |
| 6,407,408 | B1 | 6/2002 | Zhou et al. |
| 6,465,115 | B2 | 10/2002 | Shi et al. |
| 6,472,468 | B1 | 10/2002 | Omura |
| 6,538,374 | B2 | 3/2003 | Hosokawa |
| 6,787,468 | B2 | 9/2004 | Kim et al. |
| 6,835,950 | B2 | 12/2004 | Brown et al. |
| 6,900,470 | B2 | 5/2005 | Kobayashi et al. |
| 6,927,270 | B2 | 8/2005 | Lichtenhan et al. |
| 6,995,035 | B2 | 2/2006 | Cok et al. |
| 7,018,713 | B2 | 3/2006 | Padiyath |
| 7,099,299 | B2 | 8/2006 | Liang et al. |
| 7,105,298 | B2 | 9/2006 | Liu et al. |
| 7,175,815 | B2 | 2/2007 | Yamasaki et al. |
| 7,193,015 | B1 | 3/2007 | Mabry et al. |
| 7,217,683 | B1 | 5/2007 | Blanski et al. |
| 7,319,129 | B2 | 1/2008 | Yoshida et al. |
| 7,363,308 | B2 | 4/2008 | Dillon et al. |
| 7,402,948 | B2 | 7/2008 | Yamazaki et al. |
| 7,427,783 | B2 | 9/2008 | Lee et al. |
| 7,449,539 | B2 | 11/2008 | Morimoto et al. |
| 7,491,975 | B2 | 2/2009 | Kubota |
| 7,495,389 | B2 | 2/2009 | Noguchi et al. |
| 7,701,132 | B2 | 4/2010 | Oh |
| 7,728,510 | B2 | 6/2010 | Oh |
| 7,816,861 | B2 | 10/2010 | Choi et al. |
| 7,839,083 | B2 | 11/2010 | Kubota |
| 7,897,667 | B2 | 3/2011 | Mabry et al. |
| 7,947,519 | B2 | 5/2011 | Lee et al. |
| 7,956,351 | B2 | 6/2011 | Choi |
| 7,986,672 | B2 | 7/2011 | Tiedemann et al. |
| 8,004,180 | B2 | 8/2011 | Seo |
| 8,030,838 | B2 | 10/2011 | Kwak et al. |
| 8,044,580 | B2 | 10/2011 | Yamazaki et al. |
| 8,089,066 | B2 | 1/2012 | Yamazaki et al. |
| 8,115,376 | B2 | 2/2012 | Fujioka et al. |
| 8,232,350 | B2 | 7/2012 | Fujita et al. |
| 8,237,351 | B2 | 8/2012 | Sung et al. |
| 8,310,149 | B2 | 11/2012 | Lifka et al. |
| 8,318,878 | B2 | 11/2012 | Sudo et al. |
| 8,343,637 | B2 | 1/2013 | Parham et al. |
| 8,362,469 | B2 | 1/2013 | Suh |
| 8,679,647 | B2 | 3/2014 | Pflumm et al. |
| 8,703,303 | B2 | 4/2014 | Yamamoto et al. |
| 8,766,306 | B2 | 7/2014 | Lifka et al. |
| 8,795,847 | B2 | 8/2014 | Heil et al. |
| 8,809,838 | B2 | 8/2014 | Jeong et al. |
| 8,852,756 | B2 | 10/2014 | Vestweber et al. |
| 8,872,206 | B2 | 10/2014 | Chung et al. |
| 8,895,972 | B2 | 11/2014 | Chung et al. |
| 8,940,568 | B2 | 1/2015 | Mohan et al. |
| 8,957,413 | B2 | 2/2015 | Song et al. |
| 8,963,137 | B2 | 2/2015 | Lee et al. |
| 8,963,414 | B2 | 2/2015 | Sawabe |
| 8,986,852 | B2 | 3/2015 | Stoessel et al. |
| 8,994,010 | B2 | 3/2015 | Choi et al. |
| 9,018,621 | B2 | 4/2015 | Park et al. |
| 9,024,307 | B2 | 5/2015 | Lee |
| 9,040,962 | B2 | 5/2015 | Adamovich et al. |
| 9,051,344 | B2 | 6/2015 | Lin et al. |
| 9,064,755 | B2 | 6/2015 | Park et al. |
| 9,076,993 | B2 | 7/2015 | Kim et al. |
| 9,088,004 | B2 | 7/2015 | Chung et al. |
| 9,093,403 | B2 | 7/2015 | Kim et al. |
| 9,093,669 | B2 | 7/2015 | Park et al. |
| 9,105,865 | B2 | 8/2015 | Chung et al. |
| 9,105,867 | B2 | 8/2015 | Verschuuren et al. |
| 9,117,402 | B2 | 8/2015 | Lee et al. |
| 9,126,970 | B2 | 9/2015 | Pflumm |
| 9,231,030 | B2 | 1/2016 | Choi et al. |
| 9,245,934 | B2 | 1/2016 | Chung et al. |
| 9,246,123 | B2 | 1/2016 | Kim et al. |
| 9,287,339 | B2 | 3/2016 | Lee et al. |
| 9,293,515 | B2 | 3/2016 | Choi |
| 9,312,312 | B1 | 4/2016 | Tsai et al. |
| 9,331,308 | B2 | 5/2016 | Choi et al. |
| 9,444,064 | B2 | 9/2016 | Kaiser et al. |
| 9,450,027 | B2 | 9/2016 | Pang et al. |
| 9,450,033 | B2 | 9/2016 | Suh et al. |
| 9,478,591 | B2 | 10/2016 | Nam et al. |
| 9,570,471 | B2 | 2/2017 | Heo et al. |
| 9,595,681 | B2 | 3/2017 | Mujica-Fernaud |
| 9,624,193 | B2 | 4/2017 | Aihara |
| 9,627,645 | B2 | 4/2017 | Cui et al. |
| 9,660,195 | B2 | 5/2017 | Kawamura et al. |
| 9,711,751 | B2 | 7/2017 | Prushinskiy et al. |
| 9,748,318 | B2 | 8/2017 | Shim et al. |
| 9,761,651 | B2 | 9/2017 | Chang et al. |
| 9,776,983 | B2 | 10/2017 | Marchionni et al. |
| 9,859,520 | B2 | 1/2018 | Kim |
| 9,892,672 | B2 | 2/2018 | Lee et al. |
| 9,954,039 | B2 | 4/2018 | Im et al. |
| 9,960,216 | B2 | 5/2018 | Lee et al. |
| 9,966,554 | B2 | 5/2018 | Lee et al. |
| 10,032,843 | B2 | 7/2018 | Lee et al. |
| 10,084,019 | B2 | 9/2018 | Shim et al. |
| 10,084,150 | B1 | 9/2018 | Lou |
| 10,090,370 | B2 | 10/2018 | Lee et al. |
| 10,147,769 | B2 | 12/2018 | Lee et al. |
| 10,177,206 | B2 | 1/2019 | Jung et al. |
| 10,181,573 | B2 | 1/2019 | Im |
| 10,186,568 | B2 | 1/2019 | Kim et al. |
| 10,224,386 | B2 | 3/2019 | Rieutort-Louis et al. |
| 10,240,084 | B2 | 3/2019 | Molaire |
| 10,263,185 | B2 | 4/2019 | Matsueda et al. |
| 10,269,879 | B2 | 4/2019 | Shim et al. |
| 10,276,641 | B2 | 4/2019 | Lou |
| 10,297,762 | B2 | 5/2019 | Zeng et al. |
| 10,361,375 | B2 | 7/2019 | Zeng et al. |
| 10,501,583 | B2 | 12/2019 | Song et al. |
| 10,552,696 | B2 | 2/2020 | Cho et al. |
| 10,700,304 | B2 | 6/2020 | Helander et al. |
| 11,145,702 | B2 | 10/2021 | Chang et al. |
| 11,222,929 | B2 | 1/2022 | Wang et al. |
| 11,290,583 | B2 | 3/2022 | Hong et al. |
| 11,538,392 | B2 | 12/2022 | Li et al. |
| 11,567,311 | B1 | 1/2023 | Qiao et al. |
| 11,569,322 | B2 | 1/2023 | Ma et al. |
| 11,930,681 | B2 | 3/2024 | Wang et al. |
| 12,127,431 | B2 | 10/2024 | Chang et al. |
| 12,329,010 | B1 | 6/2025 | Liu et al. |
| 2002/0090811 | A1 | 7/2002 | Kim et al. |
| 2002/0189392 | A1 | 12/2002 | Molstad |
| 2003/0196987 | A1 | 10/2003 | Kung et al. |
| 2006/0125390 | A1 | 6/2006 | Oh |
| 2007/0077349 | A1 | 4/2007 | Newman et al. |
| 2007/0178405 | A1 | 8/2007 | Kanda et al. |
| 2009/0033208 | A1 | 2/2009 | Nagayama et al. |
| 2009/0199903 | A1 | 8/2009 | Oyamada et al. |
| 2010/0078628 | A1 | 4/2010 | Chi et al. |
| 2010/0193768 | A1 | 8/2010 | Habib |
| 2010/0244197 | A1 | 9/2010 | Arena et al. |
| 2011/0006289 | A1 | 1/2011 | Mizuki et al. |
| 2011/0094889 | A1 | 4/2011 | Shin et al. |
| 2011/0102308 | A1 | 5/2011 | Nakamura et al. |
| 2011/0175031 | A1 | 7/2011 | Matsunami et al. |
| 2011/0186820 | A1 | 8/2011 | Kim et al. |
| 2011/0309307 | A1 | 12/2011 | Zeika et al. |
| 2012/0003484 | A1 | 1/2012 | Roehrig et al. |
| 2012/0018770 | A1 | 1/2012 | Lu et al. |
| 2012/0146030 | A1 | 6/2012 | You et al. |
| 2012/0187541 | A1 | 7/2012 | Arena et al. |
| 2013/0049024 | A1 | 2/2013 | Choi et al. |
| 2013/0056784 | A1 | 3/2013 | Lee et al. |
| 2013/0112952 | A1 | 5/2013 | Adamovich et al. |
| 2014/0070236 | A1 | 3/2014 | Chen et al. |
| 2014/0103306 | A1 | 4/2014 | Moon et al. |
| 2014/0110680 | A1 | 4/2014 | Choe |
| 2014/0186983 | A1 | 7/2014 | Kim et al. |
| 2014/0231761 | A1 | 8/2014 | Kim et al. |
| 2014/0299866 | A1 | 10/2014 | Ruske et al. |

(56) References Cited

U.S. PATENT DOCUMENTS

| | | | |
|---|---|---|---|
| 2014/0353601 | A1 | 12/2014 | Cho et al. |
| 2015/0090989 | A1 | 4/2015 | Matsumoto et al. |
| 2015/0097171 | A1 | 4/2015 | Kim et al. |
| 2015/0144902 | A1 | 5/2015 | Do et al. |
| 2015/0287846 | A1 | 10/2015 | Helander et al. |
| 2015/0376768 | A1 | 12/2015 | Veres et al. |
| 2016/0013438 | A1 | 1/2016 | Im et al. |
| 2016/0104859 | A1 | 4/2016 | Kim et al. |
| 2016/0149156 | A1 | 5/2016 | Kim et al. |
| 2016/0163770 | A1 | 6/2016 | Kim et al. |
| 2016/0180763 | A1 | 6/2016 | Park et al. |
| 2016/0197124 | A1 | 7/2016 | Kim |
| 2016/0211454 | A1 | 7/2016 | Kim et al. |
| 2016/0293888 | A1 | 10/2016 | Shim et al. |
| 2016/0351638 | A1 | 12/2016 | Im et al. |
| 2017/0018733 | A1 | 1/2017 | Jin et al. |
| 2017/0033166 | A1 | 2/2017 | Shim et al. |
| 2017/0062755 | A1 | 3/2017 | Im et al. |
| 2017/0125495 | A1 | 5/2017 | Lee et al. |
| 2017/0125506 | A1 | 5/2017 | Kim |
| 2017/0155078 | A1 | 6/2017 | Lee |
| 2017/0170246 | A1 | 6/2017 | Im et al. |
| 2017/0186831 | A1 | 6/2017 | Nam et al. |
| 2017/0256747 | A1 | 9/2017 | Lee et al. |
| 2017/0294417 | A1 | 10/2017 | Edmond et al. |
| 2017/0317154 | A1 | 11/2017 | Heo |
| 2017/0338438 | A1 | 11/2017 | Kwon et al. |
| 2018/0006264 | A1 | 1/2018 | Lee et al. |
| 2018/0040685 | A1 | 2/2018 | Yeo et al. |
| 2018/0061323 | A1 | 3/2018 | Kwon et al. |
| 2018/0083217 | A1 | 3/2018 | Chung et al. |
| 2018/0090063 | A1 | 3/2018 | Ying et al. |
| 2018/0102499 | A1 | 4/2018 | Pyo et al. |
| 2018/0123078 | A1 | 5/2018 | Byun et al. |
| 2018/0158881 | A1 | 6/2018 | Lim et al. |
| 2018/0165533 | A1 | 6/2018 | Cho et al. |
| 2018/0166518 | A1 | 6/2018 | Kim |
| 2018/0182838 | A1 | 6/2018 | Yeo |
| 2018/0198080 | A1 | 7/2018 | Noh et al. |
| 2018/0212060 | A1 | 7/2018 | Kang et al. |
| 2018/0219058 | A1 | 8/2018 | Xiang et al. |
| 2018/0226455 | A1 | 8/2018 | Kim et al. |
| 2018/0261797 | A1 | 9/2018 | Lee |
| 2018/0294436 | A1 | 10/2018 | Choi et al. |
| 2018/0309085 | A1 | 10/2018 | Park et al. |
| 2018/0337219 | A1 | 11/2018 | Rhee et al. |
| 2018/0366678 | A1 | 12/2018 | Chi et al. |
| 2019/0081111 | A1 | 3/2019 | Lee et al. |
| 2019/0088204 | A1 | 3/2019 | Zhang et al. |
| 2019/0130822 | A1 | 5/2019 | Jung et al. |
| 2019/0131365 | A1 | 5/2019 | Jung |
| 2019/0207156 | A1 | 7/2019 | Gil |
| 2019/0237517 | A1 | 8/2019 | Hack |
| 2019/0250450 | A1 | 8/2019 | Li |
| 2019/0253591 | A1 | 8/2019 | Chen et al. |
| 2019/0273125 | A1 | 9/2019 | Takechi |
| 2019/0317629 | A1 | 10/2019 | Jung et al. |
| 2019/0325805 | A1 | 10/2019 | Moon et al. |
| 2019/0340980 | A1 | 11/2019 | Yum et al. |
| 2019/0341435 | A1 | 11/2019 | Chang et al. |
| 2019/0341575 | A1 | 11/2019 | Chung et al. |
| 2019/0348627 | A1 | 11/2019 | Lee et al. |
| 2019/0355288 | A1 | 11/2019 | Choi et al. |
| 2019/0386242 | A1 | 12/2019 | Choi et al. |
| 2020/0035951 | A1 | 1/2020 | Cheon et al. |
| 2020/0044197 | A1 | 2/2020 | Shedletsky et al. |
| 2020/0064968 | A1 | 2/2020 | Kim et al. |
| 2020/0075683 | A1 | 3/2020 | Polyakov et al. |
| 2020/0075693 | A1 | 3/2020 | Polyakov et al. |
| 2020/0075864 | A1 | 3/2020 | Helander et al. |
| 2020/0099836 | A1 | 3/2020 | Chao |
| 2020/0102442 | A1 | 4/2020 | He et al. |
| 2020/0105843 | A1 | 4/2020 | Baek et al. |
| 2020/0111401 | A1 | 4/2020 | Zhao et al. |
| 2020/0124927 | A1 | 4/2020 | Kim et al. |
| 2020/0133040 | A1 | 4/2020 | Bang et al. |
| 2020/0136077 | A1 | 4/2020 | Lee et al. |
| 2020/0159284 | A1 | 5/2020 | Mathew et al. |
| 2020/0176530 | A1 | 6/2020 | Baek |
| 2020/0176722 | A1 | 6/2020 | Lu et al. |
| 2020/0194676 | A1 | 6/2020 | Chang et al. |
| 2020/0194730 | A1 | 6/2020 | Park et al. |
| 2020/0209729 | A1 | 7/2020 | Chen et al. |
| 2020/0212130 | A1 | 7/2020 | Kim et al. |
| 2020/0212131 | A1 | 7/2020 | Kim et al. |
| 2020/0219915 | A1 | 7/2020 | Kim et al. |
| 2020/0265798 | A1 | 8/2020 | Choi et al. |
| 2020/0286972 | A1 | 9/2020 | Seo et al. |
| 2020/0312926 | A1 | 10/2020 | Bae et al. |
| 2020/0343319 | A1 | 10/2020 | Matsueda |
| 2020/0350361 | A1 | 11/2020 | Tao et al. |
| 2020/0357871 | A1 | 11/2020 | Chung et al. |
| 2020/0363894 | A1 | 11/2020 | Park et al. |
| 2020/0365664 | A1 | 11/2020 | Jeon et al. |
| 2020/0365667 | A1 | 11/2020 | Jo et al. |
| 2020/0365674 | A1 | 11/2020 | Jeon et al. |
| 2020/0381489 | A1 | 12/2020 | Hwang et al. |
| 2020/0394964 | A1 | 12/2020 | Hyun et al. |
| 2020/0403024 | A1 | 12/2020 | Lin et al. |
| 2020/0411605 | A1 | 12/2020 | Moon et al. |
| 2020/0411606 | A1 | 12/2020 | Kim et al. |
| 2021/0020704 | A1 | 1/2021 | Kim |
| 2021/0028244 | A1 | 1/2021 | Jeong et al. |
| 2021/0028248 | A1 | 1/2021 | Kim et al. |
| 2021/0036070 | A1 | 2/2021 | Jeon et al. |
| 2021/0043875 | A1 | 2/2021 | Lee et al. |
| 2021/0056884 | A1 | 2/2021 | Choi et al. |
| 2021/0056913 | A1 | 2/2021 | Ko et al. |
| 2021/0057494 | A1 | 2/2021 | Chung et al. |
| 2021/0057496 | A1 | 2/2021 | Bae et al. |
| 2021/0065620 | A1 | 3/2021 | Yang et al. |
| 2021/0066648 | A1 | 3/2021 | Chung et al. |
| 2021/0091157 | A1 | 3/2021 | Oh et al. |
| 2021/0118961 | A1 | 4/2021 | Lee et al. |
| 2021/0126059 | A1 | 4/2021 | Chang et al. |
| 2021/0134926 | A1 | 5/2021 | Song |
| 2021/0143231 | A1 | 5/2021 | Chae et al. |
| 2021/0143244 | A1 | 5/2021 | Kim et al. |
| 2021/0151544 | A1 | 5/2021 | Kim et al. |
| 2021/0167320 | A1 | 6/2021 | Kim et al. |
| 2021/0175297 | A1 | 6/2021 | Kim |
| 2021/0175298 | A1 | 6/2021 | Park |
| 2021/0183983 | A1 | 6/2021 | Bang et al. |
| 2021/0183986 | A1 | 6/2021 | Shin et al. |
| 2021/0183991 | A1 | 6/2021 | Shin et al. |
| 2021/0184155 | A1 | 6/2021 | Chae et al. |
| 2021/0191552 | A1 | 6/2021 | Bok et al. |
| 2021/0193688 | A1 | 6/2021 | Shin et al. |
| 2021/0193765 | A1 | 6/2021 | Kim et al. |
| 2021/0193769 | A1 | 6/2021 | Bok et al. |
| 2021/0193781 | A1 | 6/2021 | Shim et al. |
| 2021/0200366 | A1 | 7/2021 | Bok et al. |
| 2021/0202532 | A1 | 7/2021 | Kim et al. |
| 2021/0202595 | A1 | 7/2021 | Lee et al. |
| 2021/0202617 | A1 | 7/2021 | Cho |
| 2021/0202628 | A1 | 7/2021 | Kim et al. |
| 2021/0202641 | A1 | 7/2021 | Shin et al. |
| 2021/0202680 | A1 | 7/2021 | Shin et al. |
| 2021/0202683 | A1 | 7/2021 | Lee et al. |
| 2021/0202880 | A1 | 7/2021 | Kim et al. |
| 2021/0210564 | A1 | 7/2021 | Chae et al. |
| 2021/0210584 | A1 | 7/2021 | Youn et al. |
| 2021/0225292 | A1 | 7/2021 | Park et al. |
| 2021/0225958 | A1 | 7/2021 | Ko et al. |
| 2021/0225970 | A1 | 7/2021 | Ryu et al. |
| 2021/0233976 | A1 | 7/2021 | Lee |
| 2021/0240026 | A1 | 8/2021 | Yeke Yazdandoost et al. |
| 2021/0241671 | A1 | 8/2021 | Lee et al. |
| 2021/0241719 | A1 | 8/2021 | Choi et al. |
| 2021/0249492 | A1 | 8/2021 | Choi et al. |
| 2021/0249635 | A1 | 8/2021 | Cho et al. |
| 2021/0257419 | A1 | 8/2021 | Jang et al. |
| 2021/0257594 | A1 | 8/2021 | Kim et al. |
| 2021/0265431 | A1 | 8/2021 | Yun et al. |

(56) References Cited

U.S. PATENT DOCUMENTS

| | | | |
|---|---|---|---|
| 2021/0280825 | A1 | 9/2021 | Beon et al. |
| 2021/0313410 | A1 | 10/2021 | Kim et al. |
| 2021/0320278 | A1 | 10/2021 | Chung et al. |
| 2021/0351261 | A1 | 11/2021 | Kim et al. |
| 2021/0359025 | A1 | 11/2021 | Jung et al. |
| 2021/0376007 | A1 | 12/2021 | Choi et al. |
| 2021/0376300 | A1 | 12/2021 | Moon et al. |
| 2021/0376301 | A1 | 12/2021 | Kim et al. |
| 2021/0408167 | A1 | 12/2021 | Kim et al. |
| 2022/0013749 | A1 | 1/2022 | Kim et al. |
| 2022/0037419 | A1 | 2/2022 | Ma et al. |
| 2022/0045144 | A1 | 2/2022 | Lee et al. |
| 2022/0045160 | A1 | 2/2022 | Lee et al. |
| 2022/0052125 | A1 | 2/2022 | Choi et al. |
| 2022/0052291 | A1 | 2/2022 | Lee et al. |
| 2022/0068830 | A1 | 3/2022 | Lee et al. |
| 2022/0069048 | A1 | 3/2022 | Bok et al. |
| 2022/0085326 | A1 | 3/2022 | Chai et al. |
| 2022/0093697 | A1 | 3/2022 | Hong et al. |
| 2022/0102446 | A1 | 3/2022 | Baek et al. |
| 2022/0106477 | A1 | 4/2022 | Lee et al. |
| 2022/0123081 | A1 | 4/2022 | Park et al. |
| 2022/0123260 | A1 | 4/2022 | Chung et al. |
| 2022/0130915 | A1 | 4/2022 | Son et al. |
| 2022/0149316 | A1 | 5/2022 | Kim et al. |
| 2022/0179452 | A1 | 6/2022 | Srikanth et al. |
| 2022/0223667 | A1 | 7/2022 | Choi et al. |
| 2022/0225006 | A1 | 7/2022 | Allec et al. |
| 2022/0271254 | A1 | 8/2022 | Ran et al. |
| 2022/0336548 | A1 | 10/2022 | Chen |
| 2022/0352284 | A1 | 11/2022 | Helander et al. |
| 2022/0382067 | A1 | 12/2022 | Mermillod-Anselme et al. |
| 2022/0392963 | A1 | 12/2022 | Chen et al. |
| 2022/0398759 | A1 | 12/2022 | Schindler et al. |
| 2022/0415871 | A1 | 12/2022 | Steckel |
| 2023/0008148 | A1 | 1/2023 | Hyun et al. |
| 2023/0043940 | A1 | 2/2023 | Bae et al. |
| 2023/0048617 | A1 | 2/2023 | Kim et al. |
| 2023/0053320 | A1 | 2/2023 | Park et al. |
| 2023/0057334 | A1 | 2/2023 | Yang et al. |
| 2023/0065135 | A1 | 3/2023 | Kim et al. |
| 2023/0087411 | A1 | 3/2023 | Niu et al. |
| 2023/0087691 | A1 | 3/2023 | Chen et al. |
| 2023/0094620 | A1 | 3/2023 | Lee et al. |
| 2023/0103050 | A1 | 3/2023 | Lee et al. |
| 2023/0105374 | A1* | 4/2023 | Jeong .................. H10K 59/878 257/40 |
| 2023/0112955 | A1 | 4/2023 | Lee et al. |
| 2023/0113586 | A1 | 4/2023 | Hong et al. |
| 2023/0117800 | A1 | 4/2023 | Kim et al. |
| 2023/0142423 | A1 | 5/2023 | Helander et al. |
| 2023/0143745 | A1 | 5/2023 | Lee et al. |
| 2023/0152640 | A1 | 5/2023 | Woo et al. |
| 2023/0157052 | A1 | 5/2023 | Kim et al. |
| 2023/0157103 | A1 | 5/2023 | Lee et al. |
| 2023/0165050 | A1 | 5/2023 | Bok et al. |
| 2023/0168711 | A1 | 6/2023 | Srikanth et al. |
| 2023/0172026 | A1 | 6/2023 | Lee |
| 2023/0172053 | A1 | 6/2023 | Ko et al. |
| 2023/0172553 | A1 | 6/2023 | An et al. |
| 2023/0184938 | A1 | 6/2023 | Hannan et al. |
| 2023/0189547 | A1 | 6/2023 | Lee et al. |
| 2023/0189616 | A1 | 6/2023 | Kim et al. |
| 2023/0200196 | A1 | 6/2023 | Sung et al. |
| 2023/0209891 | A1 | 6/2023 | Ma |
| 2023/0226643 | A1 | 7/2023 | Kim et al. |
| 2023/0258785 | A1 | 8/2023 | Mandai et al. |
| 2023/0276656 | A1 | 8/2023 | Nishimura et al. |
| 2023/0276675 | A1 | 8/2023 | Jing |
| 2023/0284481 | A1 | 9/2023 | Kim et al. |
| 2023/0288252 | A1 | 9/2023 | Eaton et al. |
| 2023/0292549 | A1 | 9/2023 | Seo et al. |
| 2023/0292573 | A1 | 9/2023 | Lee et al. |
| 2023/0320178 | A1 | 10/2023 | Park et al. |
| 2023/0329035 | A1 | 10/2023 | Yun et al. |

FOREIGN PATENT DOCUMENTS

| | | | |
|---|---|---|---|
| CN | 101617064 | A | 12/2009 |
| CN | 101730938 | A | 6/2010 |
| CN | 104037359 | A | 9/2014 |
| CN | 104769149 | A | 7/2015 |
| CN | 204651324 | U | 9/2015 |
| CN | 105094451 | A | 11/2015 |
| CN | 105097877 | A | 11/2015 |
| CN | 105206650 | A | 12/2015 |
| CN | 105206753 | A | 12/2015 |
| CN | 106206995 | A | 12/2016 |
| CN | 106992267 | A | 7/2017 |
| CN | 107045156 | A | 8/2017 |
| CN | 107564945 | A | 1/2018 |
| CN | 107808895 | A | 3/2018 |
| CN | 108364967 | A | 8/2018 |
| CN | 108376019 | A | 8/2018 |
| CN | 108389878 | A | 8/2018 |
| CN | 108418928 | A | 8/2018 |
| CN | 108630830 | A | 10/2018 |
| CN | 108767136 | A | 11/2018 |
| CN | 108881531 | A | 11/2018 |
| CN | 108900659 | A | 11/2018 |
| CN | 109299631 | A | 2/2019 |
| CN | 109461758 | A | 3/2019 |
| CN | 109599030 | A | 4/2019 |
| CN | 106772732 | B | 5/2019 |
| CN | 109742132 | A | 5/2019 |
| CN | 109817672 | A | 5/2019 |
| CN | 109817694 | A | 5/2019 |
| CN | 109830495 | A | 5/2019 |
| CN | 109920931 | A | 6/2019 |
| CN | 109950293 | A | 6/2019 |
| CN | 106094087 | B | 7/2019 |
| CN | 110061014 | A | 7/2019 |
| CN | 110112182 | A | 8/2019 |
| CN | 110144551 | A | 8/2019 |
| CN | 110265474 | A | 9/2019 |
| CN | 110275358 | A | 9/2019 |
| CN | 110323259 | A | 10/2019 |
| CN | 110365819 | A | 10/2019 |
| CN | 110391348 | A | 10/2019 |
| CN | 110416269 | A | 11/2019 |
| CN | 110429117 | A | 11/2019 |
| CN | 110444125 | A | 11/2019 |
| CN | 110459175 | A | 11/2019 |
| CN | 110473898 | A | 11/2019 |
| CN | 110473988 | A | 11/2019 |
| CN | 110491917 | A | 11/2019 |
| CN | 110491918 | A | 11/2019 |
| CN | 110492018 | A | 11/2019 |
| CN | 110518034 | A | 11/2019 |
| CN | 110570774 | A | 12/2019 |
| CN | 110619813 | A | 12/2019 |
| CN | 110620129 | A | 12/2019 |
| CN | 110634930 | A | 12/2019 |
| CN | 110649179 | A | 1/2020 |
| CN | 110660823 | A | 1/2020 |
| CN | 110718580 | A | 1/2020 |
| CN | 110727142 | A | 1/2020 |
| CN | 110752249 | A | 2/2020 |
| CN | 110767662 | A | 2/2020 |
| CN | 110767682 | A | 2/2020 |
| CN | 110767708 | A | 2/2020 |
| CN | 110767709 | A | 2/2020 |
| CN | 110767713 | A | 2/2020 |
| CN | 110767720 | A | 2/2020 |
| CN | 110767736 | A | 2/2020 |
| CN | 110767739 | A | 2/2020 |
| CN | 110767830 | A | 2/2020 |
| CN | 110767835 | A | 2/2020 |
| CN | 110767836 | A | 2/2020 |
| CN | 110767844 | A | 2/2020 |
| CN | 110780375 | A | 2/2020 |
| CN | 110782807 | B | 2/2020 |
| CN | 110783384 | A | 2/2020 |
| CN | 110783390 | A | 2/2020 |
| CN | 110783394 | A | 2/2020 |

(56) References Cited

FOREIGN PATENT DOCUMENTS

| | | | |
|---|---|---|---|
| CN | 110783484 | A | 2/2020 |
| CN | 110783485 | A | 2/2020 |
| CN | 110783486 | A | 2/2020 |
| CN | 110828533 | A | 2/2020 |
| CN | 110828699 | A | 2/2020 |
| CN | 110832660 | A | 2/2020 |
| CN | 110854176 | A | 2/2020 |
| CN | 210052743 | U | 2/2020 |
| CN | 110867527 | A | 3/2020 |
| CN | 110890412 | A | 3/2020 |
| CN | 110914891 | A | 3/2020 |
| CN | 110923625 | A | 3/2020 |
| CN | 110928453 | A | 3/2020 |
| CN | 110931538 | A | 3/2020 |
| CN | 110943116 | A | 3/2020 |
| CN | 107887404 | B | 4/2020 |
| CN | 110956925 | A | 4/2020 |
| CN | 110970480 | A | 4/2020 |
| CN | 110989861 | A | 4/2020 |
| CN | 111009619 | A | 4/2020 |
| CN | 111020489 | A | 4/2020 |
| CN | 111028678 | A | 4/2020 |
| CN | 111029381 | A | 4/2020 |
| CN | 111029382 | A | 4/2020 |
| CN | 111029391 | A | 4/2020 |
| CN | 111046599 | A | 4/2020 |
| CN | 111048564 | A | 4/2020 |
| CN | 210272432 | U | 4/2020 |
| CN | 111129100 | A | 5/2020 |
| CN | 111129102 | A | 5/2020 |
| CN | 111142180 | A | 5/2020 |
| CN | 111155055 | A | 5/2020 |
| CN | 111180490 | A | 5/2020 |
| CN | 111192902 | A | 5/2020 |
| CN | 210467844 | U | 5/2020 |
| CN | 210575958 | U | 5/2020 |
| CN | 111046599 | B | 6/2020 |
| CN | 111223908 | A | 6/2020 |
| CN | 111261641 | A | 6/2020 |
| CN | 111292617 | A | 6/2020 |
| CN | 111293235 | A | 6/2020 |
| CN | 111293236 | A | 6/2020 |
| CN | 111312795 | A | 6/2020 |
| CN | 111341936 | A | 6/2020 |
| CN | 112928147 | A | 6/2020 |
| CN | 210668382 | U | 6/2020 |
| CN | 111383543 | A | 7/2020 |
| CN | 111383579 | A | 7/2020 |
| CN | 111403621 | A | 7/2020 |
| CN | 111435952 | A | 7/2020 |
| CN | 111435953 | A | 7/2020 |
| CN | 111490069 | A | 8/2020 |
| CN | 111524460 | A | 8/2020 |
| CN | 111524469 | A | 8/2020 |
| CN | 111554716 | A | 8/2020 |
| CN | 111584725 | A | 8/2020 |
| CN | 111584748 | A | 8/2020 |
| CN | 109449178 | B | 9/2020 |
| CN | 111640882 | A | 9/2020 |
| CN | 111668240 | A | 9/2020 |
| CN | 111682055 | A | 9/2020 |
| CN | 111682120 | A | 9/2020 |
| CN | 111725288 | A | 9/2020 |
| CN | 111739921 | A | 10/2020 |
| CN | 111739924 | A | 10/2020 |
| CN | 111755493 | A | 10/2020 |
| CN | 111755623 | A | 10/2020 |
| CN | 111799320 | A | 10/2020 |
| CN | 111799374 | A | 10/2020 |
| CN | 111834547 | A | 10/2020 |
| CN | 111862875 | A | 10/2020 |
| CN | 111863900 | A | 10/2020 |
| CN | 111863911 | A | 10/2020 |
| CN | 110783484 | B | 11/2020 |
| CN | 111883559 | A | 11/2020 |
| CN | 111883560 | A | 11/2020 |
| CN | 111987120 | A | 11/2020 |
| CN | 112002749 | A | 11/2020 |
| CN | 110783386 | B | 12/2020 |
| CN | 112037704 | A | 12/2020 |
| CN | 112054048 | A | 12/2020 |
| CN | 112071886 | A | 12/2020 |
| CN | 112071887 | A | 12/2020 |
| CN | 112072000 | A | 12/2020 |
| CN | 112103318 | A | 12/2020 |
| CN | 112271263 | A | 1/2021 |
| CN | 112310325 | A | 2/2021 |
| CN | 112382651 | A | 2/2021 |
| CN | 112420618 | A | 2/2021 |
| CN | 108807487 | B | 3/2021 |
| CN | 109728048 | B | 3/2021 |
| CN | 109860237 | B | 3/2021 |
| CN | 112436029 | A | 3/2021 |
| CN | 112436030 | A | 3/2021 |
| CN | 112436031 | A | 3/2021 |
| CN | 112436032 | A | 3/2021 |
| CN | 112562518 | A | 3/2021 |
| CN | 112635533 | A | 4/2021 |
| CN | 112687193 | A | 4/2021 |
| CN | 112838115 | A | 5/2021 |
| CN | 112861763 | A | 5/2021 |
| CN | 112864186 | A | 5/2021 |
| CN | 112864211 | A | 5/2021 |
| CN | 112864216 | A | 5/2021 |
| CN | 112864338 | A | 5/2021 |
| CN | 112885876 | A | 6/2021 |
| CN | 112885976 | A | 6/2021 |
| CN | 112928149 | A | 6/2021 |
| CN | 112928225 | A | 6/2021 |
| CN | 112951878 | A | 6/2021 |
| CN | 112952021 | A | 6/2021 |
| CN | 112992991 | A | 6/2021 |
| CN | 113013360 | A | 6/2021 |
| CN | 113053978 | A | 6/2021 |
| CN | 113053985 | A | 6/2021 |
| CN | 113054133 | A | 6/2021 |
| CN | 113054134 | A | 6/2021 |
| CN | 113066940 | A | 7/2021 |
| CN | 113077749 | A | 7/2021 |
| CN | 113078199 | A | 7/2021 |
| CN | 113096581 | A | 7/2021 |
| CN | 113126825 | A | 7/2021 |
| CN | 111341817 | B | 8/2021 |
| CN | 113241367 | A | 8/2021 |
| CN | 113327972 | A | 8/2021 |
| CN | 113327973 | A | 8/2021 |
| CN | 113383611 | A | 9/2021 |
| CN | 113394261 | A | 9/2021 |
| CN | 113497206 | A | 10/2021 |
| CN | 113629205 | A | 11/2021 |
| CN | 113629207 | A | 11/2021 |
| CN | 113629208 | A | 11/2021 |
| CN | 113745271 | A | 12/2021 |
| CN | 113745433 | A | 12/2021 |
| CN | 113937134 | A | 1/2022 |
| CN | 114097102 | A | 2/2022 |
| CN | 114665036 | A | 6/2022 |
| CN | 114975812 | A | 8/2022 |
| CN | 115084205 | A | 9/2022 |
| CN | 116209328 | A | 6/2023 |
| EP | 1 850 368 | A1 | 10/2007 |
| EP | 1 873 162 | A1 | 1/2008 |
| EP | 2 998 997 | A1 | 3/2016 |
| EP | 3 182 477 | A1 | 6/2017 |
| EP | 2 248 849 | B1 | 7/2017 |
| EP | 3 240 036 | A1 | 11/2017 |
| EP | 3 316 311 | A1 | 5/2018 |
| EP | 3 331 045 | A1 | 6/2018 |
| EP | 3 336 899 | A1 | 6/2018 |
| EP | 3 406 752 | A1 | 11/2018 |
| EP | 3 499 576 | A1 | 6/2019 |
| JP | 2004-352815 | A | 12/2004 |
| JP | 2007-188854 | A | 7/2007 |
| JP | 2010-258410 | A | 11/2010 |

(56) References Cited

FOREIGN PATENT DOCUMENTS

| | | | |
|---|---|---|---|
| JP | 5233074 | B2 | 7/2013 |
| JP | 2013-219278 | A | 10/2013 |
| JP | 2020-187998 | A | 11/2020 |
| JP | 2020-204762 | A | 12/2020 |
| KR | 10-20100054630 | A | 5/2010 |
| KR | 10-20100123735 | A | 11/2010 |
| KR | 10-20140062258 | A | 5/2014 |
| KR | 10-20150127368 | A | 11/2015 |
| KR | 101640772 | B1 | 7/2016 |
| KR | 10-20170024182 | A | 3/2017 |
| KR | 10-20170030168 | A | 3/2017 |
| KR | 10-20170075865 | A | 7/2017 |
| KR | 10-20180067196 | A | 6/2018 |
| KR | 10-20180115655 | A | 10/2018 |
| KR | 10-20180121304 | A | 11/2018 |
| KR | 10-20200078686 | A | 7/2020 |
| KR | 10-20200126463 | A | 11/2020 |
| KR | 10-20210002829 | A | 1/2021 |
| KR | 10-20210024315 | A | 3/2021 |
| KR | 10-20210028302 | A | 3/2021 |
| KR | 10-20210075549 | A | 6/2021 |
| KR | 10-20210079850 | A | 6/2021 |
| KR | 10-20210083043 | A | 7/2021 |
| KR | 10-20210084869 | A | 7/2021 |
| KR | 10-20210085263 | A | 7/2021 |
| KR | 10-20210086033 | A | 7/2021 |
| KR | 1020220135161 | A | 10/2022 |
| KR | 10-20230146678 | A | 10/2023 |
| TW | 201929219 | A | 7/2019 |
| WO | WO-2011/012212 | A1 | 2/2011 |
| WO | WO-2011/049284 | A1 | 4/2011 |
| WO | WO-2016/056364 | A1 | 4/2016 |
| WO | WO-2017/072678 | A1 | 5/2017 |
| WO | WO-2018/206575 | A1 | 11/2018 |
| WO | WO-2019/002198 | A1 | 1/2019 |
| WO | WO-2019/006749 | A1 | 1/2019 |
| WO | WO-2019/047126 | A1 | 3/2019 |
| WO | WO-2019/062221 | A1 | 4/2019 |
| WO | WO-2019/062236 | A1 | 4/2019 |
| WO | WO-2019/088594 | A2 | 5/2019 |
| WO | WO-2019/141198 | A1 | 7/2019 |
| WO | WO-2019/147012 | A1 | 8/2019 |
| WO | WO-2019/178782 | A1 | 9/2019 |
| WO | WO-2019/199131 | A1 | 10/2019 |
| WO | WO-2019/199139 | A1 | 10/2019 |
| WO | WO-2019/199693 | A1 | 10/2019 |
| WO | WO-2019/200862 | A1 | 10/2019 |
| WO | WO-2019/233298 | A1 | 12/2019 |
| WO | WO-2019/242510 | A1 | 12/2019 |
| WO | WO-2020/029559 | A1 | 2/2020 |
| WO | WO-2020/029612 | A1 | 2/2020 |
| WO | WO-2020/029621 | A1 | 2/2020 |
| WO | WO-2020/045038 | A1 | 3/2020 |
| WO | WO-2020/045262 | A1 | 3/2020 |
| WO | WO-2020/052232 | A1 | 3/2020 |
| WO | WO-2020/057208 | A1 | 3/2020 |
| WO | WO-2020/079456 | A1 | 4/2020 |
| WO | WO-2020/105015 | A1 | 5/2020 |
| WO | WO-2020/134914 | A1 | 7/2020 |
| WO | WO-2020/191889 | A1 | 10/2020 |
| WO | WO-2020/192051 | A1 | 10/2020 |
| WO | WO-2020/195917 | A1 | 10/2020 |
| WO | WO-2020/199445 | A1 | 10/2020 |
| WO | WO-2020/199575 | A1 | 10/2020 |
| WO | WO-2020/219267 | A1 | 10/2020 |
| WO | WO-2020/221633 | A1 | 11/2020 |
| WO | WO-2020/226383 | A1 | 11/2020 |
| WO | WO-2020/243740 | A1 | 12/2020 |
| WO | WO-2020/261191 | A1 | 12/2020 |
| WO | WO-2021/012400 | A1 | 1/2021 |
| WO | WO-2021/017320 | A1 | 2/2021 |
| WO | WO-2021/055547 | A2 | 3/2021 |
| WO | WO-2021/088953 | A1 | 5/2021 |
| WO | WO-2021/120761 | A1 | 6/2021 |
| WO | WO-2021/205410 | A1 | 10/2021 |
| WO | WO-2022/035527 | A1 | 2/2022 |
| WO | WO-2022/097043 | A1 | 5/2022 |
| WO | WO-2022/101429 | A1 | 5/2022 |
| WO | WO-2022/192005 | A1 | 9/2022 |
| WO | WO-2022/203222 | A1 | 9/2022 |
| WO | WO-2022/203276 | A1 | 9/2022 |
| WO | WO-2022/203323 | A1 | 9/2022 |
| WO | WO-2022/229208 | A1 | 11/2022 |
| WO | WO-2022/241786 | A1 | 11/2022 |
| WO | WO-2023/278000 | A1 | 1/2023 |
| WO | WO-2023/043579 | A1 | 3/2023 |
| WO | WO-2023/077523 | A1 | 5/2023 |
| WO | WO-2023/156317 | A1 | 8/2023 |
| WO | WO-2023/156449 | A1 | 8/2023 |

OTHER PUBLICATIONS

Alhadid A. et al., "Design of Deep Eutectic Systems: A Simple Approach for Preselecting Eutectic Mixture Constituents (Supplementary Material)", Molecules, 25.5 (2020):1077.

Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

Allcock, H.R. "Phosphorus-nitrogen Compounds", pp. 400-447, Academic Press (1972).

Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.

Allcock, Harry R., and Dawn E. Smith. "Surface studies of poly (organophosphazenes) containing dimethylsiloxane grafts." Chemistry of materials 7.8 (1995): 1469-1474.

Allcock, Harry R., and Michael L. Turner. "Ring expansion and polymerization of transannular bridged cyclotriphosphazenes and their spirocyclic analogs." Macromolecules 26.1 (1993): 3-10.

Allcock, Harry R., Gayann S. McDonnell, and James L. Desorcie. "Ring expansion and equilibration in organophosphazenes and the relationship to polymerization." Inorganic chemistry 29.19 (1990): 3839-3844.

Allcock, Harry R., Michael L. Turner, and Karyn B. Visscher. "Synthesis of transannular-and spiro-substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]." Inorganic chemistry 31.21 (1992): 4354-4364.

Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.

Aneta Wiatrowska, et al. "Ultra-Precise Deposition for Display Manufacturing: from Rapid Prototyping to Mass Production", The 21st international meeting on information display, Seoul, Korea.

Aqra, Fathi, and Ahmed Ayyad. "Surface free energy of alkali and transition metal nanoparticles." Applied surface science 314 (2014): 308-313.

Araki, H. and Naka, K., "Syntheses and Properties of Dumbbell-Shaped POSS Derivatives Linked by Luminescent p-Conjugated Units", Polymer Chemistry, 50.20 (2012):4170-4181.

Araki, H. and Naka, K., "Syntheses and Properties of Star- and Dumbbell-Shaped POSS Derivatives Containing Isobutyl Groups", Polymer Journal, 44 (2012):340-346.

Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.

Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.

Bae, J. et al. "Optically recoverable, deep ultraviolet (UV) stable and transparent sol-gel fluoro siloxane hybrid material for a UV LED encapsulant." RSC advances 6.32 (2016): 26826-26834.

(56) References Cited

OTHER PUBLICATIONS

Baek, Seungin, et al. "74-2: Diffracted Image Retrieving with Deep Learning." SID Symposium Digest of Technical Papers. vol. 51. No. 1. 2020.
Baradie, B. et al. "Synthesis and characterization of novel polysiloxane-grafted fluoropolymers." Canadian journal of chemistry 83.6-7 (2005): 553-558.
Barry, B., "Routes to Silsesquioxanes Functionalization—Capping of DDSQs for the Synthesis of Asymmetric POSS Compounds", Masters Thesis, Michigan State University (2019).
Bechtolsheim, C. V., V. Zaporojtchenko, and F. Faupel. "Interface structure and formation between gold and trimethylcyclohexane polycarbonate." Journal of materials research 14.9 (1999): 3538-3543.
Bertolucci, M. et al. "Wetting Behavior of Films of New Fluorinated Styrene—Siloxane Block Copolymers." Macromolecules 37.10 (2004): 3666-3672.
Besli, S. et al., "Bridged Cyclophosphazenes Resulting From Deprotonation Reactions of Cyclotriphophazenes Bearing a P-NH Group", Dalton Trans., 40.19 (2011):5307.
Biederman, H. and Holland, L., "Metal Doped Fluorocarbon Polymer Films Prepared by Plasma Polymerization Using an RF Planar Magnetron Target", Nuclear Instruments and Methods, 212. 1-3 (1983):497-503.
Biederman, H. et al., "The Properties of Fluorocarbon Films Prepared by R.F.Sputtering and Plasma Polymerization in Inert and Active Gas", Thin Solid Films, 41.3 (1977):329-339.
Blanchet, G.B., "Deposition of Amorphous Fluoropolymers Thin Films by Laser Ablation", Appl. Phys. Lett. 62 (1993):479-481.
Blanco, I., "The Rediscovery of Poss: A Molecule Rather than a Filler", Polymers, 10.8 (2018):904-914.
Boyne, D. et al., "Vacuum Thermal Evaporation of Polyaniline Doped with Camphor Sulfonic Acid", Journal of Vacuum Science & Technology A, 33.3 (2015):031510.
Brickley, J.F. et al., "Supramolecular Variations on a Molecular Theme: the Structural Diversity of Phosphazenes (RNH)6P3N3 in the Solid State", Dalton Trans., 7 (2003):1235-1244.
Brown, Douglas E., et al. "Poly [(vinyloxy) cyclophosphazenes]." Macromolecules 34.9 (2001):2870-2875.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "P-13.10: A New Color Space Model for AMOLED Display Based on IR Drop" SID Symposium Digest of Technical Papers 54 (2023).
Camino, G. et al., "Polydimethylsiloxane Thermal Degradation Part 1. Kinetic Aspects", Polymer, 42.6 (2001):2395-2402.
Chaiprasert, T. et al. "Vinyl-functionalized Janus ring siloxane: potential precursors to hybrid functional materials." Materials 14.8 (2021): 2014.
Chan, E.P. et al., "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007):1045-1074.
Chaudhury, M. and Pocius, A. V. "Adhesion science and engineering-2: Surfaces, Chemistry and Applications" Elsevier (2002).
Chen, G. K. J., and J. Chen. "Flexible displays: Flexible AMOLED manufacturing." Handbook of Visual Display Technology; Chen, J., Cranton, W., Fihn, M., Eds (2016).
Chen, W. et al., "Highly Thermal Stable Phenolic Resin Based on Double-Decker-Shaped POSS Nanocomposites for Supercapacitors", Polymers, 12.9 (2020):2151-2165.
Chen, Yu-Hung, et al. "58.2: High-Performance Large-Size OLED Tv with Ultra Hd Resolution." SID Symposium Digest of Technical Papers. vol. 46. No. 1. 2015.
Ching, Suet Ying. "Plasmonic properties of silver-based alloy thin films." (2015). Open Access Theses and Dissertations. 194.
Ching, Suet Ying. "Plasmonic properties of silver-based alloy thin films." (2016).
Cho, H.U. et al. "17-1: Invited Paper: Enhancement of Current Efficiency for OLED Devices Using Meta-Heuristic Algorithm." SID Symposium Digest of Technical Papers. 52.1 (2021).
Cho, H.U. et al. "Enhancement of Current Efficiency for OLED Devices Using Meta-Heuristic Algorithm." 2021 Virtual Display Week International Symposium (2021).
Choi, B. K. et al. "48-1: Invited Paper: Next Generation Highly Efficient and Stable Phosphorescent Emitting Materials For OLEDs." SID Symposium Digest of Technical Papers 51.1 (2020).
Choi, B. K. et al. "Next Generation Highly Efficient and Stable Phosphorescent Emitting Materials For OLEDs." SID2020 Symposium.
Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.
Cordes, D.B. et al., "Recent Developments in the Chemistry of Cubic Polyhedral Oligosilsesquioxanes", Chem. Rev., 110 (2010):2081-2173.
Dalvi, V.H. and Rossky, P.J., "Molecular Origins of Fluorocarbon Hydrophobicity", PNAS, 107.31 (2010):13603-13607.
Dash, P. and Y. C.H. "How much battery does dark mode save? An accurate OLED display power profiler for modern smartphones." Proceedings of the 19th Annual International Conference on Mobile Systems, Applications, and Services (2021).
David, Robert, Neumann, A. Wilhelm. "A Theory for the Surface Tensions and Contact Angles of HydrogenBonding Liquids." Langmuir 30.39 (2014):11634-11639.
De Wilde, W., "Evaporation of Polytetrafluoroethylene by Electron Bombardment of the Bulk Material", Thin Solid Films, 24.1 (1974):101-111.
Dong, H. et al., "Surface Properties and Thermal Stability of a Novel Low-Surface-Energy Polybenzoxazine/Clay Nanocomposites", Polymer Composites, 33.8 (2012):1313-1320.
Drelich, J. et al., "Hydrophilic and Superhydrophilic Surfaces and Materials", Soft Matter, 7.21 (2011):9804-9828.
Dubrovskii, Vladimir. "Fundamentals of Nucleation Theory." Nucleation Theory and Growth of Nanostructures. Springer, Berlin, Heidelberg, 2014. 1-73.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019):504-542.
Dutkiewicz, M. et al., "New Fluorocarbofunctional Spherosilicates: Synthesis and Characterization", Organometallics, 30.8 (2011):2149-2153.
Eguchi, Shingo, et al. "35-1: Strategy for Developing an Ultra-High-Luminance AMOLED Display." SID Symposium Digest of Technical Papers. vol. 49. No. 1. 2018.
Eilers, H., et al. "Teflon AF/Ag nanocomposites with tailored optical properties." Journal of materials research 21.9 (2006): 2168-2171.
Ellison, A. H., H. W. Fox, and W. A. Zisman. "Wetting of fluorinated solids by hydrogen-bonding liquids." The Journal of Physical Chemistry 57.7 (1953): 622-627.
Emerton, Neil, David Ren, and Tim Large. "28-1: Image Capture Through TFT Arrays." SID Symposium Digest of Technical Papers. vol. 51. No. 1. 2020.
Faupel, F., et al. "Nucleation, growth, interdiffusion, and adhesion of metal films on polymers." AIP Conference Proceedings. vol. 491. No. 1. American Institute of Physics, 1999.

(56) References Cited

OTHER PUBLICATIONS

Feher, F.J. and Budzichowski, T.A., "Silasesquioxanes as Ligands in Inorganic and Organometallic Chemistry", Polyhedron, 14.22 (1995):3239-3253.
Feng, Zhengyu, et al. "28-3: Pixel Design for Transparent MicroLED Display with Low Blurring." SID Symposium Digest of Technical Papers. vol. 51. No. 1. 2020.
Flores-Camacho, Jose Manuel, et al. "Growth and optical properties of Ag clusters deposited on poly (ethylene terephthalate)." Nanotechnology 22.27 (2011): 275710.
Forrest, James A."Reductions of the glass transition temperature in thin polymer films: Probing the length scale of cooperative dynamics." Physical Review E 61.1 (2000): R53-6.
Fowkes, Frederick M. "Attractive Forces at Interfaces." Industrial and Engineering Chemistry 56.12 (1964): 40-52.
Fox, H.W. et al., "Polyorganosiloxanes . . . Surface Active Properties", Ind. Eng. Chem., 39.11 (1947):1401-1409.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness." Macromolecules 34.16 (2001): 5627-5634.
Fusella, Michael A., et al. "Plasmonic enhancement of stability and brightness in organic light-emitting devices." Nature 585.7825 (2020): 379-382.
Gabler, D.G. and Haw, J.F., "Hydrolysis Chemistry of the Chlorophosphazene Cyclic Trimer", Inorganic Chemistry, 29.20 (1990):4018-4021.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Giebink, C. "Catastrophic OLED failure and pathways to address it" Department of Energy, url:https://www.energy.gov/sites/prod/files/2018/02/f48/giebink_oled-failure_nashville18_0.pdf (2018).
Glüge, J. et al., "An Overview of the Uses of Per- and Polyfluoroalkyl Substances (PFAS)—Electronic supplementary information 1", Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014):1212-1220.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Grant Norton, M. et al., "Pulsed Laser Ablation and Deposition of Fluorocarbon Polymers", Applied Surface Science, 96-98 (1996):617-620.
Gritsenko, K.P. and Krasovsky, A.M., "Thin-Film Deposition of Polymers by Vacuum Degradation", Chem. Rev., 103.9 (2003):3607-3649.
Grytsenko, K. "Vacuum-deposited fluoropolymer films for organic electronics" International Symphosium on Plastics Electronics (Part of Semicon Europe—2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016):139-148.
Hadi, A., et al. "Active Learning for the Accelerated Design and Optimization of Novel OLED Materials", The 21st international meeting on information display, Seoul, Korea.
Halls, M. D., et al. "An Innovation Platform for Optoelectronics: Synergistic Acceleration of de Novo Design Powered by Multiscale Simulations and Machine Learning", The 21st international meeting on information display, Seoul, Korea.
Heaney, James B. "Evaluation of commercially supplied silver coated Teflon for spacecraft temperature control usage." (1974).
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hoge, J. "Novel Benzoxazine Based System for Flame Retardant Aircraft Interior Prepreg Applications" The Sixth Triennial International Aircraft Fire and Cabin Safety Research (2010).
Holland, L. et al., "Sputtered and Plasma Polymerized Fluorocarbon Films", Thin Solid Films, 35 (1976): L19-L21.
Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.
Hwang, S. et al., "ChemInform Abstract: Dendritic Macromolecules for Organic Light-Emitting Diodes", Chemical Society Reviews, 37.11 (2008):2543-2557.
Iacono, S. T. et al. "Fluorinated polyhedral oligomeric silsesquioxanes (F-POSS)", Defense Technical Information Center, (2010) url:https://apps.dtic.mil/sti/tr/pdf/ADA521393.pdf.
Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.
Ikonnikov, D.A., "Controlling Multiple Diffraction with Quasiperiodic Gratings", Laser Phys. Lett., 16.12 (2019):126202.
Imoto, H. et al., "Corner- and Side-Opened Cage Silsesquioxanes: Structural Effects on the Materials Properties", European Journal of Inorganic Chemistry, 2020.9 (2020):737-742.
Imoto, H. et al., "Tripodal Polyhedral Oligomeric Silsesquioxanes as a Novel Class of Three-Dimensional Emulsifiers", Polymer Journal, 47 (2015):609-615.
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1-yl)alkyl]acetamides", Russian Journal of Organic Chemistry, 52.11 (2016):1558-1564.
Iwamori, S. et al., "Adsorption Properties of Fluorocarbon Thin Films Prepared by Physical Vapor Deposition Methods", Surface & Coatings Technology, 204:16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jarvis, N.L. and Zisman, W.A., "Surface Chemistry of Fluorochemicals", Defense Technical Information Center (1965):1-37.
Jiao, Zhiqiang, et al. "61-2: Weakening Micro-Cavity Effects in White Top-Emitting WOLEDs with Semitransparent Metal Top Electrode." SID Symposium Digest of Technical Papers. vol. 49. No. 1. 2018.
Jin, Y. et al. "Two-Tier Ensemble Deep Learning Model for Anomaly Detection in OLED Encapsulation Process" The 21st International Meeting on Information Display, Seoul, Korea (2021).
Jung, W. et al. "62-3: High Precise laser glass cutting for future display" Journal of the Society for Information Display 30.5 (2022): 462-470.
Jung, W. et al. "Extremely Precise Laser Glass Cutting Technology for Future Display", The 21st international meeting on information display, Seoul, Korea.
Kaesler, K., "The hidden defenders Silane and siloxane impregnation protects construction materials", European coatings journal, 3 (2006):36-41.
Kanzow, J., et al. "Formation of a metal/epoxy resin interface." Applied surface science 239.2 (2005): 227-236.

(56) References Cited

OTHER PUBLICATIONS

Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp. 422-427.
Kato, Daimotsu, et al. "52.4 L Transmissive One-Side-Emission OLED Panel using Alignment-Free Cathode Patterning." SID Symposium Digest of Technical Papers. vol. 46. No. 1. 2015.
Khanin, D. A., et al. "New hybrid materials based on cyclophosphazene and polysiloxane precursors: Synthesis and properties." Polymer 186 (2020): 122011.
Kim, Chiwoo, et al. "Fine metal mask material and manufacturing process for high-resolution active-matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, H. et al. "Reliability Characterization of Luminance Degradation of OLED Mobile Display Considering Color Difference Index Based on Usage Patterns." SID 2020 Symposium.
Kim, Haewon, et al. "Analysis of Semi-Transparent Cathode Performance Based on Fabrication Methods." IDW '19. 2019.
Kim, Hyun-Chang, et al. "39-4: A Method of Panel-Current Limitation for Automotive OLED Displays." SID Symposium Digest of Technical Papers. vol. 51. No. 1. 2020.
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, S et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Long lifetime Phosphorescent Blue" 2022 Display Week International Symposium, San Jose (2022).
Kim, S. et al. "Machine-Learning-Assisted Materials Discovery of Blue Emitter for a More Efficient and Durable OLED Device." 2021 Virtual Display Week International Symposium (2021).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scentific Reports, 8.6391 (2018): 1-7.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kim, T. et al., "Electrical Injection and Transport in Teflon-Diluted Hole Transport Materials", Organic Electronics, 83 (2020):105754.
Kim, Y. "AI & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
Kim, Y. et al. "17-2: Invited talk: Simulation Based Artificial Intelligence for Displays." 2021 Virtual Display Week International Symposium (2021).
Kisin, Srdjan. Adhesion changes at metal-polymer interfaces: Study of the copper-(acrylonitrile-butadiene-styrene) system. Diss. Dissertation, Technische Universiteit Eindhoven, 2007.
Kiskan, B., "Adapting Benzoxazine Chemistry for Unconventional Applications", Reactive and Functional Polymers, 129 (2018):76-88.
Knight Jr, L. B., et al. "Unusual behavior of vaporized magnesium under low pressure conditions." The Journal of Physical Chemistry 79.12 (1975): 1183-1190.
Koh, K et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005):1264-1270.
Koma, N. et al. "44.2: Novel Front-light System Using Fine-pitch Patterned OLED." SID Symposium Digest of Technical Papers, 39: 655-658. 2008.
Kota, Arun K., Gibum Kwon, and Anish Tuteja. "The design and applications of superomniphobic surfaces." NPG Asia Materials 6.7 (2014): e109.
Kovacik, P. et al., "Vacuum-Deposited Planar Heterojunction Polymer Solar Cells", ACS Appl. Mater. Interfaces, 3.1 (2011):11-15.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Lanoux, S. and Mas, R.H., "Reactions of the Hydrolyzed Phosphazene N3P3(OCH2CF3)5ONa", Phosphorus and Sulfur and the Related Elements, 26.2 (1986):139-142.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs." SID Symposium Digest of Technical Papers. vol. 46. No. 1. 2015.
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).
Lee, J. et al. "55-2: Methods for Overcoming the Trade-off between Efficiency and Lifetime of Organic Light-Emitting Diodes: OLED Lifetime Simulation." SID2020 Symposium.
Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Lee, S. et al. "20-2: High Efficiency and Long Device Lifetime Green Organic Light Emitting Diodes using a Pt Complex." SID Symposium Digest of Technical Papers 51.1 (2020).
Lee, S. et al. "Highly Efficient and Long-lifetime Green OLED using a Pt Complex." 2020 Virtual Display Week International Symposium.
Li, L. et al., "Synthesis and Properties of Microporous Organic Polymers Based on Adamantane", Progress in Chemistry, 32 (2020):190-203.
Li, P. et al. "Preparation and application of fluorinated-siloxane protective surface coating material for stone inscriptions." Journal of Polymer Engineering 35.6 (2015): 511-522.
Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).
Lifka, H. et al. "P-169: Single Side Emitting Transparent OLED Lamp." SID Symposium Digest of Technical Papers, 42: 1737-1739. 2011.

(56) References Cited

OTHER PUBLICATIONS

Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, C. et al., "Mechanistic Studies on Ring-Opening Polymerization of Benzoxazines: A Mechanistically Based Catalyst Design", Macromolecules, 44.12 (2011):4616-4622.
Liu, F. et al. "Syntheses and structure of the first eight-membered fluoro and chloro hafnium siloxane complexes" Zeitschrift für anorganische und allgemeine Chemie 622.5 (1996): 819-822.
Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Liu, Z. et al., "Two-Dimensional Gratings of Hexagonal Holes for High Order Diffraction Suppression", Optics Express, 25.2 (2017): 1339-1349.
Lowe, R.D. et al., "Deposition of Dense Siloxane Monolayers from Water and Trimethoxyorganosilane Vapor", Langmuir, 27.16 (2011):9928-9935.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane—OH and Epoxy Resins", Journal of Applied Polymer Science, 106.6 (2007):4117-4123.
Lund, L. G., et al. "514. Phosphonitrilic derivatives. Part I. The preparation of cyclic and linear phosphonitrilic chlorides." Journal of the Chemical Society (Resumed) (1960): 2542-2547.
Lysien, M. et al. "55-1: Deposition of Conductive and Insulating Materials at Micrometer Scale for Display-Component Prototyping." SID Symposium Digest of Technical Papers 53.1 (2022).
Mabry, J.M. et al., "Fluorinated Polyhedral Oligomeric Silsesquioxanes (F-POSS)", Angew. Chem. Int. Ed., 47.22 (2008):4137-4140.
Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.
Mackus, A.J.M. et al. "From the bottom-up: toward area-selective atomic layer deposition with high selectivity" Chemistry of Materials 31.1 (2018): 2-12.
Maissel, Leon I., and Maurice H. Francombe. An introduction to thin films. CRC Press, 1973. pp. 61-83, 198, 199.
Majhy, B. et al., "Facile Fabrication and Mechanistic Understanding of a Transparent Reversible Superhydrophobic-Superhydrophilic Surface", Scientific Reports, 8 (2018):18018.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Marzari, N. et al. "Electronic-structure methods for materials design." Nature materials 20.6 (2021): 736-749.
Meinders, Marcel BJ, William Kloek, and Ton van Vliet. "Effect of surface elasticity on Ostwald ripening in emulsions." Langmuir 17.13 (2001): 3923-3929.
Michele Ricks. Advanced OLED Materials Enabling Large-Size OLED Displays by Ink Jet Printing. OLEDs World Summit, Sep. 2020.
Mikhaylov, D.Y. and Budnikova, Y.H., "Fluoroalkylation of Organic Compounds", Russian Chemical Reviews, 82.9 (2013):835-864.
Mittal, Kashmiri Lal, ed. Metallized plastics 3: fundamental and applied aspects. Springer Science & Business Media, 2012.
Morgenstern, Karina, Georg Rosenfeld, and George Comsa. "Decay of two-dimensional Ag islands on Ag (111)." Physical review letters 76.12 (1996): 2113.
Mugisawa, M. et al., "Synthesis and Application of Novel Fluoroalkyl End-Capped Cooligomers Having Adamantane as a Pendant Group", Colloid Polym Sci, 285 (2007):737-744.
Murano, Sven, et al. "30.3: Invited Paper: AMOLED Manufacturing—Challenges and Solutions from a Material Makers Perspective." SID Symposium Digest of Technical Papers. vol. 45. No. 1. 2014.
Murray, M. et al., "NMR Studies of Hydrolysis and Rearrangement Reactions of Cyclophosphazenes", Phosphorus, Sulfur, and Silicon and the Related Elements, 65.1-4 (1992):83-86.
Nakamura, Daiki, et al. "68-4: Top-emission OLED Kawara-type Multidisplay with Auxiliary Electrode." SID Symposium Digest of Technical Papers. vol. 49. No. 1. 2018.
Nason, T.C. et al., "Deposition of Amorphous Fluoropolymer Thin Films by Thermolysis of Teflon Amorphous Fluoropolymer", Appl. Phys. Lett. 60 (1992):1866-1868.
Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on—CF3 Alignment", Langmuir, 15 (1999):4321-4323.
Nittler, Laurent, et al. "Morphology study of small amounts of evaporated gold on polymers." Surface and interface analysis 44.8 (2012): 1072-1075.
Niu, J. et al., "High Order Diffraction Suppression by Quasi-Periodic Two-Dimensional Gratings", Optical Materials Express, 7.2 (2017):366-375.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Ohring, Milton. Materials science of thin films. Elsevier, 2001.
Oka, M. and Satoshi, H. "Synthesis of photoresponsive cyclic poly (dimethyl siloxane) s from monodisperse linear precursors" Reactive and functional polymers 158 (2021): 104800.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.
Olejnik, A. et al., "Silsesquioxanes in the Cosmetics Industry—Applications and Perspectives", Materials, 15.3 (2022):1126-1143.
Owen, M. J. "A review of significant directions in fluorosiloxane coatings" Surface Coatings International Part B: Coatings Transactions 87:B2 (2004).
Pandharkar, Riddhish, et al. "A Computational Study of AIF3 and ACF Surfaces." Inorganics 6.4 (2018): 124.
Park, Chan II, et al. "54-1: Distinguished Paper: World 1st Large Size 77-inch Transparent Flexible OLED Display." SID Symposium Digest of Technical Papers. vol. 49. No. 1. 2018.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.
Peters, Richard D., et al. "Using Self-Assembled Monolayers Exposed to X-rays To Control the Wetting Behavior of Thin Films of Diblock Copolymers." Langmuir 16.10 (2000): 4625-4631.
Pham, J.Q. and Green, P.F., "The Glass Transition of Thin Film Polymer/Polymer Blends: Interfacial Interactions and Confinement", J. Chem. Phys., 116.13 (2002):5801-5806.

(56) References Cited

OTHER PUBLICATIONS

Pocius, A. V. and Dillard, D.A. "Adhesion science and engineering-1: The Mechanics of Adhesion" Elsevier (2002).
Pu, T. et al., "Effects of Structure Parameters on High-Order Diffraction Suppression of Quasi-Periodic Gratings", Journal of the Optical Society of America B, 35.4 (2018):711-717.
Quan, Wei, et al. "69-2: Transparent Conductive Hybrid Cathode Structure for Top-Emitting Organic Light-Emitting Devices." SID Symposium Digest of Technical Papers. vol. 51. No. 1. 2020.
Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.
Reichert, V.R. and Mathias, L.J., "Expanded Tetrahedral Molecules from 1,3,5,7-Tetraphenyladarnantane", Macromolecules, 27.24 (1994):7015-7023.
Ribeiro, Paulo, David L. Andrews, and Maria Raposo, eds. Optics, Photonics and Laser Technology 2017. vol. 222. Springer, 2019.
Ringe, E., "Shapes, Plasmonic Properties, and Reactivity of Magnesium Nanoparticles", J. Phys, Chem. C, 124 (2020):15665.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Roy, M.R., "Surface Properties of Hard Fluorinated Amorphous Carbon Films Deposited by Pulsed-DC Discharges", Doctoral Thesis, Universitat de Barcelona (2012).
Safonov, Alexey I., et al. "Deposition of thin composite films consisting of fluoropolymer and silver nanoparticles having surface plasmon resonance." Thin Solid Films 603 (2016): 313-316.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schilling, C.I. et al., "Fourfold Suzuki-Miyaura and Sonogashira Cross-Coupling Reactions on Tetrahedral Methane and Adamantane Derivatives", Eur. J. Org. Chem., 2011.9 (2011):1743-1754.
Schissel, Paul, and Alvin Warren Czanderna. "Reactions at the silver/polymer interface: a review." Solar Energy Materials 3.1-2 (1980): 225-245.
Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.
Seebauer, E.G. and Allen, C.E., "Estimating Surface Diffusion Coefficients", Progress in Surface Science, 49.3 (1995): 265-330.
Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.
Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.
Sessler, C.D. et al., "CF2H, a Hydrogen Bond Donor", J. Am. Chem. Soc., 139.27 (2017):9325-9332.
Shen, Mingmin, et al. "Destabilization of Ag nanoislands on Ag (100) by adsorbed sulfur." The Journal of chemical physics 135.15 (2011): 154701.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shi, L. et al. "The quasi-triangle array of rectangular holes with the completely suppression of high order diffractions." International Conference on Photonics, Optics and Laser Technology. vol. 2. Scitepress (2017).
Shi, Lina, et al. "Two dimensional gratings of connected holes for high order diffraction suppression." Optics, Photonics and Laser Technology 2017 (2019): 55-74.
Shi, Shiming, et al. "56-1: Invited Paper: Research on Commercial Foldable AMOLED and Relevant Technologies." SID Symposium Digest of Technical Papers. vol. 51. No. 1. 2020.
Shih, H. et al., "A Cross-Linkable Triphenylamine Derivative as a Hole Injection/Transporting Material in Organic Light-Emitting Diodes", Polym. Chem., 6 (2015):6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Shin, Dong-Youn, and Inyoung Kim. "Self-patterning of fine metal electrodes by means of the formation of isolated silver nanoclusters embedded in polyaniline." Nanotechnology 20.41 (2009): 415301.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Sohn, I. et al. "Improved modeling of material deposition during OLED manufacturing using direct simulation monte carlo method on GPU Architecture." International Journal of Precision Engineering and Manufacturing—Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing—Green Technology (2021): 1-14.
Song, Hongwei, Olusegun J. Ilegbusi, and L. I. Trakhtenberg. "Modeling vapor deposition of metal/semiconductor—polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Spoljaric, S. et al., "Novel Elastomer-Dumbbell Functionalized POSS Composites: Thermomechanical and Morphological Properties", Journal of Applied Polymer Science, 123.1 (2012):585-600.
Starr, F.W. et al., "Bound Layers 'Cloak' Nanoparticles in Strongly Interacting Polymer Nanocomposites", ACS Nano, 10.12 (2016):10960-10965.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, J. et al. "Realizing Deep Blue Emission in Blue Phosphorescent Organic Light-Emitting Diodes", SID Symposium Digest of Technical Papers, 2020.
Sun, T. et al., "Reversible Switching between Superhydrophilicity and Superhydrophobicity", Angew. Chem. Int. Ed., 43.3 (2004):357-360.
Svorcik, V. et al., "Deposition of Polystyrene Films by Vacuum Evaporation", Journal of Materials Science Letters, 16 (1997):1564-1566.
Takele, H. et al., "Plasmonic Properties of Ag Nanoclusters in Various Polymer Matrices", Nanotechnology, 17.14 (2006):3499-3505.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tao, C. et al., "Highly Icephobic Properties on Slippery Surfaces Formed From Polysiloxane and Fluorinated POSS", Progress in Organic Coatings, 103 (2017):48-59.
Tarasevich, Y. I. "Surface energy of oxides and silicates." Theoretical and Experimental Chemistry 42 (2006): 145-161.

(56) References Cited

OTHER PUBLICATIONS

Thran, A., et al. "Condensation coefficients of Ag on polymers." Physical review letters 82.9 (1999): 1903.
Tokuchi. S. et al. "8-4: Oxide Semiconductor In—Zn—O—X system with High Electron Mobility." SID Symposium Digest of Technical Papers 54.1 (2023).
Tong, T. et al., "Adhesion in Organic Electronics Structures", Journal of Applied Physics, 106.8 (2009): 083708.
Töpper, T. et al. "Siloxane-based thin films for biomimetic low-voltage dielectric actuators." Sensors and Actuators A: Physical 233 (2015): 32-41.
Tsai, Yu-Hsiang, et al. "P-202: A Flexible Transparent OLED Display with FlexUPTM Technology." SID Symposium Digest of Technical Papers. vol. 48. No. 1. 2017.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Selective metal deposition on photoswitchable molecular surfaces." Journal of the American Chemical Society 130.32 (2008): 10740-10747.
Tsujioka, Tsuyoshi, Rie Takagi, and Takahiro Shiozawa. "Light-controlled metal deposition on photochromic polymer films." Journal of Materials Chemistry 20.43 (2010): 9623-9627.
Tuteja, A. et al., "Designing Superoleophobic Surfaces", Science, 318.5856 (2007):1618-1622.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by Ionized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by Ionization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Vampola, K. J. et al. "12-1: Through-OLED Display Ambient Color Sensing." Apple, Cupertino CA.
Van de Grampel, R.D., "Surfaces of Fluorinated Polymer Systems", Doctoral Thesis, Technische Universiteit Eindhoven (2002).
Varagnolo, Silvia, et al. "Embedded-grid silver transparent electrodes fabricated by selective metal condensation." Journal of Materials Chemistry C?8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vasilak, L. et al., "A statistical paradigm for organic optoelectronic devices: normal force testing for adhesion of OPVs and OLEDs", ACS Appl. Mater. Interfaces, 9.15 (2017), 13347-13356.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vitos, Levente, et al. "The surface energy of metals." Surface science 411.1-2 (1998): 186-202.
Vogelsang, D.F. et al., "Separation of Asymmetrically Capped Double-Decker Silsesquioxanes Mixtures", Polyhedron, 155 (2018): 189-193.
Von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3-Dimethyl-adamantane", ACS Omega, 5.26 (2020):16085-16088.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, Hailiang, et al. "P-132: An Under-Display Camera Optical Structure for Full-Screen LCD." SID Symposium Digest of Technical Papers. vol. 51. No. 1. 2020.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.
Wang, Y. et al., "Substrate Effect on the Melting Temperature of Thin Polyethylene Films", Physical Review Letters, 96.2 (2006):028303.
Wang, Zhibin, et al. "55-1: Invited Paper: Self-Assembled Cathode Patterning in AMOLED for Under-Display Camera." SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Wei, H. and Eilers, H., "Electrical Conductivity of Thin-Film Composites Containing Silver Nanoparticles Embedded in a Dielectric Teflon® AF Matrix (Pre-print version)", Thin Solid Films, 517.2 (2008):575-581.
Weigel, W.K. et al., "Direct Radical Functionalization Methods to Access Substituted Adamantanes and Diamondoids", Org. Biomol. Chem., 20 (2022):10-36.
Weimer, P. K. "Physics of Thin Films, vol. 2.". Academic Press, (1964).
Weiss, F.M. et al., "Molecular Beam Deposition of High-Permittivity Polydimethylsiloxane for Nanometer-Thin Elastomer Films in Dielectric Actuators", Materials and Design, 105 (2016):106-113.
Winget, P. et al. "57-1: Accelerating Next-Generation Display Materials Development with a Smart Digital Chemistry Platform." SID Symposium Digest of Technical Papers 54.1 (2023).
Wojtczak, L., "The Melting Point of Thin Films", Phys. Stat. Sol., 23.2 (1967):K163-K166.
Wolfgang Decker, Vast Films, Ltd. "Pattern Metallization: Selective Deposition of Metals on Polymer Films for Functional Applications" AIMCAL Fall Conference 2005.
Wu, Y. et al. "P-13.5: Investigation on Chromatic Dispersion of Reflection for CFOT Display" SID Symposium Digest of Technical Papers 54 (2023).
Wu, Zhongyuan, et al. "34-2: Distinguished Paper: Development of 55inch 8K AMOLED TV by Inkjet Printing Process." SID Symposium Digest of Technical Papers. vol. 51. No. 1. 2020.
Xie, Changqing, et al. "Towards high-order diffraction suppression using two-dimensional quasi-periodic gratings." Optics, Photonics and Laser Technology 2017 (2019): 31-53.
Xie, J. et al., "Regioselective Synthesis of Methyl-Substituted Adamantanes for Promoting Oxidation Stability of High-Density Fuels", Energy Fuels, 34.4 (2020):4516-4524.
Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, J. et al., "Polyhedral Oligomeric Silsesquioxanes Tethered with Perfluoroalkylthioether Corner Groups: Facile Synthesis and Enhance-

(56) References Cited

OTHER PUBLICATIONS ment of Hydrophobicity of Their Polymer Blends", Journal of Materials Chemistry, 19.27 (2009):4740-4745.
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).
Yamada, Toshikazu, et al. "Nanoparticle chemisorption printing technique for conductive silver patterning with submicron resolution." Nature communications 7.1 (2016): 1-9.
Yang, H. et al., "Catalyst-Controlled C—H Functionalization of Adamantanes Using Selective H-Atom Transfer", ACS Catal., 9.6 (2019):5708-5715.
Yang, J. et al. "25-4: Methodology and Correlation of AI-Based Design for OLED Materials." SID Symposium Digest of Technical Papers 52.1 (2021).
Yang, J. et al. "25.4: Methodology and Correlation of AI-Based Design for OLED Materials." SID2021 Symposium.
Yang, Jun-Yu, et al. "32-3: AMOLED IR Drop Compensation for Channel Length Modulation." SID Symposium Digest of Technical Papers. vol. 51. No. 1. 2020.
Yao, Y. et al. "P-7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.
Yoo, D. et al. "Retrosynthesis Planning for Thermally Activated Delayed Fluorescence Molecules" The 21st International Meeting on Information Display, Seoul, Korea (2021).
Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zalewski, K. et al., "A Review of Polysiloxanes in Terms of Their Application in Explosives", Polymers, 13.7 (2021):1080-1090.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method." Surface science 532 (2003): 300-305.
Zaporojtchenko, V., et al. "Determination of condensation coefficients of metals on polymer surfaces." Surface science 454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zeng, Yang, et al. "28-4: Investigation of Moir? Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects." SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018):5641-5646.
Zhang, Zhenhua. "74-3: Image Deblurring of Camera Under Display by Deep Learning." SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.
Zhu, C. et al. "A novel synthetic UV-curable fluorinated siloxane resin for low surface energy coating." Polymers 10.9 (2018): 979.
Zibarov, A. et al., "AB5 Derivatives of Cyclotriphosphazene for the Synthesis of Dendrons and Their Applications", Molecules, 26.13 (2021):4017-4040.
International Search Report and Written Opinion on International Application No. PCT/IB2024/054685 dated Sep. 5, 2024.
International Search Report and Written Opinion on PCT Application No. PCT/IB2022/053926 dated Aug. 12, 2022 (9 pages).
JP Office Action for JP Appl. No. 2023-564561 dated Mar. 3, 2026 (18 pages).
KR Office Action for KR Appl. No. 10-2023-7040910 dated Jan. 19, 2026 (24 pages).
KR Office Action for KR Appl. No. 10-2025-7040799 dated Mar. 5, 2026 (31 pages).
CN Office Action for CN Appl. 202480037693.3 Dated Jun. 19, 2026 (18 Pages).

* cited by examiner

OPTO-ELECTRONIC DEVICE WITH TRANSPARENT APERTURES IN NON-UNIFORM LAYOUT

RELATED APPLICATIONS

The present application is a National Stage Entry under 35 U.S.C. § 371 of International Application No. PCT/IB2024/054685, filed May 15, 2024, which claims the benefit of priority to U.S. Provisional Patent Application No. 63/502,317 filed May 15, 2023, the contents of which are incorporated by reference in their entirety.

TECHNICAL FIELD

The present disclosure relates to layered semiconductor devices, and in some non-limiting examples, to a layered opto-electronic device having a plurality of sub-pixel emissive regions and a plurality of EM radiation transmissive regions, each sub-pixel comprising first and second electrodes separated by a semiconductor layer, in which at least one of: the electrodes, and transmissive regions, may be patterned by depositing a patterning coating that may at least one of act, and be, a nucleation inhibiting coating.

BACKGROUND

In an opto-electronic device such as an organic light emitting diode (OLED), at least one semiconducting layer, comprising an emissive layer, may be disposed between a pair of electrodes, such as an anode and a cathode. The anode and cathode may be electrically coupled with a power source and respectively generate holes and electrons that migrate toward each other through the at least one semiconducting layer. When a pair of holes and electrons combine, EM radiation, in the form of a photon, may be emitted by the emissive layer.

OLED display panels, such as an active-matrix OLED (AMOLED) panel, may comprise a plurality of pixels, each pixel further comprising a plurality of (including without limitation, one of: three, and four) sub-pixels. In some non-limiting examples, the various sub-pixels of a pixel may be characterized by one of: three, and four, different colors, including without limitation, R(ed), G(reen), and B(lue). Each (sub-) pixel may have an associated emissive region, comprising a stack of an associated pair of electrodes and at least one semiconducting layer between them. In some non-limiting examples, each sub-pixel of a pixel may emit EM radiation, including without limitation, photons, that have an associated wavelength spectrum characterized by a given color, including without limitation, one of, R(ed), G(reen), B(lue), and W(hite). In some non-limiting examples, the (sub-) pixels may be selectively driven by a driving circuit comprising at least one thin-film transistor structure electrically coupled with conductive metal lines, in some non-limiting examples, within a substrate upon which the electrodes and the at least one semiconducting layer are deposited. Various coatings (layers) of such panels are typically formed by vacuum-based deposition processes.

In AMOLED panels, EM radiation may be emitted by a sub-pixel when a voltage is applied across an anode and a cathode of the sub-pixel. By controlling the voltage applied across the anode and the cathode, it may be possible to control the emission of EM radiation from each sub-pixel of such panel. In cases where a common cathode is provided across multiple sub-pixels, the voltage across the anode and the cathode in each sub-pixel, may be controlled by modulating the voltage of the anode. In some non-limiting examples, the adjacent anodes may be spaced apart in a lateral aspect, and at least one non-emissive region may be provided therebetween.

In some non-limiting examples, there may be an aim to make at least a part of the panel substantially transparent to EM radiation, that is, capable of exchanging EM radiation, including without limitation, signals, including without limitation, photons, therethrough, while still being capable of emitting EM radiation, including without limitation, photons, therefrom. In some non-limiting examples, the panel may comprise a plurality of (EM radiation) transmissive regions distributed among emissive regions, at least in at least one part thereof. In some non-limiting examples, such part of the panel may be denoted as a signal-exchanging part. In some non-limiting examples, the signal-exchanging part of the display panel may comprise at least one transmissive region and at least one emissive region. In some non-limiting examples, the at least one emissive region may correspond to a (sub-) pixel of the display panel.

In some non-limiting examples, at least one of: a shape, a pitch, and an arrangement, of a boundary of the transmissive regions may impart a diffraction pattern to the EM radiation transmitted therethrough, which may cause interference therewith, including without limitation, by distorting any information content contained therewithin.

U.S. Pat. No. 9,761,651, entitled "Transparent Organic Light Emitting Display Apparatus and Method of Manufacturing the Same", filed 13 Nov. 2015 by Samsung Display Co., Ltd., and issued 12 Sep. 2017, discloses a transparent organic light emitting display apparatus including a base substrate, a light blocking pattern disposed on the base substrate, a thin film transistor disposed in the base substrate, a first electrode disposed on the base substrate and electrically connected to the thin film transistor, a pixel defining layer disposed on the base substrate and overlapping the first light blocking pattern, a second electrode disposed on the base substrate, a light emitting structure disposed between the first electrode and the second electrode, and a second light blocking pattern overlapping the first light blocking pattern. The first light blocking pattern defines a first opening. The second light blocking pattern defines a second opening which overlaps the first opening. The pixel defining layer defines a third opening which overlaps the first and second openings configured to pass external light through the first to third openings.

United States Patent Application Publication No. 2022/0130915, entitled "Display Device", filed 23 Aug. 2021 by Samsung Display Co. Ltd., and published 28 Apr. 2022, discloses a display device according to an embodiment that includes: a substrate including a display area and a transmission area; a metal blocking layer disposed in the display area of the substrate; an inorganic insulating layer disposed on the metal blocking film; a transistor disposed on the inorganic insulating layer; an emission layer connected to the transistor; and a light blocking layer and a color filter disposed on the emission layer of the display area, wherein the edge of the light blocking layer is protruded toward the transmission area more than the edge of the metal blocking layer.

U.S. Pat. No. 11,569,322, entitled "Display Device", filed 23 Mar. 2021 by Samsung Display Co. Ltd. and granted 31 Jan. 2023, discloses a display device that includes: a substrate including a display area and a transmission area; a blocking layer disposed in the display area of the substrate and including a first blocking layer and a second blocking layer that is disposed on the first blocking layer; an insulating layer disposed on the blocking layer; a transistor disposed on the insulating layer; and a light emitting element connected to the transistor, wherein a first reflectivity of the first blocking layer is smaller than a second reflectivity of the second blocking layer, and a first absorption coefficient of the first blocking layer is smaller than a second absorption coefficient of the second blocking layer.

Chinese Patent Application No. 112310325, entitled “Light-Transmitting Display Module, Display Panel and Preparation Method of Light-Transmitting Display Module”, filed 30 Oct. 2020 by Hefei Visionox Technology Co. Ltd., and issued 23 Aug. 2022, discloses a light-transmitting display module, a display panel and a preparation method of the light-transmitting display module, wherein the light-transmitting display module comprises the following components: a substrate; the first electrodes are positioned on the substrate, and the first electrodes are distributed in an array and are arranged at intervals through first gaps, the pixel defining layer is positioned on one side of the first electrode, which is far away from the substrate, the second electrode layer is positioned on one side, away from the first electrode, of the pixel defining layer and comprises a second electrode and a light-transmitting filling part, and the orthographic projection of the light-transmitting filling part on the substrate covers the orthographic projection of at least part of the first gap on the substrate. The embodiment of the invention can realize high light transmission and normal display or at least partial area of the display panel, and is convenient for the under-screen integration of the photosensitive assembly.

Chinese Patent Application 111009619, entitled “Light-Transmitting Display Panel, Manufacturing Method Thereof, and Display Panel”, filed 24 Dec. 2019 by Kunshan Govisionox Optoelectronics Co. Ltd., and issued 17 May 2022, discloses a light-transmitting display panel, a manufacturing method thereof and a display panel. The light-transmitting display panel includes: an array substrate; and the light-emitting element layer is positioned on the array substrate and comprises a first electrode, a first light-emitting structure positioned on the first electrode and a second electrode layer positioned on the first light-emitting structure, wherein a plurality of through holes with unequal sizes are distributed on the second electrode layer, and each through hole penetrates through the second electrode layer in the thickness direction of the light-transmitting display panel. According to the light-transmitting display panel provided by the embodiment of the invention, the overall light transmittance of the second electrode layer is improved, and the diffraction phenomenon of the light-transmitting display panel to light rays is improved.

Chinese Patent Application No. 111029391, entitled “Light-Transmitting Display Panel, Display Panel and Display Device”, filed 24 Dec. 2019 by Kunshan Govisionox Optoelectronics Co. Ltd., and issued 13 Sep. 2022, discloses a light-transmitting display panel, a display panel and a display device. The light-transmitting display panel comprises a first pixel array, the first pixel array comprises a first minimum repeating unit, the first minimum repeating unit comprises at least one light-transmitting column unit, each light-transmitting column unit is provided with a central axis parallel to the extending direction of the light-transmitting column unit, each light-transmitting column unit comprises a plurality of first sub-pixels which are spaced from each other in the extending direction of the light-transmitting column unit, and at least one first sub-pixel in the at least one light-transmitting column unit is arranged in a mode of deviating from the central axis. According to the light-transmitting display panel provided by the embodiment of the invention, the back surface of the light-transmitting display panel can be integrated with the photosensitive component, so that the under-screen integration of the photosensitive component such as a camera is realized, and meanwhile, the light-transmitting display panel can display pictures, so that the light-transmitting display panel is applied to the comprehensive screen design of a display device.

U.S. Pat. No. 11,567,311, entitled “Devices with Displays Having Transparent Openings”, filed 22 Mar. 2021 by Apple Inc., and issued 31 Jan. 2023, discloses an electronic device that may include a display and an optical sensor formed underneath the display. The electronic device may include a plurality of transparent windows that overlap the optical sensor. Each transparent window may be devoid of thin-film transistors and other display components. The plurality of transparent windows is configured to increase the transmittance of light through the display to the sensor. The transparent windows may have non-periodic portions to mitigate diffraction artifacts in light that passes through the display to the optical sensor. The transparent windows may be shifted by a random amount in a random direction relative to a grid defining point and/or may be randomly rotated to increase the non-periodicity. A transparency gradient may be formed between the transparent windows and the surrounding opaque portion of the display. The transparent windows may be defined by non-linear edges.

In some non-limiting examples, there may be an aim to provide a plurality of EM radiation transparent apertures between emissive regions of an opto-electronic device in an arrangement that reduces a likelihood of introduction of interference from diffraction effects for EM radiation passing through such apertures.

BRIEF DESCRIPTION OF THE DRAWINGS

Examples of the present disclosure will now be described by reference to the following figures, in which identical reference numerals in different figures indicate at least one of: identical, and in some non-limiting examples, at least one of: analogous, and corresponding elements, and in which.

Figure 1:
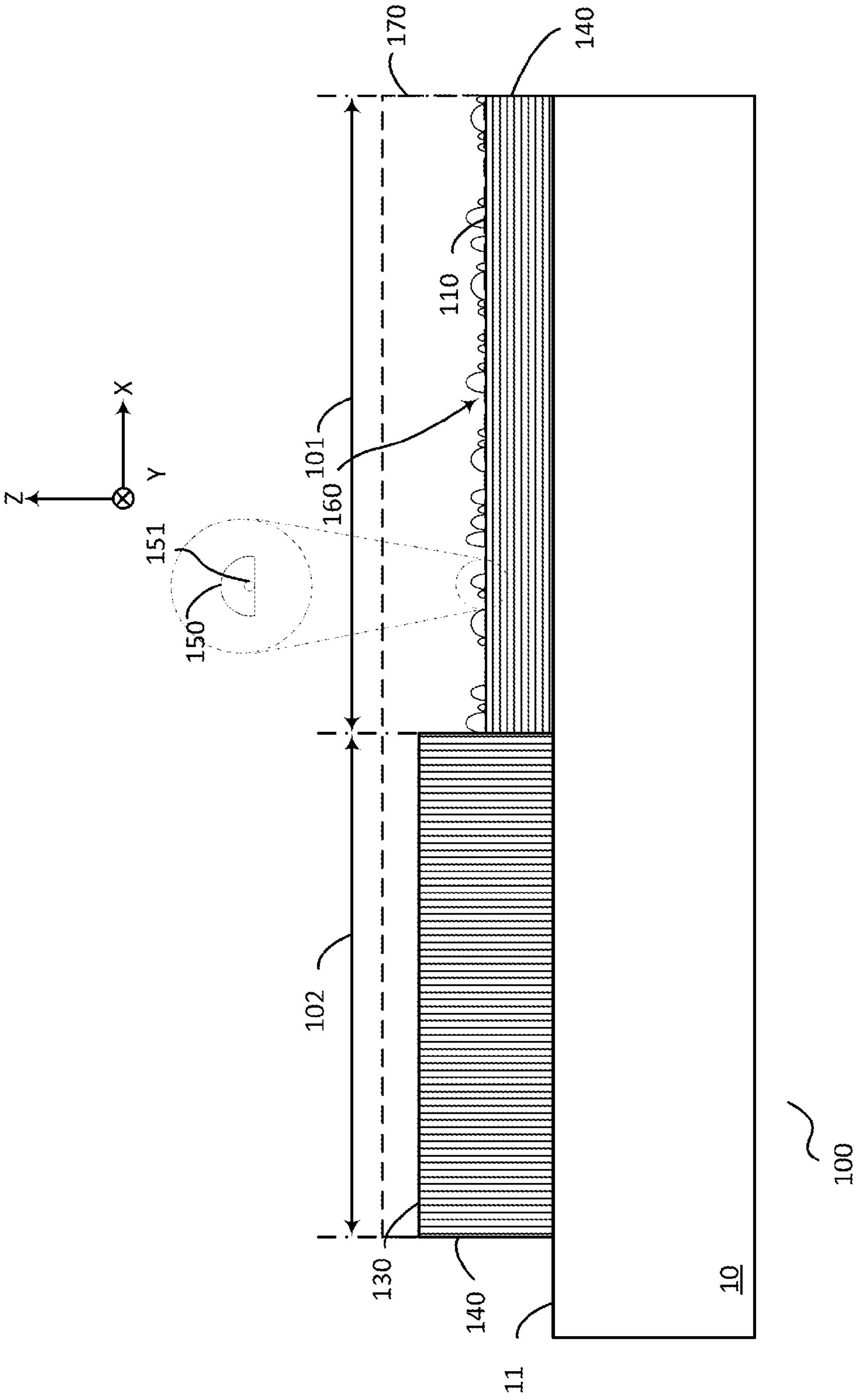
FIG. 1 is a simplified block diagram from a longitudinal aspect, of an example device having a plurality of layers in a lateral aspect, formed by selective deposition of a patterning coating in a first portion of the lateral aspect, followed by deposition of a closed coating of deposited material in a second portion thereof, according to an example in the present disclosure.

In the present disclosure, a reference numeral having at least one of: at least one numeric value (including without limitation, in at least one of: superscript, and subscript), and at least one alphabetic character (including without limitation, in lower-case) appended thereto, may be considered to refer to at least one of: a particular instance, and subset thereof, of the feature (element) described by the reference numeral. Reference to the reference numeral without reference to the at least one of: the appended value(s), and the character(s), may, as the context dictates, refer generally to the feature(s) described by at least one of: the reference numeral, and the set of all instances described thereby. Similarly, a reference numeral may have the letter "x' in the place of a numeric digit. Reference to such reference numeral may, as the context dictates, refer generally to feature(s) described by the reference numeral, where the character "x" is replaced by at least one of: a numeric digit, and the set of all instances described thereby.

In the present disclosure, for purposes of explanation and not limitation, specific details are set forth to provide a thorough understanding of the present disclosure, including without limitation, particular architectures, interfaces and techniques. In some instances, detailed descriptions of well-known systems, technologies, components, devices, circuits, methods, and applications are omitted to not obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, to not obscure the disclosure with details that will be readily apparent to those of ordinary skill in the art having the benefit of the description herein.

Any drawings provided herein may not be drawn to scale and may not be considered to limit the present disclosure in any way.

Any feature shown in dashed outline may in some examples be considered as optional.

SUMMARY

An opto-electronic device comprises first and second laterally extending defining layers deposited on a substrate. The first and second defining layers reduce EM transmission therethrough in corresponding wavelength range(s) and comprises respective first and second layer aperture(s) therein defined by corresponding first and second layer laterally extending aperture(s). A geometric intersection of the first and second layer apertures substantially defines a corresponding aperture(s) of corresponding transmissive region(s). The first and second defining layers are disposed in respective lateral patterns in which at least one of a: location, shape, spacing, size, orientation, and position, of the corresponding layer aperture boundary, is respectively substantially, regular, and non-uniform. Signal(s) passing through the transmissive region(s) are impacted by a diffraction characteristic of the corresponding aperture(s) of the corresponding transmissive region(s).

According to a broad aspect, there is disclosed an opto-electronic device having a plurality of layers deposited on a substrate and extending in at least one lateral aspect defined by a lateral axis thereof, comprising: a first defining layer that substantially reduces transmission of EM radiation therethrough in at least one wavelength range of the EM spectrum, the first defining layer comprising at least one first layer aperture therein that is defined by a corresponding first layer aperture boundary that extends in the lateral aspect; and a second defining layer that substantially reduces transmission of EM radiation therethrough in at least one wavelength range of the EM spectrum, the second defining layer comprising at least one second layer aperture therein that is defined by a corresponding second layer aperture boundary that extends in the lateral aspect; wherein: a geometric intersection of overlap of: the at least one first layer aperture, and the at least one second layer aperture, substantially defines a corresponding at least one aperture of a corresponding at least one transmissive region of the device; the first defining layer is disposed in a first lateral pattern, in which at least one of a: location, shape, spacing, size, orientation, and position, of the at least one first layer aperture boundary, is substantially regular; and the second defining layer is disposed in a second lateral pattern, in which at least one of a: location, shape, spacing, size, orientation, and position, of the at least one second layer aperture boundary, is substantially non-uniform; wherein at least one signal passing through the at least one transmissive region is impacted by a diffraction characteristic of the corresponding at least one aperture of the corresponding at least one transmissive region.

In some non-limiting examples, at least one of: the first defining layer, and the second defining layer, may reduce transmission of EM radiation therethrough by one of at least about: 99, 95, 90, 80, 75, 70, 60, 50, 40, and 30%.

In some non-limiting examples, at least one of: the first defining layer, and the second defining layer, may be substantially opaque therethrough other than through at least one aperture therein.

In some non-limiting examples, the at least one wavelength range may be at least one of: a visible spectrum, an ultraviolet (UV) spectrum, an infrared (IR) spectrum, a near IR (NIR) spectrum, and a part thereof.

In some non-limiting examples, the first lateral pattern may be characterized by at least one of the: location, shape, spacing, size, orientation, and position, of the at least one first layer aperture boundary, being substantially repeating.

In some non-limiting examples, the first lateral pattern may be characterized by substantially all of the: location, shape, spacing, size, orientation, and position, of the at least one first layer aperture boundary, being substantially regular.

In some non-limiting examples, at least one of the: location, shape, spacing, size, orientation, and position, of the at least one second layer aperture boundary, may exhibit variability within the second lateral pattern.

In some non-limiting examples, at least one of the: location, shape, spacing, size, orientation, and position, of substantially all of the at least one second layer aperture boundaries, may exhibit variability within the second lateral pattern.

In some non-limiting examples, substantially all of the: location, shape, spacing, size, orientation, and position, of the at least one second layer aperture boundary, may exhibit variability within the second lateral pattern.

In some non-limiting examples, the location of at least one of: the at least one first layer aperture boundary, and the at least one second layer aperture boundary, may be defined by a centroid of at least one of: the corresponding one of: the at least one first layer aperture boundary, and the at least one second layer aperture boundary, and a pixel surrounding it.

In some non-limiting examples, the size of at least one of: the at least one first layer aperture boundary, and the at least one second layer aperture boundary, may be defined by a length of at least one of: a major axis, a minor axis, a side, and a diameter, thereof.

In some non-limiting examples, the orientation of at least one of: the at least one first layer aperture boundary, and the at least one second layer aperture boundary, may be defined by an angle of one of: a side, and a vertex, thereof.

In some non-limiting examples, the diffraction characteristic may be a function of at least one of: the lateral pattern of at least one boundary of the at least one aperture of the at least one transmissive region, and a shape of the at least one boundary.

In some non-limiting examples, the shape of the at least one first layer aperture boundary may be one that at least one of: increases a length of a pattern boundary within a diffraction pattern between region(s) of high intensity of EM radiation and region(s) of low intensity of EM radiation, as a function of a pattern circumference of the diffraction pattern, and that reduces a ratio of the pattern circumference relative to the length of the pattern boundary.

In some non-limiting examples, the shape of the at least one first layer aperture boundary may be substantially non-polygonal.

In some non-limiting examples, the at least one transmissive region may be disposed in at least one signal-exchanging part of the device.

In some non-limiting examples, the at least one signal-exchanging part of the device may comprise at least one emissive region, each comprising a first electrode, a second electrode, wherein the first electrode is disposed between the substrate and the second electrode, and at least one semiconducting layer disposed between the first electrode and the second electrode.

In some non-limiting examples, at least one of: the first defining layer, and the second defining layer, may comprise at least one of: a layer in a frontplane of the device, a layer in a backplane of the device, and an opaque coating.

In some non-limiting examples, the layer in the frontplane may comprise at least one of: the first electrode, the second electrode, the at least one semiconducting layer, and a pixel definition layer.

In some non-limiting examples, the layer in the backplane may comprise at least one of: at least one TFT structure, a TFT insulating layer, a buffer layer, a gate insulating layer, an interlayer insulating layer, the first electrode, and at least one conductive metal line coupled with the at least one TFT structure.

In some non-limiting examples, the opaque coating may reduce a likelihood that at least one of: the first layer aperture boundary, and the second layer aperture boundary, has a transition region proximate thereto, in which a reduced amount of EM radiation may be transmitted therethrough.

In some non-limiting examples, the first defining layer may comprise at least one of: the layer in the backplane, and the opaque coating disposed in the backplane.

In some non-limiting examples, the second defining layer may comprise at least one of: the layer in the frontplane, and the opaque coating disposed in the frontplane.

In some non-limiting examples, at least one of: the at least one first layer aperture, and the at least one second layer aperture, comprises an absence of a material in a corresponding one of: the first defining layer, and the second defining layer, wherein the absence of the material is achieved by at least one of: removal of the material, and ensuring that the material fails to be deposited thereon.

In some non-limiting examples, the removal of the material may be performed by at least one of: photolithography, chemical etching, and laser ablation.

In some non-limiting examples, the ensuring that the material fails to be deposited thereon may be achieved by depositing a patterning material adapted to impact a propensity of an evaporated flux of the material to be deposited thereon, in at least one region, such that the at least one aperture is substantially devoid of a closed coating of the material.

DESCRIPTION

Layered Device

Figure 2:
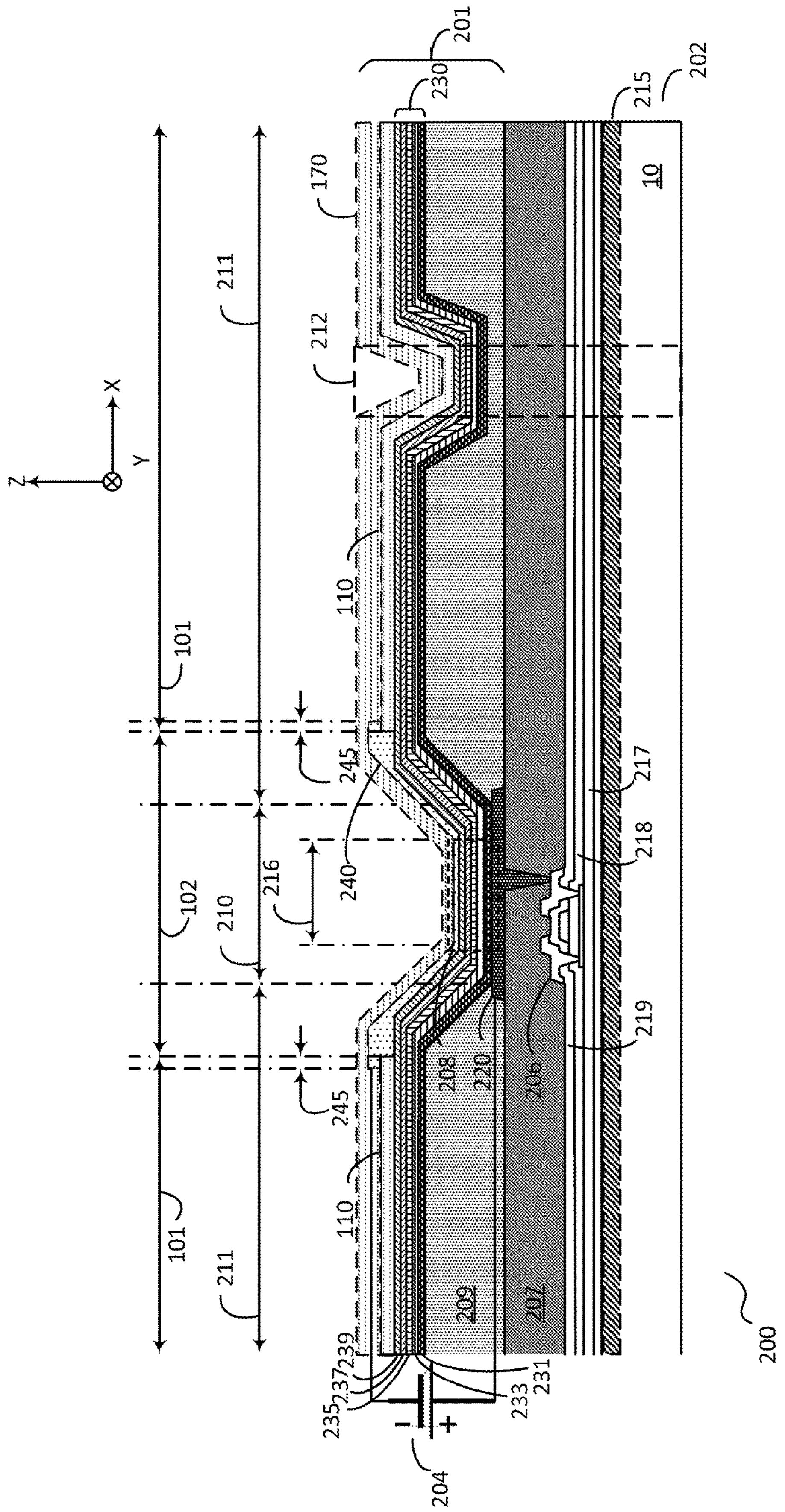
FIG. 2 is a simplified diagram, from a longitudinal aspect, of an example version of the device of FIG. 1, in which the closed coating of deposited material in the second portion forms a second electrode of an opto-electronic device, according to an example in the present disclosure.

The present disclosure relates generally to layered semiconductor devices 100, and more specifically, to opto-electronic devices 200 (FIG. 2). An opto-electronic device 200 may generally encompass any device that converts electrical signals into EM radiation in the form of photons and vice versa. In some non-limiting examples, the opto-electronic device 200 may be an organic light-emitting diode (OLED).

Those having ordinary skill in the relevant art will appreciate that, while the present disclosure is directed to opto-electronic devices 200, the principles thereof may, in some non-limiting examples, be applicable to any panel having a plurality of layers, including without limitation, at least one layer of conductive deposited material 831 (FIG. 8A), including as a thin film, and in some non-limiting examples, through which electromagnetic (EM) signals may pass, including without limitation, one of partially, and entirely, at a non-zero angle relative to a plane of at least one of the layers.

Turning now to FIG. 1, there may be shown a cross-sectional view of an example layered semiconductor device 100. In some non-limiting examples, as shown in greater detail in FIG. 2, the device 100 may comprise a plurality of layers deposited upon a substrate 10.

A first lateral axis, identified as the X-axis, may be shown, together with a longitudinal axis, identified as the Z-axis. A second lateral axis, identified as the Y-axis, may be shown as being substantially transverse to both the X-axis and the Z-axis. At least one of the lateral axes may define a lateral aspect of the device 100. The longitudinal axis may define a longitudinal aspect of the device 100.

The layers of the device 100 may extend, in the lateral aspect, substantially parallel to a plane defined by the lateral axes. Those having ordinary skill in the relevant art will appreciate that the substantially planar representation shown in FIG. 1 may be, in some non-limiting examples, an abstraction for purposes of illustration. In some non-limiting examples, there may be, across a lateral extent of the device 100, localized substantially planar strata of different thicknesses and dimension, including, in some non-limiting examples, the substantially complete absence of at least one layer separated by non-planar transition areas (including lateral gaps and even discontinuities).

Thus, while for illustrative purposes, the device 100 may be shown in its longitudinal aspect as a substantially stratified structure of substantially parallel planar layers, such device may illustrate locally, a diverse topography to define features, each of which may substantially exhibit the stratified profile discussed in the longitudinal aspect.

In some non-limiting examples, a lateral aspect of an exposed layer surface 11 of the device 100 may comprise a first portion 101 and a second portion 102. In some non-limiting examples, the second portion 102 may comprise that part of the exposed layer surface 11 of the device 100 that lies beyond the first portion 101.

Opto-Electronic Device

FIG. 2 is a simplified block diagram from a longitudinal aspect, of an example opto-electronic device, which may be, in some non-limiting examples, an electro-luminescent device 200, according to the present disclosure. In some non-limiting examples, the device 200 may be an OLED.

The device 200 may comprise a substrate 10, upon which a frontplane 201, comprising a plurality of layers, respectively, a first electrode 220, at least one semiconducting layer 230, and a second electrode 240, are disposed. In some non-limiting examples, the frontplane 201 may provide mechanisms for at least one of: emission of EM radiation, including without limitation, photons, and manipulation of emitted EM radiation.

Emissive Region(s)

In some non-limiting examples, including where the OLED device 200 may comprise a display module, the lateral aspect of the device 200 may be sub-divided into a plurality of emissive regions 210 of the device 200, in which the longitudinal aspect of the device structure 200, within each of the emissive region(s) 210, may cause EM radiation to be emitted therefrom when energized.

In some non-limiting examples, an individual emissive region 210 may have an associated pair of electrodes 220, 240, one of which may act as an anode and the other of which may act as a cathode, and at least one semiconducting layer 230 between them. Such an emissive region 210 may emit EM radiation at a given wavelength spectrum and may correspond to one of: a pixel 615 (FIG. 6A), and a sub-pixel 216 thereof. In some non-limiting examples, a plurality of sub-pixels 216, each corresponding to and emitting EM radiation of a different wavelength (range) may collectively form a pixel 615.

In some non-limiting examples, a single display pixel 615 may comprise three sub-pixels 216, which in some non-limiting examples, may correspond respectively to a single sub-pixel 216 of each of three colours, including without limitation, at least one of: a R(ed) sub-pixel 216R, a G(reen) sub-pixel 216G, and a B(lue) sub-pixel 216B. In some non-limiting examples, a single display pixel 615 may comprise four sub-pixels 216, each corresponding respectively to a single sub-pixel 216 of each of two colours, including without limitation, a R(ed) sub-pixel 216R, and a B(lue) sub-pixel 216B, and two sub-pixels 216 of a third colour, including without limitation, a G(reen) sub-pixel 216G. In some non-limiting examples, a single display pixel 615 may comprise four sub-pixels 216, which in some non-limiting examples, may correspond respectively to a single sub-pixel 216 of each of three colours, including without limitation, at least one of: a R(ed) sub-pixel 216R, a G(reen) sub-pixel 216G, and a B(lue) sub-pixel 216B, and a fourth W(hite) sub-pixel 216*w*.

In some non-limiting examples, an active region 208 of an individual emissive region 210 may be defined to be bounded, in the longitudinal aspect, by the first electrode 220 and the second electrode 240, and to be confined, in the lateral aspect, to an emissive region 210, defined by presence of each of the first electrode 220, the second electrode 240, and the at least one semiconducting layer 230 therebetween ("emissive region layers").

Those having ordinary skill in the relevant art will appreciate that the lateral aspect of the emissive region 210, and thus the lateral boundaries of the active region 208, may not correspond to the entire lateral aspect of at least one of: the first electrode 220, and the second electrode 240. Rather, the lateral aspect of the emissive region 210 may be substantially no more than the lateral extent of either of: the first electrode 220, and the second electrode 240. In some non-limiting examples, at least one of: parts of the first electrode 220 may be covered by the PDL(s) 209, and parts of the second electrode 240 may not be disposed on the at least one semiconducting layer 230, with the result, in at least one scenario, that the emissive region 210 may be laterally constrained.

Where the layout of the emissive region layers is not identical, a given emissive region 210 may be defined by overlaying the layouts of each emissive region layer thereof and selecting the intersection thereof, such that the emissive region 210, including without limitation, the active region 208 thereof, corresponds to the lateral aspect of the device 200 wherein each of the emissive region layers overlap and are disposed such that the at least one semiconducting layer 230 is adjacent to and in physical contact throughout with both the first electrode 220, and the second electrode 240.

In some non-limiting examples, in a longitudinal aspect, the configuration of each emissive region 210 may, in some non-limiting examples, be defined by the introduction of at least one pixel definition layer (PDL) 209. In some non-limiting examples, the PDLs 209 may comprise an insulating material.

In some non-limiting examples, the first electrode 220 may be disposed over an exposed layer surface 11 of the device 200, in some non-limiting examples, within at least a part of the lateral aspect of the emissive region 210. In some non-limiting examples, at least within the lateral aspect of the emissive region 210 of the (sub-) pixel(s) 615/216, the exposed layer surface 11, may, at the time of deposition of the first electrode 220, comprise the TFT insulating layer 207 of the various TFT structures 206 that make up the driving circuit for the emissive region 210 corresponding to a single display (sub-) pixel 615/216.

In some non-limiting examples, the TFT insulating layer 207 may be formed with an opening extending therethrough to permit the first electrode 220 to be electrically coupled with a TFT electrode including, without limitation, a TFT drain electrode.

In some non-limiting examples, the TFT insulating layer 207 may be deposited on an exposed layer surface 11 of an interlayer insulating layer 219, which, in some non-limiting examples, may be deposited on an exposed layer surface 11 of a gate insulating layer 218, which, in some non-limiting examples, may be deposited on an exposed layer surface 11 of a buffer layer 217, which in some limiting examples, may be deposited on an exposed layer surface 11 of the base substrate 215. In some non-limiting examples, two of such layers may be separated by an intervening layer.

Those having ordinary skill in the relevant art will appreciate that the driving circuit may comprise a plurality of TFT structures 206. In FIG. 2, for purposes of simplicity of illustration, only one TFT structure 206 may be shown, but it will be appreciated by those having ordinary skill in the relevant art, that such TFT structure 206 may be representative of at least one of: such plurality thereof, and at least one component thereof, that comprise the driving circuit.

In some non-limiting examples, an extremity of the first electrode 220 may be covered by at least one PDL 209 such that a part of the at least one PDL 209 may be interposed between the first electrode 220 and the at least one semiconducting layer 230, such that such extremity of the first electrode 220 may lie beyond the active region 208 of the associated emissive region 210.

In some non-limiting examples, part(s) of the second electrode 240 may not be disposed directly on the at least one semiconducting layer 230, such that the emissive region 210, including without limitation, the active region 208 thereof, may be laterally constrained thereby.

In some non-limiting examples, the at least one semiconducting layer 230 (including without limitation, at least one of: layers 231, 233, 235, 237, 239 thereof) may be deposited over the exposed layer surface 11 of the device 200, including at least a part of the lateral aspect of such emissive region 210 of the (sub-) pixel(s) 615/216. In some non-limiting examples, at least within the lateral aspect of the emissive region 210 of the (sub-) pixel(s) 615/216, such exposed layer surface 11, may, at the time of deposition of such at least one semiconducting layer 230, comprise the first electrode 220.

In some non-limiting examples, the at least one semiconducting layer 230 may also extend beyond the lateral aspect of the emissive region 210 of the (sub-) pixel(s) 615/216 and at least partially within the lateral aspects of the surrounding non-emissive region(s) 211. In some non-limiting examples, such exposed layer surface 11 of such surrounding non-emissive region(s) 211 may, at the time of deposition of the at least one semiconducting layer 230, comprise the PDL(s) 209.

In some non-limiting examples, the second electrode 240 may be disposed over an exposed layer surface 11 of the device 200, including at least a part of the lateral aspect of the emissive region 210 of the (sub-) pixel(s) 615/216. In some non-limiting examples, at least within the lateral aspect of the emissive region 210 of the (sub-) pixel(s) 615/216, such exposed layer surface 11, may, at the time of deposition of the second electrode 220, comprise the at least one semiconducting layer 230.

In some non-limiting examples, the second electrode 240 may also extend beyond the lateral aspect of the emissive region 210 of the (sub-) pixel(s) 615/216 and at least partially within the lateral aspects of the surrounding non-emissive region(s) 211. In some non-limiting examples, an exposed layer surface 11 of such surrounding non-emissive region(s) 211 may, at the time of deposition of the second electrode 240, comprise the PDL(s) 209.

In some non-limiting examples, the second electrode 240 may extend throughout a substantial part, including without limitation, substantially all, of the lateral aspects of the surrounding non-emissive region(s) 211.

Display Part and Signal-Exchanging Part

Figure 3:
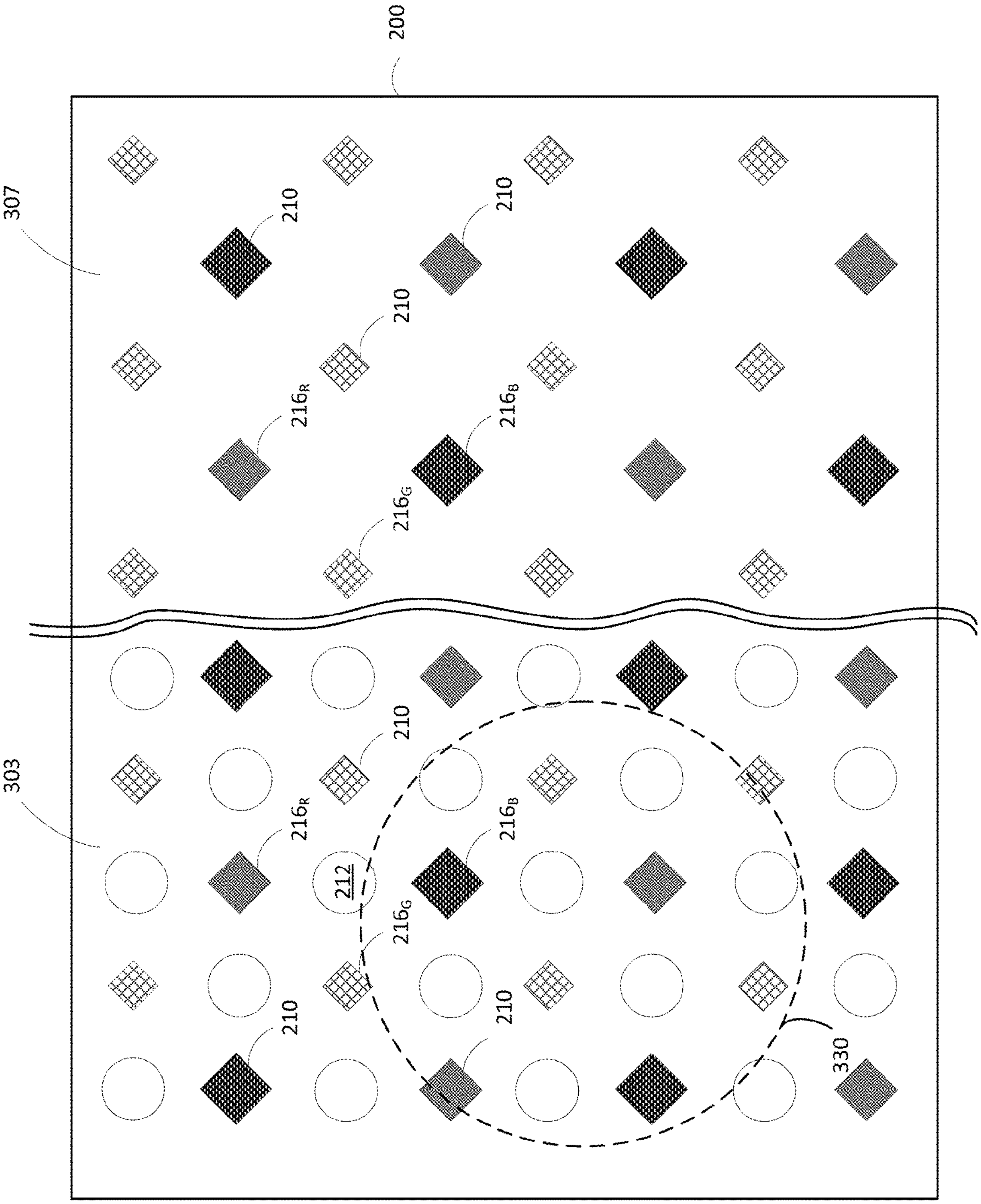
FIG. 3 is a schematic diagram illustrating, in plan, an example version of the device of FIG. 2, showing a display part and a signal-exchanging part, according to an example in the present disclosure.

Turning now to FIG. 3, there is shown a magnified view, partially cut-away, of parts of the device 200 in plan, according to a non-limiting example. In some non-limiting examples, the device 200 may comprise at least one signal-exchanging part 303 and at least one display part 307.

In some non-limiting examples, the at least one display part 307 may comprise a plurality of emissive regions 210, in some non-limiting examples, laid out in a lateral pattern. In some non-limiting examples, the emissive regions 210 in the at least one display part 307 may correspond to (sub-) pixels 615/216 of the device 200.

In some non-limiting examples, the at least one signal-exchanging part 303 may comprise at least one emissive region 210 and at least one (signal-, including without limitation, light-) transmissive region 212. In some non-limiting examples, the at least one emissive region 210 in the at least one signal-exchanging part 303 may correspond to (sub-) pixel(s) 615/216 of the device 200, and in some non-limiting examples, may be substantially laid out in a similar, including without limitation, identical, lateral pattern as in the at least one display part 307.

In some non-limiting examples, as shown, the at least one signal-exchanging part 303 may comprise a plurality of transmissive regions 212.

In some non-limiting examples, the at least one display part 307 may be adjacent to, and in some non-limiting examples, separated by, at least one signal-exchanging part 303.

In some non-limiting examples, the at least one signal-exchanging part 303 may be positioned proximate to an extremity of the device 200, including without limitation, at least one of: an edge, and a corner, thereof. In some non-limiting examples, the at least one signal-exchanging part 303 may be positioned substantially centrally within the lateral aspect of the device 200.

In some non-limiting examples, the at least one display part 307 may substantially surround, including without limitation, in conjunction with at least one other display part 307, the at least one signal-exchanging part 303.

In some non-limiting examples, the at least one signal-exchanging part 303 may be positioned proximate to an extremity and configured such that the at least one display part(s) 307 do(es) not completely surround the at least one signal-exchanging part 303.

In some non-limiting examples, the at least one transmissive region 212 may be configured to allow EM radiation, including without limitation, a (n) (EM) signal 431 (FIG. 4), including without limitation, light, including without limitation, in the form of a photon, to pass through the device 200 along an axis that may be substantially transverse to a surface of the device 200.

In some non-limiting examples, the at least one transmissive region 212 may configured to allow transmission of EM radiation in a wavelength range that corresponds to at least one of: the visible spectrum, NIR spectrum, IR spectrum, and a sub-set thereof.

In some non-limiting examples, a transmittance of each of the at least one transmissive regions 212 may be substantially the same and in some non-limiting examples, may be at least one of about: 50, 60, 70, 80, and 90%.

In some non-limiting examples, a transmittance in the at least one transmissive region 212 may be at least one of about: 60, 65, 70, 75, 80, 85, 90, and 95%, for wavelengths in a wavelength range of one of between about: 400-1,400, 420-1,200, and 430-1,100, nm.

In some non-limiting examples, at least one under-display component 330 may be positioned laterally within the signal-exchanging part 303. As shown, the at least one under-display component 330 is shown in dashed outline, to illustrate that it is positioned on a side of the substrate 10 opposite to the various deposited thereon, in the illustration, beneath the page, such that the device 200 presents the at least one transmissive region 212 in the signal-exchange part 303 to accommodate the exchange of at least one signal 431 therethrough and thus, through the device 200, to be at least one of: emitted, and received, by the at least one under-display component 330.

(Sub-) Pixel Layout

In some non-limiting examples, the lateral pattern of emissive regions 210 may extend along a first lateral direction. In some non-limiting examples, the pattern may also extend along a second lateral direction, which in some non-limiting examples, may extend at an angle relative to the first lateral direction. In some non-limiting examples, the second lateral direction may be substantially normal to the first lateral direction. In some non-limiting examples, the pattern may have a number of elements in such pattern, each element being characterized by at least one feature thereof, including without limitation, at least one of: a wavelength of EM radiation emitted by the emissive region 210 thereof, a shape of such emissive region 210, a dimension (along at least one of: the first, and second, lateral direction(s)), an orientation(relative to at least one of: the first, and second, lateral direction(s)), and a spacing(relative to at least one of: the first, and second, lateral direction(s)) from a previous element in the pattern. In some non-limiting examples, the pattern may repeat in at least one of: the first, and second, lateral direction(s).

In some non-limiting examples, each individual emissive region 210 of the device 200 may be associated with, and driven by, a corresponding driving circuit within the backplane 202 of the device 200, for driving an OLED structure for the associated emissive region 210. In some non-limiting examples, including without limitation, where the emissive regions 210 may be laid out in a regular pattern extending in both the first (row) lateral direction and the second (column) lateral direction, there may be a signal line in the backplane 202, corresponding to each row of emissive regions 210 extending in the first lateral direction and a signal line, corresponding to each column of emissive regions 210 extending in the second lateral direction. In such a non-limiting configuration, a signal on a row selection line may energize the respective gates of the switching TFT structure(s) 206 electrically coupled therewith and a signal on a data line may energize the respective sources of the switching TFT structure(s) 206 electrically coupled therewith, such that a signal on a row selection line/data line pair may electrically couple and energise, by the positive terminal of the power source, the anode of the OLED structure of the emissive region 210 associated with such pair, causing the emission of a photon therefrom, the cathode thereof being electrically coupled with the negative terminal of the power source.

In some non-limiting examples, a lateral aspect of at least one emissive region 210 may extend across and include at least one TFT structure 206 associated therewith for driving the emissive region 210 along data and scan lines (not shown), which, in some non-limiting examples, may be formed of at least one of: Cu, and a TCO.

In some non-limiting examples, the (sub-) pixels 615/216 may be disposed in a side-by-side arrangement. In some non-limiting examples, a (colour) order of the sub-pixels 216 of a first pixel 615 may be the same as a (colour) order of the sub-pixels 216 of a second pixel 615. In some non-limiting examples, a (colour) order of the sub-pixels 216 of a first pixel 615 may be different from a (colour) order of the sub-pixels 216 of a second pixel 615.

In some non-limiting examples, the sub-pixels 216 of adjacent pixels 315 may be aligned in at least one of: a row, column, and array, arrangement.

In some non-limiting examples, a first at least one of: a row, and a column, of aligned sub-pixels 216 of adjacent pixels 615 may comprise sub-pixels 216 of one of: a same, and a different, colour.

In some non-limiting examples, a first at least one of: a row, and a column, of aligned sub-pixels 216 of adjacent pixels 615 may be aligned with at least one of: a second, and a third, at least one of: a row, and a column, of aligned sub-pixels 216 of adjacent pixels 615.

In some non-limiting examples, a first at least one of: a row, and a column, of aligned sub-pixels 216 of adjacent pixels 615 may be one of: offset from, and mis-aligned with, at least one of: a second, and a third, at least one of: a row, and a column, of aligned sub-pixels 216 of adjacent pixels 615.

In some non-limiting examples, the sub-pixels 216 of adjacent pixels 615 of such at least one of: first, second, and third, at least one of: a row, and a column, may be arranged such that corresponding sub-pixels 216 of each of the at least one of: first, second, and third, at least one of: a row, and a column, may be of a same colour.

In some non-limiting examples, the sub-pixels 216 of adjacent pixels 615 of such at least one of: first, second, and third, at least one of: a row, and a column, may be arranged such that corresponding sub-pixels 216 of each of the at least one of: first, second and third, at least one of: a row, and a column, may be of different colours.

In some non-limiting examples, in the at least one signal-exchanging part 303 of a device 200, the at least one transmissive region 212 may be disposed between a plurality of emissive regions 210. In some non-limiting examples, the at least one transmissive region 212 may be disposed between adjacent (sub-) pixels 615/216. In some non-limiting examples, the adjacent sub-pixels 216 surrounding the at least one transmissive region 212 may form part of a same pixel 615. In some non-limiting examples, the adjacent sub-pixels 216 surrounding the at least one transmissive region 212 may be associated with different pixels 615.

In some non-limiting examples, a region that may be substantially devoid of a closed coating 140 of a second electrode material ("cathode-free region"), including without limitation, the at least one transmissive region 212, in some non-limiting examples, may exhibit different opto-electronic characteristics from other regions, including without limitation, the at least one emissive region 210. In some non-limiting examples, such cathode-free regions may nevertheless comprise some second electrode material, including without limitation, in the form of a discontinuous layer 160 of one of: at least one particle structure 150, and at least one instance of such particle structures 150.

Non-Emissive Regions

In some non-limiting examples, the various emissive regions 210 of the device 200 may be substantially surrounded and separated by, in at least one lateral direction, at least one non-emissive region 211, in which at least one of: the structure, and configuration, along the longitudinal aspect, of the device 200 shown, without limitation, may be varied, to substantially inhibit EM radiation to be emitted therefrom.

In some non-limiting examples, the non-emissive regions 211 may comprise those regions in the lateral aspect, that are substantially devoid of an emissive region 210.

In some non-limiting examples, the longitudinal topology of the various layers of the at least one semiconducting layer 230 may be varied to define at least one emissive region 210, surrounded (at least in one lateral direction) by at least one non-emissive region 211.

A non-limiting example of an implementation of the longitudinal aspect of the device 200 as applied to an emissive region 210 corresponding to a single display (sub-) pixel 615/216 of the display 200 will now be described. While features of such implementation are shown to be specific to the emissive region 210, those having ordinary skill in the relevant art will appreciate that in some non-limiting examples, more than one emissive region 210 may encompass features in common.

In some non-limiting examples, the lateral aspects of the surrounding non-emissive region(s) 211 may be characterized by the presence of a corresponding PDL 209.

In some non-limiting examples, a thickness of the PDL 209 may increase from a minimum, where it covers the extremity of the first electrode 220, to a maximum beyond the lateral extent of the first electrode 220. In some non-limiting examples, the change in thickness of the at least one PDL 209 may define a valley shape centered about the emissive region 210. In some non-limiting examples, the valley shape may constrain the field of view (FOV) of the EM radiation emitted by the emissive region 210.

While the PDL(s) 209 have been generally illustrated herein as having a linearly-sloped surface to form a valley-shaped configuration that define the emissive region(s) 210 surrounded thereby, those having ordinary skill in the relevant art will appreciate that in some non-limiting examples, at least one of: the shape, aspect ratio, thickness, width, and configuration of such PDL(s) 209 may be varied. In some non-limiting examples, a PDL 209 may be formed with one of: a substantially steep part and a more gradually sloped part. In some non-limiting examples, such PDL(s) 209 may be configured to extend substantially normally away from a surface on which it is deposited, that may cover at least one edge of the first electrode 220. In some non-limiting examples, such PDL(s) 209 may be configured to have deposited thereon at least one semiconducting layer 230 by a solution-processing technology, including without limitation, by printing, including without limitation, ink-jet printing.

In some non-limiting examples, the PDLs 209 may be deposited substantially over the TFT insulating layer 207, although, as shown, in some non-limiting examples, the PDLs 209 may also extend over at least a part of the deposited first electrode 220, including without limitation, its outer edges.

In some non-limiting examples, the lateral extent of at least one of the non-emissive regions 211 may be at least, and in some non-limiting examples, exceed, including without limitation, be a multiple of, the lateral extent of the emissive region 210 interposed therebetween.

In some non-limiting examples, a thickness of at least one PDL 209 in at least one transmissive region 212, in some non-limiting examples, of at least one non-emissive region 211, interposed between adjacent emissive regions 210, in some non-limiting examples, at least in a region laterally spaced apart therefrom, and in some non-limiting examples; although not shown, of the TFT insulating layer 207, may be reduced in order to enhance at least one of: a transmittivity, and a transmittivity angle, relative to and through the layers of a device 200, to facilitate transmission of EM radiation therethrough.

Display Panel and User Device

Figure 4:
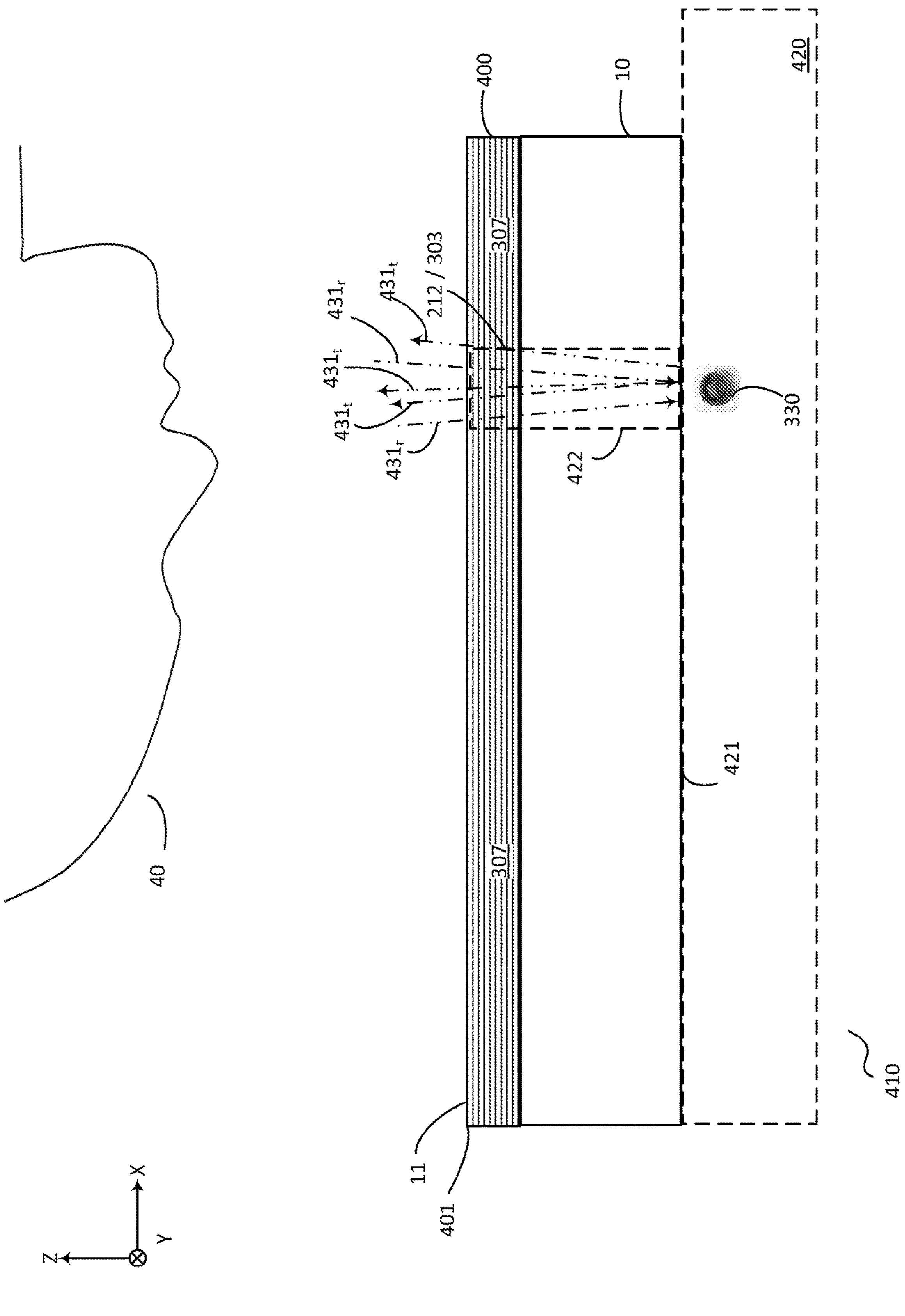
FIG. 4 is a schematic diagram illustrating an example cross-sectional view of an example display panel having a plurality of layers, comprising at least one aperture therewithin, through which at least one electromagnetic signal may be exchanged according to an example in the present disclosure.

Turning now to FIG. 4, there is shown a cross-sectional view of an example layered opto-electronic device 200, such as a display panel 400. In some non-limiting examples, the display panel 400 may comprise a plurality of layers deposited on a substrate 10, culminating with an outermost layer that forms a face 401 thereof. In some non-limiting examples, the display panel 400 may be a version of the device 200.

The face 401 of the display panel 400 may extend across a lateral aspect thereof, substantially along a plane defined by the lateral axes.

In some non-limiting examples, the face 401, and indeed, the entire display panel 400, may act as a face of a user device 410 through which at least one signal 431 may be exchanged therethrough at a non-zero angle relative to the plane of the face 401. In some non-limiting examples, the user device 410 may be a computing device, such as, without limitation, a smartphone, a tablet, a laptop, an e-reader, and some other electronic device, such as a monitor, a television set, and a smart device, including without limitation, an automotive display, windshield, a household appliance, and a medical, commercial, and industrial device.

In some non-limiting examples, the face 401 may correspond to, and in some non-limiting examples, mate with, at least one of: a body 420, and an opening 421 therewithin, within which the at least one under-display component 330 may be housed.

In some non-limiting examples, the at least one under-display component 330 may be formed, including without limitation, at least one of: integrally, and as an assembled module, with the display panel 400 on a surface thereof opposite to the face 401.

In some non-limiting examples, at least one aperture 422 may be formed in the display panel 400 to allow for the exchange of at least one signal 431 through the face 401 of the display panel 400, at a non-zero angle to the plane defined by the lateral axes, including without limitation, concomitantly, the layers of the display panel 400, including without limitation, the face 401 of the display panel 400.

In some non-limiting examples, the at least one aperture 422 may be understood to comprise one of: the absence, and reduction in at least one of: thickness, and capacity, of at least one coating otherwise disposed across the display panel 400 that may (in combination) be substantially opaque. In some non-limiting examples, the at least one aperture 422 may be embodied as a corresponding at least one transmissive region 212 of the at least one signal-exchanging part 303, as described herein, including without limitation, defining a shape in the lateral aspect of such at least one transmissive region 212.

However the at least one aperture 422 is embodied, the at least one signal 431 may pass therethrough such that it passes through the face 401. As a result, the at least one signal 431 may be considered to exclude any EM radiation that may extend along the plane defined by the lateral axes, including without limitation, any electric current that may be conducted across at least one particle structure 150 laterally across the display panel 400.

Further, those having ordinary skill in the relevant art will appreciate that the at least one signal 431 may be differentiated from EM radiation per se, including without limitation, one of: electric current, and an electric field generated thereby, in that the at least one signal 431 may convey, either one of: alone, and in conjunction with other signals 431, some information content, including without limitation, an identifier by which the at least one signal 431 may be distinguished from other signals 431. In some non-limiting examples, the information content may be conveyed by at least one of: specifying, altering, and modulating, at least one of: the wavelength, frequency, phase, timing, bandwidth, resistance, capacitance, impedance, conductance, and other characteristic of the at least one signal 431.

In some non-limiting examples, the at least one signal 431 passing through the at least one aperture 422 of the display panel 400 may comprise at least one photon and, in some non-limiting examples, may have a wavelength spectrum that lies, without limitation, within at least one of: the visible spectrum, the IR spectrum, and the NIR spectrum. In some non-limiting examples, the at least one signal 431 passing through the at least one aperture 422 of the display panel 400 may have a wavelength that lies, without limitation, within at least one of: the IR, and NIR, spectrum.

In some non-limiting examples, the at least one signal 431 passing through the at least one aperture 422 of the display panel 400 may comprise ambient light incident thereon.

In some non-limiting examples, the at least one signal 431 exchanged through the at least one aperture 422 of the display panel 400 may be at least one of: transmitted, and received, by the at least one under-display component 330.

In some non-limiting examples, as shown in FIG. 3, the at least one under-display component 330 may have a size that is at least a single transmissive region 212, but may underlie not only a plurality thereof, but also at least one emissive region 210 extending therebetween. Similarly, in some non-limiting examples, the at least one under-display component 330 may have a size that is at least a single one of the at least one aperture 422.

In some non-limiting examples, the at least one under-display component 330 may comprise a receiver 330*r*, adapted to receive and process at least one received signal 431*r*, passing through the at least one aperture 422 from beyond the user device 410. In some non-limiting examples, such receiver 330*r* may comprise at least one of: an under-display camera (UDC), and a sensor, including without limitation, IR sensor/detector, an NIR sensor/detector, a LIDAR sensing module, a fingerprint sensing module, an optical sensing module, an IR (proximity) sensing module, an iris recognition sensing module, and a facial recognition sensing module, including without limitation, a part thereof.

In some non-limiting examples, the at least one under-display component 330 may comprise a transmitter $\mathbf{330}_t$ adapted to emit at least one transmitted signal $\mathbf{431}_t$ passing through the at least one aperture 422 beyond the user device 410. Non-limiting examples, of such transmitter $\mathbf{330}_t$ include a source of EM radiation, including without limitation, a built-in flash, a flashlight, an IR emitter, a NIR emitter, a LIDAR sensing module, a fingerprint sensing module, an optical sensing module, an IR (proximity) sensing module, an iris recognition sensing module, and a facial recognition sensing module, including without limitation, a part thereof.

In some non-limiting examples, the at least one received signal 431*r* may include at least a fragment of the at least one transmitted signal 431$_t$ which is one of:

reflected off, and otherwise returned by, an external surface to the user device 410, including without limitation, a user 40.

In some non-limiting examples, the at least one signal 431 passing through the at least one aperture 422 of the display panel 400 beyond the user device 410, including without limitation, those transmitted signals 431$_t$ emitted by the at least one under-display component 330 that may comprise a transmitter 330$_t$, may emanate from the display panel 400, and pass back as received signals 431*r* through the at least one aperture 422 of the display panel 400 to at least one under-display component 330 that may comprise a receiver 330*r*.

In some non-limiting examples, the under-display component 330 may comprise an IR emitter and an IR sensor. In some non-limiting examples, such under-display component 330 may comprise, as one of: a part, component, and module, thereof: at least one of: a dot-matrix projector, a time-of-flight (ToF) sensor module, which may operate as one of: a direct ToF, and an indirect ToF, sensor, a vertical cavity surface-emitting laser (VCSEL), flood illuminator, NIR imager, folded optics, and a diffractive grating.

In some non-limiting examples, there may be a plurality of under-display components 330 within the user device 410, a first one of which may comprise a transmitter 330$_t$ for emitting at least one transmitted signal 431$_t$ to pass through the at least one aperture 422, beyond the user device 410, and a second one of which may comprise a receiver 330*r*, for receiving at least one received signal 431*r*. In some non-limiting examples, such transmitter 330$_t$ and receiver 330*r* may be embodied in a single under-display component 330.

In some non-limiting examples, the user device 410 may house at least one transmitter 330$_t$ for transmitting at least one transmitted signal 431$_t$ through at least one first transmissive region 212 in, and in some non-limiting examples, substantially corresponding to, a first signal-exchanging part 303, beyond the face 401. In some non-limiting examples, the user device 410 may house at least one receiver 330*r* for receiving at least one received signal 431*r* through at least one second transmissive region 212 in, and in some non-limiting examples, substantially corresponding to, a second signal-exchanging part 303, from beyond the face 401. In some non-limiting examples, the at least one received signal 431*r* may be the same as the at least one transmitted signal 431$_t$, reflected off an external surface, including without limitation, a user 40, including without limitation, for biometric authentication thereof.

In some non-limiting examples, at least one of: the at least one transmitter 330$_t$, and the at least one receiver 330$_r$, may be arranged behind the corresponding at least one signal-exchanging part 303, such that IR signals may be at least one of: emitted, and received, respectively, by passing through the at least one signal-exchanging part 303 of the display panel 400. In some non-limiting examples, the at least one transmitter 330$_t$ and the at least one receiver 330*r* may both be arranged behind a single signal-exchanging part 303, which in some non-limiting examples, may be elongated along at least one configuration axis, such that it extends across both the at least one transmitter 330$_t$ and the at least one receiver 330*r*.

In some non-limiting examples, the display panel 400 may further comprise a non-display part (not shown), which in some non-limiting examples, may be substantially devoid of any emissive regions 210. In some non-limiting examples, the user device 410 may house an under-display component 330, including without limitation, a camera, arranged within the non-display part.

In some non-limiting examples, the non-display part may be arranged adjacent to, and in some non-limiting examples, between a plurality of signal-exchanging parts 303 corresponding to a plurality of under-display components 330, including without limitation, a transmitter 330$_t$ and a receiver 330*r*.

In some non-limiting examples, the non-display part may comprise a through-hole part (not shown), which in some non-limiting examples, may be arranged to overlap the camera. In some non-limiting examples, the display panel 400 may, in the through-hole part, be substantially devoid of any of at least one of: a layer, coating, and component, that may otherwise be present in at least one of: the at least one signal-exchanging part 303, and the at least one display part 307, including without limitation, a component of at least one of: the backplane 202, and the frontplane 201, the presence of which may otherwise interfere with the capture of an image by the camera. In some non-limiting examples, an overlying layer 170, including without limitation, at least one of: a polarizer, and one of: a cover glass, and a glass cap, of the display panel 400, may extend substantially across the at least one signal-exchanging part 303, the at least one display part 307, and the non-display part, such that it may extend substantially across the display panel 400. In some non-limiting examples, the through-hole part may be substantially devoid of a polarizer in order to enhance the transmission of EM radiation therethrough.

In some non-limiting examples, the non-display part may comprise a non-through-hole part, which in some non-limiting examples, may be arranged between the through-hole part and an adjacent signal-exchanging part 303 in a lateral aspect. In some non-limiting examples, the non-through-hole part may surround at least a part of a perimeter of the through-hole part. In some non-limiting examples, the user device 410 may comprise additional ones of at least one of: a module, component, and sensor, in a part of the user device 410 corresponding to the non-through-hole part of the display panel 400.

In some non-limiting examples, the emissive regions 210 in the at least one signal-exchanging part 303 may be electrically coupled with at least one TFT structure 206 located in the non-through-hole part of the non-display part. That is, in some non-limiting examples, the TFT structures 206 for actuating the (sub-) pixels 615/216 in the at least one signal-exchanging part 303 may be relocated outside the at least one signal-exchanging part 303 and within the non-through-hole part of the display panel 400, such that a substantially high transmission of EM radiation, in at least one of: the IR spectrum, and the NIR spectrum, may be directed through the non-emissive regions 211 within the at least one signal-exchanging part 303. In some non-limiting examples, the TFT structures 206 in the non-through-hole part may be electrically coupled with (sub-) pixels 615/216 in the at least one signal-exchanging part 303 via conductive trace(s). In some non-limiting examples, at least one of the transmitter 430$_t$ and the receiver 430*r* may be arranged to be proximate to the non-through-hole part in the lateral aspect, such that a distance over which electrical current travels between the TFT structures 206 and the (sub-) pixels 615/216 associated therewith, may be reduced.

Diffraction Reduction

In the present disclosure, as used herein, the adjective "regular", unless the context indicates otherwise, may generally ascribe to a term that it modifies, the sense of substantial, including without limitation, exact, similarity, including without limitation, symmetry, in an attribute thereof, including without limitation, in location, shape, spacing, size, orientation, and position, of at least one of: the noun itself, and a part thereof, including without limitation, in respect of a pattern thereof.

Figure 5A:
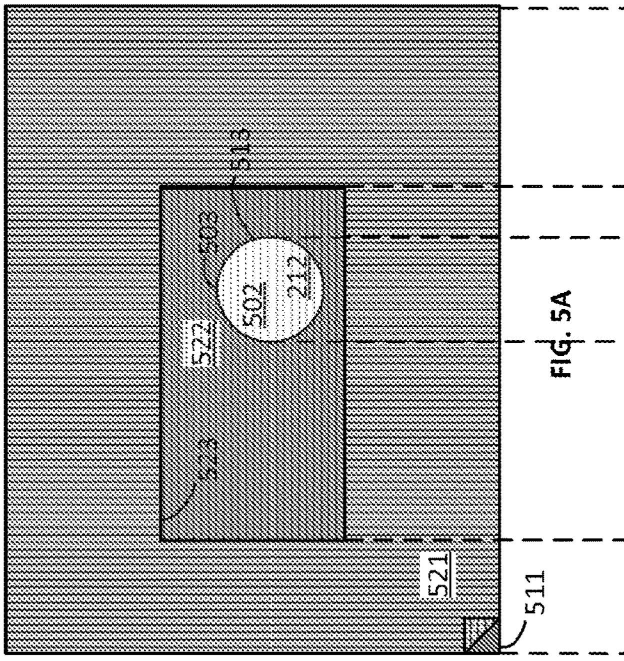
FIGS. 5A-5B, and 5C-5D are respective sets of stacked schematic diagrams illustrating respectively in plan and in cross-section, an example cross-sectional view of a fragment of a signal-exchanging part of a display panel, showing an aperture of a transmissive region whose boundary is defined by an intersection of a boundary of an aperture of a first layer lateral pattern with a boundary of a corresponding aperture of a second layer lateral pattern according to an example in the present disclosure.
Figure 5B:
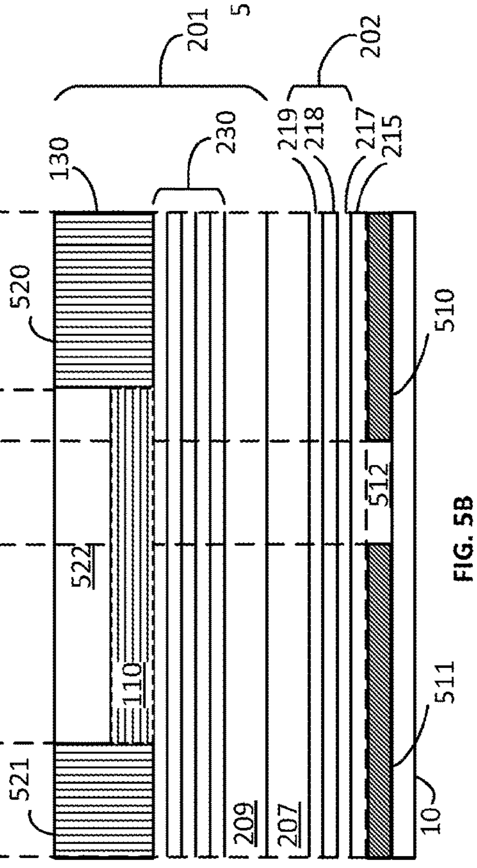
Figure 5C:
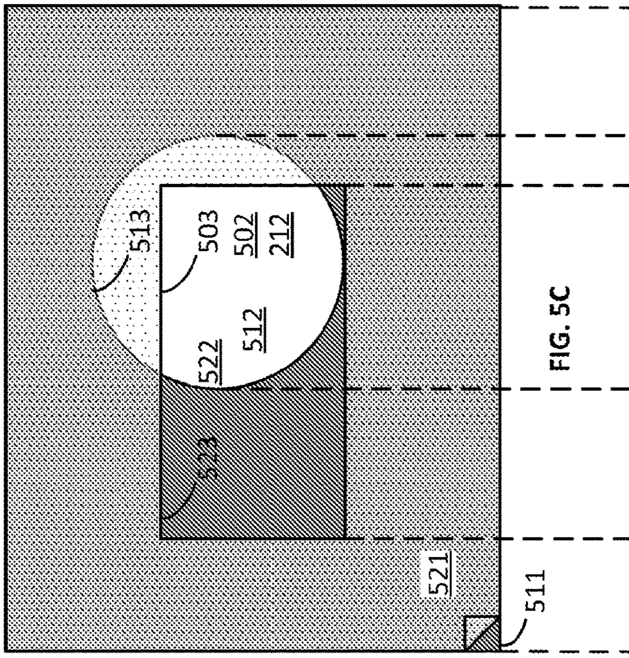
Figure 5D:
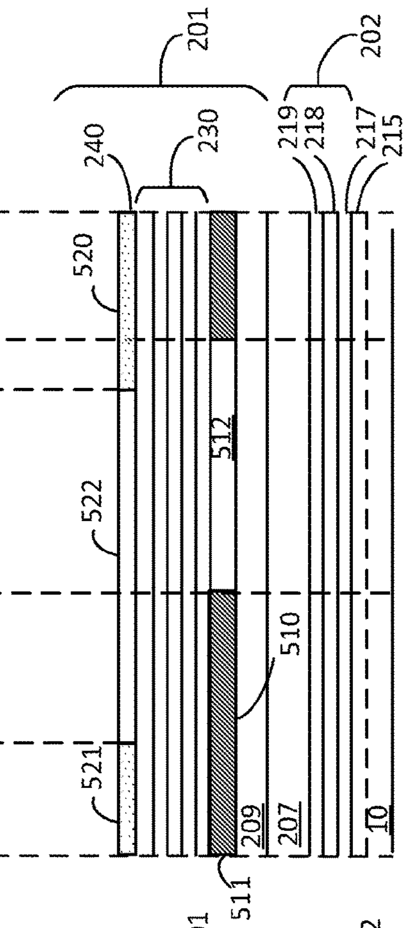

Turning now to the complementary views of FIGS. 5A-5B, and of FIGS. 5C-5D, it has been discovered that, in some non-limiting examples, the at least one signal 431 passing through the at least one transmissive region 212 may be impacted by a diffraction characteristic of a lateral pattern imposed in the lateral aspect, of the at least one transmissive region 212. Such diffraction characteristic may be a function of at least one of: the lateral pattern of at least one boundary 503 of aperture(s) 422 defining corresponding transmissive region(s) 212 across the signal-exchanging part 303, and a shape, in the lateral aspect, of the boundary 503 itself.

In some non-limiting examples, such lateral pattern may interfere with an ability to permit an under-display component 330 to be able to one of: accurately receive, and process, at least one signal 431, including without limitation, an image, passing through the at least one transmissive region 212 of a display panel 400, even with the application of optical post-processing techniques, and allow a viewer of such at least one signal 431 through such display panel 400 to discern information contained therein.

Thus, in some non-limiting examples, a lateral pattern, that is substantially regular, including without limitation, repetitive, may interfere with the capture of at least one of: an image, and an EM radiation pattern represented thereby.

In some non-limiting examples, a lateral pattern, of transmissive regions 212, may be achieved by ensuring the absence of material in at least one defining layer 511, 521, including without limitation, deposited material 831 forming a deposited layer 130, of which the second electrode 240 may be comprised, that substantially reduces transmission of EM radiation therethrough, in at least one wavelength range of the EM spectrum, including without limitation, at least one of: the visible spectrum, the UV spectrum, the IR spectrum, the NIR spectrum, and a part thereof, in regions, in the lateral aspect, corresponding to at least one of: the location, shape, spacing, size, orientation, and position, in the form of at least one boundary 503, of aperture(s) 422 defining corresponding transmissive region(s) 212 across the signal-exchanging part 303.

In some non-limiting examples, such defining layers 511, 521 may comprise: at least one of: a layer that may be typically encountered in an opto-electronic device 200, including without limitation, the substrate 10, at least one layer in the backplane 202, including without limitation, at least one TFT structure 206, the TFT insulating layer 207, the buffer layer 217, the gate insulating layer 218, the interlayer insulating layer 219, at least one conductive metal line coupled with the at least one TFT structure 206 (including without limitation, data and scan lines which, in some non-limiting examples, may be formed of at least one of: Cu, and a TCO), and the first electrode 220, and at least one layer in the frontplane 201, including without limitation, the first electrode 220, the second electrode 240, at least one semiconducting layer 230 therebetween, and a PDL 209, to the extent that such layer substantially reduces transmission of EM radiation therethrough in at least a wavelength range of the EM spectrum, including without limitation, at least one of: the visible spectrum, the UV spectrum, the IR spectrum, and a part thereof.

Those having ordinary skill in the relevant art will appreciate that in some non-limiting examples, the first electrode 220 of an opto-electronic device 200 may be considered to form part of the backplane 202, and in some non-limiting examples, the first electrode 220 of an opto-electronic device 200 may be considered to form part of the frontplane 201.

As used herein, the term "substantially reduces transmission of EM radiation therethrough" may generally refer to a reduction, in the transmission of EM radiation therethrough, that is no less than one of about: 99, 95, 90, 80, 75, 70, 60, 50, 40, 30, 20, and 10%.

In some non-limiting examples, the definition of the lateral pattern, in the lateral aspect, of transmissive regions 212, using at least one defining layer 511, 521 that may be typically encountered in an opto-electronic device 200, that, to at least some extent, may substantially reduce transmission of EM radiation therethrough in at least a wavelength range of the EM spectrum, including without limitation, at least one of: the visible spectrum, the UV spectrum, the IR spectrum, the NIR spectrum, and a part thereof, may introduce a "grey zone" in which the ability to substantially reduce transmission of EM radiation of such at least one defining layer 511, 521 is substantially less than 100% and a substantial fraction of the EM radiation may pass through such defining layer(s) 511, 521 beyond the at least one boundary 513 (FIG. 5A), 523 of aperture(s) 512, 522 defining corresponding transmissive region(s) 212 across the signal-exchanging part 303.

In some non-limiting examples, such defining layers 511, 521 may comprise at least one opaque coating that substantially reduces transmission of EM radiation therethrough in at least a wavelength range of the EM spectrum, including without limitation, at least one of: the visible spectrum, the UV spectrum, the IR spectrum, the NIR spectrum, and a part thereof. In some non-limiting examples, such opaque coating may not be typically encountered in an opto-electronic device 200 but has been introduced for purposes of contributing to the definition of at least one boundary 513, 523 of aperture(s) 512, 522 defining corresponding transmissive region(s) 212 in a lateral pattern, in the lateral aspect, across the signal-exchanging part 303.

In some non-limiting examples, the use of an opaque coating may reduce a likelihood that at least one boundary 513, 523 of aperture(s) 512, 522 defining corresponding transmissive region(s) 212 in a lateral pattern in the lateral aspect, across the signal-exchanging part 303, may have reduced definition, including without limitation, having a transition region proximate to the at least one boundary 513, 523 of aperture(s) 512, 522 defining corresponding transmissive region(s) 212, in which a reduced amount of EM radiation may be transmitted therethrough.

In some non-limiting examples, the absence of material in aperture(s) 512, 522 in defining layer(s) 511, 521, including without limitation, one of: a layer that may be typically encountered in an opto-electronic device 200, and an opaque coating introduced for purposes of contribution to a definition of at least one boundary 513, 523 of aperture(s) 512, 522 defining corresponding transmissive region(s) 212 in a lateral pattern, in the lateral aspect, across the signal-exchanging part 303, may be achieved by removal of such material, including without limitation, by laser ablation.

In some non-limiting examples, the absence of such material may be achieved by ensuring that such material fails to be deposited thereon, including without limitation, by depositing a patterning material 711 in at least one region, in the lateral aspect, to form a patterning coating 110 in a pattern corresponding to at least one boundary 513, 523 of aperture(s) 512, 522 defining corresponding transmissive region(s) 212 in a lateral pattern, in the lateral aspect, across the signal-exchanging part 303.

In some non-limiting examples, the action of depositing the patterning material 711 may make use of a shadow mask 715 (FIG. 7) such as, without limitation, a fine metal mask (FMM), during a vapour deposition process, in which the patterning material 711 is deposited through at least one aperture 716 (FIG. 7) in the shadow mask 715 that corresponds to at least one boundary 513, 523 of aperture(s) 512, 522 defining corresponding transmissive region(s) 212 in a lateral pattern, in the lateral aspect, across the signal-exchanging part 303.

However achieved, in some non-limiting examples, the absence of such material may be restricted to the at least one boundary 513, 523 of aperture(s) 512, 522 defining corresponding transmissive region(s) 212 in a lateral pattern, in the lateral aspect, across the signal-exchanging part 303.

Figure 10A:
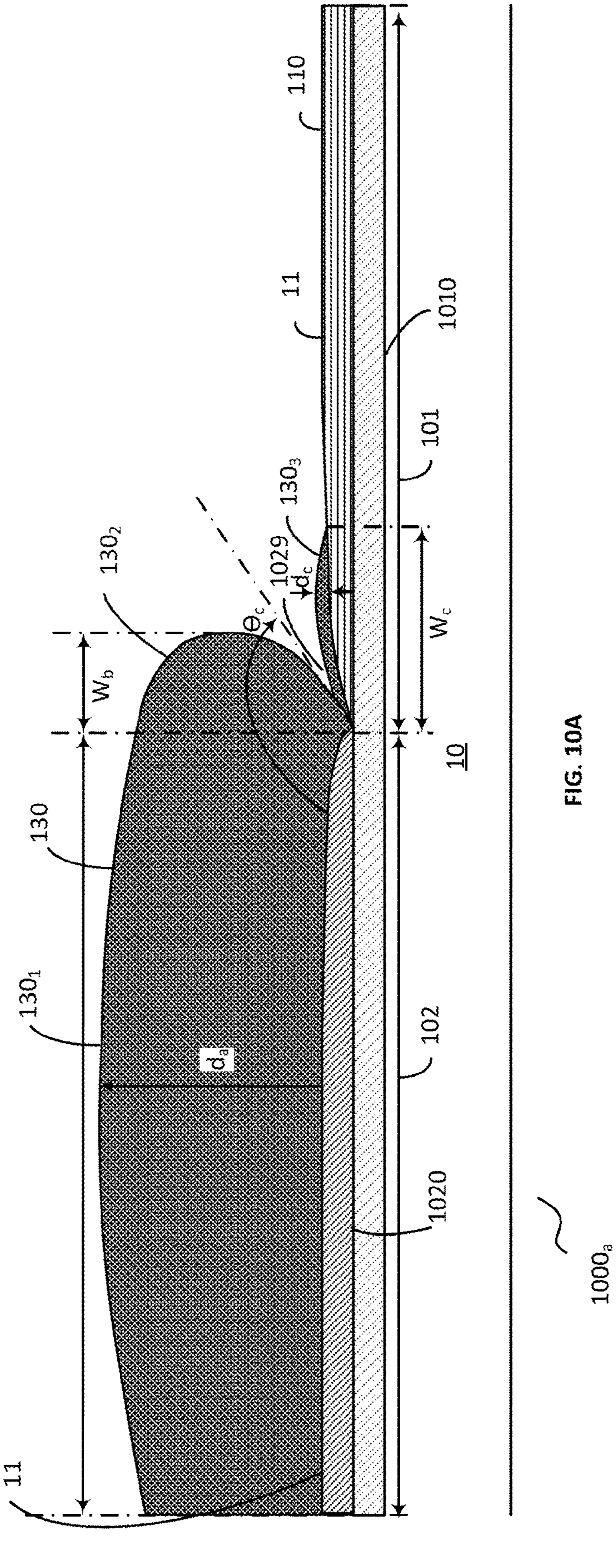
FIGS. 10A-10B are schematic diagrams that show various potential behaviours of a patterning coating at a deposition interface with a deposited layer in an example version of the device of FIG. 1 according to various examples in the present disclosure.

In some non-limiting examples, a deposited layer 130 comprising a deposited material 831 may be deposited in the frontplane 201, in a lateral pattern 520 comprising at least one frontplane aperture 522, characterized by the absence of a closed coating 140 of the deposited material 831 therewithin, on an exposed layer surface 11 of an underlying layer 1010 (FIG. 10A).

In some non-limiting examples, the lateral pattern 520 of the deposited layer 130 may be specified by depositing a patterning coating 110, comprising a patterning material 711 (FIG. 7), including without limitation, an NIC, in a pattern, including without limitation, by interposing a shadow mask 715 therebetween during the deposition process, across the (fragment of the) signal-exchanging part 303 prior to the deposition of the deposited material 831.

In some non-limiting examples, when the patterning coating 110 comprises a NIC, the pattern of the patterning material 711 may substantially correspond to at least one boundary 523 of (frontplane) second layer aperture(s) 522, such that, when the deposited material 831 is thereafter deposited, the deposited material 831 tends not to be deposited where the patterning coating 110 has been deposited, and tends to be accumulate to form the deposited layer 130 in areas that are substantially devoid of the patterning coating 110.

In some non-limiting examples, the pattern of the deposited layer 130 may be specified by depositing the deposited material 831 through apertures of a shadow mask 715 in a pattern that is substantially the reverse of the lateral pattern of the at least one (frontplane) second layer aperture(s) 522.

In some non-limiting examples, the lateral pattern of the deposited layer 130 may be specified by depositing the deposited material 831 and thereafter removing deposited material in the lateral pattern 520 corresponding to the at least one (frontplane) second layer aperture(s) 522, including without limitation, by laser ablation.

In at least some applications, there may be scenarios calling for the lateral pattern 520 of at least one of: the location, shape, spacing, size, orientation, and position, of the at least one boundary 523 of (frontplane) second layer aperture(s) 522 to be substantially regular, including without limitation, repeating, for ease of at least one of: design, and manufacture, including without limitation, when the lateral pattern 520 of at least one of: the location, shape, spacing, size, orientation, and position, of the at least one boundary 523, of (frontplane) second layer aperture(s) 522, are formed using a shadow mask 715.

Those having ordinary skill in the relevant art will appreciate that defining at least one boundary 513, 523 of apertures 512, 522 defining corresponding transmissive region(s) 212 in a lateral pattern, in the lateral aspect, across the signal-exchanging part 303, solely by the lateral pattern 520 of at least one of: the location, shape, spacing, size, orientation, and position, of the at least one (frontplane) second layer aperture(s) 522, may cause an aim of having such a pattern that is substantially regular, including without limitation, repetitive, for purposes of ease of at least one of: design, and manufacture, to be in conflict with an aim of defining at least one boundary 513, 523 of aperture(s) 512, 522 defining corresponding transmissive region(s) 212 in a lateral pattern, in the lateral aspect, across the signal-exchanging part 303, to be other than substantially regular, including without limitation, repetitive, for purposes of minimizing interference with the capture of at least one of: an image, and an EM radiation pattern, passing through the plurality of transmissive regions 212 across the signal-exchanging part 303.

As shown in the complementary views of FIGS. 5A-5B, and of FIGS. 5C-5D, those having ordinary skill in the relevant art will appreciate that at least one boundary 513, 523 of aperture(s) 512, 522 defining corresponding transmissive region(s) 212 in a lateral pattern, in the lateral aspect, across the signal-exchanging part 303, may be defined by a geometric intersection, of at least one first layer aperture boundary 513, of first layer aperture(s) 512, in a first lateral pattern 510, in the lateral aspect, of a first defining layer 511, and of at least one overlapping second layer aperture boundary 523, of second layer aperture(s) 522, in a second lateral pattern 520, in the lateral aspect, of a second defining layer 521, wherein each of: the first defining layer 511, and the second defining layer 512, substantially reduce transmission of EM radiation therethrough.

FIG. 5A is a view of a fragment of the signal exchanging part 303 shown in plan. FIG. 5B is a complementary cross-sectional view of various layers of the device 200 across the fragment, including a first defining layer 511 and a second defining layer 521.

In FIG. 5B, at least one layer, including without limitation, at least one layer in the backplane 202, including without limitation: the buffer layer 217, the gate insulating layer 218, the interlayer insulating layer 219, and the TFT insulating layer 207, are shown disposed on a first side of the substrate 10, including without limitation, an exposed layer surface 11 of the base substrate 215. In some non-limiting examples, at least one layer in the frontplane 201, including without limitation: a PDL 209, and at least one semiconducting layer 230 may be disposed on an exposed layer surface 11 of such layer(s) in the backplane 202.

As shown in FIGS. 5A and 5C, the first defining layer 511 may have at least one first layer aperture 512 therein, defined by a corresponding first layer aperture boundary 513 and the second defining layer 521 may have at least one second layer aperture 522 therein, defined by a corresponding second layer aperture boundary 523. The geometric intersection of the first layer boundary 513 overlapping with the second layer aperture boundary 523 may result in an aperture boundary 503 defining an aperture 422, including without limitation, as shown in FIG. 5C. The lateral pattern of at least one of: the location, shape, spacing, size, orientation, and position, of the at least one boundary 503 of aperture(s)

422 define corresponding transmissive regions 212, in the lateral aspect, across the signal-exchanging part 303.

In some non-limiting examples, a shape of the first layer aperture boundary 513 may be different from a shape of the second layer aperture boundary 523. In some non-limiting examples, as shown, the first layer aperture boundary 513 may exhibit a substantially circular shape. In some non-limiting examples, as shown, the second layer aperture boundary 523 may exhibit a substantially rectangular shape.

In some non-limiting examples, as shown in FIG. 5A, the first layer boundary 513 may lie entirely within the second layer boundary 523, such that the at least one boundary 503 of aperture(s) 422 may be defined solely by the first layer boundary 513.

In some non-limiting examples, although not shown, the second layer boundary 523 may lie entirely within the first layer boundary 513, such that the at least one boundary 503 of aperture(s) 422 may be defined solely by the second layer boundary 523.

In some non-limiting examples, as shown in FIG. 5B, the first defining layer 511 may comprise a layer in the backplane 202. Where the first defining layer 511 is disposed within the backplane 202, the at least one first layer aperture 512 may be a backplane aperture.

In some non-limiting examples, as shown in FIG. 5D, the first defining layer 511 may comprise a layer in the frontplane 201. Where the first defining layer 511 is disposed within the frontplane 201, the at least one first layer aperture 512 may be a frontplane aperture.

In some non-limiting examples, as shown in FIG. 5B, the first defining layer 511 may comprise an opaque coating, including without limitation, disposed on the first side of the substrate 10.

Those having ordinary skill in the relevant art will appreciate that, although not shown, in some non-limiting examples, the opaque coating may be disposed on the exposed layer surface 11 of other layers, including without limitation, at least one of: the base substrate 215 (corresponding to the first side of the substrate 10), at least one layer in the backplane 202, including without limitation, at least one of: at least one TFT structure 206, the TFT insulating layer 207, the buffer layer 217, the gate insulating layer 218, the interlayer insulating layer 219, and the first electrode 220.

In some non-limiting examples, although not shown, the first defining layer 511 may comprise an opaque coating disposed on a second side of the substrate 10, which may be opposite to the first side of the substrate 10 corresponding to the base substrate 215.

In some non-limiting examples, as shown in FIG. 5D, the first defining layer 511 may comprise an opaque coating, including without limitation, disposed on an exposed layer surface 11 of the PDL 209.

Those having ordinary skill in the relevant art will appreciate that, although not shown, in some non-limiting examples, the opaque coating may be disposed on the exposed layer surface 11 of other layers of the frontplane 201, including without limitation, at least one of: the first electrode 220, the second electrode 240, and at least one semiconducting layer 230 therebetween.

In some non-limiting examples, although not shown, the first defining layer 511 may comprise an existing layer of the frontplane 201, including without limitation, at least one of: the first electrode 220, the second electrode 240, and at least one semiconducting layer 230 therebetween, and the PDL 209.

In some non-limiting examples, although not shown, the at least one first layer aperture boundary 513 of first layer aperture(s) 512 may be formed in existing (backplane) first defining layer(s) 511 of the backplane 202 and without depositing an opaque coating, including without limitation, by relocating, including without limitation, removing, elements of such (backplane) first defining layer(s) 511 that substantially reduce transmission of EM radiation therethrough in at least a wavelength range of the EM spectrum, including without limitation, at least one of: the visible spectrum, the UV spectrum, the IR spectrum, the NIR spectrum, and a part thereof, including without limitation, elements that are at least one of: opaque, and reflective, including without limitation, at least one TFT structure 206, and at least one conductive metal line coupled with the at least one TFT structure 206 (including without limitation, data and scan lines).

In some non-limiting examples, the second defining layer 521 may comprise a layer in the frontplane 201. Where the second defining layer 521 is disposed within the frontplane 201, the second layer aperture 522 may be a frontplane aperture.

In some non-limiting examples, although not shown, the second defining layer 521 may comprise a layer in the backplane 202. Where the second defining layer 521 is disposed within the backplane 202, the second layer aperture 522 may be a backplane aperture.

In some non-limiting examples, as shown in FIG. 5B, the second defining layer 521 may comprise a deposited layer 130, of which the second electrode 240 may be comprised.

In some non-limiting examples, as shown in FIG. 5D, the second defining layer 521 may comprise the second electrode 240.

In some non-limiting examples, where the first defining layer 511 is disposed within the backplane 202, other mechanisms for patterning the at least one (backplane) first aperture boundary 513, of (backplane) first aperture(s) 512, of the (backplane) first defining layer 511, may be employed, including without limitation, photolithography, chemical etching, and laser ablation.

In some non-limiting examples, because such other mechanism(s) as applied to the (backplane) first defining layer 511, in some non-limiting examples, may not employ a shadow mask 715, the scenarios calling for having a pattern of at least one of: the location, shape, spacing, size, orientation, and position, of the at least one second layer aperture boundary 523 of frontplane second layer aperture(s) 522, that is substantially regular, including without limitation, repetitive, for purposes of ease of at least one of: design, and manufacture, may not have application with respect to the at least one first layer aperture boundary 513 of first layer aperture(s) 512 in the first defining layer 511 when the first defining layer 511 is disposed in the backplane 202.

Thus, in some non-limiting examples, at least one of: the location, shape, spacing, size, orientation, and position, of the at least one (background) first pattern aperture boundary 513 of (background) first pattern aperture(s) 512 in the first defining layer 511 when deposited in the backplane 202, may be other than substantially regular, including without limitation, repetitive, such that the at least one aperture boundary 503 of aperture(s) 422 defining corresponding transmissive region(s) 212 in a lateral pattern, in the lateral aspect, across the signal-exchanging part 303, comprising the geometric intersection of: a corresponding (backplane) first layer aperture 512, overlaid with a corresponding and overlapping (frontplane) second layer aperture 522, may also be other than substantially regular, including without limitation, repetitive, such that the aim of defining at least one of: the location, shape, spacing, size, orientation, and position, of at least one aperture boundary 503, of aperture (s) 422, of a lateral pattern, in the lateral aspect, of the transmissive regions 212 in the signal-exchanging part 303, to be other than substantially regular, including without limitation, repetitive, for purposes of minimizing interference with the capture of at least one of: an image and an EM radiation pattern passing therethrough, may no longer be in conflict with the aim of having a pattern of at least one of: the location, shape, spacing, size, orientation, and position, of the at least one frontplane (second layer) aperture boundary 523 of frontplane (second layer) aperture(s) 522, of the second defining layer 521 that is substantially regular, including without limitation, repetitive, for purposes of ease of at least one of: design, and manufacture.

Figure 6A:
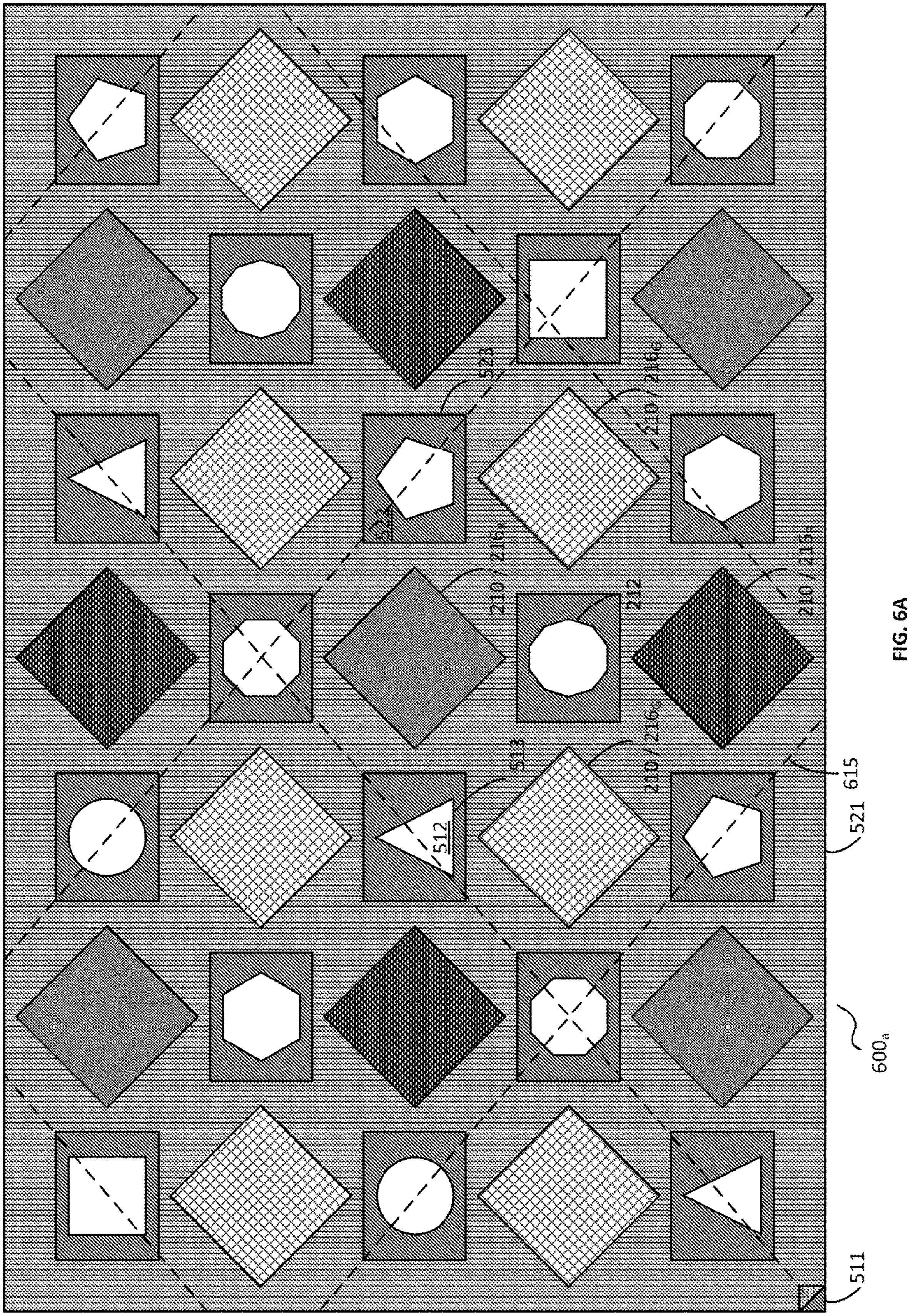
FIG. 6A is a schematic diagram illustrating an example view in plan of a fragment of a signal-exchanging part of a display panel, showing a plurality of (sub-) pixels interspersed with a plurality of transmissive regions, whose boundary is defined by an intersection of a boundary of differently-shaped (backplane) first layer aperture(s) of a first defining layer with a boundary of corresponding (frontplane) second layer aperture(s) of a second defining layer according to an example in the present disclosure.

Turning now to FIG. 6A, there is shown a non-limiting example of a first lateral pattern $\mathbf{600}_a$, in the lateral aspect, of at least one transmissive region 212 across the signal-exchanging part 303, defined by a geometric intersection of: a first layer lateral pattern 510 of a first defining layer 511, and an overlapping second layer lateral pattern 520 of a second defining layer 521.

In some non-limiting examples, the at least one transmissive region 212 may be disposed within the emissive regions 210, in the lateral aspect, of a plurality (including without limitation, four) sub-pixels 216 that may collectively define a pixel 615 (shown in dashed outline).

In some non-limiting examples, as shown, the first layer lateral pattern 510 may extend across at least a part of the signal-exchanging part 303 and may comprise at least one first layer aperture 512, each defined by a corresponding first layer aperture boundary 513.

In some non-limiting examples, as shown, the second layer lateral pattern 520 may extend across at least a part of the signal-exchanging part 303 and may comprise at least one second layer aperture 522, each defined by a corresponding second layer aperture boundary 523.

In some non-limiting examples, as shown, the at least one first layer aperture boundary 513 of first layer aperture(s) 512 may overlap with a corresponding at least one second layer aperture boundary 523 of second layer aperture(s) 522, such that a geometric intersection thereof may define a corresponding at least one aperture boundary 503 of aperture(s) 422 that define at least one corresponding transmissive region 212 in the signal-exchanging part 303.

In some non-limiting examples, the (frontplane) second layer lateral pattern 520 may exhibit a substantially regular, including without limitation, repetitive, pattern of at least one of: the location, shape, spacing, size, orientation, and position, of the at least one (frontplane) second layer aperture boundary 523 of second layer aperture(s) 522. In some non-limiting examples, the (frontplane) second layer lateral pattern may exhibit at least one of: a substantially common shape of the at least one (frontplane) second layer aperture boundary 523 of (frontplane) second layer aperture(s) 522, including without limitation, as shown, a substantially rectangular shape, a substantially common spacing between (frontplane) second layer aperture(s) 522, and a substantially common size of the (frontplane) second layer aperture(s) 522.

In some non-limiting examples, as shown, the (backplane) first layer lateral pattern may exhibit variability, such that it exhibits other than a substantially regular pattern of at least one of: the location, shape, spacing, size, orientation, and position, of the at least one (backplane) first layer aperture boundary 513 of first layer aperture(s) 512.

In some non-limiting examples, as shown, a shape of that at least one (backplane) first layer aperture boundary 513 of (backplane) first layer aperture(s) 512 may exhibit variability. In some non-limiting examples, the at least one (backplane) first layer aperture boundary 513 of (backplane) first layer aperture(s) 512 may exhibit a shape that is at least one of substantially: elliptical, including without limitation, circular, polygonal, including without limitation, triangular, quadrilateral (including without limitation, square, rectangular, and diamond-shaped), pentagonal, hexagonal, and octagonal. In some non-limiting examples, although not shown, such shape may exhibit a substantially irregular configuration, in that a plurality of at least one of: the axes, interior angles, and sides, have different values.

In some non-limiting examples, a location of the first layer aperture boundary 513, including without limitation, as defined by a centroid thereof, may be different from a location of the second layer aperture boundary 523, including without limitation, as defined by a centroid thereof.

Figure 6B:
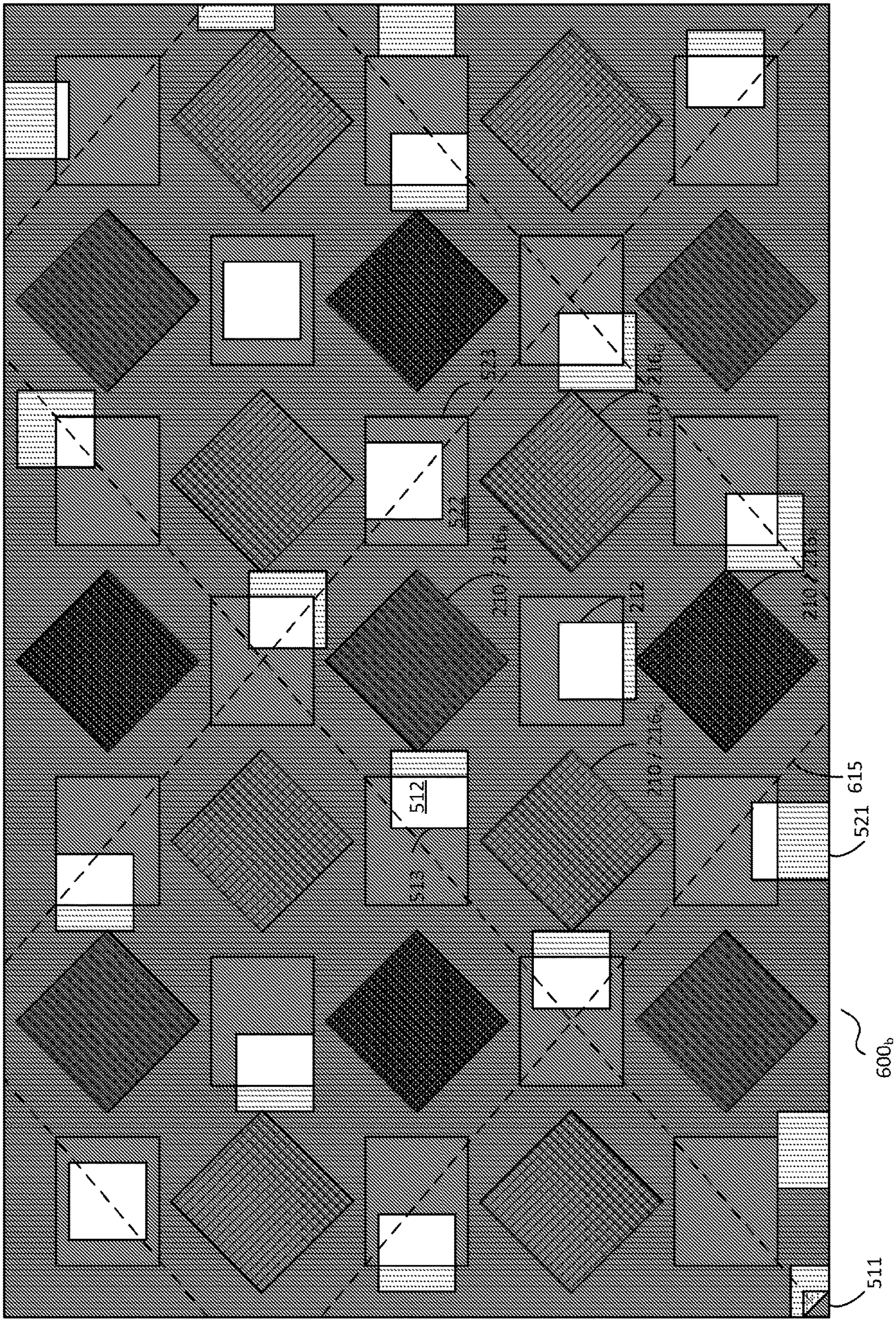
FIG. 6B is a schematic diagram illustrating an example view in plan of a fragment of a signal-exchanging part of a display panel, showing a plurality of (sub-) pixels interspersed with a plurality of transmissive regions, whose boundary is defined by an intersection of a boundary of differently-spaced (backplane) first layer aperture(s) of a first defining layer with a boundary of corresponding (frontplane) second layer aperture(s) of a second defining layer according to an example in the present disclosure.

Turning now to FIG. 6B, there is shown a non-limiting example of a second lateral pattern $\mathbf{600}_b$, in the lateral aspect, of transmissive regions 212 across the signal-exchanging part 303, defined by a geometric intersection of: a first layer lateral pattern 510 of a first defining layer 511, and an overlapping second layer lateral pattern 520 of a second defining layer 521.

In some non-limiting examples, the at least one transmissive region 212 may be disposed within the emissive regions 210, in the lateral aspect, of a plurality (including without limitation, four) sub-pixels 216 that may collectively define a pixel 615 (shown in dashed outline).

In some non-limiting examples, as shown, the first layer lateral pattern 510 may extend across at least a part of the signal-exchanging part 303 and may comprise at least one first layer aperture 512, each defined by a corresponding first layer aperture boundary 513.

In some non-limiting examples, as shown, the second layer lateral pattern 520 may extend across at least a part of the signal-exchanging part 303 and may comprise at least one second layer aperture 522, each defined by a corresponding second layer aperture boundary 523.

In some non-limiting examples, as shown, the at least one first layer aperture boundary 513 of first layer aperture(s) 512 may overlap with a corresponding at least one second layer aperture boundary 523 of second layer aperture(s) 522, such that a geometric intersection thereof may define a corresponding at least one aperture boundary 503 of aperture(s) 422 that define at least one corresponding transmissive region 212 in the signal-exchanging part 303.

In some non-limiting examples, the (frontplane) second layer lateral pattern 520 may exhibit a substantially regular, including without limitation, repetitive, pattern of at least one of: the location, shape, spacing, size, orientation, and position, of the at least one (frontplane) second layer aperture boundary 523 of second layer aperture(s) 522. In some non-limiting examples, the (frontplane) second layer lateral pattern may exhibit at least one of: a substantially common shape of the at least one (frontplane) second layer aperture boundary 523 of (frontplane) second layer aperture(s) 522, including without limitation, as shown, a substantially rectangular shape, a substantially common spacing between (frontplane) second layer aperture(s) 522, and a substantially common size of the (frontplane) second layer aperture(s) 522.

In some non-limiting examples, as shown, the (backplane) first layer lateral pattern 510 may exhibit variability, such that it exhibits other than a substantially regular pattern of at least one of: the location, shape, spacing, size, orientation, and position, of the at least one (backplane) first layer aperture boundary 513 of first layer aperture(s) 512.

Figure 6C:
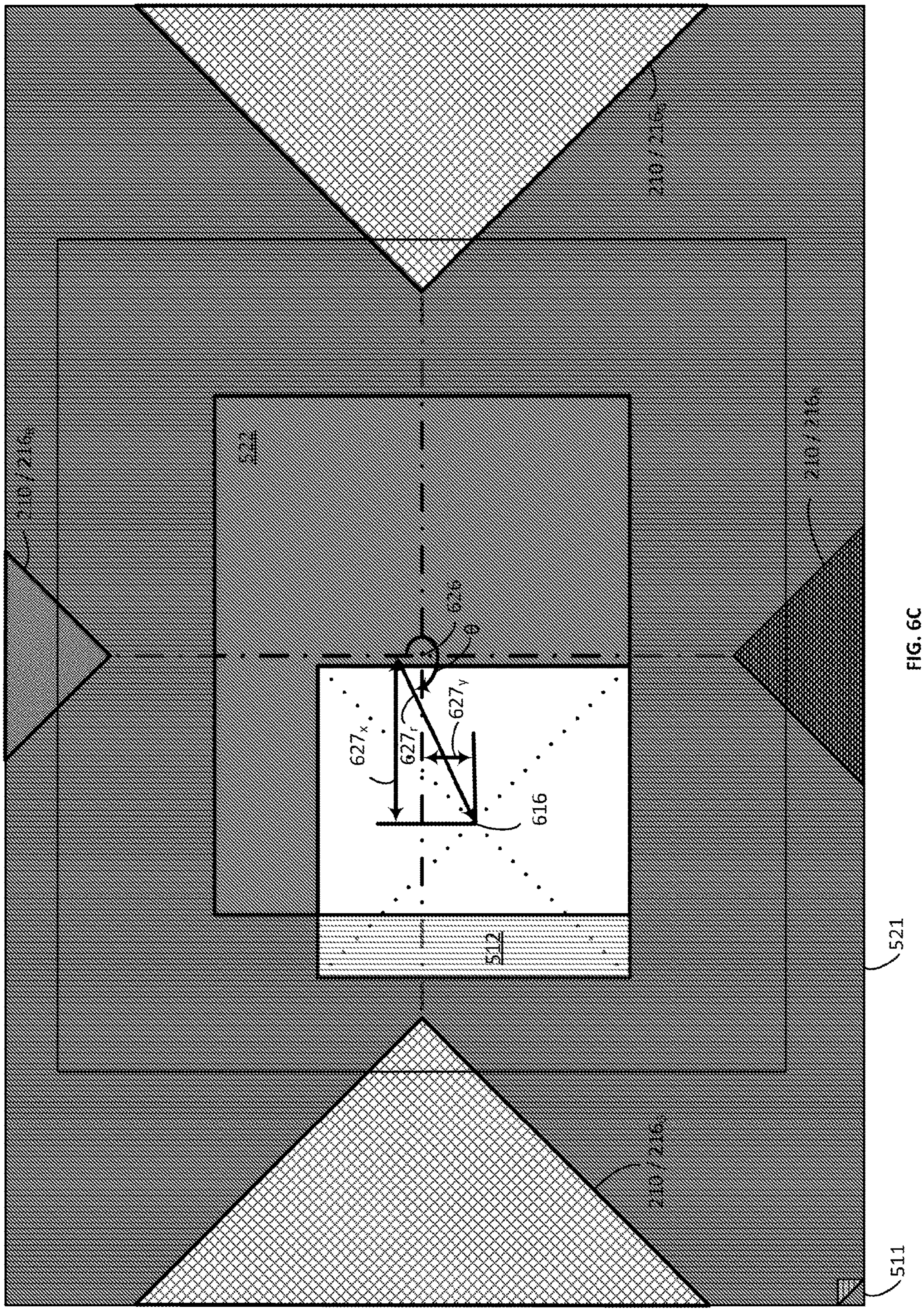
FIG. 6C is a schematic diagram illustrating an example view in plan of a fragment of a signal-exchanging part of a display panel, showing alternative mechanisms of measuring variability in spacing of a boundary of (backplane) first layer aperture(s) of a first defining layer, which, by intersection with corresponding (frontplane) second layer aperture(s) of a second defining layer, define transmissive regions, according to an example in the present disclosure.

In some non-limiting examples, as shown, a spacing between (backplane) first layer apertures 512 may exhibit variability. In some non-limiting examples, a measure of the variability may be defined by a difference 627 between a centroid 616 of the at least one (backplane) first layer aperture(s) 512 and a centroid 626 of at least one of: the at least one (frontplane) second layer aperture(s) 522, and the pixel 615 surrounding it. As shown in FIG. 6C, in which an enlarged view of a non-limiting example transmissive region 212 comprising, in the lateral aspect, an intersection of at least one (backplane) first layer aperture 512 and a respective at least one (frontplane) second layer aperture 522 located intermediate a plurality (including without limitation, four) sub-pixels 216 that may collectively define a pixel 615 (shown in dashed outline), such difference may be defined in terms of at least one difference component 627, at least one of which may be varied. In some non-limiting examples, as shown, such difference may be defined in terms of a radial difference 627$_r$ and an angular displacement θ.

Figure 6D:
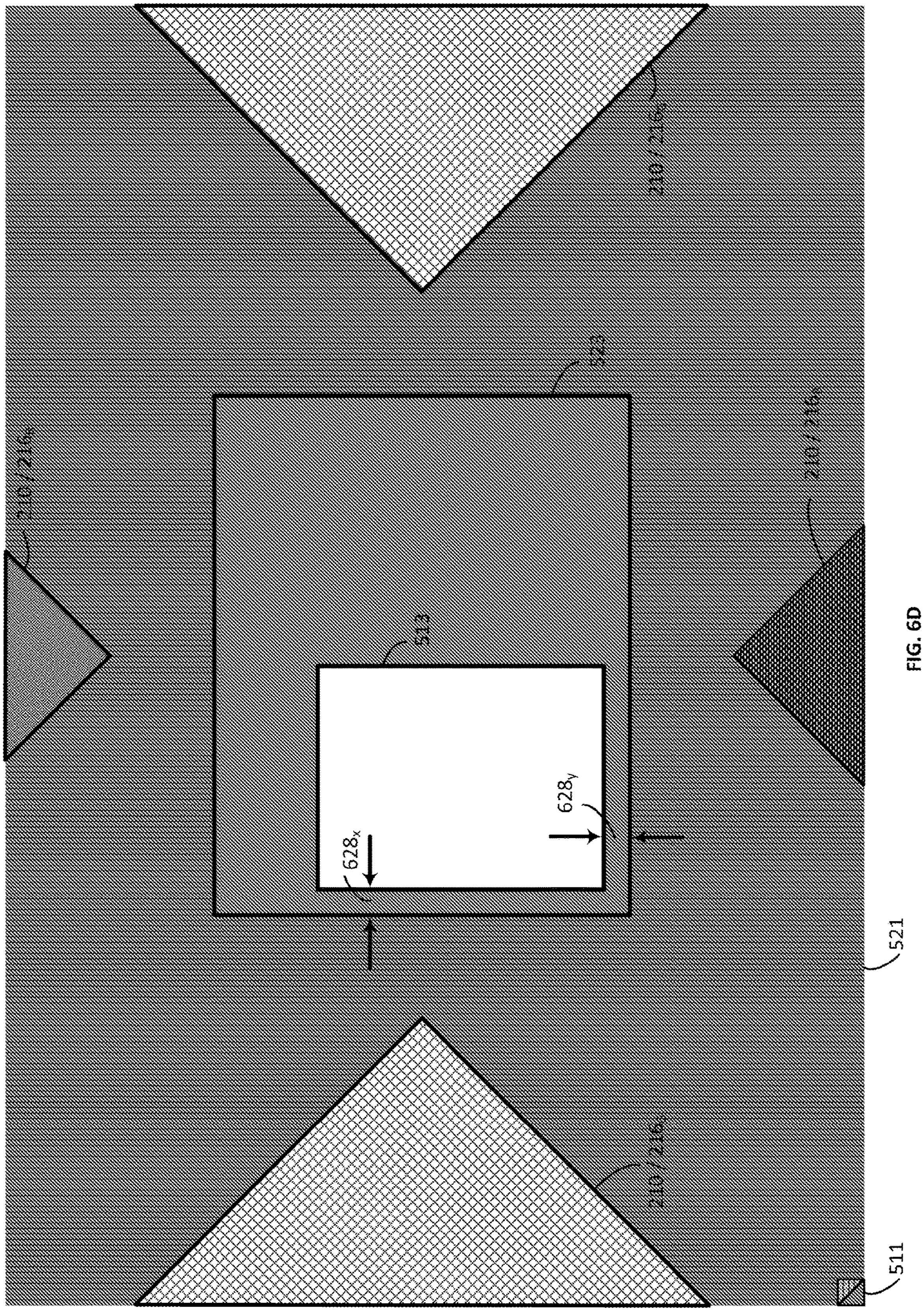
FIG. 6D is a schematic diagram illustrating an example view in plan of a fragment of a signal-exchanging part of a display panel, showing a minimum separation between a boundary of (backplane) first layer aperture(s) of a first defining layer, and a corresponding boundary of (frontplane) second layer aperture(s) of second defining layer, the intersection of which define transmissive regions, according to an example in the present disclosure.

In some non-limiting examples, as shown in FIG. 6D, there may be scenarios calling for at least one (backplane) first layer aperture boundary 513 to lie entirely within a respective (frontplane) second layer aperture boundary 523.

In some non-limiting examples, as shown, there may be scenarios calling for a distance between (a part of) at least one (backplane) first layer aperture boundary 513 and a respective (part of) at least one (frontplane) second layer aperture boundary 523 that may be substantially parallel thereto to be at least a minimum separation 628, including without limitation, components thereof, including without limitation, one of at least about: 12, 10, 8, 6, 4, 2, and 1, μm.

In some non-limiting examples, such scenarios may facilitate achieving a higher yield of devices 200 manufactured. By way of non-limiting example, incorporating the minimum separation 628 into the design of devices 200 may permit for a greater alignment tolerance of a shadow mask 715 which may be used during manufacturing.

In some non-limiting examples, a size of the first layer aperture boundary 513, including without limitation, as defined by a length of a major axis thereof, may be different from a size of the second layer aperture boundary 523, including without limitation, as defined by a length of a major axis thereof.

Figure 6E:
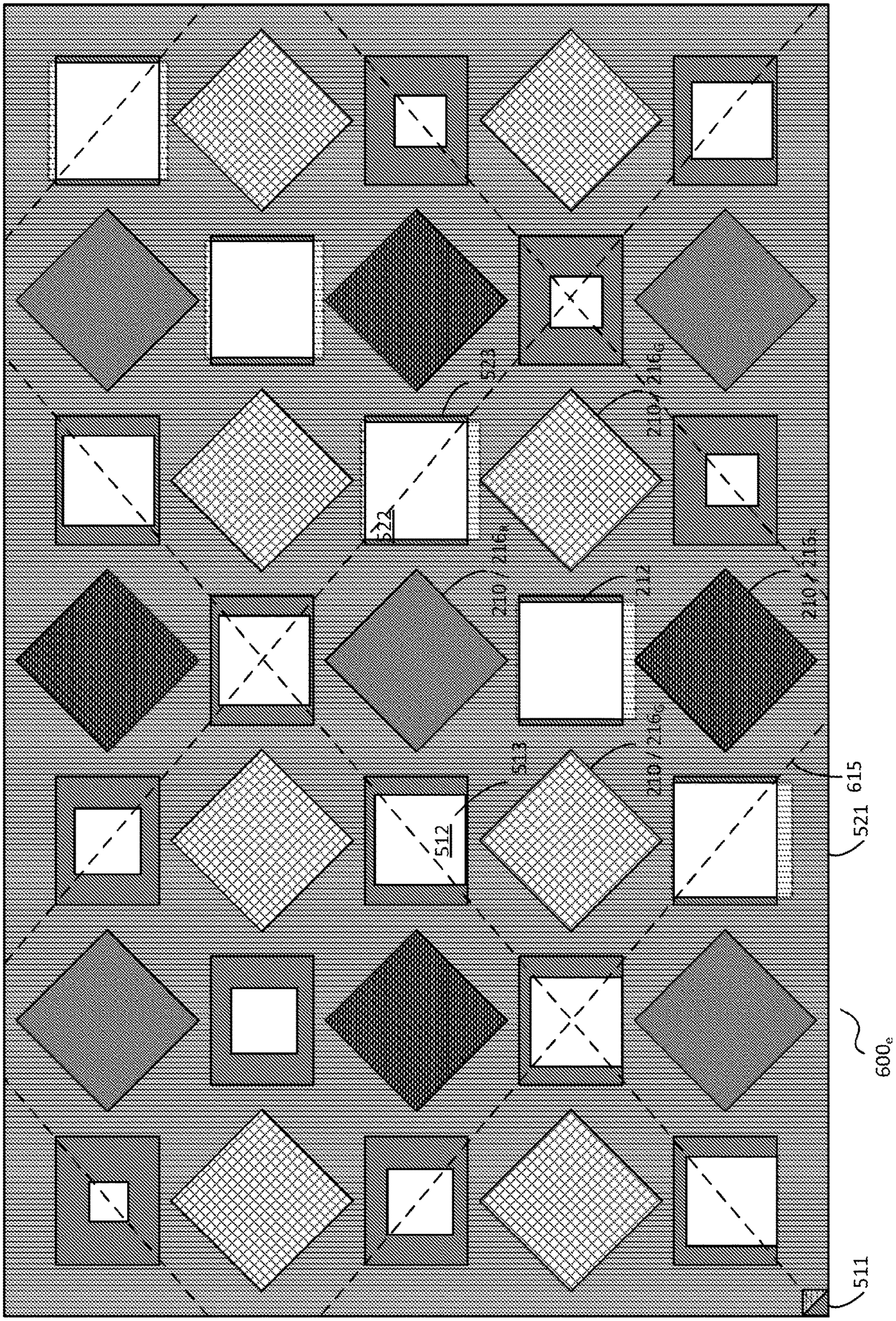
FIG. 6E is a schematic diagram illustrating an example view in plan of a fragment of a signal-exchanging part of a display panel, showing a plurality of (sub-) pixels interspersed with a plurality of transmissive regions, whose boundary is defined by an intersection of a boundary of differently-sized (backplane) first layer aperture(s) of a first defining layer with a boundary of corresponding (frontplane) second layer aperture(s) of a second defining layer according to an example in the present disclosure.

Turning now to FIG. 6E, there is shown a non-limiting example of a third lateral pattern 600$_e$, in the lateral aspect, of at least one transmissive region 212 across the signal-exchanging part 303, defined by a geometric intersection of: a first layer lateral pattern 510 of a first defining layer 511, and an overlapping second layer lateral pattern 520 of a second defining layer 521.

In some non-limiting examples, the at least one transmissive region 212 may be disposed within the emissive regions 210, in the lateral aspect, of a plurality (including without limitation, four) sub-pixels 216 that may collectively define a pixel 615 (shown in dashed outline).

In some non-limiting examples, as shown, the first layer lateral pattern 510 may extend across at least a part of the signal-exchanging part 303 and may comprise at least one first layer aperture 512, each defined by a corresponding first layer aperture boundary 513.

In some non-limiting examples, as shown, the second layer lateral pattern 520 may extend across at least a part of the signal-exchanging part 303 and may comprise at least one second layer aperture 522, each defined by a corresponding second layer aperture boundary 523.

In some non-limiting examples, as shown, the at least one first layer aperture boundary 513 of first layer aperture(s) 512 may overlap with a corresponding at least one second layer aperture boundary 523 of second layer aperture(s) 522, such that a geometric intersection thereof may define a corresponding at least one aperture boundary 503 of aperture(s) 422 that define at least one corresponding transmissive region 212 in the signal-exchanging part 303.

In some non-limiting examples, the (frontplane) second layer lateral pattern 520 may exhibit a substantially regular, including without limitation, repetitive, pattern of at least one of: the location, shape, spacing, size, orientation, and position, of the at least one (frontplane) second layer aperture boundary 523 of second layer aperture(s) 522. In some non-limiting examples, the (frontplane) second layer lateral pattern may exhibit at least one of: a substantially common shape of the at least one (frontplane) second layer aperture boundary 523 of (frontplane) second layer aperture(s) 522, including without limitation, as shown, a substantially rectangular shape, a substantially common spacing between (frontplane) second layer aperture(s) 522, and a substantially common size of the (frontplane) second layer aperture(s) 522.

In some non-limiting examples, as shown, the (backplane) first layer lateral pattern may exhibit variability, such that it exhibits other than a substantially regular pattern of at least one of: the location, shape, spacing, size, orientation, and position, of the at least one (backplane) first layer aperture boundary 513 of first layer aperture(s) 512.

In some non-limiting examples, as shown, a size of the (backplane) first layer apertures 512 may exhibit variability. In some non-limiting examples, a measure of the variability may be defined by varying a length, including without limitation, of at least one of: a major axis, a minor axis, a side, and a diameter, of the (backplane) first layer aperture(s) 512.

Figure 6F:
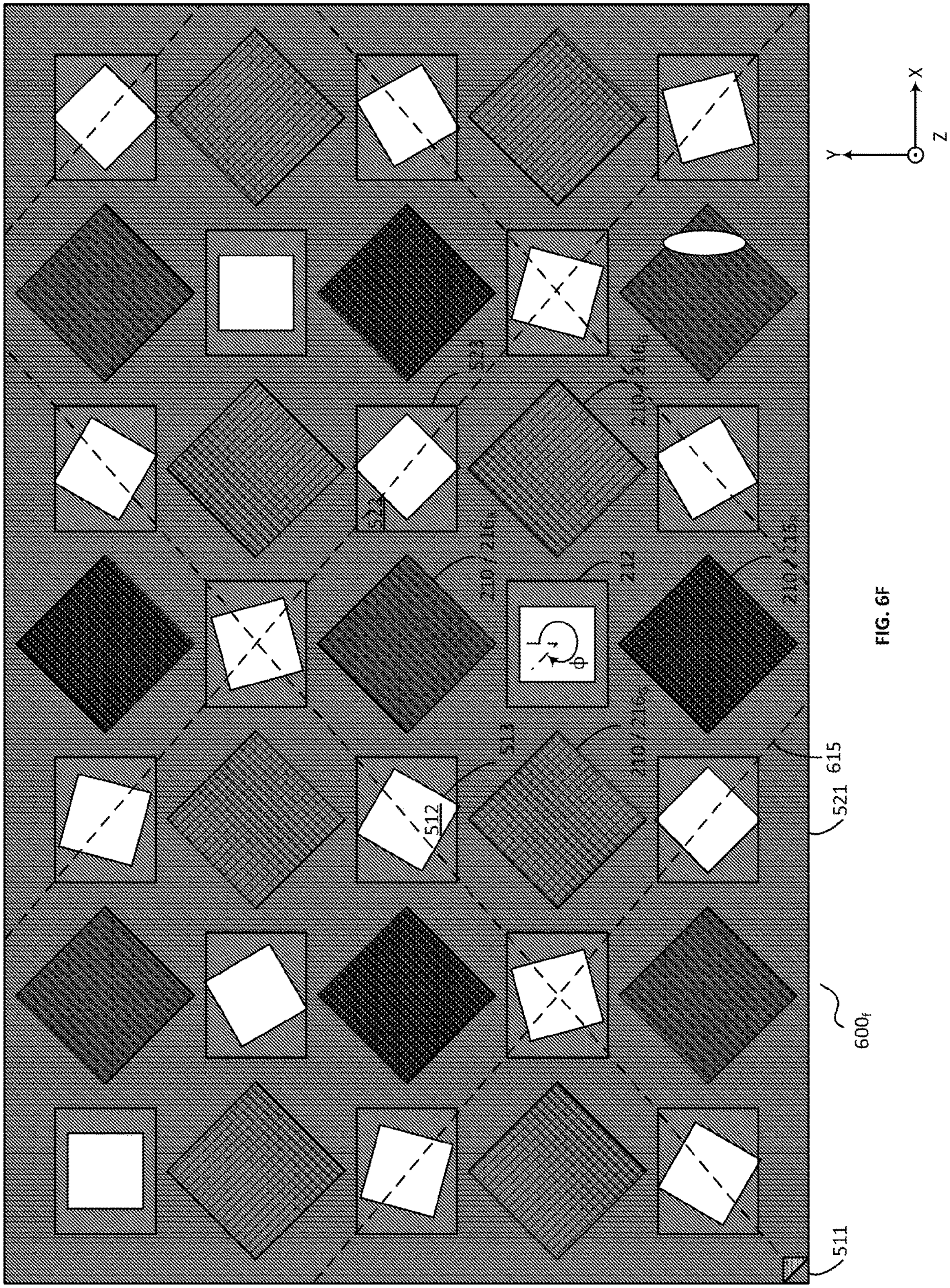
FIG. 6F is a schematic diagram illustrating an example view in plan of a fragment of a signal-exchanging part of a display panel, showing a plurality of (sub-) pixels interspersed with a plurality of transmissive regions, whose boundary is define by an intersection of a boundary of differently-oriented (backplane) first layer aperture(s) of a first defining layer with a boundary of corresponding (frontplane) second layer aperture(s) of a second defining layer according to an example in the present disclosure.

Turning now to FIG. 6F, there is shown a non-limiting example of a fourth lateral pattern 600*f*, in the lateral aspect, of transmissive region 212 across the signal-exchanging part 303, defined by a geometric intersection of: a first layer lateral pattern 510 of a first defining layer 511, and an overlapping second layer lateral pattern 520 of a second defining layer 521.

In some non-limiting examples, the at least one transmissive region 212 may be disposed within the emissive regions 210, in the lateral aspect, of a plurality (including without limitation, four) sub-pixels 216 that may collectively define a pixel 615 (shown in dashed outline).

In some non-limiting examples, as shown, the first layer lateral pattern 510 may extend across at least a part of the signal-exchanging part 303 and may comprise at least one first layer aperture 512, each defined by a corresponding first layer aperture boundary 513.

In some non-limiting examples, as shown, the second layer lateral pattern 520 may extend across at least a part of the signal-exchanging part 303 and may comprise at least one second layer aperture 522, each defined by a corresponding second layer aperture boundary 523.

In some non-limiting examples, as shown, the at least one first layer aperture boundary 513 of first layer aperture(s) 512 may overlap with a corresponding at least one second layer aperture boundary 523 of second layer aperture(s) 522, such that an intersection thereof may define a corresponding at least one aperture boundary 503 of aperture(s) 422 that define at least one corresponding transmissive region 212 in the signal-exchanging part 303.

In some non-limiting examples, the (frontplane) second layer lateral pattern 520 may exhibit a substantially regular, including without limitation, repetitive, pattern of at least one of: the location, shape, spacing, size, orientation, and position, of the at least one (frontplane) second layer aperture boundary 523 of second layer aperture(s) 522. In some non-limiting examples, the (frontplane) second layer lateral pattern may exhibit at least one of: a substantially common shape of the at least one (frontplane) second layer aperture boundary 523 of (frontplane) second layer aperture(s) 522, including without limitation, as shown, a substantially rectangular shape, a substantially common spacing between (frontplane) second layer aperture(s) 522, and a substantially common size of the (frontplane) second layer aperture(s) 522.

In some non-limiting examples, as shown, the (backplane) first layer lateral pattern may exhibit variability, such that it exhibits other than a substantially regular pattern of at least one of: the location, shape, spacing, size, orientation, and position, of the at least one (backplane) first layer aperture boundary 513 of (backplane) first layer aperture(s) 512.

In some non-limiting examples, an orientation of the at least one (backplane) first layer aperture(s) 512 may exhibit variability. In some non-limiting examples, a measure of the variability may be defined by an angle φ of one of: a side, and a vertex, of the at least one (backplane) first layer aperture boundary 513 relative to one of: a side of a corresponding at least one (frontplane) second layer aperture boundary 523, a vertex thereof, and one of the lateral axes, including without limitation, one of: the X-axis, and the Y-axis (as shown) of the device 200.

Although, as shown, a single one only of: the location, shape, spacing, size, orientation, and position, including without limitation, a shape (as shown in FIG. 6A), a spacing (as shown in FIG. 6B), a size (as shown in FIG. 6E), and an orientation (as shown in FIG. 6F), of at least one of: the (backplane) first layer aperture(s) 512, and the (backplane) first layer aperture boundary 513 thereof may be varied, those having ordinary skill in the relevant art will appreciate that, in some non-limiting examples, the variability may be increased by varying a plurality of: a shape, a spacing, a size, and an orientation, of at least one of: the (backplane) first layer aperture(s) 512, and the (backplane) first layer aperture boundary 513 thereof.

Although, in some non-limiting examples, the variability of at least one of: the location, shape, spacing, size, orientation, and position, including without limitation, a shape (as shown in FIG. 6A), a spacing (as shown in FIG. 6B), a size (as shown in FIG. 6E), and an orientation (as shown in FIG. 6F), of at least one of: the (backplane) first layer aperture(s) 512, and the (backplane) first layer aperture boundary 513 thereof, may, across at least a part of the first layer lateral pattern 510 may vary in a monotonically varying manner, those having ordinary skill in the relevant art will appreciate that, in some non-limiting examples, the variability may be increased by varying at least one of: a shape, a spacing, a size, and an orientation, of at least one of: the (backplane) first layer aperture(s) 512, and the (backplane) first layer aperture boundary 513 thereof, in other than a monotonically varying manner across at least a part of the first layer lateral pattern 510.

Those having ordinary skill in the relevant art will appreciate that, in some non-limiting examples, other features of at least one of: the location, shape, spacing, size, orientation, and position, of the at least one (backplane) first layer aperture boundary 513 of first layer aperture(s) 512 of the (backplane) first layer lateral pattern 510 may exhibit variability.

Those having ordinary skill in the relevant art will appreciate that, in some non-limiting examples, there may be at least one additional layer that may, to some extent, reduce transmission of EM radiation therethrough in at least a wavelength range of the EM spectrum, including without limitation, at least one of: the visible spectrum, the UV spectrum, the IR spectrum, the NIR spectrum, and a part thereof. In some non-limiting examples, the extent to which such additional layer(s) may reduce transmission of EM radiation therethrough may vary across a range between substantially 0% to substantially 100% and may depend upon its construction, including without limitation, at least one of: its composition, its thickness, and the wavelength range of the EM radiation passing therethrough.

In some non-limiting examples, a shape, in the lateral aspect, of a transmissive region 212, including without limitation, one formed by defined by an intersection of: a first layer lateral pattern 510 of a first defining layer 511, and a second layer lateral pattern 520 of a second defining layer 521, that is shaped to exhibit a distinctive and non-uniform diffraction pattern, may interfere with the capture of at least one of: an image, and an EM radiation pattern represented thereby.

In some non-limiting examples, at least one of: a distinctive, and non-uniform, diffraction pattern may result from a shape, in the lateral aspect, of the at least one transmissive region 212 that may cause distinct, including without limitation, angularly separated, diffraction spikes in the diffraction pattern.

In some non-limiting examples, a first diffraction spike may be distinguished from a second proximate diffraction spike by simple observation, such that a total number of diffraction spikes along a full angular revolution may be counted. However, in some non-limiting examples, especially where the number of diffraction spikes is large, it may be more difficult to identify individual diffraction spikes. In such circumstances, the distortion effect of the resulting diffraction pattern may in fact facilitate mitigation of the interference caused thereby, since the distortion effect tends to be at least one of: blurred, and distributed more evenly. Such at least one of: blurring and more even distribution, of the distortion effect may, in some non-limiting examples, be more amenable to mitigation, including without limitation, by optical post-processing techniques, in order to recover the original image (information) contained therein.

In some non-limiting examples, an ability to facilitate mitigation of the interference caused by the diffraction pattern may increase as the number of diffraction spikes increases.

In some non-limiting examples, a distinctive and non-uniform diffraction pattern may result from a shape of the at least one transmissive region 212, including without limitation, of the at least one (backplane) first layer aperture boundary 513 of first layer aperture(s) 512 of the (backplane) first layer lateral pattern 510, that one that at least one of: increases a length of a pattern boundary, within the diffraction pattern between region(s) of high intensity of EM radiation and region(s) of low intensity of EM radiation as a function of a pattern circumference of the diffraction pattern, and that reduces a ratio of the pattern circumference relative to the length of the pattern boundary thereof.

Without wishing to be bound by any specific theory, it may be postulated that display panels 400 having closed boundaries of transmissive regions 212 defined by a corresponding transmissive region 212 that are polygonal may exhibit a distinctive and non-uniform diffraction pattern that may adversely impact an ability to facilitate mitigation of interference caused by the diffraction pattern, relative to a display panel 400 having closed boundaries of transmissive regions 212 defined by a corresponding transmissive region 212 that is non-polygonal.

In the present disclosure, the term "polygonal" may refer generally to at least one of: shapes, figures, closed boundaries, and perimeters, formed by a finite number of linear segments and the term "non-polygonal" may refer generally to at least one of: shapes, figures, closed boundaries, and perimeters, that are not polygonal. In some non-limiting examples, a closed boundary formed by a finite number of linear segments and at least one non-linear (curved) segment may be considered non-polygonal.

Without wishing to be bound by a particular theory, it may be postulated that when a closed boundary of an EM radiation transmissive region 212 defined by a corresponding transmissive region 212 comprises at least one non-linear (curved) segment, signals incident thereon and transmitted therethrough may exhibit a less distinctive (more uniform) diffraction pattern that facilitates mitigation of interference caused by the diffraction pattern.

In some non-limiting examples, a display panel 400 having a closed boundary of the EM radiation transmissive regions 212 defined by a corresponding transmissive region 212 that is substantially elliptical, including without limitation, circular, may further facilitate mitigation of interference caused by the diffraction pattern.

In some non-limiting examples, a transmissive region 212 may be defined by a finite plurality of convex rounded segments. In some non-limiting examples, at least some of these segments coincide at a concave notch (peak).

Layered Semiconductor Device

As shown in FIG. 1, the layers of the device 100 may comprise a substrate 10, and a patterning coating 110 disposed on an exposed layer surface 11 of at least a portion of the lateral aspect thereof. In some non-limiting examples, the patterning coating 110 may be limited in its lateral extent to the first portion 101 and a deposited layer 130 may be disposed as a closed coating 140 on an exposed layer surface 11 of the device 100 in a second portion 102 of its lateral aspect.

In some non-limiting examples, at least one particle structure 150 may be disposed as a discontinuous layer 160 on the exposed layer surface 11 of the patterning coating 110. In some non-limiting examples, although not shown, at least one of: the patterning coating 110, the deposited layer 130, and at least one particle structure 150, may be deposited on a layer (underlying layer 1010) other than the substrate 10 including without limitation, an intervening layer between the substrate 10 and at least one of: the patterning coating 110, deposited layer 130, and the at least one particle structure 150. In some non-limiting examples, the underlying layer 1010 may comprise at least one of: an orientation layer, and an organic supporting layer.

In some non-limiting examples, at least one of: the patterning coating 110, the deposited layer 130, and the at least one particle structure 150, may be covered by at least one overlying layer 170.

In some non-limiting examples, such overlying layer 170 may comprise at least one of: an encapsulation layer and an optical coating. In some non-limiting examples, an encapsulation layer may comprise at least one of: a glass cap, a barrier film, a barrier adhesive, a barrier coating, an encapsulation layer, and a thin film encapsulation (TFE) layer, provided to encapsulate the device 100. In some non-limiting examples, an optical coating may comprise at least one of: an optical, and structural, coating, and at least one component thereof, including without limitation, a polarizer, a color filter, an anti-reflection coating, an anti-glare coating, cover glass, and an optically clear adhesive (OCA).

In some non-limiting examples, at least one of: a substantially thin patterning coating 110 in the first portion 101, and a deposited layer 130 in the second portion 102, may provide a substantially planar surface on which the overlying layer 170 may be deposited. In some non-limiting examples, providing such a substantially planar surface for application of such overlying layer 170 may increase adhesion thereof to such surface.

In some non-limiting examples, the optical coating may be used to modulate optical properties of EM radiation being at least one of: transmitted, emitted, and absorbed, by the device 100, including without limitation, plasmon modes. In some non-limiting examples, the optical coating may be used as at least one of: an optical filter, index-matching coating, optical outcoupling coating, scattering layer, diffraction grating, and parts thereof.

In some non-limiting examples, the optical coating may be used to modulate at least one optical microcavity effect in the device by, without limitation, tuning at least one of: the total optical path length, and the refractive index thereof. At least one optical property of the device may be affected by modulating at least one optical microcavity effect including without limitation, the output EM radiation, including without limitation, at least one of: an angular dependence of an intensity thereof, and a wavelength shift thereof. In some non-limiting examples, the optical coating may be a non-electrical component, that is, the optical coating may not be configured to at least one of: conduct, and transmit, electrical current during normal device operations.

In some non-limiting examples, the optical coating may be formed of any deposited material 831, and in some non-limiting examples, may employ any mechanism of depositing a deposited layer 130 as described herein.

In some non-limiting examples, various coatings of such devices 200 may be formed by vacuum-based deposition processes.

In some non-limiting examples, the second electrode 240 may extend partially over the patterning coating 110 in a transition region 245.

In some non-limiting examples, at least one particle structure $\mathbf{150}_d$ of a discontinuous layer 160 of a material of which the deposited layer 130 may be comprised (deposited material 831) may extend partially over the patterning coating 110, which may act as a particle structure patterning coating $\mathbf{110}_p$ in the transition region 245. In some non-limiting examples, such discontinuous layer 160 may form at least a part of the second electrode 240.

In some non-limiting examples, the device 200 may be electrically coupled with a power source. When so coupled, the device 200 may emit EM radiation, including without limitation, photons, as described herein.

Substrate

In some non-limiting examples, the substrate 10 may comprise a base substrate 215. In some non-limiting examples, the base substrate 215 may be formed of material suitable for use thereof, including without limitation, at least one of: an inorganic material, including without limitation, at least one of: Si, glass, metal (including without limitation, a metal foil), sapphire, and other inorganic material, and an organic material, including without limitation, a polymer, including without limitation, at least one of: a polyimide, and an Si-based polymer. In some non-limiting examples, the base substrate 215 may be one of: rigid, and flexible. In some non-limiting examples, the substrate 10 may be defined by at least one planar surface. In some non-limiting examples, the substrate 10 may have at least one exposed layer surface 11 that supports the remaining frontplane 201 components of the device 200, including without limitation, at least one of: the first electrode 220, the at least one semiconducting layer 230, and the second electrode 240.

In some non-limiting examples, such surface may be at least one of: an organic surface, and an inorganic surface.

In some non-limiting examples, the substrate 10 may comprise, in addition to the base substrate 215, at least one additional at least one of: organic, and inorganic, layer (not shown nor specifically described herein) supported on an exposed layer surface 11 of the base substrate 215.

In some non-limiting examples, such additional layers may comprise, at least one organic layer, which may at least one of: comprise, replace, and supplement, at least one of the semiconducting layers 230.

In some non-limiting examples, such additional layers may comprise at least one inorganic layer, which may comprise, at least one electrode, which in some non-limiting examples, may at least one of: comprise, replace, and supplement, at least one of: the first electrode 220, and the second electrode 240.

Backplane and TFT Structure(s) Embodied Therein

In some non-limiting examples, such additional layers, including without limitation, at least one of: the buffer layer 217, the gate insulating layer 218, and interlayer insulating layer 219, may comprise a backplane 202. In some non-limiting examples, the backplane 202 may comprise at least one of: power circuitry, and switching elements for driving the device 200, including without limitation, at least one of: at least one electronic TFT structure 206, and at least one component thereof, that may be formed by a photolithography process.

In some non-limiting examples, the backplane 202 of the substrate 10 may comprise at least one electronic, including without limitation, an opto-electronic, component, including without limitation, one of: transistors, resistors, and capacitors, such as which may support the device 200 acting as one of: an active-matrix, and a passive matrix, device. In some non-limiting examples, such structures may be a thin-film transistor (TFT) structure 206.

In some non-limiting examples, TFT structures 206 may comprise one of: top-gate, bottom-gate, n-type and p-type TFT structures 206. In some non-limiting examples, the TFT structure 206 may incorporate one of: amorphous Si (a-Si), indium gallium zinc oxide (IGZO), and low-temperature polycrystalline Si (LTPS).

First Electrode

The first electrode 220 may be deposited over the substrate 10. In some non-limiting examples, the first electrode 220 may be electrically coupled with at least one of: a terminal of the power source, and ground. In some non-limiting examples, the first electrode 220 may be so coupled through at least one driving circuit which in some non-limiting examples, may incorporate at least one TFT structure 206 in the backplane 202 of the substrate 10.

In some non-limiting examples, the first electrode 220 may comprise one of: an anode, and cathode. In some non-limiting examples, the first electrode 220 may be an anode.

In some non-limiting examples, the first electrode 220 may be formed by depositing at least one thin conductive film, over (a part of) the substrate 10. In some non-limiting examples, there may be a plurality of first electrodes 220, disposed in a spatial arrangement over a lateral aspect of the substrate 10. In some non-limiting examples, at least one of such at least one first electrodes 220 may be deposited over (a part of) a TFT insulating layer 207 disposed in a lateral aspect in a spatial arrangement. If so, in some non-limiting examples, at least one of such at least one first electrodes 220 may extend through an opening of the corresponding TFT insulating layer 207 to be electrically coupled with an electrode of the TFT structures 206 in the backplane 202.

In some non-limiting examples, at least one of: the at least one first electrode 220, and at least one thin film thereof, may comprise various materials, including without limitation, at least one metallic material, including without limitation, at least one of: magnesium (Mg), aluminum (Al), calcium (Ca), zinc (Zn), silver (Ag), cadmium (Cd), barium (Ba), and ytterbium (Yb), including without limitation, alloys comprising any of such materials, at least one metal oxide, including without limitation, a TCO, including without limitation, ternary compositions such as, without limitation, at least one of: FTO, IZO, and ITO, in varying proportions, including without limitation, combinations of any plurality thereof in at least one layer, any at least one of which may be, without limitation, a thin film.

Second Electrode

The second electrode 240 may be deposited over the at least one semiconducting layer 230. In some non-limiting examples, the second electrode 240 may be electrically coupled with at least one of: a terminal of the power source, and ground. In some non-limiting examples, the second electrode 240 may be so coupled through at least one driving circuit, which in some non-limiting examples, may incorporate at least one TFT structure 206 in the backplane 202 of the substrate 10.

In some non-limiting examples, the second electrode 240 may comprise one of: an anode, and a cathode. In some non-limiting examples, the second electrode 240 may be a cathode.

In some non-limiting examples, the second electrode 240 may be formed by depositing a deposited layer 130, in some non-limiting examples, as at least one thin film, over (a part of) the at least one semiconducting layer 230. In some non-limiting examples, there may be a plurality of second electrodes 240, disposed in a spatial arrangement over a lateral aspect of the at least one semiconducting layer 230.

In some non-limiting examples, the at least one second electrode 240 may comprise various materials, including without limitation, at least one metallic material, including without limitation, at least one of: Mg, Al, Ca, Zn, Ag, Cd, Ba, and Yb, including without limitation, alloys comprising at least one of: any of such materials, at least one metal oxide, including without limitation, a TCO, including without limitation, ternary compositions such as, without limitation, at least one of: FTO, IZO, and ITO, including without limitation, in varying proportions, zinc oxide (ZnO), and other oxides comprising at least one of: In, and Zn, in at least one layer, and at least one non-metallic material, any of which may be, without limitation, a thin conductive film. In some non-limiting examples, for a Mg:Ag alloy, such alloy composition may range between about 1:9-9:1 by volume.

In some non-limiting examples, the deposition of the second electrode 240 may be performed using one of: an open mask, and a mask-free deposition process.

In some non-limiting examples, the second electrode 240 may comprise a plurality of such coatings. In some non-limiting examples, such coatings may be distinct coatings disposed on top of one another.

In some non-limiting examples, the second electrode 240 may comprise a Yb/Ag bi-layer coating. In some non-limiting examples, such bi-layer coating may be formed by depositing a Yb coating, followed by an Ag coating. In some non-limiting examples, a thickness of such Ag coating may exceed a thickness of the Yb coating.

In some non-limiting examples, the second electrode 240 may be a multi-coating electrode 240 comprising a plurality of one of: a metallic coating, and an oxide coating.

In some non-limiting examples, the second electrode 240 may comprise a fullerene and Mg.

In some non-limiting examples, such coating may be formed by depositing a fullerene coating followed by an Mg coating. In some non-limiting examples, a fullerene may be dispersed within the Mg coating to form a fullerene-containing Mg alloy coating. In some non-limiting examples, such coatings may be described in at least one of: United States Patent Application Publication No. 2015/0287846 published 8 Oct. 2015, and in PCT International Application No. PCT/IB2017/054970 filed 15 Aug. 2017 and published as WO2018/033860 on 22 Feb. 2018.

Semiconducting Layer

In some non-limiting examples, the at least one semiconducting layer 230 may comprise a plurality of layers 231, 233, 235, 237, 239, any of which may be disposed, in some non-limiting examples, in a thin film, in a stacked configuration, which may include, without limitation, at least one of: a hole injection layer (HIL) 231, a hole transport layer (HTL) 233, an emissive layer (EML) 235, an electron transport layer (ETL) 237, and an electron injection layer (EIL) 239.

In some non-limiting examples, the at least one semiconducting layer 230 may form a "tandem" structure comprising a plurality of EMLs 235. In some non-limiting examples, such tandem structure may also comprise at least one charge generation layer (CGL).

Those having ordinary skill in the relevant art will readily appreciate that the structure of the device 200 may be varied by one of: omitting, and combining, at least one of the semiconductor layers 231, 233, 235, 237, 239.

In some non-limiting examples, any of the layers 231, 233, 235, 237, 239 of the at least one semiconducting layer 230 may comprise any number of sub-layers. In some non-limiting examples, any of such layers 231, 233, 235, 237, 239, including without limitation, sub-layer(s) thereof may comprise various ones of: a mixture, and a composition gradient. In some non-limiting examples, although not shown, the device 200 may comprise at least one layer comprising one of: an inorganic, and an organometallic, material, and may not be necessarily limited to devices comprised solely of organic materials. By way of non-limiting example, the device 200 may comprise at least one quantum dot (QD).

In some non-limiting examples, the HIL 231 may be formed using a hole injection material, which may, in some non-limiting examples, facilitate injection of holes by the anode.

In some non-limiting examples, the HTL 233 may be formed using a hole transport material, which may, in some non-limiting examples, exhibit high hole mobility.

In some non-limiting examples, the ETL 237 may be formed using an electron transport material, which may, in some non-limiting examples, exhibit high electron mobility.

In some non-limiting examples, the EIL 239 may be formed using an electron injection material, which may, in some non-limiting examples, facilitate injection of electrons by the cathode.

In some non-limiting examples, the at least one EML 235 may be formed, by way of non-limiting example, by doping a host material with at least one emitter material. In some non-limiting examples, the emitter material may be at least one of: a fluorescent emitter material, a phosphorescent emitter material, and a thermally activated delayed fluorescence (TADF) emitter material.

In some non-limiting examples, the emitter material may be one of a R(ed) emitter material, a G(reen) emitter material, and a B(lue) emitter material, that is, an emitter material that facilitates the emission of respectively, R(ed), G(reen), and B(lue) EM radiation.

In some non-limiting examples, the device 200 may be an OLED in which the at least one semiconducting layer 230 may comprise at least one EML 235 interposed between conductive thin film electrodes 220, 240, whereby, when a potential difference is applied across them, holes may be injected into the at least one semiconducting layer 230 through the anode and electrons may be injected into the at least one semiconducting layer 230 through the cathode, to migrate toward the at least one EML 235 and combine to emit EM radiation in the form of photons.

In some non-limiting examples, the device 200 may be an electro-luminescent QD device in which the at least one semiconducting layer 230 may comprise an active layer comprising at least one QD. When current is provided by the power source to the first electrode 220 and second electrode 240, EM radiation, including without limitation, in the form of photons, may be emitted from the active layer comprising the at least one semiconducting layer 230 between them.

In some non-limiting examples, including where the device 200 comprises a lighting panel, an entire lateral aspect of the device 200 may correspond to a single emissive element. As such, the substantially planar cross-sectional profile shown in FIG. 2 may extend substantially along the entire lateral aspect of the device 200, such that EM radiation is emitted from the device 200 substantially along the entirety of the lateral extent thereof. In some non-limiting examples, such single emissive element may be driven by a single driving circuit of the device 200.

In some non-limiting examples, including where the device 200 comprises a display module, the lateral aspect of the device 200 may be sub-divided into a plurality of emissive regions 210 of the device 200, in which the longitudinal aspect of the device structure 200, within each of the emissive region(s) 210, may cause EM radiation to be emitted therefrom when energized.

Those having ordinary skill in the relevant art will readily appreciate that the structure of the device 200 may be varied by the introduction of at least one additional layer (not shown) at appropriate position(s) within the at least one semiconducting layer 230 stack, including without limitation, at least one of: a hole blocking layer (HBL) (not shown), an electron blocking layer (EBL) (not shown), a charge transport layer (CTL) (not shown), and a charge injection layer (CIL) (not shown).

In some non-limiting examples, the patterning coating 110 may be formed concurrently with the at least one semiconducting layer(s) 230. In some non-limiting examples, at least one material used to form the patterning coating 110 may also be used to form the at least one semiconducting layer(s) 230. In some non-limiting examples, the ETL 237 of the at least one semiconducting layer 230 may be a patterning coating 110 that may be deposited in the first portion 101 and the second portion 102 during the deposition of the at least one semiconducting layer 230. The EIL 239 may then be selectively deposited in the emissive region 210 of the second portion 102 over the ETL 237, such that the exposed layer surface 11 of the ETL 237 in the first portion 101 may be substantially devoid of the EIL 239. The exposed layer surface 11 of the EIL 239 in the emissive region 210 and the exposed layer surface of the ETL 237, which acts as the patterning coating 110, may then be exposed to a vapor flux 832 (FIG. 8) of the deposited material 831 to form a closed coating 140 of the deposited layer 130 on the EIL 239 in the second portion 102, and a discontinuous layer 160 of the deposited material 831 on the ETL 239 in the first portion 101. In such non-limiting example, several stages for fabricating the device 200 may be reduced.

Emissive Region(s)

In some non-limiting examples, the wavelength spectrum may correspond to a colour in, without limitation, the visible spectrum. The EM radiation at a first wavelength (range) emitted by a first sub-pixel 216 of a pixel 615 may perform differently than the EM radiation at a second wavelength (range) emitted by a second sub-pixel 216 thereof because of the different wavelength (range) involved.

In some non-limiting examples, at least one of the various emissive region layers may be deposited by deposition of a corresponding constituent emissive region layer material.

In some non-limiting examples, some of the at least one semiconducting layers 230 may be laid out in a desired pattern by vapor deposition of the corresponding emissive region layer material through an FMM having apertures corresponding to the desired locations where the emissive region layer material is to be deposited. In some non-limiting examples, a plurality of the emissive region layers may be laid out in a similar pattern, including without limitation, by depositing the respective emissive region layer material thereof in their respective deposition stages using an FMM.

In some non-limiting examples, as discussed herein, the emissive region layer material corresponding to at least one of the first electrode 220 and the second electrode 240, including without limitation, the second electrode 240, may be deposited by prior deposition of a patterning coating 110 by vapor deposition of a patterning material through an FMM having apertures corresponding to the desired locations where the patterning coating 110 is to be deposited and thereafter depositing the emissive region layer material using one of: an open mask, and mask-free deposition process.

In some non-limiting examples, the patterning coating 110 may be adapted to impact a propensity of a vapor flux 832 of a deposited material 831 of which the emissive region layer material may be comprised, to be deposited thereon, including without limitation, an initial sticking probability against the deposition of the deposited material 831 that is no more than an initial sticking probability against the deposition of the deposited material 831 of the exposed layer surface 11 of the at least one semiconducting layer 230.

In some non-limiting examples, the emission spectrum of the EM radiation emitted by a given (sub-) pixel 615/216 may correspond to the colour by which the (sub-) pixel 615/216 may be denoted. In some non-limiting examples, the wavelength of the EM radiation may not correspond to such colour, but further processing may be performed, in a manner apparent to those having ordinary skill in the relevant art, to transform the wavelength to one that does so correspond.

In some non-limiting examples, the emission spectrum of the EM radiation emitted by a given (sub-) pixel 615/216, corresponding to the colour by which the (sub-) pixel 615/216 may be denoted, may be related to at least one of: the structure and composition of the at least one semiconducting layer 230 extending between the first electrode 220 and the second electrode 240 thereof, including without limitation, the at least one EML 235. In some non-limiting examples, the at least one EML 235 of the at least one semiconducting layer 230 may be tuned to facilitate the emission of EM radiation having an emission spectrum corresponding to the colour by which the (sub-) pixel 615/216 may be denoted. In some non-limiting examples, the EML 235 of a R(ed) sub-pixel 216R may comprise a R(ed) EML material, including without limitation, a host material doped with a R(ed) emitter material. In some non-limiting examples, the EML 235 of a G(reen) sub-pixel 216G may comprise a G(reen) EML material, including without limitation, a host material doped with a G(reen) emitter material. In some non-limiting examples, the EML 235 of a B(lue) sub-pixel 216B may comprise B(lue) EML material, including without limitation, a host material doped with a B(lue) emitter material.

In some non-limiting examples, at least one characteristic of at least one of the at least one semiconducting layer 230, including without limitation, the HIL 231, the HTL 233, the EML 235, the ETL 237, and the EIL 239, including without limitation, a presence thereof, an absence thereof, a thickness thereof, a composition thereof, and an order thereof, in the longitudinal aspect, may be selected to facilitate emission therefrom of EM radiation having a wavelength spectrum corresponding to the colour by which a given sub-pixel 216 may be denoted, including without limitation, at least one of: R(ed), G(reen), and B(lue).

In some non-limiting examples, emission of EM radiation having a wavelength spectrum corresponding to a plurality of colours selected from: R(ed), G(reen), and B(lue) may facilitate emission of EM radiation having a wavelength spectrum corresponding to a different colour, including without limitation W(hite) (R+G+B), Y(ellow) (R+G), C(yan) (G+B), and M(agenta) (B+R), according to the additive colour model.

In some non-limiting examples, the exposed layer surface 11 of the device 100 may be exposed to a vapor flux 832 of a deposited material 831, including without limitation, in one of: an open mask, and mask-free, deposition process.

In some non-limiting examples, in at least a part of the emissive region 210, the at least one semiconducting layer 230 may be deposited over the exposed layer surface 11 of the device 200, which in some non-limiting examples, comprise the first electrode 220.

In some non-limiting examples, the exposed layer surface 11 of the device 200, which may, in some non-limiting examples, comprise the at least one semiconducting layer 230, may be exposed to a vapor flux 712 (FIG. 7) of the patterning material 711, including without limitation, using a shadow mask 715, to form a patterning coating 110 in the first portion 101. Whether a shadow mask 715 is employed, the patterning coating 110 may be restricted, in its lateral aspect, substantially to a transmissive region 212.

In some non-limiting examples, this may be achieved by laser ablation of the second electrode material. However, in some non-limiting examples, laser ablation may create a debris cloud, which may impact the vapour deposition process.

In some non-limiting examples, this may be achieved by disposing a patterning coating 110, which may, in some non-limiting examples, be a nucleation inhibiting coating (NIC), using an FMM, in a pattern on an exposed layer surface 11 of the at least one semiconducting layer 230 prior to depositing a deposited material 831 for forming the second electrode 240 thereon.

In some non-limiting examples, the patterning coating 110 may be adapted to impact a propensity of a vapor flux 832 of the deposited material 831 to be deposited thereon, including without limitation, an initial sticking probability against the deposition of the deposited material 831 that is no more than an initial sticking probability against the deposition of the deposited material 831 of the exposed layer surface 11 of the at least one semiconducting layer 230.

In some non-limiting examples, the patterning coating 110 may be deposited in a pattern that may correspond to the first portion 101 of a lateral aspect, including without limitation, of at least some of the transmissive regions 212.

In some non-limiting examples, the patterning coating 110 may be deposited in a plurality of stages, each using a different FMM defining a different pattern within the first portion 101, that respectively correspond to a different subset of the transmissive regions 212.

In some non-limiting examples, the display panel 400 may, subsequent to (all of the stages of) the deposition of the patterning coating 110, be subjected to a vapor flux 832 of the deposited material 831, in one of: an open mask. and mask-free, deposition process, to form the second electrode 240 for each of the emissive regions 210 corresponding to a (sub-) pixel 615/216 in at least the second portion 102 of the lateral aspect, but not in the first portion 101 of the lateral aspect.

In some non-limiting examples, although not shown, the overlying layer 170 may be arranged above at least one of: the second electrode 240, and the patterning coating 110. In some non-limiting examples, although not shown, the overlying layer 170 may be deposited at least partially across the lateral extent of the opto-electronic device 200, in some non-limiting examples, covering the second electrode 240 in the second portion 102, and, in some non-limiting examples, at least partially covering the at least one particle structure 150 and forming an interface with the patterning coating 110 at the exposed layer surface 11 thereof in the first portion 101.

Patterning

In some non-limiting examples, with reference to FIG. 1, in some non-limiting examples, a patterning coating 110, comprising a patterning material 711, which in some non-limiting examples, may be an NIC material, may be disposed, in some non-limiting examples, as a closed coating 140, on an exposed layer surface 11 of an underlying layer 1010, including without limitation, a substrate 10, of the device 100, in some non-limiting examples, restricted in lateral extent by selective deposition, including without limitation, using a shadow mask 715 such as, without limitation, an FMM, including without limitation, to the first portion 101.

Thus, in some non-limiting examples, in the second portion 102 of the device 100, the exposed layer surface 11 of the underlying layer 1010 of the device 100, may be substantially devoid of a closed coating 140 of the patterning coating 110.

Display Panel and User Device

In some non-limiting examples, a pixel density of the at least one emissive region 210 of the at least one signal-exchanging part 303 may be substantially the same as a pixel density of the at least one emissive region 210 of the at least one display part 307 proximate thereto, at least in an area thereof that is substantially proximate to the at least one signal-exchanging part 303. In some non-limiting examples, the pixel density of the display panel 400 may be substantially uniform thereacross. In at least some applications, there may be scenarios calling for the at least one signal-exchanging part 303 and the at least one display part 307 to have substantially the same pixel density, including without limitation, so that a resolution of the display panel 400 may be substantially the same across both the at least one signal-exchanging part 303 and the at least one display part 307 thereof.

Those having ordinary skill in the relevant art will appreciate that there may be scenarios calling for the layout of (sub-) pixels 615/216 in the signal-exchanging part 303 of the display panel 400 to resemble, to some extent, the layout thereof in the display part 307 of the display panel 400, including without limitation, a size, shape, (colour) order, and configuration of (sub-) pixels 615/216, and wherein a spacing between adjacent (sub-) pixels 615/216 ("pitch") in the signal-exchanging part 303 is one of: the same, and an integer multiple thereof, of a pitch thereof in the display part 307.

Having said this, examples in the present disclosure may have applicability in scenarios in which the layout of (sub-) pixels 615/216 in the signal-exchanging part 303 may be substantially different than the layout thereof in the display part 307 of the display panel 400.

In some non-limiting examples, the display panel 400 may further comprise at least one transition region (not shown) between the at least one signal-exchanging part 303 and the at least one display part 307 otherwise adjacent thereto, wherein at least one of: a configuration of the at least one emissive region 210 therein may be different from a corresponding configuration of at least one of: the at least one display part 307, and the at least one signal-exchanging part 303, and a configuration of the at least one transmissive region 212 therein may be different from a corresponding configuration of the at least one signal-exchanging part 303. In some non-limiting examples, such transition region may be omitted such that the emissive regions 210 may be provided in a substantially continuous repeating pattern across both the at least one signal-exchanging part 303 and the at least one display part 307.

In some non-limiting examples, the at least one signal-exchanging part 303 may have a polygonal contour, including without limitation, at least one of a substantially square, and rectangular, configuration.

In some non-limiting examples, the at least one signal-exchanging part 303 may have a curved contour, including without limitation, at least one of a substantially circular, oval, and elliptical, configuration.

In some non-limiting examples, the transmissive regions 212 in the at least one signal-exchanging part 303 may be configured to allow signals having a wavelength (range) corresponding to the IR spectrum to pass through the entirety of a cross-sectional aspect thereof.

In some non-limiting examples, the at least one signal-exchanging part 303 may have a reduced number of, including without limitation, be substantially devoid of, backplane components, including without limitation, TFT structures 206, including without limitation, metal trace lines, capacitors, and other EM radiation-absorbing element, including without limitation, opaque elements, the presence of which may otherwise interfere with the capture of the EM radiation by the at least one under-display component 330, including without limitation, the capture of an image by a camera.

Patterning Coating

The patterning coating 110 may comprise a patterning material 711. In some non-limiting examples, the patterning coating 110 may comprise a closed coating 140 of the patterning material 711.

The patterning coating 110 may provide an exposed layer surface 11 with a substantially low propensity (including without limitation, a substantially low initial sticking probability) (in some non-limiting examples, under the conditions identified in the dual QCM technique described by Walker et al.) against the deposition of a deposited material 831 to be deposited thereon upon exposing such surface to a vapor flux 832 of the deposited material 831, which, in some non-limiting examples, may be substantially less than the propensity against the deposition of the deposited material 831 to be deposited on the exposed layer surface 11 of the underlying layer 1010 of the device 100, upon which the patterning coating 110 has been deposited.

Because of the attributes, including without limitation, a low initial sticking probability, of at least one of: the patterning coating 110, and the patterning material 711, in some non-limiting examples, when deposited as at least one of: a film, and a coating, in a form, and under similar circumstances to the deposition of the patterning coating 110 within the device 100, against the deposition of the deposited material 831, the exposed layer surface 11 of the first portion 101 comprising the patterning coating 110 may be substantially devoid of a closed coating 140 of the deposited material 831.

However, exposure of the device 100 to a vapor flux 832 of the deposited material 831 may, in some non-limiting examples, result in the formation of a closed coating 140 of a deposited layer 130 of the deposited material 831 in the second portion 102, where the exposed layer surface 11 of the underlying layer 1010 may be substantially devoid of the patterning coating 110.

Thus, in some non-limiting examples, the patterning coating 110 may be an NIC that provides high deposition (patterning) contrast against subsequent deposition of the deposited material 831, such that the deposited material 831 tends not to be deposited, in some non-limiting examples, as a closed coating 140, where the patterning coating 110 has been deposited.

In some non-limiting examples, the patterning coating 110 may comprise a patterning material 711. In some non-limiting examples, the patterning material 711 may comprise an NIC material. In some non-limiting examples, the patterning coating 110 may comprise a closed coating 140 of the patterning material 711.

In some non-limiting examples, there may be scenarios calling for providing a patterning coating 110 for causing formation of a discontinuous layer 160 of at least one particle structure 150, upon the patterning coating 110 in the first portion 101 being subjected to a vapor flux 832 of a deposited material 831. In at least some applications, the attributes of the patterning coating 110 may be such that a closed coating 140 of the deposited material 831 may be formed in the second portion 102, which may be substantially devoid of the patterning coating 110, while only a discontinuous layer 160 of at least one particle structure 150 having at least one characteristic may be formed in the first portion 101 on the patterning coating 110.

For purposes of simplicity of discussion, in the present disclosure, to the extent that a patterning coating 110 is deposited to act as a base for the deposition of at least one particle structure 150 thereon, such patterning coating 110 may be designated as a particle structure patterning coating $\mathbf{110}_p$. By contrast, to the extent that a patterning coating 110 is deposited in a first portion 101 to substantially preclude formation in such first portion 101 of a closed coating 140 of the deposited layer 130, thus restricting the deposition of a closed coating 140 of the deposited layer 130 to a second portion 102, such patterning coating 110 may be designated as a non-particle structure patterning coating $\mathbf{110}_n$. Those having ordinary skill in the relevant art will appreciate that in some non-limiting examples, a patterning coating 110 may act as both a particle structure patterning coating $\mathbf{110}_p$ and a non-particle structure patterning coating $\mathbf{110}_n$.

In some non-limiting examples, there may be scenarios calling for formation of a discontinuous layer 160 of at least one particle structure 150 of a deposited material 831, which may be, in some non-limiting examples, of one of: a metal, and a metal alloy (metal/alloy), including without limitation, at least one of: Yb, Ag, Mg, and Ag-containing materials, including without limitation, MgAg, in the second portion 102, while depositing a closed coating 140 of the deposited material 831 having a thickness of, without limitation, one of no more than about: 100, 50, 25, and 15, nm. In some non-limiting examples, an amount of the deposited material 831 deposited as a discontinuous layer 160 of at least one particle structure 150 in the first portion 101 may correspond to one of between about: 1-50, 2-25, 5-20, and 7-10% of the amount of the deposited material 831 deposited as a closed coating 140 in the second portion 102, which, by way of non-limiting example may correspond to a thickness of one of no more than about: 100, 75, 50, 25, and 15, nm.

In some non-limiting examples, the patterning coating 110 may be disposed in a pattern that may be defined by at least one region therein that may be substantially devoid of a closed coating 140 of the patterning coating 110.

In some non-limiting examples, the at least one region may separate the patterning coating 110 into a plurality of discrete fragments thereof. In some non-limiting examples, the plurality of discrete fragments of the patterning coating 110 may be physically spaced apart from one another in the lateral aspect thereof. In some non-limiting examples, the plurality of the discrete fragments of the patterning coating 110 may be arranged in a regular structure, including without limitation, an array (matrix), such that in some non-limiting examples, the discrete fragments of the patterning coating 110 may be configured in a repeating pattern.

In some non-limiting examples, at least one of the plurality of the discrete fragments of the patterning coating 110 may each correspond to an emissive region 210. In some non-limiting examples, an aperture ratio of the emissive regions 410 may be one of no more than about: 50, 40, 30, and 20%.

In some non-limiting examples, the patterning coating 110 may be formed as a single monolithic coating.

Attributes of Patterning Coating/Material Composition

In some non-limiting examples, at least one of: the patterning coating 110, and the patterning material 711, may comprise at least one of: a fluorine (F) atom, and a silicon (Si) atom. By way of non-limiting example, the patterning material 711 for forming the patterning coating 110 may be a compound that comprises at least one of: F and Si.

In some non-limiting examples, the patterning material 711 may comprise a compound that comprises F. In some non-limiting examples, the patterning material 711 may comprise a compound that comprises F and a carbon (C) atom. In some non-limiting examples, the patterning material 711 may comprise a compound that comprises F and C in an atomic ratio corresponding to a quotient of F/C of one of at least about: 0.5, 0.7, 1, 1.5, 2, and 2.5.

In some non-limiting examples, an atomic ratio of F to C may be determined by counting the F atoms present in the compound structure, and for C atoms, counting solely the $sp^3$ hybridized C atoms present in the compound structure. In some non-limiting examples, the patterning material 711 may comprise a compound that comprises, as part of its molecular sub-structure, a moiety comprising F and C in an atomic ratio corresponding to a quotient of F/C of one of at least about: 1, 1.5, and 2.

In some non-limiting examples, the patterning material 711 may comprise an organic-inorganic hybrid material.

In some non-limiting examples, the patterning material 711 may comprise an oligomer.

In some non-limiting examples, the patterning material 711 may comprise a compound having a molecular structure comprising a backbone and at least one functional group bonded to the backbone. In some non-limiting examples, the backbone may be an inorganic moiety, and the at least one functional group may be an organic moiety.

In some non-limiting examples, such compound may have a molecular structure comprising a siloxane group. In some non-limiting examples, the siloxane group may be one of: a linear siloxane group, a branched siloxane group, and a cyclic siloxane group. In some non-limiting examples, the backbone may comprise a siloxane group. In some non-limiting examples, the backbone may comprise a siloxane group and at least one functional group comprising F. In some non-limiting examples, the at least one functional group comprising F may be a fluoroalkyl group. In some non-limiting examples, such compound may comprise fluoro-siloxanes, including without limitation, Example Material 6 and Example Material 9 (discussed below).

In some non-limiting examples, the compound may have a molecular structure comprising a silsesquioxane group. In some non-limiting examples, the silsesquioxane group may be a POSS. In some non-limiting examples, the backbone may comprise a silsesquioxane group. In some non-limiting examples, the backbone may comprise a silsesquioxane group and at least one functional group comprising F. In some non-limiting examples, the at least one functional group comprising F may be a fluoroalkyl group. In some non-limiting examples, such compound may comprise fluoro-silsesquioxane and fluoro-POSS, including without limitation, Example Material 8 (discussed below).

In some non-limiting examples, the compound may have a molecular structure comprising at least one of: a substituted aryl group, an unsubstituted aryl group, a substituted heteroaryl group, and an unsubstituted heteroaryl group. In some non-limiting examples, the aryl group may comprise at least one of: phenyl, and naphthyl. In some non-limiting examples, at least one C atom of an aryl group may be substituted by a heteroatom, which by way of non-limiting example may be at least one of: O, N, and S, to derive a heteroaryl group. In some non-limiting examples, the backbone may comprise at least one of: a substituted aryl group, an unsubstituted aryl group, a substituted heteroaryl group, and an unsubstituted heteroaryl group. In some non-limiting examples, the backbone may comprise at least one of: a substituted aryl group, an unsubstituted aryl group, a substituted heteroaryl group, and an unsubstituted heteroaryl group and at least one functional group comprising F. In some non-limiting examples, the at least one functional group comprising F may be a fluoroalkyl group.

In some non-limiting examples, the compound may have a molecular structure comprising at least one of: a substituted hydrocarbon group, an unsubstituted hydrocarbon group, a linear hydrocarbon group, a branched hydrocarbon group, and a cyclic hydrocarbon group. In some non-limiting examples, at least one C atom of the hydrocarbon group may be substituted by a heteroatom, including without limitation, at least one of: O, N, and S.

In some non-limiting examples, the compound may have a molecular structure comprising a phosphazene group. In some non-limiting examples, the phosphazene group may be at least one of: a linear phosphazene group, a branched phosphazene group, and a cyclic phosphazene group. In some non-limiting examples, the backbone may comprise a phosphazene group. In some non-limiting examples, the backbone may comprise a phosphazene group and at least one functional group comprising F. In some non-limiting examples, the at least one functional group comprising F may be a fluoroalkyl group. In some non-limiting examples, such compounds may comprise fluoro-phosphazenes, including without limitation, Example Material 4 (discussed below).

In some non-limiting examples, the compound may be a fluoropolymer. In some non-limiting examples, the compound may be a block copolymer comprising F. In some non-limiting examples, the compound may be an oligomer. In some non-limiting examples, the oligomer may be a fluorooligomer. In some non-limiting examples, the compound may be a block oligomer comprising F. Non-limiting examples, of at least one of: fluoropolymers, and fluorooligomers, are those having the molecular structure of at least one of: Example Material 3, Example Material 5, and Example Material 7 (discussed herein).

In some non-limiting examples, the compound may be a metal complex. In some non-limiting examples, the metal complex may be an organo-metal complex. In some non-limiting examples, the organo-metal complex may comprise F. In some non-limiting examples, the organo-metal complex may comprise at least one ligand comprising F. In some non-limiting examples, the at least one ligand comprising F may comprise a fluoroalkyl group.

In some non-limiting examples, the patterning material 711 may comprise a plurality of different materials.

Initial Sticking Probability

In some non-limiting examples, the initial sticking probability of the patterning material 711 may be determined by depositing such material as at least one of: a film, and coating, in a form, and under similar circumstances to the deposition of the patterning coating 110 within the device 100, having sufficient thickness so as to mitigate/reduce any effects on the degree of inter-molecular interaction with the underlying layer upon deposition on a surface thereof. In some non-limiting examples, the initial sticking probability may be measured on a film/coating having a thickness of one of at least about: 20, 25, 30, 50, 60, and 100, nm.

In some non-limiting examples, at least one of: the patterning coating 110, and the patterning material 711, in some non-limiting examples, when deposited as at least one of: a film, and a coating, in a form, and under similar circumstances to the deposition of the patterning coating 110 within the device 100, may have an initial sticking probability against the deposition of the deposited material 831, that is one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

In some non-limiting examples, at least one of: the patterning coating 110, and the patterning material 711, in some non-limiting examples, when deposited as at least one of: a film, and a coating, in a form, and under similar circumstances to the deposition of the patterning coating 110 within the device 100, may have an initial sticking probability against the deposition of at least one of: Ag, and Mg that is one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

In some non-limiting examples, at least one of: the patterning coating 110, and the patterning material 711, in some non-limiting examples, when deposited as at least one of: a film, and a coating, in a form, and under similar circumstances to the deposition of the patterning coating 110 within the device 100, may have an initial sticking probability against the deposition of a deposited material 831 of one of between about: 0.15-0.0001, 0.1-0.0003, 0.08-0.0005, 0.08-0.0008, 0.05-0.001, 0.03-0.0001, 0.03-0.0003, 0.03-0.0005, 0.03-0.0008, 0.03-0.001, 0.03-0.005, 0.03-0.008, 0.03-0.01, 0.02-0.0001, 0.02-0.0003, 0.02-0.0005, 0.02-0.0008, 0.02-0.001, 0.02-0.005, 0.02-0.008, 0.02-0.01, 0.01-0.0001, 0.01-0.0003, 0.01-0.0005, 0.01-0.0008, 0.01-0.001, 0.01-0.005, 0.01-0.008, 0.008-0.0001, 0.008-0.0003, 0.008-0.0005, 0.008-0.0008, 0.008-0.001, 0.008-0.005, 0.005-0.0001, 0.005-0.0003, 0.005-0.0005, 0.005-0.0008, and 0.005-0.001.

In some non-limiting examples, at least one of: the patterning coating 110, and the patterning material 711, in some non-limiting examples, when deposited as at least one of: a film, and a coating, in a form, and under similar circumstances to the deposition of the patterning coating 110 within the device 100, may have an initial sticking probability against the deposition of a plurality of deposited materials 831 that is no more than a threshold value. In some non-limiting examples, such threshold value may be one of about: 0.3, 0.2, 0.18, 0.15, 0.13, 0.1, 0.08, 0.05, 0.03, 0.02, 0.01, 0.008, 0.005, 0.003, and 0.001.

In some non-limiting examples, at least one of: the patterning coating 110, and the patterning material 711, in some non-limiting examples, when deposited as at least one of: a film, and a coating, in a form, and under similar circumstances to the deposition of the patterning coating 110 within the device 100, may have an initial sticking probability that is no more than such threshold value against the deposition of a plurality of deposited materials 831 selected from at least one of: Ag, Mg, Yb, Cd, and Zn. In some non-limiting examples, the patterning coating 110 may exhibit an initial sticking probability of no more than such threshold value against the deposition of a plurality of deposited materials 831 selected from at least one of: Ag, Mg, and Yb.

In some non-limiting examples, at least one of: the patterning coating 110, and the patterning material 711, in some non-limiting examples, when deposited as at least one of: a film, and a coating, in a form, and under similar circumstances to the deposition of the patterning coating 110 within the device 100, may exhibit an initial sticking probability against the deposition of a first deposited material 831 of, including without limitation, below, a first threshold value, and an initial sticking probability against the deposition of a second deposited material 831 of, including without limitation, below, a second threshold value. In some non-limiting examples, the first deposited material 831 may be Ag, and the second deposited material 831 may be Mg. In some non-limiting examples, the first deposited material 831 may be Ag, and the second deposited material may be Yb. In some non-limiting examples, the first deposited material 831 may be Yb, and the second deposited material 831 may be Mg. In some non-limiting examples, the first threshold value may exceed the second threshold value.

In some non-limiting examples, there may be scenarios calling for providing a patterning coating 110 for causing formation of a discontinuous layer 160 of at least one particle structure 150, upon the patterning coating 110 being subjected to a vapor flux 832 of a deposited material 831. In some non-limiting examples, the patterning coating 110 may exhibit a substantially low initial sticking probability such that a closed coating 140 of the deposited material 831 may be formed in the second portion 102, which may be substantially devoid of the patterning coating 110, while the discontinuous layer 160 of at least one particle structure 150 having at least one characteristic may be formed in the first portion 101 on the patterning coating 110. In some non-limiting examples, there may be scenarios calling for formation of a discontinuous layer 160 of at least one particle structure 150 of a deposited material 831, which may be, in some non-limiting examples, of one of: a metal, and a metal alloy, in the second portion 102, while depositing a closed coating 140 of the deposited material 831 having a thickness of, for example, one of no more than about: 100, 50, 25, and 15, nm. In some non-limiting examples, an amount of the deposited material 831 deposited as a discontinuous layer 160 of at least one particle structure 150 in the first portion 101 may correspond to one of between about: 1-50, 2-25, 5-20, and 7-10% of the amount of the deposited material 831 deposited as a closed coating 140 in the second portion 102, which in some non-limiting examples, may correspond to a thickness of one of no more than about: 100, 75, 50, 25, and 15, nm.

In some non-limiting examples, there may be a positive correlation between the initial sticking probability of at least one of: the patterning coating 110, and the patterning material 711, in some non-limiting examples, when deposited as at least one of: a film, and a coating, in a form, and under circumstances similar to the deposition of the patterning coating 110 within the device 100, against the deposition of the deposited material 831, and an average layer thickness of the deposited material 831 thereon.

Transmittance

In some non-limiting examples, at least one of: the patterning coating 110, and the patterning material 711, in some non-limiting examples, when deposited as at least one of: a film, and a coating, in a form, and under circumstances similar to the deposition of the patterning coating 110 within the device 100, may have a transmittance for EM radiation of at least a threshold transmittance value, after being subjected to a vapor flux 832 of the deposited material 831, including without limitation, Ag.

In some non-limiting examples, such transmittance may be measured after exposing the exposed layer surface 11 of at least one of: the patterning coating 110 and the patterning material 711, formed as a thin film, to a vapor flux 832 of the deposited material 831, including without limitation, at least one of: a metal, and an alloy, including without limitation, at least one of: Yb, Ag, Mg, and Ag-containing materials, including without limitation, MgAg, under typical conditions that may be used for depositing an electrode of an opto-electronic device, which in some non-limiting examples, may be a cathode of an organic light-emitting diode (OLED) device.

In some non-limiting examples, the conditions for subjecting the exposed layer surface 11 to the vapor flux 832 of the deposited material 831, including without limitation, at least one of: a metal, and an alloy, including without limitation, at least one of: Yb, Ag, Mg, and Ag-containing materials, including without limitation, MgAg, may comprise: maintaining a vacuum pressure at a reference pressure, including without limitation, of one of about: $10^{-4}$, and $10^{-5}$, Torr; the vapor flux 832 of the deposited material 831, including without limitation, at least one of: a metal, and an alloy, including without limitation, at least one of: Yb, Ag, Mg, and Ag-containing materials, including without limitation, MgAg, being substantially consistent with a reference deposition rate, including without limitation, of about 1 angstrom (Å)/sec, which in some non-limiting examples, may be monitored using a QCM; the vapor flux 832 of the deposited material 831 being directed toward the exposed layer surface 11 at an angle that is substantially close to normal to a plane of the exposed layer surface 11; the exposed layer surface 11 being subjected to the vapor flux 832 of the deposited material 831, including without limitation, at least one of: a metal, and an alloy, including without limitation, at least one of: Yb, Ag, Mg, and Ag-containing materials, including without limitation, MgAg, until a reference average layer thickness, including without limitation, of about 15 nm, is reached, and upon such reference average layer thickness being attained, the exposed layer surface 11 not being further subjected to the vapor flux of the deposited material 831, including without limitation, at least one of: a metal, and an alloy, including without limitation, at least one of: Yb, Ag, Mg, and Ag-containing materials, including without limitation, MgAg.

In some non-limiting examples, the exposed layer surface 11 being subjected to the vapor flux 832 of the deposited material 831, including without limitation, at least one of: Yb, Ag, Mg, and Ag-containing materials, including without limitation, MgAg, may be substantially at room temperature (e.g. about 25° C.). In some non-limiting examples, the exposed layer surface 11 being subjected to the vapor flux 832 of the deposited material 831, including without limitation, at least one of: a metal, and an alloy, including without limitation, at least one of: Yb, Ag, Mg, and Ag-containing materials, including without limitation, MgAg, may be positioned about 65 cm away from an evaporation source by which the deposited material 831, including without limitation, at least one of: a metal, and an alloy, including without limitation, at least one of: Yb, Ag, Mg, and Ag-containing materials, including without limitation, MgAg, is evaporated.

In some non-limiting examples, the threshold transmittance value may be measured at a wavelength in the visible spectrum, which may be one of at least about: 460, 500, 550, and 600, nm. In some non-limiting examples, the threshold transmittance value may be measured at a wavelength in at least one of: the IR, and NIR, spectrum. In some non-limiting examples, the threshold transmittance value may be measured at a wavelength of one of about: 700, 900, and 1,000, nm. In some non-limiting examples, the threshold transmittance value may be expressed as a percentage of incident EM power that may be transmitted through a sample. In some non-limiting examples, the threshold transmittance value may be one of at least about: 60, 65, 70, 75, 80, 85, and 90%.

It would be appreciated by a person having ordinary skill in the relevant art that high transmittance may generally indicate an absence of a closed coating 140 of the deposited material 831, including without limitation, at least one of: Yb, Ag, Mg, and Ag-containing materials, including without limitation, MgAg. On the other hand, low transmittance may generally indicate presence of a closed coating 140 of the deposited material 831, including without limitation, at least one of: Yb, Ag, Mg, and Ag-containing materials, including without limitation, MgAg, since metallic thin films, particularly when formed as a closed coating 140, may exhibit a high degree of absorption of EM radiation.

A series of samples was fabricated to measure the transmittance of an example material, as well as to visually observe whether a closed coating 140 of Ag was formed on the exposed layer surface 11 of such example material. Each sample was prepared by depositing, on a glass substrate 10, an approximately 50 nm thick coating of an example material, then subjecting the exposed layer surface 11 of the coating to a vapor flux 832 of Ag at a rate of about 1 Å/sec until a reference layer thickness of about 15 nm was reached. Each sample was then visually analyzed and the transmittance through each sample was measured.

The molecular structures of the example materials used in the samples herein are set out in Table 1 below:

TABLE 1

| Material | Molecular Structure/Name |
|---|---|
| HT211 | 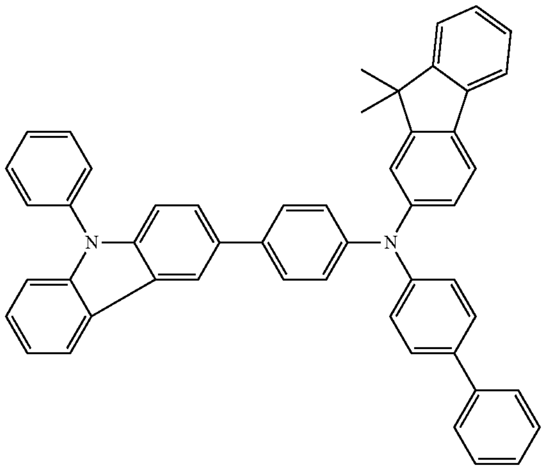 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] |

TABLE 1-continued
| Material | Molecular Structure/Name |
|---|---|
| HT01 | 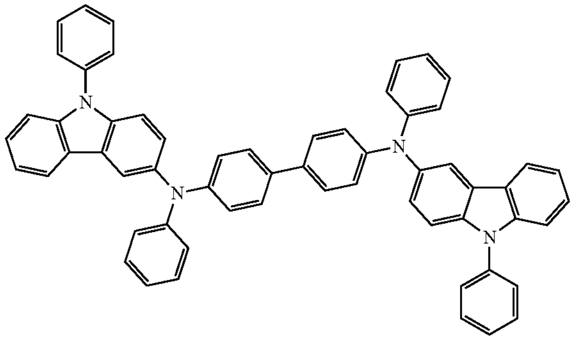 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1] |
| TAZ | 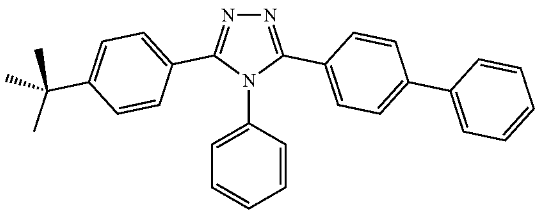 |
| Balq | 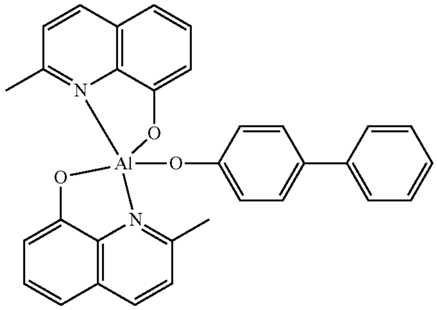 |
| Liq | 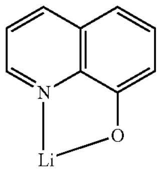 |
| Example Material 1 | 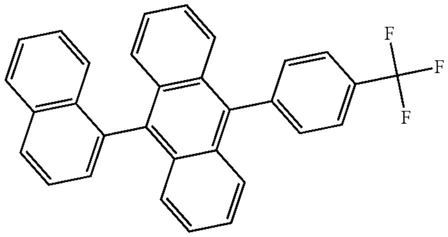 [SMILES: FC(F)(F)c1ccc(-c2c3ccccc3c(-c3cccc4ccccc34)c3ccccc23)cc1] |
| Example Material 2 | 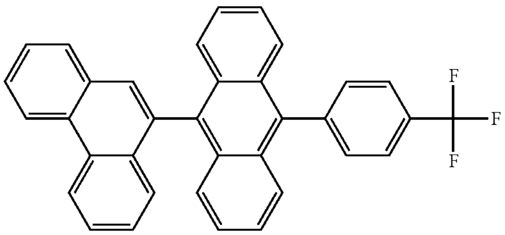 [SMILES: FC(F)(F)c1ccc(-c2c3ccccc3c(-c3cc4ccccc4c4ccccc34)c3ccccc23)cc1] |

TABLE 1-continued
| Material | Molecular Structure/Name |
| --- | --- |
| Example Material 3 | 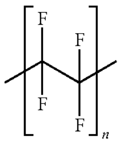 |
| Example Material 4 | 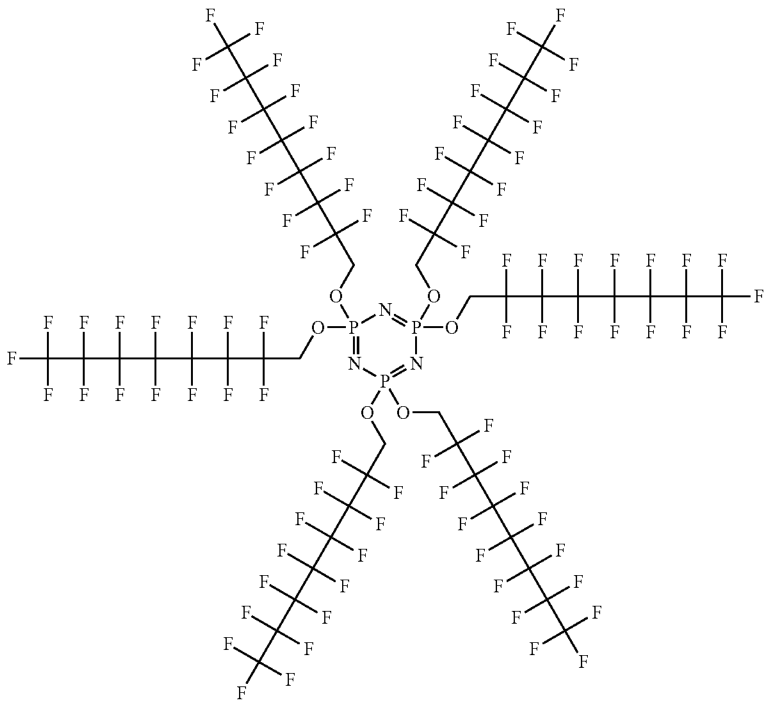 [SMILES: FC(F)(F)C(F)(F)C(F)(F)C(F)(F)C(F)(F)C(F)(F)C(F)(F)COP1(OCC(F)(F)C(F)(F)C(F)(F)C(F)(F)C(F)(F)C(F)(F)C(F)(F)F)=NP(OCC(F)(F)C(F)(F)C(F)(F)C(F)(F)C(F)(F)C(F)(F)C(F)(F)F)(OCC(F)(F)C(F)(F)C(F)(F)C(F)(F)C(F)(F)C(F)(F)C(F)(F)F)=NP(OCC(F)(F)C(F)(F)C(F)(F)C(F)(F)C(F)(F)C(F)(F)C(F)(F)F)(OCC(F)(F)C(F)(F)C(F)(F)C(F)(F)C(F)(F)C(F)(F)C(F)(F)F)=N1] |
| Example Material 5 | 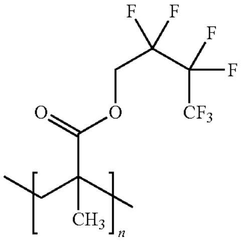 |
| Example Material 6 | 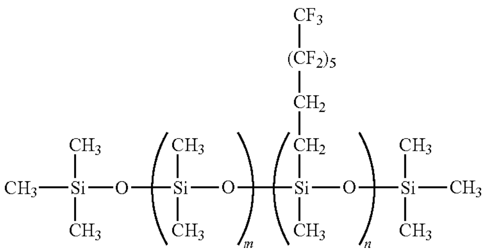 |
| Example Material 7 | 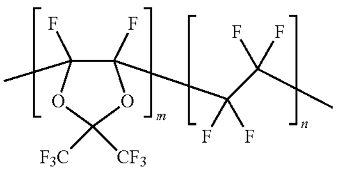 |

TABLE 1-continued

| Material | Molecular Structure/Name |
|---|---|
| Example Material 8 | 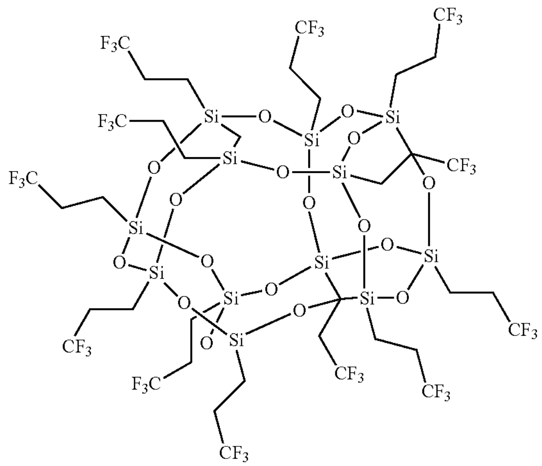 |
| Example Material 9 | 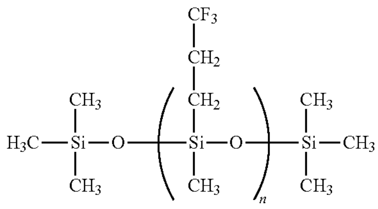 |

Those having ordinary skill in the relevant art will appreciate that samples having little to no deposited material 831, including without limitation, at least one of: a metal, and an alloy, including without limitation, at least one of: Yb, Ag, Mg, and Ag-containing materials, including without limitation, MgAg, present thereon may be substantially transparent, while samples with substantial amounts of at least one of: a metal, and an alloy, deposited thereon, including without limitation, as a closed coating 140, may in some non-limiting examples, exhibit a substantially reduced transmittance. Accordingly, the performance of various example coatings as a patterning coating 110 may be assessed by measuring transmission through the samples, which may be positively correlated to at least one of: an amount, and an average layer thickness, of the deposited material 831, including without limitation, at least one of: a metal, and an alloy, including without limitation, in the form of at least one of Yb, Ag, Mg, and Ag-containing materials, including without limitation, MgAg, being deposited thereon, since metallic thin films, including without limitation, when formed as a closed coating 140, may exhibit a high degree of absorption of EM radiation.

The samples in which a substantially closed coating 140 of a deposited material 831, in the form of Ag, had formed were visually identified, and the presence of such closed coating 140 in these samples was further confirmed by measurement of transmittance therethrough, which showed transmittance of no more than about 50% at a wavelength of about 460 nm.

In addition, for samples in which the absence of formation of a closed coating 140 of a deposited material 831, in the form of Ag, was identified, the absence of such closed coating 140 in these samples was further confirmed by measurement of EM transmittance therethrough, which showed transmittance (of EM radiation at a wavelength of about 460 nm) of at least about 70%.

The results are summarized in Table 2 below:

TABLE 2

| Material | Closed Coating of Ag? |
|---|---|
| HT211 | Present |
| HT01 | Present |
| TAZ | Present |
| Balq | Present |
| Liq | Present |
| Example Material 1 | Present |
| Example Material 2 | Present |
| Example Material 3 | Not Present |
| Example Material 4 | Not Present |
| Example Material 5 | Not Present |
| Example Material 6 | Not Present |
| Example Material 7 | Not Present |
| Example Material 8 | Not Present |
| Example Material 9 | Not Present |

Based on the foregoing, it was found that the materials used in the first 7 samples in Tables 1 and 2 (HT211 to Example Material 2) may have reduced applicability in some scenarios for inhibiting the deposition of the deposited material 831 thereon, including without limitation, at least one of: a metal, and an alloy, including without limitation, at least one of: Yb, Ag, Mg, and Ag-containing materials, including without limitation, MgAg.

On the other hand, it was found that Example Material 3 to Example Material 9 may have applicability in some scenarios, to act as a patterning coating 110 for inhibiting the deposition of the deposited material 831 including without limitation, at least one of: a metal, and an alloy, including without limitation, at least one of: Yb, Ag, Mg, and Ag-containing materials, including without limitation, MgAg, thereon.

Deposition Contrast

In some non-limiting examples, a material, including without limitation, a patterning material 711, that may function as an NIC for a given at least one of: a metal, and an alloy, including without limitation, at least one of: Mg, Ag, and MgAg, may have a substantially high deposition contrast when deposited on a substrate 10.

In some non-limiting examples, if a substrate 10 tends to act as a nucleation-promoting coating (NPC) 1020 (FIG. 10), and a portion thereof is coated with a material, including without limitation, a patterning material 711, that may tend to function as an NIC against deposition of a deposited material 831, including without limitation, at least one of: a metal, and an alloy, including without limitation, at least one of: Yb, Ag, Mg, and Ag-containing materials, including without limitation, MgAg, a coated portion (first portion 101) and an uncoated portion (second portion 102) may tend to have different at least one of: initial sticking probabilities, and nucleation rates, such that the deposited material 831 deposited thereon may tend to have different average film thicknesses.

As used herein, a quotient of an average film thickness of the deposited material 831 deposited in the second portion 102 divided by the average film thickness of the deposited material 831 in the first portion 101 in such scenario may be generally referred to as a deposition contrast. Thus, if the deposition contrast is substantially high, the average film thickness of the deposited material 831 in the second portion 102 may be substantially greater than the average film thickness of the deposited material 831 in the first portion 101.

In some non-limiting examples, a material, including without limitation, a patterning material 711, that may function as an NIC for a given deposited material 831, may have a substantially high deposition contrast when deposited on a substrate 10.

In some non-limiting examples, there may be a negative correlation between the initial sticking probability of at least one of: the patterning coating 110, and the patterning material 711, in some non-limiting examples, when deposited as at least one of: a film, and a coating, in a form, and under circumstances similar to the deposition of the patterning coating 110 within the device 100, against the deposition of the deposited material 831 and a deposition contrast thereof, that is, a low initial sticking probability may be highly correlated with a high deposition contrast.

In some non-limiting examples, if the deposition contrast is substantially high, there may be little to no deposited material 831 deposited in the first portion 101, when there is sufficient deposition of the deposited material 831 to form a closed coating 140 thereof in the second portion 102.

In some non-limiting examples, if the deposition contrast is substantially low, there may be a discontinuous layer 160 of at least one particle structure 150 of the deposited material 831 deposited in the first portion 101, when there is sufficient deposition of the deposited material 831 to form a closed coating 140 in the second portion 102.

In some non-limiting examples, there may be scenarios calling for the formation of a discontinuous layer 160 of at least one particle structure 150 of the deposited material 831, in the first portion 101, when an average layer thickness of a closed coating 140 of the deposited material 831 in the second portion 102 is substantially small, including without limitation, one of no more than about: 100, 50, 25, and 15, nm, including without limitation, the formation of nanoparticles (NPs) in the first portion 101, where absorption of EM radiation by such NPs is called for, including without limitation, to protect an underlying layer 1010 from EM radiation having a wavelength of no more than about 460 nm.

In some non-limiting examples, in such scenarios, there may be applicability for a deposition contrast of one of between about: 2-100, 4-50, 5-20, and 10-15.

In some non-limiting examples, a material, including without limitation, a patterning material 711, having a substantially low deposition contrast against deposition of a deposited material 831, may have reduced applicability in some scenarios calling for substantially high deposition contrast, including without limitation, where the average layer thickness of the deposited material 831 in the first portion 101 is large, including without limitation, one of at least about: 95, 45, 20, 10, and 8, nm.

In some non-limiting examples, a material, including without limitation, a patterning material 711, having a substantially low deposition contrast against deposition of a deposited material 831, may have reduced applicability in some scenarios calling for substantially high deposition contrast, including without limitation, scenarios calling for at least one of: the substantial absence of a closed coating 140, and a high density of, particle structures 150 in the first portion 101, including without limitation, when an average layer thickness of the deposited material 831 in the second portion 102 is large, including without limitation, one of at least about: 95, 45, 20, 10, and 8, nm, including without limitation, in some scenarios calling for the substantial absence of absorption of EM radiation in at least one of the visible spectrum and the NIR spectrum, including without limitation, scenarios calling for an increased transparency to EM radiation having a wavelength that is at least about 460 nm.

In some non-limiting examples, a material, including without limitation, a patterning material 711, having a substantially low deposition contrast against the deposition of a deposited material 831, may have applicability in some scenarios calling for at least one of: a discontinuous layer 160 of, and a low density of, particle structures 150 of the deposited material 831 in the first portion 101, when an average layer thickness of a closed coating 140 of the deposited material 831 in the second portion 102 is substantially high, including without limitation, one of at least about: 95, 45, 20, 10, and 8, nm. In some non-limiting examples, a deposition contrast of one of between about: 2-100, 4-50, 5-20, and 10-15, may have applicability in some scenarios when an average layer thickness of the deposited material 831 in the second portion 102 is substantially high, including without limitation, one of at least about: 95, 45, 20, 10, and 8, nm.

In some non-limiting examples, a material, including without limitation, a patterning material 711, may tend to have a substantially low deposition contrast if the initial sticking probability of such material against deposition of at least one of: a metal, and an alloy, including without limitation, at least one of: Mg, Ag, and MgAg, is substantially high.

Surface Energy

A characteristic surface energy, as used herein, in some non-limiting examples, with respect to a material, may generally refer to a surface energy determined from such material.

In some non-limiting examples, a characteristic surface energy may be measured from a surface formed by the material deposited (coated) in a thin film form.

Various methods and theories for determining the surface energy of a solid are known.

In some non-limiting examples, a surface energy may be calculated (derived) based on a series of contact angle measurements, in which various liquids may be brought into contact with a surface of a solid to measure the contact angle between the liquid-vapor interface and the surface. In some non-limiting examples, a surface energy of a solid surface may be equal to the surface tension of a liquid with the highest surface tension that completely wets the surface.

In some non-limiting examples, the critical surface tension of a surface may be determined according to the Zisman method, as further detailed in W. A. Zisman, *Advances in Chemistry* 43 (1964), pp. 1-51.

In some non-limiting examples, a characteristic surface energy of a material, including without limitation, a patterning material 711, in a coating, including without limitation, a patterning coating 110, may be determined by depositing the material as a substantially pure coating (e.g. a coating formed by a substantially pure material) on a substrate 10 and measuring a contact angle thereof with an applicable series of probe liquids.

In some non-limiting examples, a Zisman plot may be used to determine a maximum value of surface tension that would result in complete wetting (i.e. a contact angle $\theta_c$ of) 0° of the surface.

A material which has applicability for use in providing the patterning coating 110 may generally have a low surface energy when deposited as a thin film (coating) on a surface. In some non-limiting examples, a material with a low surface energy may exhibit low intermolecular forces.

Without wishing to be bound by any particular theory, it is now postulated that a material with a substantially high surface energy may have applicability at least in some applications that call for a high temperature reliability.

Without wishing to be bound by any particular theory, it has now been found that a patterning coating 110 comprising a material which, when deposited as a thin film, exhibits a substantially high surface energy, may, in some non-limiting examples, form a discontinuous layer 160 of at least one particle structure 150 of a deposited material 831 in the first portion 101, and a closed coating 140 of the deposited material 831 in the second portion 102, including without limitation, in cases where the thickness of the closed coating is, by way of non-limiting example, one of no more than about: 100, 75, 50, 25, and 15, nm.

In some non-limiting examples, a series of samples was fabricated to measure the critical surface tension of the surfaces formed by the various materials. The results of the measurement are summarized in Table 3:

TABLE 3

| Material | Critical Surface Tension (dynes/cm) |
|---|---|
| HT211 | 25.6 |
| HT01 | >24 |
| TAZ | 22.4 |
| Balq | 25.9 |
| Liq | 24 |
| Example Material 1 | 26.3 |
| Example Material 2 | 24.8 |
| Example Material 3 | 19 |
| Example Material 4 | 12.4 |
| Example Material 5 | 15.9 |
| Example Material 6 | 21.1 |
| Example Material 7 | 13.1 |
| Example Material 8 | 21 |
| Example Material 9 | 18.9 |

Based on the foregoing measurement of the critical surface tension in Table 3 and the previous observation regarding one of: the presence, and absence, of a substantially closed coating 140 of a deposited material 831, in the form of Ag, it was found that materials that form substantially low surface energy surfaces when deposited as a coating, including without limitation, a patterning coating 110, which in some non-limiting examples, may be those having a critical surface tension of one of between about: 13-20 dynes/cm, and 13-19 dynes/cm, may have applicability for forming the patterning coating 110 to inhibit deposition of a deposited material 831 thereon, including without limitation, at least one of Yb, Ag, Mg, and Ag-containing materials, including without limitation, MgAg.

Without wishing to be bound by any particular theory, it may be postulated that materials that form a surface having a surface energy lower than, by way of non-limiting example, about 13 dynes/cm, may have reduced applicability as a patterning material 711 in some scenarios, as such materials may exhibit at least one of: substantially poor adhesion to layer(s) surrounding such materials, a low melting point, and a low sublimation temperature.

In some non-limiting examples, a material, including without limitation, a patterning material 711 that may tend to function as an NIC for a deposited material 831, including without limitation, at least one of: a metal, and an alloy, including without limitation, at least one of: Mg, Ag, and Ag-containing materials, including without limitation, MgAg, may tend to exhibit a substantially low surface energy when deposited as a thin film (coating) on an exposed layer surface 11.

In some non-limiting examples, a material, including without limitation, a patterning material 711, may tend to exhibit a substantially low surface energy when deposited as a thin film (coating) on an exposed layer surface 11.

In some non-limiting examples, a material, including without limitation, a patterning material 711, with a substantially low surface energy may tend to exhibit substantially low inter-molecular forces.

In some non-limiting examples, there may be scenarios calling for a patterning material 711 that has a substantially low surface energy that is not unduly low.

In some non-limiting examples, a material, including without limitation, a patterning material 711, with a substantially high surface energy may have applicability for some scenarios to detect a film of such material using optical techniques.

Without wishing to be bound by any particular theory, it may be postulated that, in some non-limiting examples, a material, including without limitation, a patterning material 711, having a substantially high surface energy may have applicability for some scenarios that call for substantially high temperature reliability.

In some non-limiting examples, a material, including without limitation, a patterning material 711, that may function as an NIC for at least one of: a metal, and an alloy, including without limitation, at least one of Mg, Ag, and Ag-containing materials, including without limitation, MgAg, having a substantially high surface energy may have applicability in some scenarios calling for a discontinuous layer 160 of particle structures 150 of at least one of: the metal, and the alloy, in the first portion 101, when an average layer thickness of a continuous coating 140 of at least one of: the metal, and the alloy, in the second portion 102 is substantially low, including without limitation, one of no more than about: 100, 50, 25, and 15, nm.

In some non-limiting examples, a material, including without limitation, a patterning material 711, that may function as an NIC for a deposited material 831, including without limitation, at least one of: a metal, and an alloy, including without limitation, at least one of: Yb, Ag, Mg, and Ag-containing materials, including without limitation, MgAg, having a substantially low surface energy may have applicability in some scenarios calling for one of: a discontinuous layer 160 of, and a low density of, particle structures 150 of the deposited material 831 in the first portion 101, when an average layer thickness of a closed coating 140 of the deposited material 831 in the second portion 102 is substantially high, including without limitation, one of at least about: 95, 45, 20, 10, and 8, nm.

In some non-limiting examples, the surface of at least one of: the patterning coating 110, and the patterning material 711, in some non-limiting examples, when deposited as at least one of: a film, and a coating, in a form, and under circumstances similar to the deposition of the patterning coating 110 within the device 100, comprising the compounds described herein, may exhibit a surface energy of one of no more than about: 24, 22, 20, 18, 16, 15, 13, 12, and 11, dynes/cm.

In some non-limiting examples, the surface values in various non-limiting examples herein may correspond to such values measured at around normal temperature and pressure (NTP), which may correspond to a temperature of 20° C., and an absolute pressure of 1 atm.

In some non-limiting examples, the surface energy may be one of at least about: 6, 7, and 8, dynes/cm.

In some non-limiting examples, the surface energy may be one of between about: $10^{-20}$, and 13-19, dynes/cm.

Temperature

Glass Transition Temperature

In some non-limiting examples, at least one of: the patterning coating 110, and the patterning material 711, in some non-limiting examples, when deposited as at least one of: a film, and coating, in a form, and under circumstances similar to the deposition of the patterning coating 110 within the device 100, may have a glass transition temperature that is one of: (i) one of at least about: 300, 150, and 130° C., and (ii) one of no more than about: 30, 0, −30, and −50° C.

Sublimation Temperature

In some non-limiting examples, a material, including without limitation, a patterning material 711, having substantially low inter-molecular forces may tend to exhibit a substantially low sublimation temperature.

In some non-limiting examples, a material, including without limitation, a patterning material 711, having a substantially low sublimation temperature, may have reduced applicability for manufacturing processes that may call for substantially precise control of an average layer thickness in a deposited film of the material.

In some non-limiting examples, a material, including without limitation, a patterning material 711, having a sublimation temperature that is one of no more than about: 140, 120, 110, 100 and 90° C., may tend to encounter constraints on at least one of: the deposition rate and the average layer thickness, of a film comprising such material that may be deposited using known deposition methods, including without limitation, vacuum thermal evaporation.

In some non-limiting examples, a material, including without limitation, a patterning material 711, having a substantially high sublimation temperature may have applicability in some scenarios calling for substantially high precision in the control of the average layer thickness of a film comprising such material.

In some non-limiting examples, the patterning material may have a sublimation temperature of one of between about: 100-320, 120-300, 140-280, and 150-250° C. In some non-limiting examples, such sublimation temperature may allow the patterning material 711 to be substantially readily deposited as a coating using PVD.

In some non-limiting examples, a material with substantially low intermolecular forces may exhibit a substantially low sublimation temperature.

In some non-limiting examples, a material, including without limitation, a patterning material 711, having a substantially low sublimation temperature, may have reduced applicability for manufacturing processes that may call for substantially precise control of an average layer thickness of a closed coating 140 of the material.

In some non-limiting examples, a material, including without limitation, a patterning material 711, having a sublimation temperature that is one of no more than about: 140, 120, 110, 100 and 90° C., may tend to encounter constraints on at least one of: the deposition rate and the average layer thickness, of a film comprising such material that may be deposited using known deposition methods, including without limitation, vacuum thermal evaporation.

In some non-limiting examples, a material, including without limitation, a patterning material 711, having a substantially high sublimation temperature may have applicability in some scenarios calling for substantially high precision in the control of the average layer thickness of a film comprising such material.

The sublimation temperature of a material, including without limitation, a patterning material 711, may be determined using various methods apparent to those having ordinary skill in the relevant art, including without limitation, by heating the material in an evaporation source under a substantially high vacuum environment, in some non-limiting examples, about $10^{-4}$ Torr, and including without limitation, in a crucible and by determining a temperature that may be attained, to at least one of:

- observe commencement of the deposition of the material onto an exposed layer surface 11 on a QCM mounted a fixed distance from the crucible;
- observe a specific deposition rate, in some non-limiting examples, 0.1 Å/sec, onto an exposed layer surface 11 on a QCM mounted a fixed distance from the crucible; and
- reach a threshold vapor pressure of the material, in some non-limiting examples, one of about $10^{-4}$, and $10^{-5}$, Torr.

In some non-limiting examples, the QCM may be mounted about 65 cm away from the crucible for the purpose of determining the sublimation temperature.

In some non-limiting examples, the patterning material 711 may have a sublimation temperature of one of between about: 100-320, 100-300, 120-300, 100-250, 140-280, 120-230, 130-220, 140-210, 140-200, 150-250, and 140-190° C.

Melting Point

In some non-limiting examples, a material, including without limitation, a patterning material 711, with substantially low inter-molecular forces may tend to exhibit a substantially low melting point.

In some non-limiting examples, a material, including without limitation, a patterning material 711, having a substantially low melting point may have reduced applicability in some scenarios calling for substantial temperature reliability for temperatures of one of no more than about: 60, 80, and 100° C., in some non-limiting examples, because of changes in physical properties of such material at operating temperatures that approach the melting point.

In some non-limiting examples, a material with a melting point of about 120° C. may have reduced applicability in some scenarios calling for substantially high temperature reliability, including without limitation, of at least about: 100° C.

In some non-limiting examples, a material, including without limitation, a patterning material 711, having a substantially high melting point may have applicability in some scenarios calling for substantially high temperature reliability.

In some non-limiting examples, at least one of: the patterning coating 110 and the compound thereof may have a melting temperature that is one of at least about: 90, 100, 110, 120, 140, 150, and 180° C.

Cohesion Energy

According to Young's equation (Equation 13) the cohesion energy (fracture toughness/cohesion strength) of a material may tend to be proportional to its surface energy (cf. Young, Thomas (1805) "An essay on the cohesion of fluids", *Philosophical Transactions of the Royal Society of London,* 95:65-87).

According to Lindemann's criterion, the cohesion energy of a material may tend to be proportional to its melting temperature (cf. Nanda, K. K., Sahu, S. N, and Behera, S. N (2002), "Liquid-drop model for the size-dependent melting of low-dimensional systems" *Phys. Rev. A.* 66 (1): 013208).

In some non-limiting examples, a material, including without limitation, a patterning material 711, having substantially low inter-molecular forces may tend to exhibit a substantially low cohesion energy.

In some non-limiting examples, a material, including without limitation, a patterning material 711, having a substantially low cohesion energy may have reduced applicability in some scenarios that call for substantial fracture toughness, including without limitation, in a device that may tend to undergo at least one of: sheer, and bending, stress during at least one of: manufacture, and use, as such material may tend to crack (fracture) in such scenarios. In some non-limiting examples, a material, including without limitation, a patterning material 711, having a cohesion energy of no more than about 30 dynes/cm may have reduced applicability in some scenarios in a device manufactured on a flexible substrate 10.

In some non-limiting examples, a material, including without limitation, a patterning material 711, that has a substantially high cohesion energy, may have applicability in some scenarios calling for substantially high reliability under at least one of: sheer, and bending, stress, including without limitation, a device manufactured on a flexible substrate 10.

In some non-limiting examples, a material, including without limitation, a patterning material 711, having a surface energy that is substantially low but is not unduly low may have applicability in some scenarios that call for substantial reliability under at least one of: sheer, and bending, stress, including without limitation, a device manufactured on a flexible substrate 10.

Optical/Band Gap

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials may thus tend to exhibit electrical conductivity that is substantially no more than that of a conductive material (including without limitation, at least one of: a metal, and an alloy), but that is substantially at least as great as an insulating material (including without limitation, glass). In some non-limiting examples, the semiconductor material may comprise an organic semiconductor material. In some non-limiting examples, the semiconductor material may comprise an inorganic semiconductor material.

In some non-limiting examples, an optical gap of a material, including without limitation, a patterning material 711, may tend to correspond to the HOMO-LUMO gap of the material.

In some non-limiting examples, a material, including without limitation, a patterning material 711, having a substantially large/wide optical (HOMO-LUMO gap) may tend to exhibit substantially weak, including without limitation, substantially no, photoluminescence in at least one of: the deep B(lue) region of the visible spectrum, the near UV spectrum, the visible spectrum, and the NIR spectrum.

In some non-limiting examples, a material having a substantially small HOMO-LUMO gap may have applicability in some scenarios to detect a film of the material using optical techniques.

In some non-limiting examples, an optical gap of the patterning material 711 may be wider than a photon energy of the EM radiation emitted by the source, such that the patterning material 711 does not undergo photoexcitation when subjected to such EM radiation.

Refractive Index and Extinction Coefficient

In some non-limiting examples, at least one of: the patterning coating 110, and the patterning material 711, in some non-limiting examples, when deposited as at least one of: a film, and a coating, in a form, and under circumstances similar to the deposition of the patterning coating 110 within the device 100, may have a low refractive index.

In some non-limiting examples, at least one of: the patterning coating 110, and the patterning material 711, in some non-limiting examples, when deposited as at least one of: a film, and a coating, in a form, and under circumstances similar to the deposition of the patterning coating 110 within the device 100, may have a refractive index for EM radiation at a wavelength of 550 nm that may be one of no more than about: 1.55, 1.5, 1.45, 1.43, 1.4, 1.39, 1.37, 1.35, 1.32, and 1.3.

In some non-limiting examples, the refractive index, of the patterning coating 110 may be no more than about 1.7. In some non-limiting examples, the refractive index of the patterning coating 110 may be one of no more than about: 1.6, 1.5, 1.4, and 1.3. In some non-limiting examples, the refractive index of the patterning coating 110 may be one of between about: 1.2-1.6, 1.2-1.5, and 1.25-1.45. As further described in various non-limiting examples above, the patterning coating 110 exhibiting a substantially low refractive index may have application in some scenarios, to enhance at least one of: the optical properties, and performance, of the device, including without limitation, by enhancing outcoupling of EM radiation emitted by the opto-electronic device.

Without wishing to be bound by any particular theory, it has been observed that providing the patterning coating 110 having a substantially low refractive index may, at least in some devices 100, enhance transmission of external EM radiation through the second portion 102 thereof. In some non-limiting examples, devices 100 including an air gap therein, which may be arranged near to the patterning coating 110, may exhibit a substantially high transmittance when the patterning coating 110 has a substantially low refractive index relative to a similarly configured device in which such low-index patterning coating 110 was not provided.

In some non-limiting examples, a series of samples was fabricated to measure the refractive index at a wavelength of 550 nm for the coatings formed by some of the various example materials. The results of the measurement are summarized in Table 4 below:

TABLE 4

| Material | Refractive Index |
|---|---|
| HT211 | 1.76 |
| HT01 | 1.80 |
| TAZ | 1.69 |
| Balq | 1.69 |
| Liq | 1.64 |
| Example Material 2 | 1.72 |
| Example Material 3 | 1.37 |
| Example Material 5 | 1.38 |
| Example Material 7 | 1.3 |
| Example Material 8 | 1.37 |

Based on the foregoing measurement of refractive index in Table 4, and the previous observation regarding one of: the presence, and absence, of a substantially closed coating 140 of Ag in Table 4, it was found that materials that form a low refractive index coating, which in some non-limiting examples, may be those having a refractive index of one of no more than about: 1.4 and 1.38, may have applicability in some scenarios for forming the patterning coating 110 to substantially inhibit deposition of a deposited material 831 thereon, including without limitation, at least one of: a metal, and an alloy, including without limitation, at least one of: Yb, Ag, Mg, and an Ag-containing material, including without limitation, MgAg.

In some non-limiting examples, at least one of: the patterning coating 110, and the patterning material 711, in some non-limiting examples, when deposited as at least one of: a film, and a coating, in a form, and under circumstances similar to the deposition of the patterning coating 110 within the device 100, may have a low refractive index.

In some non-limiting examples, at least one of: the patterning coating 110, and the patterning material 711, in some non-limiting examples, when deposited as at least one of: a film, and a coating, in a form, and under circumstances similar to the deposition of the patterning coating 110 within the device 100, may have a refractive index for EM radiation at a wavelength of 550 nm that may be one of no more than about: 1.55, 1.5, 1.45, 1.43, 1.4, 1.39, 1.37, 1.35, 1.32, and 1.3.

In some non-limiting examples, the patterning coating 110 may be at least one of: substantially transparent, and EM radiation-transmissive.

In some non-limiting examples, at least one of: the patterning coating 110, and the patterning material 711, in some non-limiting examples, when deposited as at least one of: a film, and a coating, in a form, and under similar circumstances to the deposition of the patterning coating 110 within the device 100, may have an extinction coefficient that may be no more than about 0.01 for photons at a wavelength that is one of at least about: 600, 500, 460, 420, and 410, nm.

In some non-limiting examples, at least one of: the patterning coating 110, and the patterning material 711, in some non-limiting examples, when deposited as at least one of: a film, and a coating, in a form, and under circumstances similar to the deposition of the patterning coating 110 within the device 100, may have an extinction coefficient that may be one of at least about: 0.05, 0.1, 0.2, and 0.5, for EM radiation at a wavelength that is one of no more than about: 400, 390, 380, and 370, nm.

In this way, at least one of: the patterning coating 110, and the patterning material 711, when deposited as at least one of: a film, and a coating, in a form, and under circumstances similar to the deposition of the patterning coating 110 within the device 100, may absorb EM radiation in the UVA spectrum incident upon the device 100, thereby reducing a likelihood that EM radiation in the UVA spectrum may impart constraints in terms of at least one of: device performance, device stability, device reliability, and device lifetime.

In some non-limiting examples, the patterning coating 110 may exhibit an extinction coefficient of one of no more than about: 0.1, 0.08, 0.05, 0.03, and 0.01, in the visible light spectrum.

Photoluminescence. Absorption and Other Optical Effects

In some non-limiting examples, photoluminescence of at least one of: a coating, and a material may be observed through a photoexcitation process. In a photoexcitation process, at least one of: the coating, and the material, may be subjected to EM radiation emitted by a source, including without limitation, a UV lamp.

When the emitted EM radiation is absorbed by at least one of: the coating, and the material, the electrons thereof may be temporarily excited. Following excitation, at least one relaxation process may occur, including without limitation, at least one of: fluorescence and phosphorescence, in which EM radiation may be emitted from at least one of: the coating, and the material.

The EM radiation emitted from at least one of: the coating, and the material, during such process may be detected, for example, by a photodetector, to characterize the photoluminescence properties of at least one of: the coating, and the material.

As used herein, a wavelength of photoluminescence, in relation to at least one of: the coating, and the material, may generally refer to a wavelength of EM radiation emitted by such at least one of: the coating, and the material, as a result of relaxation of electrons from an excited state. As would be appreciated by a person having ordinary skill in the relevant art, a wavelength of light emitted by at least one of: the coating, and the material, as a result of the photoexcitation process may, in some non-limiting examples, be longer than a wavelength of radiation used to initiate photoexcitation. Photoluminescence may be detected using various techniques known in the art, including, without limitation, fluorescence microscopy.

In some non-limiting examples, the optical gap of the various coatings/materials may correspond to an energy gap of the coating/material from which EM radiation is one of: absorbed, and emitted, during the photoexcitation process.

In some non-limiting examples, photoluminescence may be detected by subjecting the coating/material to EM radiation having a wavelength corresponding to the UV spectrum, such as in some non-limiting examples, one of: UVA, and UVB, spectrum. In some non-limiting examples, EM radiation for causing photoexcitation may have a wavelength of about 365 nm.

In some non-limiting examples, the patterning material 711 may not substantially exhibit photoluminescence at any wavelength corresponding to the visible spectrum.

In some non-limiting examples, the patterning material 711 may not exhibit photoluminescence upon being subjected to EM radiation having a wavelength of one of at least about: 300, 320, 350, and 365, nm.

As used herein, at least one of: the coating, and the material, that is photoluminescent, may be one that exhibits photoluminescence at a wavelength when irradiated with an excitation radiation at a certain wavelength. In some non-limiting examples, at least one of: the coating, and the material, that is photoluminescent, may exhibit photoluminescence at a wavelength that exceeds about 365 nm, which is a wavelength of the radiation source frequently used in fluorescence microscopy, upon being irradiated with an excitation radiation having a wavelength of 365 nm.

At least one of: the coating, and the material, that is photoluminescent, may be detected on a substrate 10 using standard optical techniques including without limitation, fluorescence microscopy, which may establish the presence of such at least one of: the coating, and the material.

In some non-limiting examples, a coating, including without limitation, a patterning coating 110, may exhibit photoluminescence, including without limitation, by comprising a material that exhibits photoluminescence.

In some non-limiting examples, the presence of such patterning coating 110 may be detected (observed) using routine characterization techniques such as fluorescence microscopy upon deposition of the patterning coating 110.

In some non-limiting examples, a coating, including without limitation, a patterning coating 110, may exhibit photoluminescence at a wavelength corresponding to at least one of: the UV spectrum, and visible spectrum, including without limitation, by comprising a material that exhibits photoluminescence. In some non-limiting examples, photoluminescence may occur at a wavelength (range) corresponding to the UV spectrum, including, without limitation, one of: the UVA spectrum, and UVB spectrum. In some non-limiting examples, photoluminescence may occur at a wavelength (range) corresponding to the visible spectrum. In some non-limiting examples, photoluminescence may occur at a wavelength (range) corresponding to one of: deep B(lue) and near UV.

In some non-limiting examples, at least one of the materials of the patterning coating 110 that may exhibit photoluminescence may comprise at least one of: a conjugated bond, an aryl moiety, a donor-acceptor group, and a heavy metal complex.

In some non-limiting examples, a coating, including without limitation, a patterning coating 110, comprised of a material, including without limitation, a patterning material 711, having substantially weak to no photoluminescence (absorption) in a wavelength range of one of at least about: 365, and 460, nm, may tend to not act as one of: a photoluminescent, and an absorbing, coating and may have applicability in some scenarios calling for substantially high transparency in at least one of: the visible spectrum, and the NIR spectrum.

In some non-limiting examples, such material may tend to exhibit substantially low photoluminescence upon being subjected to EM radiation having a wavelength of about 365 nm, which is a wavelength of the radiation source frequently used in fluorescence microscopy. The presence of such materials, including without limitation, a patterning material 711, especially when deposited, in some non-limiting examples, as a thin film, may have reduced applicability in some scenarios calling for typical optical detection techniques, including without limitation, fluorescence microscopy. This may impose constraints in some scenarios in which such material may be selectively deposited, for example through an FMM, over part(s) of a substrate 10, as there may be some scenarios for determining, following the deposition of the material, the part(s) in which such materials are present.

In some non-limiting examples, a material with substantially low to no absorption at a wavelength that is one of at least about: 365, and 460, nm, may have applicability in some scenarios calling for substantially high transparency in at least one of: the visible spectrum, and the NIR spectrum.

In some non-limiting examples, at least one of: the patterning coating 110, and the patterning material 711, in some non-limiting examples, when deposited as at least one of: a film, and a coating, in a form, and under circumstances similar to the deposition of the patterning coating 110 within the device 100, may not substantially attenuate EM radiation passing therethrough, in at least the visible spectrum.

In some non-limiting examples, at least one of: the patterning coating 110, and the patterning material 711, when deposited as at least one of: a film, and a coating, in a form, and under circumstances similar to the deposition of the patterning coating 110 within the device 100, may not substantially attenuate EM radiation passing therethrough, in at least one of: the IR spectrum, and the NIR spectrum.

In this way, at least one of: the patterning coating 110, and the patterning material 711, when deposited as at least one of: a film, and a coating, in a form, and under circumstances similar to the deposition of the patterning coating 110 within the device 100, may absorb EM radiation in the UVA spectrum incident upon the device 100, thereby reducing a likelihood that EM radiation in the UVA spectrum may impart constraints in terms of at least one of: device performance, device stability, device reliability, and device lifetime.

In some non-limiting examples, the patterning coating 110 may act as an optical coating.

In some non-limiting examples, the patterning coating 110 may modify at least one of: at least one property, and at least one characteristic, of EM radiation (including without limitation, in the form of photons) emitted by the device 100. In some non-limiting examples, the patterning coating 110 may exhibit a degree of haze, causing emitted EM radiation to be scattered. In some non-limiting examples, the patterning coating 110 may comprise a crystalline material for causing EM radiation transmitted therethrough to be scattered. Such scattering of EM radiation may facilitate enhancement of the outcoupling of EM radiation from the device 100 in some non-limiting examples. In some non-limiting examples, the patterning coating 110 may initially be deposited as a substantially non-crystalline, including without limitation, substantially amorphous, coating, whereupon, after deposition thereof, the patterning coating 110 may become crystallized and thereafter serve as an optical coupling.

In some non-limiting examples, the patterning material 711 may exhibit insignificant, including without limitation, no detectable, absorption when subjected to EM radiation having a wavelength of one of at least about: 300, 320, 350, and 365, nm.

In some non-limiting examples, the patterning coating 110 may not exhibit any substantial EM radiation absorption at any wavelength corresponding to the visible spectrum.

Average Layer Thickness

In some non-limiting examples, an average layer thickness of the patterning coating 110 may be one of no more than about: 10, 8, 7, 6, and 5, nm.

Weight

Without wishing to be bound by any particular theory, it may be postulated that, for compounds that are adapted to form surfaces with substantially low surface energy, there may be scenarios calling for, in at least some applications, the molecular weight of such compounds to be one of between about: 800-3,000, 900-2,000, 900-1,800, and 900-1,600, g/mol.

In some non-limiting examples, the molecular weight of the compound of the at least one patterning material 711 may be no more than about 5,000 g/mol. In some non-limiting examples, the molecular weight of the compound may be one of no more than about: 4,500, 4,000, 3,800, and 3,500, g/mol.

In some non-limiting examples, the molecular weight of the compound of the at least one patterning material 711 may be at least about 800 g/mol. In some non-limiting examples, the molecular weight of the compound may be one of at least about: 1,500, 1,700, 2,000, 2,200, and 2,500, g/mol.

In some non-limiting examples, the molecular weight of the compound may be one of between about: 800-3,000, 900-2,000, 900-1,800, and 900-1,600, g/mol.

In some non-limiting examples, a percentage of the molar weight of such compound that may be attributable to the presence of F atoms, may be one of between about: 40-90, 45-85, 50-80, 55-75, and 60-75%. In some non-limiting examples, F atoms may constitute a majority of the molar weight of such compound.

Inter-Relationships Between Patterning Coating Attributes

Without wishing to be bound by any particular theory, it may be postulated that exposed layer surfaces 11 exhibiting low initial sticking probability with respect to the deposited material 831, including without limitation, at least one of: a metal, and an alloy, including without limitation, Yb, Ag, Mg, and an Ag-containing material, including without limitation, MgAg, may exhibit high transmittance. Without wishing to be bound by any particular theory, it may be postulated that exposed layer surfaces 11 exhibiting high sticking probability with respect to the deposited material 831, including without limitation, at least one of: a metal, and an alloy, including without limitation, Yb, Ag, Mg, and an Ag-containing material, including without limitation, MgAg, may exhibit low transmittance.

In some non-limiting examples, a material, including without limitation, a patterning material 711, may tend to have a substantially high initial sticking probability against deposition of a deposited material, including without limitation, at least one of: a metal, and an alloy, including without limitation, at least one of: Yb, Ag, Mg, and an Ag-containing material, including without limitation, MgAg, if the material has a substantially high surface energy.

In some non-limiting examples, a patterning material 711 that has a substantially low surface tension that is not unduly low, may have applicability in some scenarios calling for a substantially high melting point, including without limitation, between about 15-22 dynes/cm.

In some non-limiting examples, a material, including without limitation, a patterning material 711, having a surface tension that is substantially low, but not unduly low, may have applicability in some scenarios that call for a substantially high sublimation temperature.

In some non-limiting examples, a coating, including without limitation, a patterning coating 110, comprised of a material, including without limitation, a patterning material 711, having a substantially low surface energy and a substantially high sublimation temperature may have application in some scenarios calling for substantially high precision in the control of the average layer thickness of a film comprising such material.

Without wishing to be bound by any particular theory, it may be postulated that materials that form an exposed layer surface 11 having a surface energy of no more than, in some non-limiting examples, about 13 dynes/cm, may have reduced applicability as a patterning material 711 in some scenarios, as such materials may exhibit at least one of: substantially low adhesion to layer(s) surrounding such materials, a substantially low melting point, and a substantially low sublimation temperature.

In some non-limiting examples, a patterning coating 110 having a substantially low surface energy and a substantially high melting point may have applicability in some scenarios calling for high temperature reliability. In some non-limiting examples, there may be challenges in achieving such a combination from a single material given that in some non-limiting examples, a single material having a low surface energy may tend to exhibit a low melting point.

Without wishing to be bound by any particular theory, it may be postulated that such compounds may exhibit at least one property that may have applicability in some scenarios for forming at least one of: a coating, and layer, having at least one of: (i) a substantially high melting point, in some non-limiting examples, of at least 100° C., (ii) a substantially low surface energy, and (iii) a substantially amorphous structure, when deposited, in some non-limiting examples, using vacuum-based thermal evaporation processes.

In some non-limiting examples, a coating, including without limitation, a patterning coating 110, having a substantially low surface energy, a substantially high cohesion energy, and a substantially high melting point may have applicability in some scenarios that call for substantially high reliability under various conditions. In some non-limiting examples, there may be challenges in achieving such a combination from a single material, given that, in some non-limiting examples, a unitary material having a substantially low surface energy may tend to exhibit a substantially low cohesion energy and a substantially low melting point.

In some non-limiting examples, a material, including without limitation, a patterning material 711, having a substantially low surface energy and a substantially high cohesion energy may have applicability in some scenarios that call for substantially high reliability under at least one of: sheer, and bending, stress. In some non-limiting examples, there may be challenges in achieving such a combination from a single material, given that, in some non-limiting examples, a thin film formed substantially of a single material having a substantially low surface energy may tend to exhibit a substantially low cohesion energy.

In some non-limiting examples, a material, including without limitation, a patterning material 711, having a substantially low surface energy may tend to exhibit at least one of: a substantially large, and substantially wide, optical gap. In some non-limiting examples, the optical gap of a material, including without limitation, a patterning material 711, may tend to correspond to the HOMO-LUMO gap of the material.

In general, a material with a low surface energy may exhibit at least one of: a large, and wide, optical gap which, by way of non-limiting example, may correspond to the HOMO-LUMO gap of the material.

It has also now been found, that a patterning coating 110 formed by a compound exhibiting a substantially low surface energy may also exhibit a substantially low refractive index.

In some non-limiting examples, at least one of: the patterning coating 110, and the patterning material 711, may exhibit a surface energy of no more than about 25 dynes/cm and a refractive index of no more than about 1.45. In some non-limiting examples, at least one of: the patterning coating 110, and the patterning material 711, may comprise a material exhibiting a surface energy of no more than about 20 dynes/cm and a refractive index of no more than about 1.4.

In some non-limiting examples, a material, including without limitation, a patterning material 711, having a substantially low surface energy may have applicability in some scenarios calling for substantially weak to no, at least one of:

photoluminescence, and absorption, in a wavelength range that is one of at least about: 365, and 460, nm.

In some non-limiting examples, a material, including without limitation, a patterning material 711, having at least one of: a substantially large, and substantially wide optical gap (and HOMO-LUMO gap) may tend to exhibit a substantially weak to no photoluminescence in at least one of: the deep B(lue) region of the visible spectrum, the near UV spectrum, the visible spectrum, and the NIR spectrum.

Without wishing to be bound by any particular theory, it may be postulated that, for compounds that are adapted to form surfaces with substantially low surface energy, there may be an aim, in at least some applications, for the molecular weight of such compounds to be one of between about: 1,500-5,000, 1,500-4,500, 1,700-4,500, 2,000-4,000, 2,200-4,000, and 2,500-3,800, g/mol.

At least some materials with at least one of: one of: a large, and wide, optical gap, and HOMO-LUMO gap, may exhibit substantially weak to no photoluminescence in at least one of: the visible spectrum, the deep B(lue) region thereof, and the near UV spectrum. In some non-limiting examples, a material with a substantially small HOMO-LUMO gap may have applicability in applications to detect a film of the material using optical techniques. In some non-limiting examples, a material with higher surface energy may have applicability for applications to detect of a film of the material using optical techniques.

In some non-limiting examples, a material having a substantially large HOMO-LUMO gap may have applicability in some scenarios calling for weak to no at least one of: photoluminescence, and absorption, in a wavelength range of one of at least about: 365, and 460, nm.

Doping

In some non-limiting examples, the patterning coating 110 may exhibit, including without limitation, because of at least one of: the patterning material 711 used, and the deposition environment, at least one nucleation site for the deposited material 831.

In some non-limiting examples, the patterning coating 110 may be provided with another material that may act as at least one of: a seed, and heterogeneity, to act as such a nucleation site for the deposited material 831. In some non-limiting examples, such other material may comprise an NPC 1020 material. In some non-limiting examples, such other material may comprise an organic material, such as in some non-limiting examples, at least one of: a polycyclic aromatic compound, and a material comprising a non-metallic element, such as, without limitation, at least one of: O, S, N, and C, whose presence might otherwise be a contaminant in at least one of: the source material, equipment used for deposition, and the vacuum chamber environment. In some non-limiting examples, such other material may be deposited in a layer thickness that is a fraction of a monolayer, to avoid forming a closed coating 140 thereof. Rather, the monomers of such other material may tend to be spaced apart in the lateral aspect so as form discrete nucleation sites for the deposited material.

Plurality of Patterning Materials

In some non-limiting examples, forming a patterning coating 110 of a single patterning material 711 against the deposition of a deposited material 831, including without limitation, at least one of: a given metal, and a given alloy, including without limitation, at least one of: Yb, Ag, Mg, and Ag-containing materials, including without limitation, MgAg, that satisfied constraints of at least one material property selected from at least one of: initial sticking probability, transmittance, deposition contrast, surface energy, glass transition temperature, melting point, sublimation temperature, evaporation temperature, cohesion energy, optical gap, photoluminescence, refractive index, extinction coefficient, absorption, other optical effect, average layer thickness, molecular weight, and composition, for a given scenario, may impose challenges, given the substantially complex inter-relationships between the various material properties.

In some non-limiting examples, the patterning coating 110 may comprise a plurality of materials. In some non-limiting examples, the patterning coating 110 may comprise a first material and a second material.

In some non-limiting examples, at least one of the plurality of materials of the patterning coating 110 may serve as an NIC when deposited as a thin film.

In some non-limiting examples, at least one of the plurality of materials of the patterning coating 110 may serve as an NIC when deposited as a thin film, and another material thereof may form an NPC 1020 when deposited as a thin film. In some non-limiting examples, the first material may form an NPC 1020 when deposited as a thin film, and the second material may form an NIC when deposited as a thin film. In some non-limiting examples, the presence of the first material in the patterning coating 110 may result in an increased initial sticking probability thereof compared to cases in which the patterning coating 110 is formed of the second material and is substantially devoid of the first material.

In some non-limiting examples, at least one of the materials of the patterning coating 110 may be adapted to form a surface having a low surface energy when deposited as a thin film. In some non-limiting examples, the first material, when deposited as a thin film, may be adapted to form a surface having a lower surface energy than a surface provided by a thin film comprising the second material.

In some non-limiting examples, the patterning coating 110 may exhibit photoluminescence, including without limitation, by comprising a material which exhibits photoluminescence.

In some non-limiting examples, the first material may exhibit photoluminescence at a wavelength corresponding to the visible spectrum, and the second material may not exhibit substantial photoluminescence at any wavelength corresponding to the visible spectrum.

In some non-limiting examples, the second material may not substantially exhibit photoluminescence at any wavelength corresponding to the visible spectrum. In some non-limiting examples, the second material may not exhibit photoluminescence upon being subjected to EM radiation having a wavelength of one of at least about: 300, 320, 350, and 365, nm. In some non-limiting examples, the second material may exhibit insignificant to no detectable absorption when subjected to such EM radiation.

In some non-limiting examples, the second optical gap of the second material may be wider than the photon energy of the EM radiation emitted by the source, such that the second material does not undergo photoexcitation when subjected to such EM radiation. However, in some non-limiting examples, the patterning coating 110 comprising such second material may nevertheless exhibit photoluminescence upon being subjected to EM radiation due to the first material exhibiting photoluminescence. In some non-limiting examples, the presence of the patterning coating 110 may be detected using routine characterization techniques such as fluorescence microscopy upon deposition of the patterning coating 110.

In some non-limiting examples, the first material may have a first optical gap, and the second material may have a second optical gap. In some non-limiting examples, the second optical gap may exceed the first optical gap. In some non-limiting examples, a difference between the first optical gap and the second optical gap may exceed one of about: 0.3, 0.5, 0.7, 1, 1.3, 1.5, 1.7, 2, 2.5, and 3, eV.

In some non-limiting examples, the first optical gap may be one of no more than about: 4.1, 3.5, and 3.4, eV. In some non-limiting examples, the second optical gap may exceed one of about: 3.4, 3.5, 4.1, 5, and 6.2, eV.

In some non-limiting examples, at least one of: the first optical gap, and the second optical gap, may correspond to the HOMO-LUMO gap.

In some non-limiting examples, an optical gap of at least one of: the various coatings, and materials, including without limitation, at least one of: the first optical gap, and the second optical gap, may correspond to an energy gap of at least one of: the coating, and the material, from which EM radiation is at least one of: absorbed, and emitted, during the photoexcitation process.

In some non-limiting examples, a concentration, including without limitation by weight, of the first material in the patterning coating 110 may be no more than that of the second material in the patterning coating 110. In some non-limiting examples, the patterning coating 110 may comprise one of at least about: 0.1, 0.2, 0.5, 0.8, 1, 3, 5, 8, 10, 15, and 20, wt. %, of the first material. In some non-limiting examples, the patterning coating 110 may comprise one of no more than about: 50, 40, 30, 25, 20, 15, 10, 8, 5, 3, and 1, wt. %, of the first material. In some non-limiting examples, a remainder of the patterning coating 110 may be substantially comprised of the second material. In some non-limiting examples, the patterning coating 110 may comprise additional materials, including without limitation, at least one of: a third material, and a fourth material.

In some non-limiting examples, at least one of the materials of the patterning coating 110, including without limitation, the first material and the second material, may comprise at least one of: F, and Si. By way of non-limiting example, at least one of: the first material, and the second material, may comprise at least one of: F, and Si. In some further non-limiting examples, the first material may comprise at least one of: F, and Si, and the second material may comprise at least one of: F, and Si. In some non-limiting examples, the first material and the second material both may comprise F. In some non-limiting examples, the first material and the second material both may comprise Si. In some non-limiting examples, each of the first material and the second material may comprise at least one: F, and Si.

In some non-limiting examples, at least one material of the first material and the second material may comprise both F and Si. In some non-limiting examples, one of the first material and the second material may not comprise at least one of: F, and Si. In some non-limiting examples, the second material may comprise at least one of: F, and Si, and the first material may not comprise at least one of: F, and Si.

In some non-limiting examples, at least one of the materials of the patterning coating 110, which in some non-limiting examples, may be at least one of: the first material, and the second material, may comprise F, and at least one of the other materials of the patterning coating 110 may comprise an $sp^2$ carbon. In some non-limiting examples, at least one of the materials of the patterning coating 110, including without limitation, at least one of: the first material, and the second material, may comprise F, and at least one of the other materials of the patterning coating 110 may comprise an $sp^3$ carbon. In some non-limiting examples, at least one of the materials of the patterning coating 110, including without limitation, at least one of: the first material, and the second material, may comprise F and an $sp^3$ carbon, and at least one of the other materials of the patterning coating 110 may comprise an $sp^2$ carbon. In some non-limiting examples, at least one of the materials of the patterning coating 110, including without limitation, at least one of: the first material, and the second material, may comprise F and an $sp^3$ carbon wherein all F bonded to a C may be bonded to an $sp^3$ carbon, and at least one of the other materials of the patterning coating 110 may comprise an $sp^2$ carbon. In some non-limiting examples, at least one of the materials of the patterning coating 110, including without limitation, at least one of: the first material, and the second material, may comprise F and an $sp^3$ carbon wherein all F bonded to C may be bonded to an $sp^3$ carbon, and at least one of the other materials of the patterning coating 110 may comprise an $sp^2$ carbon and may not comprise F. By way of non-limiting example, in any of the foregoing non-limiting examples, "at least one of the materials of the patterning coating 110" may correspond to the second material, and the "at least one of the other materials of the patterning coating 110" may correspond to the first material.

As would be appreciated by those having ordinary skill in the relevant art, the presence of materials in a coating which comprises at least one of: F, $sp^2$ carbon, $sp^3$ carbon, an aromatic hydrocarbon moiety, other functional groups, and other moieties, may be detected using various methods known in the art, including by way of non-limiting example, X-ray Photoelectron Spectroscopy (XPS).

In some non-limiting examples, at least one of the materials of the patterning coating 110, which by way of non-limiting example may be at least one of: the first material, and the second material, may comprise F, and at least one of the other materials of the patterning coating 110 may comprise an aromatic hydrocarbon moiety. In some non-limiting examples, at least one of the materials of the patterning coating 110, including without limitation, at least one of: the first material, and the second material, may comprise F, and at least one of the materials of the patterning coating 110 may not comprise an aromatic hydrocarbon moiety. In some non-limiting examples, at least one of the materials of the patterning coating 110, including without limitation, at least one of: the first material, and the second material, may comprise F and may not comprise an aromatic hydrocarbon moiety, and at least one of the other materials of the patterning coating 110 may comprise an aromatic hydrocarbon moiety. In some non-limiting examples, at least one of the materials of the patterning coating 110, including without limitation, at least one of: the first material, and the second material, may comprise F and may not comprise an aromatic hydrocarbon moiety, and at least one of the other materials of the patterning coating 110 may comprise an aromatic hydrocarbon moiety and may not comprise F. In some non-limiting examples, the aromatic hydrocarbon moiety may comprise at least one of: a substituted polycyclic aromatic hydrocarbon moiety, an unsubstituted polycyclic aromatic hydrocarbon moiety, a substituted phenyl moiety, and an unsubstituted phenyl moiety.

In some non-limiting examples, at least one of the materials of the patterning coating 110, including without limitation, at least one of: the first material, and the second material, may comprise F, and at least one of the other materials of the patterning coating 110 may comprise a polycyclic aromatic hydrocarbon moiety. In some non-limiting examples, at least one of the materials of the patterning coating 110, including without limitation, at least one of: the first material, and the second material, may comprise F, and at least one of the materials of the patterning coating 110 may not comprise a polycyclic aromatic hydrocarbon moiety. In some non-limiting examples, at least one of the materials of the patterning coating 110, including without limitation, at least one of: the first material, and the second material, may comprise F and may not comprise a polycyclic aromatic hydrocarbon moiety, and at least one of the other materials of the patterning coating 110 may comprise a polycyclic aromatic hydrocarbon moiety. In some non-limiting examples, at least one of the materials of the patterning coating 110, including without limitation, at least one of: the first material, and the second material, may comprise F and may not comprise a polycyclic aromatic hydrocarbon moiety, and at least one of the other materials of the patterning coating 110 may comprise a polycyclic aromatic hydrocarbon moiety and may not comprise F.

In some non-limiting examples, at least one of the materials of the patterning coating 110, including without limitation, at least one of: the first material, and the second material, may comprise at least one of: a fluorocarbon moiety and a siloxane moiety, and at least one of the other materials of the patterning coating 110 may comprise a polycyclic aromatic hydrocarbon moiety. In some non-limiting examples, at least one of the materials of the patterning coating 110, including without limitation, at least one of: the first material, and the second material, may comprise at least one of: a fluorocarbon moiety, and a siloxane moiety, and at least one of the materials of the patterning coating 110 may not comprise a polycyclic aromatic hydrocarbon moiety. In some non-limiting examples, at least one of the materials of the patterning coating 110, including without limitation, at least one of: the first material, and the second material, may comprise at least one of: a fluorocarbon moiety, and a siloxane moiety, and may not comprise a polycyclic aromatic hydrocarbon moiety, and at least one of the other materials of the patterning coating 110 may comprise a polycyclic aromatic hydrocarbon moiety. In some non-limiting examples, at least one of the materials of the patterning coating 110, including without limitation, at least one of: the first material, and the second material, may comprise at least one of: a fluorocarbon moiety, and a siloxane moiety, and may not comprise a polycyclic aromatic hydrocarbon moiety, and at least one of the other materials of the patterning coating 110 may comprise a polycyclic aromatic hydrocarbon moiety and may not comprise at least one of: a fluorocarbon moiety, and a siloxane moiety.

In some non-limiting examples, at least one of the materials of the patterning coating 110, including without limitation, at least one of: the first material, and the second material, may comprise F, and at least one of the other materials of the patterning coating 110 may comprise a phenyl moiety. In some non-limiting examples, at least one of the materials of the patterning coating 110, including without limitation, at least one of: the first material, and the second material, may comprise F, and at least one of the materials of the patterning coating 110 may not comprise a phenyl moiety. In some non-limiting examples, at least one of the materials of the patterning coating 110, including without limitation, at least one of: the first material, and the second material, may comprise F and may not comprise a phenyl moiety, and at least one of the other materials of the patterning coating 110 may comprise a phenyl moiety. In some non-limiting examples, at least one of the materials of the patterning coating 110, including without limitation, at least one of: the first material, and the second material, may comprise F and may not comprise a phenyl moiety, and at least one of the other materials of the patterning coating 110 may comprise a phenyl moiety and may not comprise F.

In some non-limiting examples, at least one of the materials of the patterning coating 110, including without limitation, at least one of: the first material, and the second material, may comprise at least one of: a fluorocarbon moiety and a siloxane moiety, and at least one of the other materials of the patterning coating 110 may comprise a phenyl moiety. In some non-limiting examples, at least one of the materials of the patterning coating 110, including without limitation, at least one of: the first material, and the second material, may comprise at least one of: a fluorocarbon moiety, and a siloxane moiety, and at least one of the materials of the patterning coating 110 may not comprise a phenyl moiety. In some non-limiting examples, at least one of the materials of the patterning coating 110, including without limitation, at least one of: the first material, and the second material, may comprise at least one of: a fluorocarbon moiety, and a siloxane moiety and may not comprise a phenyl moiety, and at least one of the other materials of the patterning coating 110 may comprise a phenyl moiety. In some non-limiting examples, at least one of the materials of the patterning coating 110, including without limitation, at least one of: the first material, and the second material, may comprise at least one of: a fluorocarbon moiety, and a siloxane moiety and may not comprise a phenyl moiety, and at least one of the other materials of the patterning coating 110 may comprise a phenyl moiety and may not comprise either of: a fluorocarbon moiety, and a siloxane moiety.

In general, at least one of: the molecular structures, and molecular compositions, of the materials of the patterning coating 110, including without limitation, at least one of: the first material, and the second material, may be different. In some non-limiting examples, the materials may be selected such that they possess at least one property which is one of: substantially similar to, and substantially different from, one another, including without limitation, at least one of: at least one of: a molecular structure of a monomer, a monomer backbone, and a functional group; a presence of a element in common; a similarity in molecular structure; a characteristic surface energy; a refractive index; a molecular weight; and a thermal property, including without limitation, at least one of: a melting temperature, a sublimation temperature, a glass transition temperature, and a thermal decomposition temperature.

A characteristic surface energy, as used herein, in some non-limiting examples, with respect to a material, may generally refer to a surface energy determined from such material. By way of non-limiting example, a characteristic surface energy may be measured from a surface formed by the material deposited in a thin film form. Various methods and theories for determining the surface energy of a solid are known. By way of non-limiting example, a surface energy may be determined based on a series of contact angle measurements, in which various liquids may be brought into contact with a surface of a solid to measure a contact angle between the liquid-vapor interface and the surface. In some non-limiting examples, a surface energy of a solid surface may be equal to the surface tension of a liquid with the highest surface tension that completely wets the surface. By way of non-limiting example, a Zisman plot may be used to determine a highest surface tension value that would result in complete wetting (i.e. contact angle of 0") of the surface.

In some non-limiting examples, at least one of: the first material, and the second material, of the patterning coating 110 may be an oligomer.

In some non-limiting examples, the first material may comprise a first oligomer, and the second material may comprise a second oligomer. Each of the first oligomer and the second oligomer may comprise a plurality of monomers.

In some non-limiting examples, at least a fragment of the molecular structure of the at least one of the materials of the patterning coating 110, including without limitation, at least one of: the first material, and the second material, may be represented by Formula (I):

$$(\mathrm{Mon})_n \qquad \text{(I)}$$

where:

Mon represents a monomer, and n is an integer of at least 2.

In some non-limiting examples, n may be an integer of one of between about: 2-100, 2-50, 3-20, 3-15, 3-10, and 3-7.

In some non-limiting examples, the molecular structure of the first material and the second material of the patterning coating 110 may each be independently represented by Formula (I). By way of non-limiting example, at least one of: the monomer, and n, of the first material may be different from that of the second material. In some non-limiting examples, n of the first material may be the same as n of the second material. In some non-limiting examples, n of the first material may be different from n of the second material. In some non-limiting examples, the first material and the second material may be oligomers.

In some non-limiting examples, the monomer may comprise at least one of: F, and Si.

In some non-limiting examples, the monomer may comprise a functional group. In some non-limiting examples, at least one functional group of the monomer may have a low surface tension. In some non-limiting examples, at least one functional group of the monomer may comprise at least one of: F, and Si. In some non-limiting examples, such functional group may comprise at least one of: a fluorocarbon group, and a siloxane group. In some non-limiting examples, the monomer may comprise a silsesquioxane group.

While some non-limiting examples have been described herein with reference to a first material and a second material, it will be appreciated that the patterning coating may further include at least one additional material, and descriptions regarding at least one of: the molecular structures, and properties, of at least one of: the first material, the second material, the first oligomer, and the second oligomer, may be applicable with respect to additional materials which may be contained in the patterning coating 110.

The surface tension attributable to a fragment of a molecular structure, including without limitation, at least one of: a monomer, a monomer backbone unit, a linker, and a functional group, may be determined using various known methods in the art, including without limitation, the use of a Parachor, such as may be further described, by way of non-limiting example, in "Conception and Significance of the Parachor", *Nature* 196:890-891. In some non-limiting examples, at least one functional group of the monomer may have a surface tension of one of no more than about: 25, 21, 20, 19, 18, 17, 16, 15, 14, 13, 12, 11, and 10, dynes/cm.

In some non-limiting examples, the monomer may comprise at least one of: a $CF_2$, and a $CF_2H$, moiety. In some non-limiting examples, the monomer may comprise at least one of: a $CF_2$, and a $CF_3$, moiety. In some non-limiting examples, the monomer may comprise a $CH_2CF_3$ moiety. In some non-limiting examples, the monomer may comprise at least one of: C, and O. In some non-limiting examples, the monomer may comprise a fluorocarbon monomer. In some non-limiting examples, the monomer may comprise at least one of: a vinyl fluoride moiety, a vinylidene fluoride moiety, a tetrafluoroethylene moiety, a chlorotrifluoroethylene moiety, a hexafluoropropylene moiety, and a fluorinated 1,3-dioxole moiety.

In some non-limiting examples, the monomer may comprise a monomer backbone and a functional group. In some non-limiting examples, the functional group may be bonded, one of: directly, and via a linker group, to the monomer backbone. In some non-limiting examples, the monomer may comprise the linker group, and the linker group may be bonded to the monomer backbone and to the functional group. In some non-limiting examples, the monomer may comprise a plurality of functional groups, which may be one of: the same, and different, from one another. In such examples, each functional group may be bonded, one of: directly, and via a linker group, to the monomer backbone. In some non-limiting examples, where a plurality of functional groups is present, a plurality of linker groups may also be present.

In some non-limiting examples, the molecular structure of at least one of the materials of the patterning coating 110, which may be at least one of: the first material, and the second material, may comprise a plurality of different monomers. In some non-limiting examples, such molecular structure may comprise monomer species that have different at least one of: molecular composition, and molecular structure. In some non-limiting examples, such molecular structure may comprise those represented by Formulae (II) and (III):

$$(\mathrm{Mon}^A)_k(\mathrm{Mon}^B)_m \qquad \text{(II)}$$

$$(\mathrm{Mon}^A)_m(\mathrm{Mon}^A)_m(\mathrm{Mon}^C)_o \qquad \text{(III)}$$

where:

$\mathrm{Mon}^A$, $\mathrm{Mon}^B$, and $\mathrm{Mon}^C$ each represent a monomer specie, and k, m, and o each represent an integer of at least 2.

In some non-limiting examples, k, m, and o each represent an integer of one of between about: 2-100, 2-50, 3-20, 3-15, 3-10, and 3-7. Those having ordinary skill in the relevant art will appreciate that various non-limiting examples and descriptions regarding monomer, Mon, may be applicable with respect to each of $\mathrm{Mon}^A$, $\mathrm{Mon}^B$, and $\mathrm{Mon}^C$.

In some non-limiting examples, the monomer may be represented by Formula (IV):

$$\mathrm{M}—(\mathrm{L}—\mathrm{R}_x)_y \qquad \text{(IV)}$$

where:

M represents the monomer backbone unit,

L represents the linker group,

R represents the functional group, x is an integer between 1 and 4, and y is an integer between 1 and 3.

In some non-limiting examples, the linker group may be represented by at least one of: a single bond, O, N, NH, C, CH, $CH_2$, and S.

Various non-limiting examples of the functional group which have been described herein may apply with respect to R of Formula (IV). In some non-limiting examples, the functional group R may comprise an oligomer unit, and the oligomer unit may further comprise a plurality of functional group monomer units. In some non-limiting examples, a functional group monomer unit may be at least one of: $CH_2$, and $CF_2$. In some non-limiting examples, a functional group may comprise a $CH_2CF_3$ moiety. For example, such functional group monomer units may be bonded together to form at least one of: an alkyl, and an fluoroalkyl, oligomer unit. In some non-limiting examples, the oligomer unit may further comprise a functional group terminal unit. In some non-limiting examples, the functional group terminal unit may be arranged at a terminal end of the oligomer unit and bonded to a functional group monomer unit. In some non-limiting examples, the terminal end at which the functional group terminal unit may be arranged may correspond to a fragment of the functional group that may be distal to the monomer backbone unit. In some non-limiting examples, the functional group terminal unit may comprise at least one of: $CF_2H$, and $CF_3$.

In some non-limiting examples, the monomer backbone unit M may have a high surface tension. In some non-limiting examples, the monomer backbone unit may have a higher surface tension than at least one of the functional group(s) R bonded thereto. In some non-limiting examples, the monomer backbone unit may have a higher surface tension than any functional group R bonded thereto.

In some non-limiting examples, the monomer backbone unit may have a surface tension of one of at least about: 25, 30, 40, 50, 75, 100; 150, 200, 250, 500, 1,000, 1,500, and 2,000, dynes/cm.

In some non-limiting examples, the monomer backbone unit may comprise phosphorus (P) and N, including without limitation, a phosphazene, in which there is a double bond between P and N and may be represented as at least one of: "NP" and "N=P". In some non-limiting examples, the monomer backbone unit may comprise Si and O, including without limitation, silsesquioxane, which may be represented as $SiO_{3/2}$.

In some non-limiting examples, at least a part of the molecular structure of the at least one of the materials of the patterning coating 110, including without limitation, at least one of: the first material, and the second material, is represented by Formula (V):

$$(NP\text{-}(L\text{-}R_x)_y)_n \quad \text{(V)}$$

where:

NP represents the phosphazene monomer backbone unit,

L represents the linker group,

R represents the functional group, x is an integer between 1 and 4, y is an integer between 1 and 3, and n is an integer of at least 2.

In some non-limiting examples, the molecular structure of at least one of: the first material, and the second material, may be represented by Formula (V). In some non-limiting examples, at least one of: the first material, and the second material, may be a cyclophosphazene. In some non-limiting examples, the molecular structure of the cyclophosphazene may be represented by Formula (V).

In some non-limiting examples, Z may represent oxygen (O), x may be 1, and R may represent a fluoroalkyl group. In some non-limiting examples, at least a fragment of the molecular structure of the at least one material of the patterning coating 110, including without limitation, at least one of: the first material, and the second material, may be represented by Formula (VI):

$$(NP(OR_f)_2)_n \quad \text{(VI)}$$

where:

$R_f$ represents the fluoroalkyl group, and n is an integer between 3 and 7.

In some non-limiting examples, the fluoroalkyl group may comprise at least one of: a $CF_2$ group, a $CF_2H$ group, $CH_2CF_3$ group, and a $CF_3$ group. In some non-limiting examples, the fluoroalkyl group may be represented by Formula (VII):

(VII)

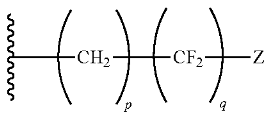

where:

p is an integer of 1 to 5;

q is an integer of 6 to 20; and

Z represents one of: hydrogen, and F.

In some non-limiting examples, p may be 1 and q may be an integer between 6 and 20.

In some non-limiting examples, the fluoroalkyl group $R_f$ in Formula (VI) may be represented by Formula (VII).

In some non-limiting examples, at least a fragment of the molecular structure of at least one of the materials of the patterning coating 110, including without limitation, at least one of: the first material, and the second material, may be represented by Formula (VIII):

$$(SiO_{3/2}\text{—}(L\text{-}R))_n \quad \text{(VIII)}$$

where:

represents the linker group,

R represents the functional group, and n is an integer between 6 and 12.

In some non-limiting examples, may represent the presence of at least one of: a single bond, O, substituted alkyl, and unsubstituted alkyl. In some non-limiting examples, n may be at least one of: 8, 10, and 12. In some non-limiting examples, R may comprise a functional group with low surface tension. In some non-limiting examples, R may comprise at least one of: a F-containing group, and a Si-containing group. In some non-limiting examples, R may comprise at least one of: a fluorocarbon group, and a siloxane-containing group. In some non-limiting examples, R may comprise at least one of: a $CF_2$ group, and a $CF_2H$ group. In some non-limiting examples, R may comprise at least one of: a $CF_2$, and a $CF_3$, group. In some non-limiting examples, R may comprise a $CH_2CF_3$ group. In some non-limiting examples, the material represented by Formula (VIII) may be a polyoctahedral silsesquioxane.

In some non-limiting examples, at least a fragment of the molecular structure of at least one of the materials of the patterning coating 110, including without limitation, at least one of: the first material, and the second material, may be represented by Formula (IX):

$$(SiO_{3/2}—R_f)_n \qquad \text{(IX)}$$

where:

n is an integer of 6-12, and $R_f$ represents a fluoroalkyl group.

In some non-limiting examples, n may be at least one of: 8, 10, and 12. In some non-limiting examples, $R_f$ may comprise a functional group with low surface tension. In some non-limiting examples, $R_f$ may comprise at least one of: a $CF_2$ moiety, and a $CF_2H$ moiety. In some non-limiting examples, $R_f$ may comprise at least one of: a $CF_2$, and a $CF_3$ moiety. In some non-limiting examples, $R_f$ may comprise a $CH_2CF_3$ moiety. In some non-limiting examples, the material represented by Formula (IX) may be a polyoctahedral silsesquioxane.

In some non-limiting examples, the fluoroalkyl group, $R_f$, in Formula (IX) may be represented by Formula (VII).

In some non-limiting examples, at least a fragment of the molecular structure of at least one of the materials of the patterning coating 110, including without limitation, at least one of: the first material, and the second material, may be represented by Formula (X):

$$(SiO_{3/2}—(CH_2)_x(CF_3))_n \qquad \text{(X)}$$

where:

x is an integer between 1 and 5, and n is an integer between 6 and 12.

In some non-limiting examples, n may be at least one of: 8, 10, and 12.

In some non-limiting examples, the compound represented by Formula (X) may be a polyoctahedral silsesquioxane.

In some non-limiting examples, at least one of: the functional group R, and the fluoroalkyl group $R_f$, may be selected independently upon each occurrence of such group in any of the foregoing formulae. Those having ordinary skill in the relevant art will appreciate that any of the foregoing formulae may represent a sub-structure of the compound, and at least one of: additional groups, and additional moieties, may be present, which are not explicitly shown in the above formulae. Those having ordinary skill in the relevant art will appreciate that various formulae provided in the present application may represent at least one of: linear, branched, cyclic, cyclo-linear, and cross-linked, structures.

In some non-limiting examples, the patterning coating 110 may comprise at least one material represented by at least one of the following Formulae: (I), (II), (III), (IV), (V), (VI), (VIII), (IX), and (X), and at least one material exhibiting at least one of the following characteristics: includes an aromatic hydrocarbon moiety, includes an $sp^2$ carbon, includes a phenyl moiety, has a characteristic surface energy of at least about 20 dynes/cm, and exhibits photoluminescence, including without limitation, exhibiting photoluminescence at a wavelength of at least about 365 nm upon being irradiated by an excitation radiation having a wavelength of about 365 nm.

In some non-limiting examples, the patterning coating may comprise a third material that is different from the first material and the second material. In some non-limiting examples, the third material may comprise a monomer in common with at least one of: the first material, and the second material.

In some non-limiting examples, a difference in the sublimation temperature of the plurality of materials of the patterning coating 110, including, without limitation, a difference between the first material and the second material, may be one of no more than about: 5, 10, 15, 20, 30, 40, and 50° C. In some non-limiting examples, at least one of the materials of the patterning coating 110, including without limitation, at least one of: the first material, and the second material, may comprise at least one of: F, and Si, and the sublimation temperatures of the materials of the patterning coating 110 may differ by no more than one of about: 5, 10, 15, 20, 25, 40, and 50° C. In some non-limiting examples, at least one of the materials of the patterning coating 110, including without limitation, at least one of: the first material, and the second material, may comprise at least one of: a fluorocarbon moiety, and a siloxane moiety, and the sublimation temperatures of the materials of the patterning coating 110 may differ by one of no more than about: 5, 10, 15, 20, 25, 40, and 50° C.

In some non-limiting examples, a difference in a melting temperature of the plurality of materials of the patterning coating 110, including, without limitation, a difference between the first material and the second material, may be one of no more than about: 5, 10, 15, 20, 30, 40, and 50° C. In some non-limiting examples, at least one of the materials of the patterning coating 110, including without limitation, the first material, and the second material, may comprise at least one of: F, and Si, and the melting temperatures of the materials of the patterning coating 110 may differ by one of no more than about: 5, 10, 15, 20, 25, 40, and 50° C. In some non-limiting examples, at least one of the materials of the patterning coating 110, including without limitation, the first material, and the second material, may comprise at least one of: a fluorocarbon moiety, and a siloxane moiety, and the melting temperatures of the materials of the patterning coating 110 may differ by one of no more than about: 5, 10, 15, 20, 25, 40, and 50° C.

In some non-limiting examples, at least one of the materials of the patterning coating 110, including without limitation, at least one of: the first material, and the second material, may have a low characteristic surface energy. In some non-limiting examples, at least one of the materials of the patterning coating 110, including without limitation, the first material, and the second material, may have a low characteristic surface energy, and at least one of the materials of the patterning coating 110 may comprise at least one of: F, and Si. In some non-limiting examples, at least one of the materials of the patterning coating 110, including without limitation, at least one of: the first material, and the second material, may have a low characteristic surface energy, may comprise at least one of: F, and Si, and at least one other material of the patterning coating 110 may have a high characteristic surface energy. In some non-limiting examples, the presence of F and Si may be accounted for by the presence of a fluorocarbon moiety and a siloxane moiety, respectively. In some non-limiting examples, at least one of the materials, including without limitation, the second material, may have a low characteristic surface energy of one of between about: 10-20, 12-20, 15-20, and 17-19, dynes/cm, and another material, including without limitation, the first material, may have a high characteristic surface energy of one of between about: 20-100, 20-50, and 25-45, dynes/cm. In some non-limiting examples, at least one of the materials may comprise at least one of: F, and Si. In some non-limiting examples, the second material may comprise at least one of: F, and Si.

In some non-limiting examples, at least one of the materials of the patterning coating 110, including without limitation, the second material, may have a low characteristic surface energy of no more than about 20 dynes/cm and may comprise at least one of: F, and Si, and another material, including without limitation, the first material, may have a characteristic surface energy of at least about 20 dynes/cm.

In some non-limiting examples, at least one of the materials of the patterning coating 110, including without limitation, the second material, may have a low characteristic surface energy of no more than about 20 dynes/cm and may comprise at least one of: a fluorocarbon moiety, and a siloxane moiety, and another material of the patterning coating 110, including without limitation, the first material, may have a characteristic surface energy of at least about 20 dynes/cm.

In some non-limiting examples, the surface energy of each of the at least two materials of the patterning coating 110, including, without limitation, those of the first material and the second material, may be one of no more about: 25, 21, 20, 19, 18, 17, 16, 15, 14, 13, 12, 11, and 10, dynes/cm.

In some non-limiting examples, a refractive index at a wavelength at least one of: 500, and 460, nm, of at least one of the materials of the patterning coating 110, including without limitation, at least one of: the first material, and the second material, may be one of no more than about: 1.5, 1.45, 1.44, 1.43, 1.42, and 1.41. In some non-limiting examples, the patterning coating 110 may comprise at least one material that exhibits photoluminescence, and the patterning coating 110 may have a refractive index, at a wavelength of at least one of: 500, and 460, nm, of one of no more than about: 1.5, 1.45, 1.44, 1.43, 1.42, and 1.41.

In some non-limiting examples, a molecular weight of at least one of the materials of the patterning coating 110, including without limitation, at least one of: the first material, and the second material, may be one of at least about: 750, 1,000, 1,500, 2,000, 2,500, and 3,000, g/mol.

In some non-limiting examples, a molecular weight of at least one of the materials of the patterning coating 110, including without limitation, at least one of: the first material, and the second material, may be one of no more than about: 10,000, 7,500, and 5,000, g/mol.

In some non-limiting examples, the patterning coating 110 may comprise a plurality of materials exhibiting similar thermal properties, wherein at least one of the materials may exhibit photoluminescence. In some non-limiting examples, the patterning coating 110 may comprise a plurality of materials with similar thermal properties, wherein at least one of the materials may photoluminescence, and wherein at least one of the materials, may comprise at least one of: F, and Si. In some non-limiting examples, the patterning coating 110 may comprise a plurality of materials with similar thermal properties, including without limitation, at least one of: a melting temperature, and a sublimation temperature, of the materials, wherein at least one of the materials may exhibit photoluminescence at a wavelength of at least about 365 nm when excited by a radiation having an excitation wavelength of about 365 nm, and wherein at least one of the materials may comprise at least one of: F, and Si.

In some non-limiting examples, the patterning coating 110 may comprise a plurality of materials having at least one of: at least one element in common, and at least one sub-structure in common, wherein at least one of the materials may exhibit photoluminescence. In some non-limiting examples, at least one of the materials may comprise F and Si. In some non-limiting examples, the patterning coating 110 may comprise a plurality of materials with similar thermal properties, wherein at least one of the materials may exhibit photoluminescence at a wavelength that is at least about 365 nm when excited by a radiation having an excitation wavelength of about 365 nm, and wherein at least one of the materials may comprise at least one of: F, and Si. In some non-limiting examples, the at least one element in common may comprise at least one of: F, and Si. In some non-limiting examples, the at least one sub-structure in common may comprise at least one of: fluorocarbon, fluoroalkyl, and siloxyl.

In some non-limiting examples, a method for manufacturing an opto-electronic device 100 may comprise actions of: depositing a patterning coating 110 on a first exposed layer surface 11 of the device 100 in a first portion 101 of a lateral aspect thereof; and depositing a deposited material 831 on a second exposed layer surface 11 of the device 100 in a second portion 102 of the lateral aspect thereof. An initial sticking probability against deposition of the deposited material 831 onto an exposed layer surface 11 of the patterning coating 110 in the first portion 101, may be substantially less than the initial sticking probability against deposition of the deposited material 831 onto an exposed layer surface 11 in the second portion 102, such that the exposed layer surface 11 of the patterning coating 110 in the first portion 101 may be substantially devoid of a closed coating 140 of the deposited material 831. The patterning coating 110 deposited on the first exposed layer surface 11 of the device 100 may comprise a first material and a second material.

In some non-limiting examples, depositing the patterning coating 110 on the first exposed layer surface 11 of the device 100 may comprise providing a mixture comprising a plurality of materials, and causing the mixture to be deposited onto the first exposed layer surface 11 of the device 100 to form the patterning coating 110 thereon. In some non-limiting examples, the mixture may comprise the first material and the second material. In some non-limiting examples, the first material and the second material may both be deposited onto the first exposed layer surface 11 to form the patterning coating 110 thereon.

In some non-limiting examples, the mixture comprising the plurality of materials may be deposited onto the first exposed layer surface 11 of the device 100 by a PVD process, including without limitation, thermal evaporation. In some non-limiting examples, the patterning coating 110 may be formed by evaporating the mixture from a single evaporation source and causing the mixture to be deposited on the first exposed layer surface 11 of the device 100. In some non-limiting examples, the mixture comprising, by way of non-limiting example, the first material and the second material, may be placed in a single evaporation source (crucible) to be heated under vacuum. Once the evaporation temperature of the materials is reached, a vapor flux generated therefrom may be directed towards the first exposed layer surface 11 of the device 100 to cause the deposition of the patterning coating 110 thereon.

In some non-limiting examples, the patterning coating 110 may be deposited by co-evaporation of the first material and the second material. In some non-limiting examples, the first material may be evaporated from a first evaporation source, and the second material may be concurrently evaporated from a second evaporation source such that the mixture may be formed in the vapor phase and may be co-deposited onto the first exposed layer surface 11 to provide the patterning coating 110 thereon.

In order to evaluate properties of certain example patterning coatings 110 comprising at least two materials, a series of samples were fabricated by depositing, in vacuo, an approximately 20 nm thick layer of an organic material that may be used as an HTL material, followed by depositing, over the organic material layer, a nucleation modifying coating having varying compositions as summarized in Table 5 below.

TABLE 5

| Sample Identifier | Composition of Nucleation Modifying Coating |
|---|---|
| Sample 1 | Patterning Material (15 nm) |
| Sample 2 | Patterning Material: PL Material 1 (0.5%, 15 nm) |
| Sample 3 | Patterning Material: PL Material 2 (0.5%, 15 nm) |
| Sample 4 | PL Material 1 (10 nm) |
| Sample 5 | PL Material 2 (10 nm) |
| Sample 6 | No nucleation modifying coating provided |

In the present example, the patterning material was selected such that, for example when deposited as a thin film, the patterning material exhibits a low initial sticking probability against deposition of the deposited material(s) 831, including without limitation, at least one of: Ag, and Yb.

In the present example, PL Material 1 and PL Material 2 were selected such that, by way of non-limiting example, when deposited as a thin film, each of PL Material 1 and PL Material 2 may exhibit photoluminescence detectable by standard optical measurement techniques including without limitation, fluorescence microscopy.

In Table 5, Sample 1 is a comparison sample in which the nucleation modifying coating was provided by depositing the Patterning Material. Sample 2 is an example sample in which the nucleation modifying coating was provided by co-depositing the Patterning Material and PL Material 1 together to form a coating comprising PL Material 1 in a concentration of 0.5 vol. %. Sample 3 is an example sample in which the nucleation modifying coating was provided by co-depositing the Patterning Material and PL Material 2 to form a coating comprising PL Material 2 in a concentration of 0.5 vol. %. Sample 4 is a comparison sample in which the nucleation modifying coating was provided by depositing PL Material 1. Sample 5 is a comparison sample in which the nucleation modifying coating was provided by depositing PL Material 2. Sample 6 is a comparison sample in which no nucleation modifying coating was provided over the organic material layer.

The photoluminescence (PL) response of each of Sample 1, Sample 2, Sample 3, and Sample 6 were measured. It was observed that the PL intensities of Sample 1 and Sample 6 were identical, thus indicating that the Patterning Material does not exhibit photoluminescence in the detected wavelength range. For each of Sample 2 and Sample 3, photoluminescence was detected in wavelengths of between about 500-600 nm.

Each of Samples 1 to 6 was then subjected to an open mask deposition of Yb, followed by Ag. Specifically, the surfaces of the nucleation modifying coatings formed by the above materials were subjected to an open mask deposition of Yb, followed by Ag. More specifically, each sample was subjected to a Yb vapor flux until a reference thickness of about 1 nm was reached, followed by an Ag vapor flux until a reference thickness of about 12 nm was reached. Once the samples were fabricated, optical transmission measurements were taken to determine the amount of at least one of: Yb, and Ag, deposited on the exposed layer surface 11 of the nucleation modifying coatings. Those having ordinary skill in the relevant art will appreciate that samples having little to no metal present thereon may be substantially transparent, while samples with metal deposited thereon, particularly as a closed coating 140, may generally exhibit a substantially lower light transmittance. Accordingly, the performance of various example coatings as a patterning coating 110 may be assessed by measuring the EM radiation transmission, which may directly correlate to an amount (thickness) of metallic deposited material deposited thereon from deposition of either of both of Yb and Ag.

The reduction in optical transmittance as a function of wavelength of each of Sample 1, Sample 2, Sample 3, Sample 4, Sample 5, and Sample 6 were measured. Additionally, a reduction in optical transmittance at a wavelength of 600 nm after each sample was subjected to an Ag vapor flux was measured and summarized in Table 6 below.

TABLE 6

| Sample Identifier | Transmittance Reduction (%) at $\lambda$ = 600 nm |
|---|---|
| Sample 1 | <1% |
| Sample 2 | <2% |
| Sample 3 | <1% |
| Sample 4 | 43% |
| Sample 5 | 47% |
| Sample 6 | 45% |

Specifically, the transmittance reduction (%) for each sample in Table 6 was determined by measuring the light transmission through the sample before and after the exposure to the Yb and Ag vapor flux and expressing the reduction in the EM radiation transmittance as a percentage.

As may be seen, Sample 1, Sample 2, and Sample 3 exhibited a substantially low transmittance reduction of less than 2%, and in the case of Samples 1 and 3, less than 1%. Accordingly, it may be observed that the nucleation modifying coatings provided for these samples acted as an NIC. By contrast, Sample 4, Sample 5, and Sample 6 each exhibited a transmittance reduction of 43, 47, and 45%, respectively. Accordingly, the nucleation modifying coatings provided for these samples did not act as an NIC but may have indeed acted as an NPC 1020.

Moreover, it was found that Sample 1, in which the patterning coating 110 was comprised of substantially only the NIC Material, did not exhibit photoluminescence. However, Sample 2 and Sample 3 in which the patterning coating 110 comprised PL Material 1 and PL Material 2, respectively, in addition to the NIC material, were found to exhibit photoluminescence while also acting as an NIC by providing a surface with low initial sticking probability against the deposition of the deposited material 831.

Deposited Layer

In some non-limiting examples, where the patterning coating 110 is restricted in its lateral extent to the first portion 101, in the second portion 102 of the lateral aspect of the device 100, a deposited layer 130 comprising a deposited material 831 may be disposed as a closed coating 140 on an exposed layer surface 11 of the underlying layer 1010.

In some non-limiting examples, the deposited layer 130 may comprise a deposited material 831.

In some non-limiting examples, the deposited material 831 may comprise an element selected from at least one of: potassium (K), sodium (Na), lithium (Li), Ba, cesium (Cs), Yb, Ag, gold (Au), Cu, Al, Mg, Zn, Cd, tin (Sn), and yttrium (Y). In some non-limiting examples, the element may comprise at least one of: K, Na, Li, Ba, Cs, Yb, Ag, Au, Cu, Al, and Mg. In some non-limiting examples, the element may comprise at least one of: Cu, Ag, and Au. In some non-limiting examples, the element may be Cu. In some non-limiting examples, the element may be Al. In some non-limiting examples, the element may comprise at least one of: Mg, Zn, Cd, and Yb. In some non-limiting examples, the element may comprise at least one of: Mg, Ag, Al, Yb, and Li. In some non-limiting examples, the element may comprise at least one of: Mg, Ag, and Yb. In some non-limiting examples, the element may comprise at least one of: Mg, and Ag. In some non-limiting examples, the element may be Ag.

In some non-limiting examples, the deposited material 831 may comprise a pure metal. In some non-limiting examples, the deposited material 831 may be (substantially) pure Ag. In some non-limiting examples, the substantially pure Ag may have a purity of one of at least about: 95, 99, 99.9, 99.99, 99.999, and 99.9995%. In some non-limiting examples, the deposited material 831 may be (substantially) pure Mg. In some non-limiting examples, the substantially pure Mg may have a purity of one of at least about: 95, 99, 99.9, 99.99, 99.999, and 99.9995%.

In some non-limiting examples, the deposited material 831 may comprise an alloy. In some non-limiting examples, the alloy may be one of: an Ag-containing alloy, an Mg-containing alloy, and an AgMg-containing alloy. In some non-limiting examples, the AgMg-containing alloy may have an alloy composition that may range from about 1:10 (Ag:Mg) to about 10:1 by volume.

In some non-limiting examples, the deposited material 831 may comprise other metals in one of: in place of, and in combination with, Ag. In some non-limiting examples, the deposited material 831 may comprise an alloy of Ag with at least one other metal. In some non-limiting examples, the deposited material 831 may comprise an alloy of Ag with at least one of: Mg, and Yb. In some non-limiting examples, such alloy may be a binary alloy having a composition between about 5-95 vol. % Ag, with the remainder being the other metal. In some non-limiting examples, the deposited material 831 may comprise Ag and Mg. In some non-limiting examples, the deposited material 831 may comprise an Ag:Mg alloy having a composition between about 1:10-10:1 by volume. In some non-limiting examples, the deposited material 831 may comprise Ag and Yb. In some non-limiting examples, the deposited material 831 may comprise a Yb:Ag alloy having a composition between about 1:20-10:1 by volume. In some non-limiting examples, the deposited material 831 may comprise Mg and Yb. In some non-limiting examples, the deposited material 831 may comprise an Mg:Yb alloy. In some non-limiting examples, the deposited material 831 may comprise Ag, Mg, and Yb. In some non-limiting examples, the deposited layer 130 may comprise an Ag:Mg:Yb alloy.

In some non-limiting examples, the deposited layer 130 may comprise at least one additional element. In some non-limiting examples, such additional element may be a non-metallic element. In some non-limiting examples, the non-metallic element may be at least one of: O, S, N, and C. It will be appreciated by those having ordinary skill in the relevant art that, in some non-limiting examples, such additional element(s) may be incorporated into the deposited layer 130 as a contaminant, due to the presence of such additional element(s) in at least one of: the source material, equipment used for deposition, and the vacuum chamber environment. In some non-limiting examples, the concentration of such additional element(s) may be limited to be below a threshold concentration. In some non-limiting examples, such additional element(s) may form a compound together with other element(s) of the deposited layer 130. In some non-limiting examples, a concentration of the non-metallic element in the deposited material 831 may be one of no more than about: 1, 0.1, 0.01, 0.001, 0.0001, 0.00001, 0.000001, and 0.0000001%. In some non-limiting examples, the deposited layer 130 may have a composition in which a combined amount of O and C therein may be one of no more than about: 10, 5, 1, 0.1, 0.01, 0.001, 0.0001, 0.00001, 0.000001, and 0.0000001%.

It has now been found, that reducing a concentration of certain non-metallic elements in the deposited layer 130, particularly in cases wherein the deposited layer 130 may be substantially comprised of at least one of: metal(s), and metal alloy(s), may facilitate selective deposition of the deposited layer 130. Without wishing to be bound by any particular theory, it may be postulated that certain non-metallic elements, such as, in some non-limiting examples, at least one of: O, and C, when present in the vapor flux 832 of at least one of: the deposited material 831, in the deposition chamber, and the environment, may be deposited onto the surface of the patterning coating 110 to act as nucleation sites for the metallic element(s) of the deposited layer 130. It may be postulated that reducing a concentration of such non-metallic elements that could act as nucleation sites may facilitate reducing an amount of deposited material 831 deposited on the exposed layer surface 11 of the patterning coating 110.

In some non-limiting examples, the deposited material 831 may be deposited on a metal-containing underlying layer 1010. In some non-limiting examples, the deposited material 831 and the underlying layer 1010 thereunder may comprise a metal in common.

In some non-limiting examples, the deposited layer 130 may comprise a plurality of layers of the deposited material 831. In some non-limiting examples, the deposited material 831 of a first one of the plurality of layers may be different from the deposited material 831 of a second one of the plurality of layers. In some non-limiting examples, the deposited layer 130 may comprise a multilayer coating. In some non-limiting examples, such multilayer coating may be one of: Yb/Ag, Yb/Mg, Yb/Mg:Ag, Yb/Yb:Ag, Yb/Ag/Mg, and Yb/Mg/Ag.

In some non-limiting examples, the deposited material 831 may comprise a metal having a bond dissociation energy, of one of no more than about: 300, 200, 165, 150, 100, 50, and 20, KJ/mol.

In some non-limiting examples, the deposited material 831 may comprise a metal having an electronegativity that is one of no more than about: 1.4, 1.3, and 1.2.

In some non-limiting examples, a sheet resistance of the deposited layer 130 may generally correspond to a sheet resistance of the deposited layer 130, measured in isolation from other components, layers, and parts of the device 100. In some non-limiting examples, the deposited layer 130 may be formed as a thin film. Accordingly, in some non-limiting examples, the characteristic sheet resistance for the deposited layer 130 may be determined based on at least one of: the composition, thickness, and morphology, of such thin film. In some non-limiting examples, the sheet resistance may be one of no more than about: 10, 5, 1, 0.5, 0.2, and 0.1, Q/p.

In some non-limiting examples, the deposited layer 130 may be disposed in a pattern that may be defined by at least one region therein that is substantially devoid of a closed coating 140 of the deposited layer 130. In some non-limiting examples, the at least one region may separate the deposited layer 130 into a plurality of discrete fragments thereof. In some non-limiting examples, each discrete fragment of the deposited layer 130 may be a distinct second portion 102. In some non-limiting examples, the plurality of discrete fragments of the deposited layer 130 may be physically spaced apart from one another in the lateral aspect thereof. In some non-limiting examples, at least two of such plurality of discrete fragments of the deposited layer 130 may be electrically coupled. In some non-limiting examples, at least two of such plurality of discrete fragments of the deposited layer 130 may be each electrically coupled with a common conductive coating, including without limitation, the underlying layer 1010, to allow the flow of electrical current between them. In some non-limiting examples, at least two of such plurality of discrete fragments of the deposited layer 130 may be electrically insulated from one another.

Selective Deposition Using Patterning Coatings

Figure 7:
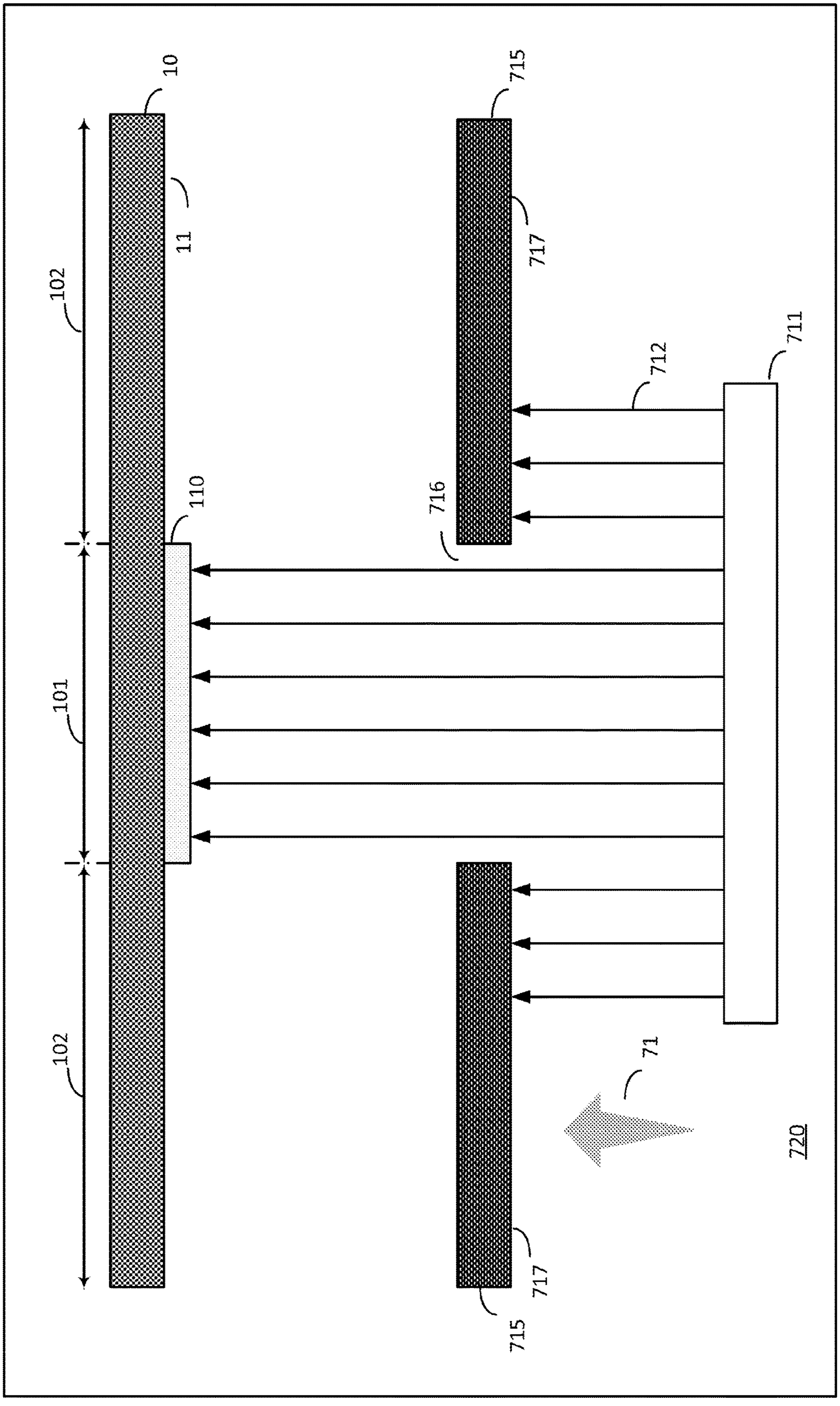
FIG. 7 is a schematic diagram showing an example process for depositing a patterning coating in a pattern on an exposed layer surface of an underlying layer in an example version of the device of FIG. 1, according to an example in the present disclosure.

FIG. 7 is an example schematic diagram illustrating a non-limiting example of an evaporative deposition process, shown generally at 700, in a chamber 720, for selectively depositing a patterning coating 110 onto a first portion 101 of an exposed layer surface 11 of the underlying layer 1010.

In the process 700, a quantity of a patterning material 711 may be heated under vacuum, to evaporate (sublime) the patterning material 711. In some non-limiting examples, the patterning material 711 may comprise substantially (including without limitation, entirely), a material used to form the patterning coating 110. In some non-limiting examples, such material may comprise an organic material.

An evaporated flux 712 of the patterning material 711 may flow through the chamber 720, including in a direction indicated by arrow 71, toward the exposed layer surface 11. When the evaporated flux 712 is incident on the exposed layer surface 11, the patterning coating 110 may be formed thereon.

In some non-limiting examples, as shown in the figure for the process 700, the patterning coating 110 may be selectively deposited only onto a portion, in the example illustrated, the first portion 101, of the exposed layer surface 11 of the underlying layer 1010, by the interposition, between the vapor flux 712 and the exposed layer surface 11 of the underlying layer 1010, of a shadow mask 715, which in some non-limiting examples, may be an FMM. In some non-limiting examples, such a shadow mask 715 may, in some non-limiting examples, be used to form substantially small features, with a feature size on the order of (smaller than) tens of microns.

The shadow mask 715 may have at least one aperture 716 extending therethrough such that a part of the evaporated flux 712 passes through the aperture 716 and may be incident on the exposed layer surface 11 to form the patterning coating 110. Where the evaporated flux 712 does not pass through the aperture 716 but is incident on a surface 717 of the shadow mask 715, it is precluded from being disposed on the exposed layer surface 11 to form the patterning coating 110. In some non-limiting examples, the shadow mask 715 may be configured such that the evaporated flux 712 that passes through the aperture 716 may be incident on the first portion 101 but not the second portion 102. The second portion 102 of the exposed layer surface 11 may thus be substantially devoid of the patterning coating 110. In some non-limiting examples (not shown), the patterning material 711 that is incident on the shadow mask 715 may be deposited on the surface 717 thereof.

Accordingly, a patterned surface may be produced upon completion of the deposition of the patterning coating 110.

Figure 8:
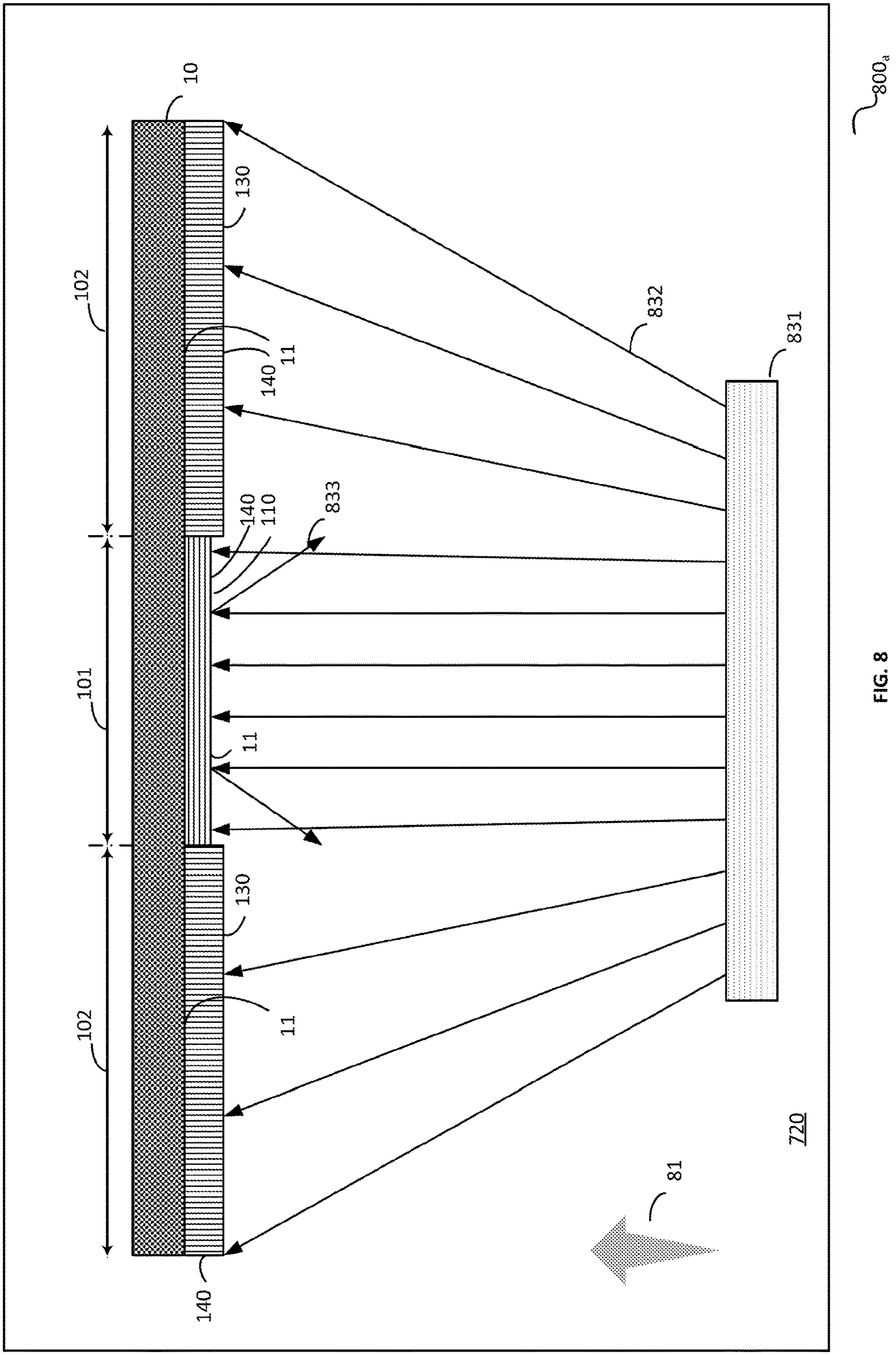
FIG. 8 is a schematic diagram showing an example process for depositing a deposited material in the second portion on an exposed layer surface that comprises the deposited pattern of the patterning coating of FIG. 7, where the patterning coating is a nucleation-inhibiting coating (NIC)

FIG. 8 is an example schematic diagram illustrating a non-limiting example of a result of an evaporative process, shown generally at $\mathbf{800}_a$, in a chamber 720, for selectively depositing a closed coating 140 of a deposited layer 130 onto the second portion 102 of an exposed layer surface 11 of the underlying layer 1010 that is substantially devoid of the patterning coating 110 that was selectively deposited onto the first portion 101, including without limitation, by the evaporative process 700 of FIG. 7.

In some non-limiting examples, the deposited layer 130 may be comprised of a deposited material 831, in some non-limiting examples, comprising at least one metal. It will be appreciated by those having ordinary skill in the relevant art that typically, a vaporization temperature of an organic material is low relative to the vaporization temperature of metals, such as may be employed as a deposited material 831.

Thus, in some non-limiting examples, there may be fewer constraints in employing a shadow mask 715 to selectively deposit a patterning coating 110 in a pattern, relative to directly patterning the deposited layer 130 using such shadow mask 715.

Once the patterning coating 110 has been deposited on the first portion 101 of the exposed layer surface 11 of the underlying layer 1010, a closed coating 140 of the deposited material 831 may be deposited, on the second portion 102 of the exposed layer surface 11 that is substantially devoid of the patterning coating 110, as the deposited layer 130.

In the process $\mathbf{800}_a$, a quantity of the deposited material 831 may be heated under vacuum, to sublime the deposited material 831. In some non-limiting examples, the deposited material 831 may be comprised of substantially, including without limitation, entirely, a material used to form the deposited layer 130.

An evaporated flux 832 of the deposited material 831 may be directed inside the chamber 720, including in a direction indicated by arrow 81, toward the exposed layer surface 11 of the first portion 101 and of the second portion 102. When the evaporated flux 832 is incident on the second portion 102 of the exposed layer surface 11, a closed coating 140 of the deposited material 831 may be formed thereon as the deposited layer 130.

In some non-limiting examples, deposition of the deposited material 831 may be performed using one of: an open mask, and a mask-free, deposition process.

It will be appreciated by those having ordinary skill in the relevant art that, contrary to that of a shadow mask 715, the feature size of an open mask may be generally comparable to the size of a device 100 being manufactured.

It will be appreciated by those having ordinary skill in the relevant art that, in some non-limiting examples, the use of an open mask may be omitted. In some non-limiting examples, an open mask deposition process described herein may alternatively be conducted without the use of an open mask, such that an entire target exposed layer surface 11 may be exposed.

Indeed, as shown in FIG. 8, the evaporated flux 832 may be incident both on an exposed layer surface 11 of the patterning coating 110 across the first portion 101 as well as the exposed layer surface 11 of the underlying layer 1010 across the second portion 102 that is substantially devoid of the patterning coating 110.

Since the exposed layer surface 11 of the patterning coating 110 in the first portion 101 may exhibit a substantially low initial sticking probability against the deposition of the deposited material 831 relative to the exposed layer surface 11 of the underlying layer 1010 in the second portion 102, the deposited layer 130 may be selectively deposited substantially only on the exposed layer surface 11, of the underlying layer 1010 in the second portion 102, that is substantially devoid of the patterning coating 110. By contrast, the evaporated flux 832 incident on the exposed layer surface 11 of the patterning coating 110 across the first portion 101 may tend to not be deposited (as shown 833), and the exposed layer surface 11 of the patterning coating 110 across the first portion 101 may be substantially devoid of a closed coating 140 of the deposited layer 130.

In some non-limiting examples, an initial deposition rate, of the evaporated flux 832 on the exposed layer surface 11 of the underlying layer 1010 in the second portion 102, may exceed one of about: 200, 550, 900, 1,000, 1,500, 1,900, and 2,000, times an initial deposition rate of the evaporated flux 832 on the exposed layer surface 11 of the patterning coating 110 in the first portion 101.

Thus, the combination of the selective deposition of a patterning coating 110 in FIG. 7 using a shadow mask 715 and one of: the open mask, and a mask-free, deposition of the deposited material 831 may result in a version 800*a* of the device 100 shown in FIG. 8.

After selective deposition of the patterning coating 110 across the first portion 101, a closed coating 140 of the deposited material 831 may be deposited over the device $\mathbf{800}_a$ as the deposited layer 130, in some non-limiting examples, using one of: an open mask, and a mask-free, deposition process, but may remain substantially only within the second portion 102, which is substantially devoid of the patterning coating 110.

The patterning coating 110 may provide, within the first portion 101, an exposed layer surface 11 with a substantially low initial sticking probability, against the deposition of the deposited material 831, and that is substantially less than the initial sticking probability, against the deposition of the deposited material 831, of the exposed layer surface 11 of the underlying layer 1010 of the device $\mathbf{800}_a$ within the second portion 102.

Thus, the first portion 101 may be substantially devoid of a closed coating 140 of the deposited material 831.

While the present disclosure contemplates the patterned deposition of the patterning coating 110 by an evaporative deposition process, involving a shadow mask 715, those having ordinary skill in the relevant art will appreciate that, in some non-limiting examples, this may be achieved by any applicable deposition process, including without limitation, a micro-contact printing process.

While the present disclosure contemplates the patterning coating 110 being an NIC, those having ordinary skill in the relevant art will appreciate that, in some non-limiting examples, the patterning coating 110 may be an NPC 1020. In such examples, the portion (such as, without limitation, the first portion 101) in which the NPC 1020 has been deposited may, in some non-limiting examples, have a closed coating 140 of the deposited material 831, while the other portion (such as, without limitation, the second portion 102) may be substantially devoid of a closed coating 140 of the deposited material 831.

In some non-limiting examples, an average layer thickness of the patterning coating 110 and of the deposited layer 130 deposited thereafter may be varied according to a variety of parameters, including without limitation, a given application and given performance characteristics. In some non-limiting examples, the average layer thickness of the patterning coating 110 may be comparable to, including without limitation, substantially no more than, an average layer thickness of the deposited layer 130 deposited thereafter. Use of a substantially thin patterning coating 110 to achieve selective patterning of a deposited layer 130 may have applicability to provide flexible devices 100.

In some non-limiting examples, the device 200 may further comprise an NPC 1020 disposed between the patterning coating 110 and the second electrode 240.

In some non-limiting examples, the patterning coating 110 may be formed concurrently with the at least one semiconducting layer(s) 230. In some non-limiting examples, at least one material used to form the patterning coating 110 may also be used to form the at least one semiconducting layer(s) 230 to reduce a number of stages for fabricating the device 200.

Edge Effects

Patterning Coating Transition Region

Figure 9A:
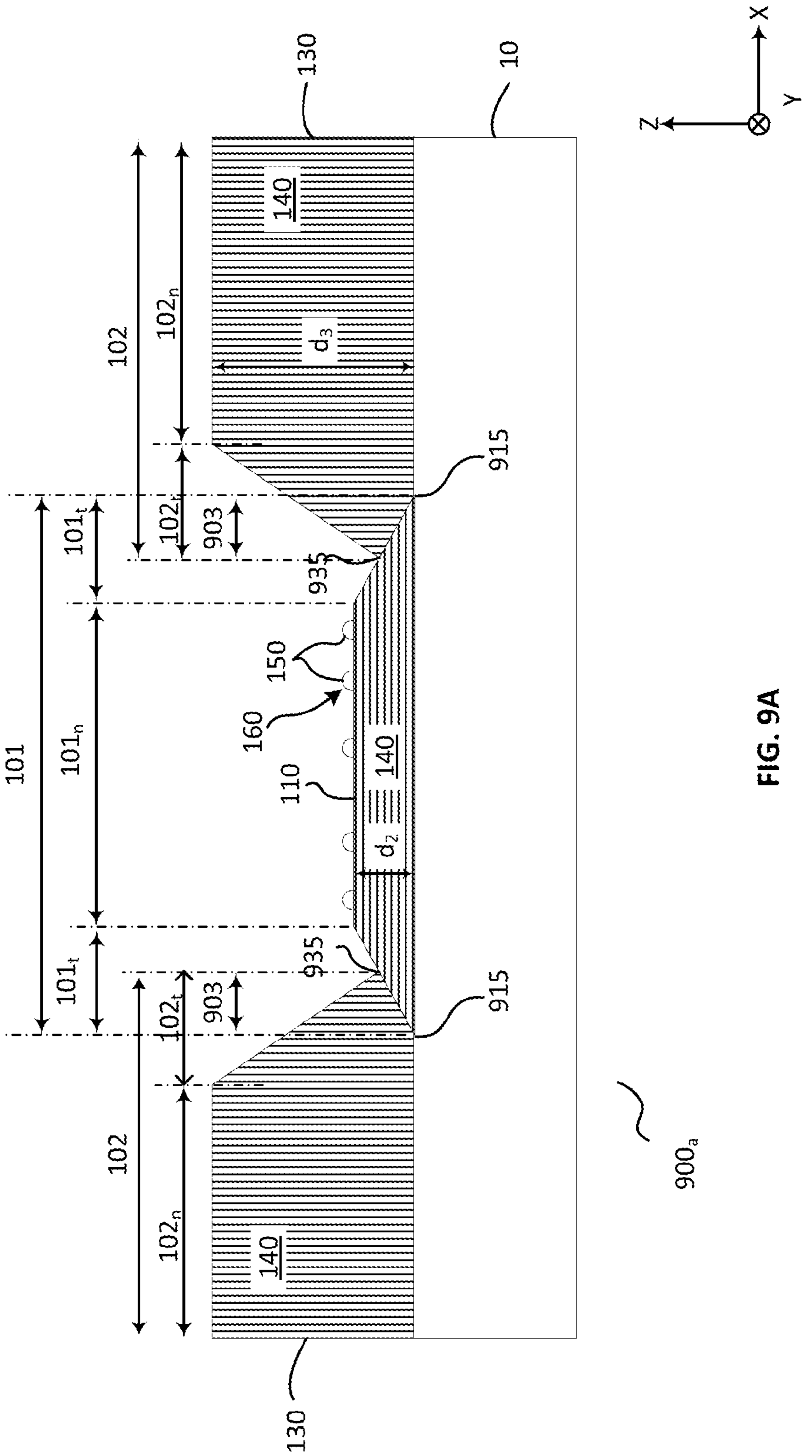
FIG. 9A is a schematic diagram illustrating an example version of the device of FIG. 1 in a cross-sectional view.
Figure 9B:
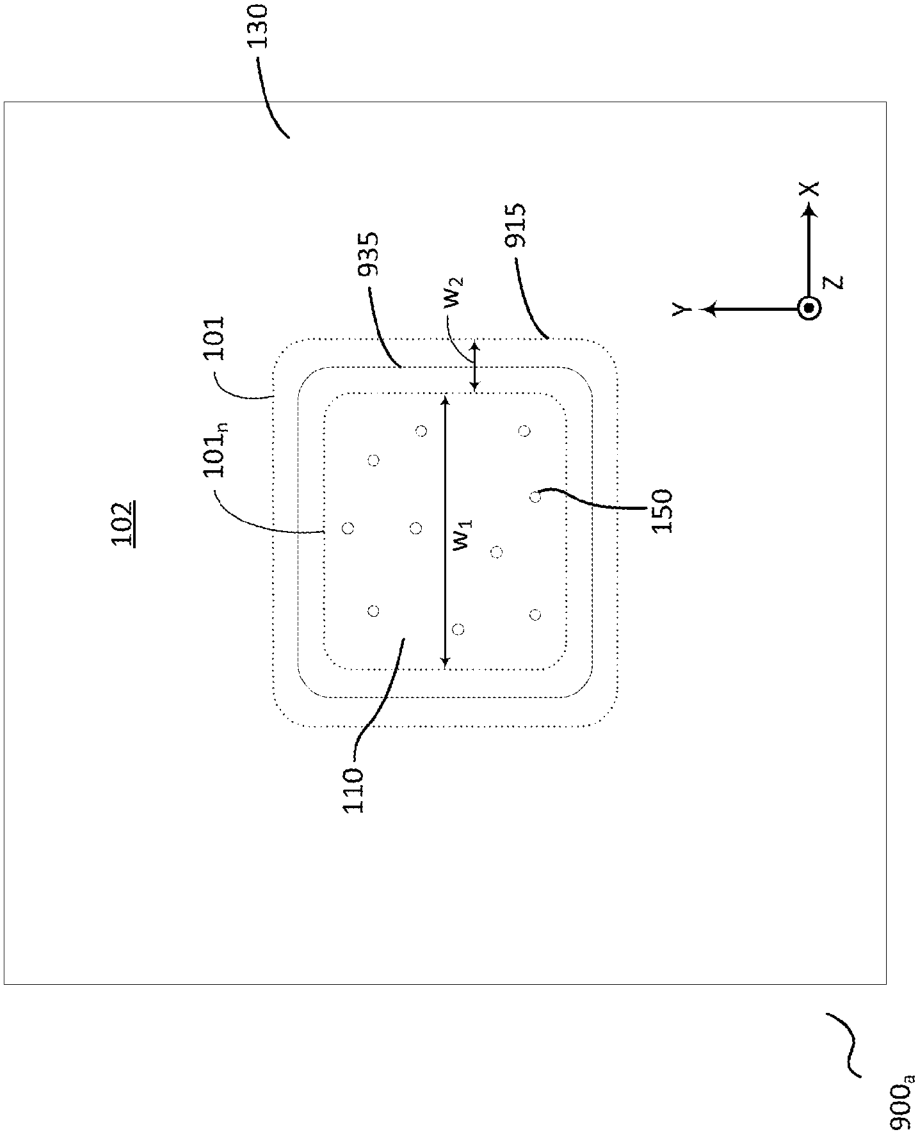
FIG. 9B is a schematic diagram illustrating the device of FIG. 9A in a complementary plan view.

Turning to FIG. 9A, there may be shown a version 900*a* of the device 100 of FIG. 1 that may show in exaggerated form, an interface between the patterning coating 110 in the first portion 101 and the deposited layer 130 in the second portion 102. FIG. 9B may show the device $\mathbf{900}_a$ in plan.

As may be better seen in FIG. 9B, in some non-limiting examples, the patterning coating 110 in the first portion 101 may be surrounded on all sides by the deposited layer 130 in the second portion 102, such that the first portion 101 may have a boundary that is defined by the further edge 915 of the patterning coating 110 in the lateral aspect along each lateral axis. In some non-limiting examples, the patterning coating edge 915 in the lateral aspect may be defined by a perimeter of the first portion 101 in such aspect.

In some non-limiting examples, the first portion 101 may comprise at least one patterning coating transition region $\mathbf{101}_t$, in the lateral aspect, in which a thickness of the patterning coating 110 may transition from a maximum thickness to a reduced thickness. The extent of the first portion 101 that does not exhibit such a transition may be identified as a patterning coating non-transition part $\mathbf{101}_n$ of the first portion 101. In some non-limiting examples, the patterning coating 110 may form a substantially closed coating 140 in the patterning coating non-transition part $\mathbf{101}_n$ of the first portion 101.

In some non-limiting examples, the patterning coating transition region $\mathbf{101}_t$ may extend, in the lateral aspect, between the patterning coating non-transition part $\mathbf{101}_n$ of the first portion 101 and the patterning coating edge 915.

In some non-limiting examples, in plan, the patterning coating transition region $\mathbf{101}_t$ may extend along a perimeter of the patterning coating non-transition part $\mathbf{101}_n$ of the first portion 101.

In some non-limiting examples, along at least one lateral axis, the patterning coating non-transition part $\mathbf{101}_n$ may occupy the entirety of the first portion 101, such that there is no patterning coating transition region $\mathbf{101}_t$ between it and the second portion 102.

As illustrated in FIG. 9A, in some non-limiting examples, the patterning coating 110 may have an average film thickness $d_2$ in the patterning coating non-transition part $\mathbf{101}_n$ of the first portion 101 that may be in a range of one of between about: 1-100, 2-50, 3-30, 4-20, 5-15, 5-10, and 1-10, nm. In some non-limiting examples, the average film thickness $d_2$ of the patterning coating 110 in the patterning coating non-transition part $\mathbf{101}_n$ of the first portion 101 may be substantially the same (constant) thereacross. In some non-limiting examples, an average layer thickness $d_2$ of the patterning coating 110 may remain, within the patterning coating non-transition part $\mathbf{101}_n$, within one of about: 95, and 90%, of the average film thickness $d_2$ of the patterning coating 110.

In some non-limiting examples, the average film thickness $d_2$ may be between about 1-100 nm. In some non-limiting examples, the average film thickness dz may be one of no more than about: 80, 60, 50, 40, 30, 20, 15, and 10, nm. In some non-limiting examples, the average film thickness $d_2$ of the patterning coating 110 may be one of at least about: 3, 5, and 8, nm.

In some non-limiting examples, the average film thickness $d_2$ of the patterning coating 110 in the patterning coating non-transition part $\mathbf{101}_n$ of the first portion 101 may be no more than about 10 nm. Without wishing to be bound by any particular theory, it has been found, that a non-zero average film thickness $d_2$ of the patterning coating 110 that is no more than about 10 nm may, at least in some non-limiting examples, have applicability in certain scenarios calling for achieving, in some non-limiting examples, enhanced patterning contrast of the deposited layer 130, relative to a patterning coating 110 having an average film thickness de in the patterning coating non-transition part $\mathbf{101}_n$ of the first portion 101 of at least about 10 nm.

In some non-limiting examples, the patterning coating 110 may have a patterning coating thickness that decreases from a maximum to a minimum within the patterning coating transition region $\mathbf{101}_t$. In some non-limiting examples, the maximum may be proximate to a boundary between the patterning coating transition region $\mathbf{101}_t$ and the patterning coating non-transition part $\mathbf{101}_n$ of the first portion 101. In some non-limiting examples, the minimum may be proximate to the patterning coating edge 915.

In some non-limiting examples, the maximum may be the average film thickness $d_2$ in the patterning coating non-transition part $\mathbf{101}_n$ of the first portion 101. In some non-limiting examples, the maximum may be no more than one of about: 95, and 90%, of the average film thickness $d_2$ in the patterning coating non-transition part $\mathbf{101}_n$ of the first portion 101. In some non-limiting examples, the minimum may be in a range of between about 0-0.1 nm.

In some non-limiting examples, a profile of the patterning coating thickness in the patterning coating transition region $\mathbf{101}_t$ may be sloped. In some non-limiting examples, such profile may be tapered. In some non-limiting examples, the taper may follow one of: a linear, non-linear, parabolic, and exponential decaying, profile.

In some non-limiting examples, the patterning coating 110 may completely cover the underlying layer 1010 in the patterning coating transition region $\mathbf{101}_t$. In some non-limiting examples, at least a part of the underlying layer 1010 may be left uncovered by the patterning coating 110 in the patterning coating transition region $\mathbf{101}_t$. In some non-limiting examples, the patterning coating 110 may comprise a substantially closed coating 140 in at least one of: at least a part of the patterning coating transition region $\mathbf{101}_t$, and at least a part of the patterning coating non-transition part $\mathbf{101}_n$.

In some non-limiting examples, the patterning coating 110 may comprise a discontinuous layer 160 in at least one of: at least a part of the patterning coating transition region $\mathbf{101}_t$, and at least a part of the patterning coating non-transition part $\mathbf{101}_n$.

In some non-limiting examples, at least a part of the patterning coating 110 in the first portion 101 may be substantially devoid of a closed coating 140 of the deposited layer 130. In some non-limiting examples, at least a part of the exposed layer surface 11 of the first portion 101 may be substantially devoid of a closed coating 140 of one of: the deposited layer 130, and the deposited material 831.

In some non-limiting examples, along at least one lateral axis, including without limitation, the X-axis, the patterning coating non-transition part $\mathbf{101}_n$ may have a width of $w_1$, and the patterning coating transition region $\mathbf{101}_t$ may have a width of $w_2$. In some non-limiting examples, the patterning coating non-transition part $\mathbf{101}_n$ may have a cross-sectional area that, in some non-limiting examples, may be approximated by multiplying the average film thickness $d_2$ by the width $w_1$. In some non-limiting examples, the patterning coating transition region $\mathbf{101}_t$ may have a cross-sectional area that, in some non-limiting examples, may be approximated by multiplying an average film thickness across the patterning coating transition region $\mathbf{101}_t$ by the width $w_1$.

In some non-limiting examples, $w_1$ may exceed $w_2$. In some non-limiting examples, a quotient of $w_1/w_2$ may be one of at least about: 5, 10, 20, 50, 100, 500, 1,000, 1,500, 5,000, 10,000, 50,000, and 100,000.

In some non-limiting examples, at least one of $w_1$ and $w_2$ may exceed the average film thickness $d_1$ of the underlying layer 1010.

In some non-limiting examples, at least one of $w_1$ and we may exceed $d_2$. In some non-limiting examples, both $w_1$ and $w_2$ may exceed dz. In some non-limiting examples, $w_1$ and we both may exceed $d_1$, and $d_1$ may exceed $d_2$.

Deposited Layer Transition Region

As may be better seen in FIG. 9B, in some non-limiting examples, the patterning coating 110 in the first portion 101 may be surrounded by the deposited layer 130 in the second portion 102 such that the second portion 102 has a boundary that is defined by the further edge 935 of the deposited layer 130 in the lateral aspect along each lateral axis. In some non-limiting examples, the deposited layer edge 935 in the lateral aspect may be defined by a perimeter of the second portion 102 in such aspect.

In some non-limiting examples, the second portion 102 may comprise at least one deposited layer transition region $\mathbf{102}_t$, in the lateral aspect, in which a thickness of the deposited layer 130 may transition from a maximum thickness to a reduced thickness. The extent of the second portion 102 that does not exhibit such a transition may be identified as a deposited layer non-transition part $\mathbf{102}_n$ of the second portion 102. In some non-limiting examples, the deposited layer 130 may form a substantially closed coating 140 in the deposited layer non-transition part $\mathbf{102}_n$ of the second portion 102.

In some non-limiting examples, in plan, the deposited layer transition region $\mathbf{102}_t$ may extend, in the lateral aspect, between the deposited layer non-transition part $\mathbf{102}_n$ of the second portion 102 and the deposited layer edge 935.

In some non-limiting examples, in plan, the deposited layer transition region $102_t$ may extend along a perimeter of the deposited layer non-transition part $102_n$ of the second portion 102.

In some non-limiting examples, along at least one lateral axis, the deposited layer non-transition part $102_n$ of the second portion 102 may occupy the entirety of the second portion 102, such that there is no deposited layer transition region $102_t$ between it and the first portion 101.

As illustrated in FIG. 9A, in some non-limiting examples, the deposited layer 130 may have an average film thickness $d_3$ in the deposited layer non-transition part $102_n$ of the second portion 102 that may be in a range of one of between about: 1-500, 5-200, 5-40, $10^{-30}$, and 10-100, nm. In some non-limiting examples, $d_3$ may exceed one of about: 10, 50, and 100, nm. In some non-limiting examples, the average film thickness $d_3$ of the deposited layer 130 in the deposited layer non-transition part $102_t$ of the second portion 102 may be substantially the same (constant) thereacross.

In some non-limiting examples, $d_3$ may exceed the average film thickness $d_1$ of the underlying layer 1010.

In some non-limiting examples, a quotient $d_2/d_1$ may be one of at least about: 1.5, 2, 5, 10, 20, 50, and 100. In some non-limiting examples, the quotient $d_3/d_1$ may be in a range of one of between about: 0.1-10, and 0.2-40.

In some non-limiting examples, $d_3$ may exceed an average film thickness $d_2$ of the patterning coating 110.

In some non-limiting examples, a quotient $d_2/d_2$ may be one of at least about: 1.5, 2, 5, 10, 20, 50, and 100. In some non-limiting examples, the quotient dal dz may be in a range of one of between about: 0.2-10, and 0.5-40.

In some non-limiting examples, $d_3$ may exceed $d_2$ and $d_2$ may exceed $d_1$. In some non-limiting examples, $d_3$ may exceed $d_1$ and $d_1$ may exceed dz.

In some non-limiting examples, a quotient $d_2/d_1$ may be between one of about: 0.2-3, and 0.1-5.

In some non-limiting examples, along at least one lateral axis, including without limitation, the X-axis, the deposited layer non-transition part $102_n$ of the second portion 102 may have a width of $w_3$. In some non-limiting examples, the deposited layer non-transition part $102_n$ of the second portion 102 may have a cross-sectional area a3 that, in some non-limiting examples, may be approximated by multiplying the average film thickness $d_3$ by the width $w_3$.

In some non-limiting examples, $w_3$ may exceed the width $w_1$ of the patterning coating non-transition part $101_n$. In some non-limiting examples, $w_1$ may exceed $w_3$.

In some non-limiting examples, a quotient $w_1/w_3$ may be in a range of one of between about: 0.1-10, 0.2-5, 0.3-3, and 0.4-2. In some non-limiting examples, a quotient $w_1/w_1$ may be one of at least about: 1, 2, 3, and 4.

In some non-limiting examples, $w_3$ may exceed the average film thickness $d_3$ of the deposited layer 130.

In some non-limiting examples, a quotient $w_3/d_3$ may be one of at least about: 10, 50, 100, and 500. In some non-limiting examples, the quotient $w_3/d_3$ may be no more than about 100,000.

In some non-limiting examples, the deposited layer 130 may have a thickness that decreases from a maximum to a minimum within the deposited layer transition region $102_t$. In some non-limiting examples, the maximum may be proximate to the boundary between the deposited layer transition region $102_t$ and the deposited layer non-transition part $102_n$ of the second portion 102. In some non-limiting examples, the minimum may be proximate to the deposited layer edge 935. In some non-limiting examples, the maximum may be the average film thickness $d_3$ in the deposited layer non-transition part $102_n$ of the second portion 102. In some non-limiting examples, the minimum may be in a range of between about 0-0.1 nm. In some non-limiting examples, the minimum may be the average film thickness $d_3$ in the deposited layer non-transition part $102_n$ of the second portion 102.

In some non-limiting examples, a profile of the thickness in the deposited layer transition region $102_t$ may be sloped. In some non-limiting examples, such profile may be tapered. In some non-limiting examples, the taper may follow a linear, non-linear, parabolic, and exponential decaying, profile.

In some non-limiting examples, although not shown, the deposited layer 130 may completely cover the underlying layer 1010 in the deposited layer transition region $102_t$. In some non-limiting examples, the deposited layer 130 may comprise a substantially closed coating 140 in at least a part of the deposited layer transition region $102_t$. In some non-limiting examples, at least a part of the underlying layer 1010 may be uncovered by the deposited layer 130 in the deposited layer transition region $102_t$.

In some non-limiting examples, the deposited layer 130 may comprise a discontinuous layer 160 in at least a part of the deposited layer transition region $102_t$.

Those having ordinary skill in the relevant art will appreciate that, although not shown, the patterning material 711 may also be present to some extent at an interface between the deposited layer 130 and an underlying layer 1010. Such material may be deposited as a result of a shadowing effect, in which a deposited pattern is not identical to a pattern of a mask and may, in some non-limiting examples, result in some evaporated patterning material 711 being deposited on a masked part of a target exposed layer surface 11. In some non-limiting examples, such material may form as at least one of: particle structures 150, and as a thin film having a thickness that may be substantially no more than an average thickness of the patterning coating 110.

Overlap

In some non-limiting examples, although not shown, the deposited layer edge 935 may be spaced apart, in the lateral aspect from the patterning coating transition region $101_t$ of the first portion 101, such that there is no overlap between the first portion 101 and the second portion 102 in the lateral aspect.

In some non-limiting examples, at least a part of the first portion 101 and at least a part of the second portion 102 may overlap in the lateral aspect. Such overlap may be identified by an overlap portion 903, such as may be shown in some non-limiting examples in FIG. 9A, in which at least a part of the second portion 102 overlaps at least a part of the first portion 101.

In some non-limiting examples, although not shown, at least a part of the deposited layer transition region $102_t$ may be disposed over at least a part of the patterning coating transition region $101_t$. In some non-limiting examples, at least a part of the patterning coating transition region $101_t$ may be substantially devoid of at least one of: the deposited layer 130, and the deposited material 831. In some non-limiting examples, the deposited material 831 may form a discontinuous layer 160 on an exposed layer surface 11 of at least a part of the patterning coating transition region $101_t$.

In some non-limiting examples, although not shown, at least a part of the deposited layer transition region $102_t$ may be disposed over at least a part of the patterning coating non-transition part $101_n$ of the first portion 101.

Although not shown, those having ordinary skill in the relevant art will appreciate that, in some non-limiting examples, the overlap portion 903 may reflect a scenario in which at least a part of the first portion 101 overlaps at least a part of the second portion 102.

Thus, in some non-limiting examples, at least a part of the patterning coating transition region $\mathbf{101}_t$ may be disposed over at least a part of the deposited layer transition region $\mathbf{102}_t$. In some non-limiting examples, at least a part of the deposited layer transition region $\mathbf{102}_t$ may be substantially devoid of at least one of: the patterning coating 110, and the patterning material 711. In some non-limiting examples, the patterning material 711 may form a discontinuous layer 160 on an exposed layer surface of at least a part of the deposited layer transition region $\mathbf{102}_t$.

In some non-limiting examples, at least a part of the patterning coating transition region $\mathbf{101}_t$ may be disposed over at least a part of the deposited layer non-transition part $\mathbf{102}_n$ of the second portion 102.

In some non-limiting examples, the patterning coating edge 915 may be spaced apart, in the lateral aspect, from the deposited layer non-transition part $\mathbf{102}_n$ of the second portion 102.

In some non-limiting examples, the deposited layer 130 may be formed as a single monolithic coating across both the deposited layer non-transition part $\mathbf{102}_n$ and the deposited layer transition region $\mathbf{102}_t$ of the second portion 102.

In some non-limiting examples, at least one deposited layer 130, including without limitation, an initial deposited layer 130, may provide, at least in part, the functionality of an EIL 239, in the emissive region 210. Non-limiting examples, of the deposited material 831 for forming such initial deposited layer 130 include Yb, which for example, may be about 1-3 nm in thickness.

Edge Effects of Patterning Coatings and Deposited Layers

Figure 10B:
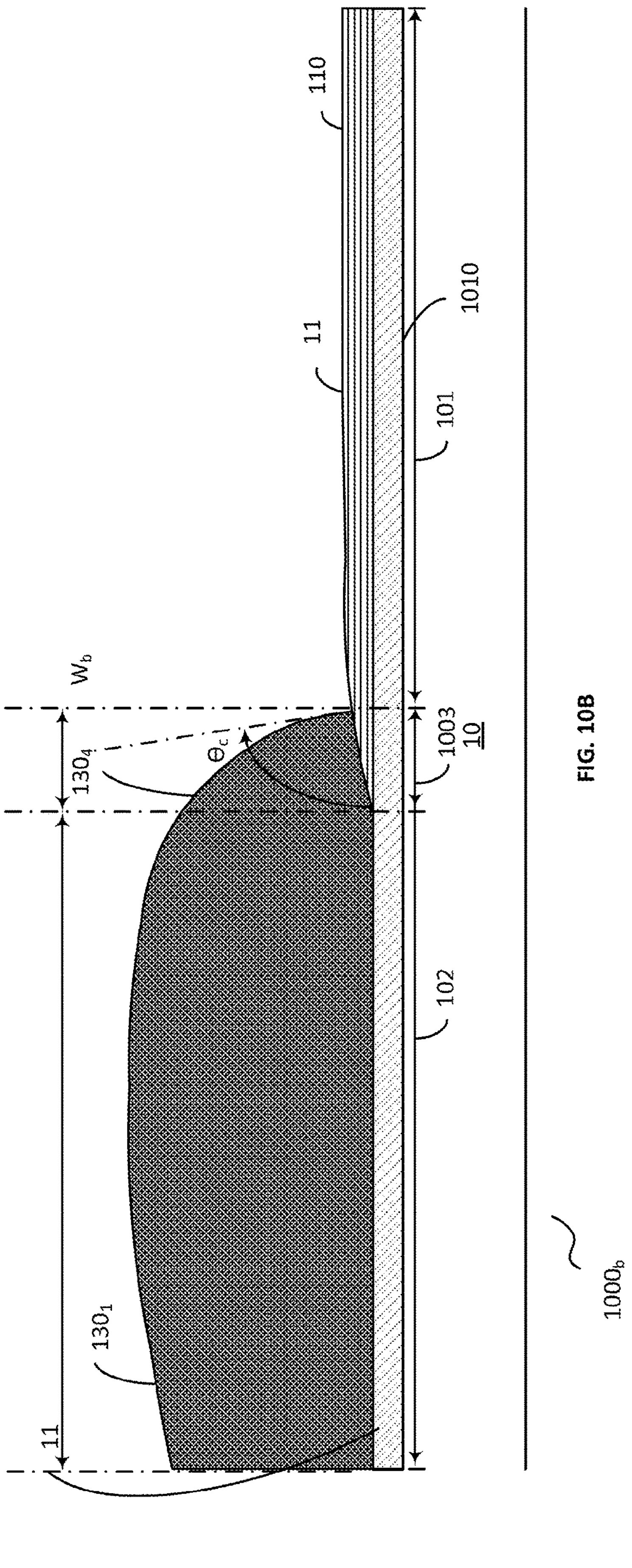

FIGS. 10A-10B describe various potential behaviours of patterning coatings 110 at a deposition interface with deposited layers 130.

Turning to FIG. 10A, there may be shown a first example of a part of an example version $\mathbf{1000}_a$ of the device 100 at a patterning coating deposition boundary. The device $\mathbf{1000}_a$ may comprise a substrate 10 having an exposed layer surface 11. A patterning coating 110 may be deposited over a first portion 101 of the exposed layer surface 11 of the underlying layer 1010. A deposited layer 130 may be deposited over a second portion 102 of the exposed layer surface 11 of the underlying layer 1010. As shown, by way of non-limiting example, the first portion 101 and the second portion 102 may be distinct and non-overlapping parts of the exposed layer surface 11.

The deposited layer 130 may comprise a first part 1301 and a second part 1302. As shown, by way of non-limiting example, the first part 1301 of the deposited layer 130 may substantially cover the second portion 102 and the second part $\mathbf{130}_2$ of the deposited layer 130 may partially overlap (project over) a first part of the patterning coating 110.

In some non-limiting examples, since the patterning coating 110 may be formed such that its exposed layer surface 11 exhibits a substantially low initial sticking probability against deposition of the deposited material 831, there may be a gap 1029 formed between the projecting second part $\mathbf{130}_2$ of the deposited layer 130 and the exposed layer surface 11 of the patterning coating 110. As a result, the second part $\mathbf{130}_2$ may not be in physical contact with the patterning coating 110 but may be spaced-apart therefrom by the gap 1029 in a cross-sectional aspect. In some non-limiting examples, the first part 1301 of the deposited layer 130 may be in physical contact with the patterning coating 110 at an interface (boundary) between the first portion 101 and the second portion 102.

In some non-limiting examples, the projecting second part $\mathbf{130}_2$ of the deposited layer 130 may extend laterally over the patterning coating 110 by a comparable extent as an average layer thickness da of the first part 1301 of the deposited layer 130. By way of non-limiting example, as shown, a width $w_b$ of the second part $\mathbf{130}_2$ may be comparable to the average layer thickness $d_a$ of the first part 1301. In some non-limiting examples, a ratio of a width $w_b$ of the second part $\mathbf{130}_2$ by an average layer thickness $d_a$ of the first part 1301 may be in a range of one of between about: 1:1-1:3, 1:1-1:1.5, and 1:1-1:2. While the average layer thickness $d_a$ may, in some non-limiting examples, be substantially uniform across the first part 1301, in some non-limiting examples, the extent to which the second part $\mathbf{130}_2$ may project over the patterning coating 110 (namely $w_b$) may vary to some extent across different parts of the exposed layer surface 11.

In some non-limiting examples, the deposited layer 130 may be shown to include a third part $\mathbf{130}_3$ disposed between the second part $\mathbf{130}_2$ and the patterning coating 110. As shown, the second part $\mathbf{130}_2$ of the deposited layer 130 may extend laterally over and may be longitudinally spaced apart from the third part $\mathbf{130}_3$ of the deposited layer 130 and the third part $\mathbf{130}_3$ may be in physical contact with the exposed layer surface 11 of the patterning coating 110. An average layer thickness de of the third part $\mathbf{130}_3$ of the deposited layer 130 may be no more than, and in some non-limiting examples, substantially less than, the average layer thickness $d_a$ of the first part 1301 thereof. In some non-limiting examples, a width $w_c$ of the third part $\mathbf{130}_3$ may exceed the width $w_b$ of the second part 1302. In some non-limiting examples, the third part 1303 may extend laterally to overlap the patterning coating 110 to a greater extent than the second part 1302. In some non-limiting examples, a ratio of a width $w_c$ of the third part $\mathbf{130}_3$ by an average layer thickness $d_a$ of the first part 1301 may be in a range of one of between about: 1:2-3:1, and 1:1.2-2.5:1. While the average layer thickness $d_a$ may, in some non-limiting examples, be substantially uniform across the first part 1301, in some non-limiting examples, the extent to which the third part $\mathbf{130}_3$ may project (overlap) with the patterning coating 110 (namely $w_c$) may vary to some extent across different parts of the exposed layer surface 11.

In some non-limiting examples, the average layer thickness de of the third part $\mathbf{130}_3$ may not exceed about 5% of the average layer thickness $d_a$ of the first part 1301. By way of non-limiting example, de may be one of no more than about: 4, 3, 2, 1, and 0.5% of $d_a$. Instead of (including without limitation, in addition to) the third part 1303 being formed as a thin film, as shown, the deposited material 831 of the deposited layer 130 may form as particle structures 150 (not shown) on a part of the patterning coating 110. By way of non-limiting example, such particle structures 150 may comprise features that are physically separated from one another, such that they do not form a continuous layer.

In some non-limiting examples, as shown, an NPC 1020 may be disposed between the substrate 10 and the deposited layer 130. The NPC 1020 may be disposed between the first part 1301 of the deposited layer 130 and the second portion 102 of the exposed layer surface 11 of the underlying layer 1010. The NPC 1020 is illustrated as being disposed on the second portion 102 and not on the first portion 101, where the patterning coating 110 has been deposited. The NPC 1020 may be formed such that, at an interface (boundary) between the NPC 1020 and the deposited layer 130, a surface of the NPC 1020 may exhibit a substantially high initial sticking probability against deposition of the deposited material 831. As such, the presence of the NPC 1020 may promote the formation (growth) of the deposited layer 130 during deposition.

In some non-limiting examples, although not shown, the NPC 1020 may be disposed on both the first portion 101 and the second portion 102 of the substrate 10 and the underlying layer 1010 may cover a part of the NPC 1020 disposed on the first portion 101, and another part of the NPC 1020 may be substantially devoid of the underlying layer 1010 and of the patterning coating 110, and the deposited layer 130 may cover such part of the NPC 1020.

Turning now to FIG. 10B, in some non-limiting examples, the first portion 101 of the substrate 10 may be coated with the patterning coating 110 and the second portion may be coated with the deposited layer 130. In some non-limiting examples, the deposited layer 130 may partially overlap a part of the patterning coating 110 in a third portion 1003 of the substrate 10. In some non-limiting examples, although not shown, in addition to the first part 1301 (and, if present, at least one of: the second part 1302, and the third part 1303), the deposited layer 130 may further comprise a fourth part 1304 that may be disposed between the first part 1301 and the second part $\mathbf{130_2}$ of the deposited layer 130 and in physical contact with the exposed layer surface 11 of the patterning coating 110. In some non-limiting examples, the fourth part 1304 of the deposited layer 130 overlapping a subset of the patterning coating in the third portion 1003 may be in physical contact with the exposed layer surface 11 thereof. In some non-limiting examples, the overlap in the third portion 1003 may be formed as a result of lateral growth of the deposited layer 130 during one of: an open mask, and mask-free, deposition process. In some non-limiting examples, while the exposed layer surface 11 of the patterning coating 110 may exhibit a substantially low initial sticking probability against deposition of the deposited material 831, and thus a probability of the material nucleating on the exposed layer surface 11 may be low, as the deposited layer 130 grows in thickness, the deposited layer 130 may also grow laterally and may cover a subset of the patterning coating 110 as shown.

In some non-limiting examples, it has been observed that conducting one of: an open mask, and mask-free, deposition of the deposited layer 130 may result in the deposited layer 130 exhibiting a tapered cross-sectional profile proximate to an interface between the deposited layer 130 and the patterning coating 110.

In some non-limiting examples, an average layer thickness of the deposited layer 130 proximate to the interface may be less than an average layer thickness $d_3$ of the deposited layer 130. While such tapered profile may be shown as being at least one of: curved, and arched, in some non-limiting examples, the profile may, in some non-limiting examples, be substantially one of: linear, and non-linear. By way of non-limiting example, an average layer thickness $d_3$ of the deposited layer 130 may decrease, without limitation, in a substantially at least one of: linear, exponential, and quadratic, fashion in a region proximate to the interface.

It has been observed that a contact angle $\theta_c$ of the deposited layer 130 proximate to the interface between the deposited layer 130 and the patterning coating 110 may vary, depending on properties of the patterning coating 110, such as an initial sticking probability. It may be further postulated that the contact angle $\theta_c$ of the nuclei may, in some non-limiting examples, dictate the thin film contact angle of the deposited layer 130 formed by deposition. Referring to FIG. 10B by way of non-limiting example, the contact angle $\theta_c$ may be determined by measuring a slope of a tangent of the deposited layer 130 proximate to the interface between the deposited layer 130 and the patterning coating 110. In some non-limiting examples, where the cross-sectional taper profile of the deposited layer 130 is substantially linear, the contact angle $\theta_c$ may be determined by measuring the slope of the deposited layer 130 proximate to the interface. As will be appreciated by those having ordinary skill in the relevant art, the contact angle $\theta_c$ may be generally measured relative to a non-zero angle of the underlying layer 1010. In the present disclosure, for purposes of simplicity of illustration, the patterning coating 110 and the deposited layer 130 may be shown deposited on a planar surface. However, those having ordinary skill in the relevant art will appreciate that the patterning coating 110 and the deposited layer 130 may be deposited on non-planar surfaces.

In some non-limiting examples, as shown in FIG. 10A, the contact angle $\theta_c$ of the deposited layer 130 may exceed about 90° and, by way of non-limiting example, the deposited layer 130 may be shown as including a part $\mathbf{130_2}$ extending past the interface between the patterning coating 110 and the deposited layer 130 and may be spaced apart from the patterning coating 110 (and, in some non-limiting examples, the third part $\mathbf{130_3}$ of the deposited layer 130) by the gap 1029. In such non-limiting scenario, the contact angle $\theta_c$ may, in some non-limiting examples, exceed 90°.

In some non-limiting examples, there may be scenarios calling for a deposited layer 130 exhibiting a substantially high contact angle $\theta_c$. By way of non-limiting example, the contact angle $\theta_c$ may exceed one of about: 10, 15, 20, 25, 30, 35, 40, 50, 70, 75, and 80°. By way of non-limiting example, a deposited layer 130 having a substantially high contact angle $\theta_c$ may allow for creation of finely patterned features while maintaining a substantially high aspect ratio. By way of non-limiting example, there may be scenarios calling for a deposited layer 130 exhibiting a contact angle $\theta_c$ that exceeds about 90°. By way of non-limiting example, the contact angle $\theta_c$ may exceed one of about: 90, 95, 100, 105, 110 120, 130, 135, 140, 145, 150, and 170°.

In some non-limiting examples, the contact angle $\theta_c$ of the deposited layer 130 may be measured at an edge thereof near the interface between it and the patterning coating 110, as shown. In FIG. 10A, the contact angle $\theta_c$ may exceed about 90°, which may, in some non-limiting examples, result in a subset, namely the second part 1302, of the deposited layer 130 being spaced apart from the patterning coating 110 (and, in some non-limiting examples, the third part $\mathbf{130_3}$ of the deposited layer 130) by the gap 1029.

Particle Structure

An NP is a particle of matter whose predominant characteristic size is of nanometer (nm) scale, generally understood to be between about: 1-300 nm. At nm scale, NPs of a given material may possess unique properties (including without limitation, optical, chemical, physical, and electrical) relative to the same material in bulk form, including without limitation, an amount of absorption of EM radiation exhibited by such NPs at different wavelengths (ranges).

These properties may be exploited when a plurality of NPs is formed into a layer of a layered semiconductor device 100, including without limitation, an opto-electronic device 200, to improve its performance.

Current mechanisms for introducing such a layer of NPs into such a device have some drawbacks.

First, typically, such NPs are formed into at least one of: a close-packed layer, and dispersed into a matrix material, of such device. Consequently, the thickness of such an NP layer may be typically much thicker than the characteristic size of the NPs themselves. The thickness of such NP layer may impart undesirable characteristics in terms of at least one of: device performance, device stability, device reliability, and device lifetime that may reduce, including without limitation, obviate, any perceived advantages provided by the unique properties of NPs.

Second, techniques to synthesize NPs, in and for use in such devices may introduce large amounts of at least one of: C, O, and sulfur(S) through various mechanisms.

In some non-limiting examples, wet chemical methods are typically used to introduce NPs that have a precisely controlled at least one of: characteristic size, length, width, diameter, height, size distribution, shape, surface coverage, configuration, deposited density, dispersity, and composition into an opto-electronic device 200. However, such methods typically employ an organic capping group (such as the synthesis of citrate-capped Ag NPs) to stabilize the NPs, but such organic capping groups introduce at least one of: C, O, and S into the synthesized NPs.

Still further, an NP layer deposited from solution may typically comprise at least one of: C, O, and S, because of the solvents used in deposition.

Additionally, these elements may be introduced as contaminants during at least one of: the wet chemical process, and the deposition of the NP layer.

However introduced, the presence of a high amount of at least one of: C, O, and S, in the NP layer of such a device 100, may erode at least one of: the performance, stability, reliability, and lifetime, of such device 100.

Third, when depositing an NP layer from solution, as the employed solvents dry, the NP layer(s) may tend to have non-uniform properties at least one of: across the NP layer, and between different patterned regions of such layer. In some non-limiting examples, an edge of a given layer may be considerably at least one of: thicker and thinner, than an internal region of such layer, which disparities may adversely impact at least one of: the device performance, stability, reliability, and lifetime.

Fourth, while there are other methods (and processes) beyond wet chemical synthesis and solution deposition processes, of at least one of: synthesizing and depositing, NPs, including without limitation, a vacuum-based process such as, without limitation, PVD, such methods tend to provide poor control of the at least one of: characteristic size, length, width, diameter, height, size distribution, shape, surface coverage, configuration, deposited density, dispersity, and composition, of the NPs deposited thereby. In some non-limiting examples, in a PVD process, the NPs tend to form a close-packed film as their size increases. As a result, methods such as PVD are generally not well-suited to form a layer of large disperse NPs with low surface coverage. Rather, the poor control of at least one of: the characteristic size, length, width, diameter, height, size distribution, shape, surface coverage, configuration, deposited density, dispersity, and composition, imparted by such methods may result in poor at least one of: device performance, stability, reliability, and lifetime.

In some non-limiting examples, such as may be shown in FIG. 9A, there may be at least one particle, including without limitation, at least one of: a nanoparticle (NP), an island, a plate, a disconnected cluster, and a network (collectively particle structure 150) disposed on an exposed layer surface 11 of an underlying layer 1010. In some non-limiting examples, the underlying layer 1010 may be the patterning coating 110 in the first portion 101. In some non-limiting examples, the at least one particle structure 150 may be disposed on an exposed layer surface 11 of the patterning coating 110. In some non-limiting examples, there may be a plurality of such particle structures 150.

In some non-limiting examples, the at least one particle structure 150 may comprise a particle material. In some non-limiting examples, the particle material may be the same as the deposited material 831 in the deposited layer.

In some non-limiting examples, the particle material in the discontinuous layer 160 in the first portion 101, at least one of: the deposited material 831 in the deposited layer 130, and a material of which the underlying layer 1010 thereunder may be comprised, may comprise a metal in common.

In some non-limiting examples, the particle material may comprise an element selected from at least one of: K, Na, Li, Ba, Cs, Yb, Ag, Au, copper (Cu), Al, Mg, Zn, Cd, Sn, and Y. In some non-limiting examples, the element may comprise at least one of: K, Na, Li, Ba, Cs, Yb, Ag, Au, Cu, Al, and Mg. In some non-limiting examples, the element may comprise at least one of: Cu, Ag, and Au. In some non-limiting examples, the element may be Cu. In some non-limiting examples, the element may be Al. In some non-limiting examples, the element may comprise at least one of: Mg, Zn, Cd, and Yb. In some non-limiting examples, the element may comprise at least one of: Mg, Ag, Al, Yb, and Li. In some non-limiting examples, the element may comprise at least one of: Mg, Ag, and Yb. In some non-limiting examples, the element may comprise at least one of: Mg, and Ag. In some non-limiting examples, the element may be Ag.

In some non-limiting examples, the particle material may comprise a pure metal. In some non-limiting examples, the at least one particle structure 150 may be a pure metal. In some non-limiting examples, the at least one particle structure 150 may be (substantially) pure Ag. In some non-limiting examples, the substantially pure Ag may have a purity of one of about: 95, 99, 99.9, 99.99, 99.999, and 99.9995%. In some non-limiting examples, the at least one particle structure 150 may be (substantially) pure Mg. In some non-limiting examples, the substantially pure Mg may have a purity of one of at least about: 95, 99, 99.9, 99.99, 99.999, and 99.9995%.

In some non-limiting examples, the at least one particle structure 150 may comprise an alloy. In some non-limiting examples, the alloy may be at least one of: an Ag-containing alloy, an Mg-containing alloy, and an AgMg-containing alloy. In some non-limiting examples, the AgMg-containing alloy may have an alloy composition that may range from about 1:10 (Ag:Mg) to about 10:1 by volume.

In some non-limiting examples, the particle material may comprise other metals one of: in place of, and in combination with, Ag. In some non-limiting examples, the particle material may comprise an alloy of Ag with at least one other metal. In some non-limiting examples, the particle material may comprise an alloy of Ag with at least one of: Mg, and Yb. In some non-limiting examples, such alloy may be a binary alloy having a composition of between about: 5-95 vol. % Ag, with the remainder being the other metal. In some non-limiting examples, the particle material may comprise Ag and Mg. In some non-limiting examples, the particle material may comprise an Ag:Mg alloy having a composition of between about 1:10-10:1 by volume. In some non-limiting examples, the particle material may comprise Ag and Yb. In some non-limiting examples, the particle material may comprise a Yb:Ag alloy having a composition of between about 1:20-10:1 by volume. In some non-limiting examples, the particle material may comprise Mg and Yb. In some non-limiting examples, the particle material may comprise an Mg:Yb alloy. In some non-limiting examples, the particle material may comprise an Ag:Mg:Yb alloy.

In some non-limiting examples, the at least one particle structure 150 may comprise at least one additional element. In some non-limiting examples, such additional element may be a non-metallic element. In some non-limiting examples, the non-metallic material may be at least one of: O, S, N, and C. It will be appreciated by those having ordinary skill in the relevant art that, in some non-limiting examples, such additional element(s) may be incorporated into the at least one particle structure 150 as a contaminant, due to the presence of such additional element(s) in at least one of: the source material, equipment used for deposition, and the vacuum chamber environment. In some non-limiting examples, such additional element(s) may form a compound together with other element(s) of the at least one particle structure 150. In some non-limiting examples, a concentration of the non-metallic element in the particle material may be one of no more than about: 1, 0.1, 0.01, 0.001, 0.0001, 0.00001, 0.000001, and 0.0000001%. In some non-limiting examples, the at least one particle structure 150 may have a composition in which a combined amount of O and C therein is one of no more than about: 10, 5, 1, 0.1, 0.01, 0.001, 0.0001, 0.00001, 0.000001, and 0.0000001%.

The at least one particle structure 150 takes advantage of plasmonics, a branch of nanophotonics, which studies the resonant interaction of EM radiation with metals. Those having ordinary skill in the relevant art will appreciate that metal NPs may exhibit at least one of: localized surface plasmon (LSP) excitations, and coherent oscillations of free electrons, whose optical response may be tailored by varying at least one of: a characteristic size, size distribution, shape, surface coverage, configuration, deposited density, and composition, of the nanostructures. Such optical response, in respect of particle structures 150, may include absorption of EM radiation incident thereon, thereby reducing at least one of: reflection thereof, and shifting to one of: a lower, and higher, wavelength ((sub-) range) of the EM spectrum, including without limitation, (a sub-range of) the visible spectrum.

It has been reported that arranging certain metal NPs near a medium having substantially low refractive index, may shift the absorption spectrum of such NPs to a lower wavelength (sub-) range (blue-shifted).

It may be postulated that disposing particle material, in some non-limiting examples, as a discontinuous layer 160 of at least one particle structure 150 on an exposed layer surface 11 of an underlying layer 1010, such that the at least one particle structure 150 is in physical contact with the underlying layer 1010, may, in some non-limiting examples, favorably shift the absorption spectrum of the particle material, including without limitation, blue-shift, such that it does not substantially overlap with a wavelength range of the EM spectrum of EM radiation being at least one of: emitted by, and transmitted at least partially through, the device 100.

In some non-limiting examples, a peak absorption wavelength of the at least one particle structure 150 may be less than a peak wavelength of the EM radiation being at least one of: emitted by, and transmitted, at least partially through the device 100. In some non-limiting examples, the particle material may exhibit a peak absorption at a wavelength (range) that is one of no more than about: 470, 460, 455, 450, 445, 440, 430, 420, and 400, nm.

It has now been found, that providing particle material, including without limitation, in the form of at least one particle structure 150, including without limitation, those comprised of a metal, proximate to, including without limitation, within, at least one low (er)-index coating, may further impact at least one of the: absorption, and transmittance, of EM radiation passing through the device 100, including without limitation, in the first direction, in at least a wavelength (sub-) range of the EM spectrum, including without limitation, (a sub-range of) the visible spectrum, passing in the first direction from, including without limitation, through, the at least one low (er)-index layer(s) and the at least one particle structure(s) 150.

In some non-limiting examples, at least one of: absorption may be reduced, and transmittance may be facilitated, in at least a wavelength (sub-) range of the EM spectrum, including without limitation, (a sub-range of) the visible spectrum.

In some non-limiting examples, the absorption may be concentrated in an absorption spectrum that is a wavelength (sub-) range of the EM spectrum, including without limitation, (a sub-range of) the visible spectrum.

In some non-limiting examples, the absorption spectrum may be one of: blue-shifted, and shifted to a higher wavelength (sub-) range(red-shifted), including without limitation, to a wavelength (sub-) range of the EM spectrum, including without limitation, (a sub-range of) the visible spectrum, and to a wavelength (sub-) range of the EM spectrum that lies, at least in part, beyond the visible spectrum.

Those having ordinary skill in the relevant art will appreciate that in some non-limiting examples, a plurality of layers of at least one particle structure 150 may be disposed on one another, whether separated by additional layers, with varying lateral aspects and having different absorption spectra. In this fashion, the absorption of certain regions of the device 100 may be tuned according to at least one desired absorption spectra.

In some non-limiting examples, the presence of the at least one particle structure 150, including without limitation, NPs, including without limitation, in a discontinuous layer 160, on an exposed layer surface 11 of the patterning coating 110 may affect some optical properties of the device 100.

In some non-limiting examples, such plurality of particle structures 150 may form a discontinuous layer 160.

Without wishing to be limited to any particular theory, it may be postulated that, while the formation of a closed coating 140 of the particle material may be substantially inhibited by the patterning coating 110, in some non-limiting examples, when the patterning coating 110 is exposed to deposition of the particle material thereon, some vapor monomers of the particle material may ultimately form at least one particle structure 150 of the particle material thereon.

In some non-limiting examples, at least some of the particle structures 150 may be disconnected from one another. In other words, in some non-limiting examples, the discontinuous layer 160 may comprise features, including particle structures 150, that may be physically separated from one another, such that the particle structures 150 do not form a closed coating 140. Accordingly, such discontinuous layer 160 may, in some non-limiting examples, thus comprise a thin disperse layer of deposited material 831 formed as particle structures 150, inserted at, including without limitation, substantially across, the lateral extent of, an interface between the patterning coating 110 and at least one overlying layer 170 in the device 100.

In some non-limiting examples, at least one of the particle structures 150 of particle material may be in physical contact with an exposed layer surface 11 of the patterning coating 110. In some non-limiting examples, substantially all of the particle structures 150 of particle material may be in physical contact with the exposed layer surface 11 of the patterning coating 110.

Without wishing to be bound by any particular theory, it has been found, that the presence of such a thin, disperse discontinuous layer 160 of particle material, including without limitation, at least one particle structure 150, including without limitation, metal particle structures 150, on an exposed layer surface 11 of the patterning coating 110, may exhibit at least one varied characteristic and concomitantly, varied behaviour, including without limitation, optical effects and properties of the device 100, as discussed herein. In some non-limiting examples, such effects and properties may be controlled to some extent by judicious selection of at least one of: the characteristic size, size distribution, shape, surface coverage, configuration, deposited density, and dispersity, of the particle structures 150 on the patterning coating 110.

In some non-limiting examples, the particle structures 150 may be controllably selected so as to have at least one of: a characteristic size, length, width, diameter, height, size distribution, shape, surface coverage, configuration, deposited density, dispersity, and composition, to achieve an effect related to an optical response exhibited by the particle structures 150.

Those having ordinary skill in the relevant art will appreciate that, having regard to the mechanism by which materials are deposited, due to possible stacking, including without limitation, clustering, of at least one of: monomers, and atoms, at least one of: an actual size, height, weight, thickness, shape, profile, and spacing, of the at least one particle structure 150 may be, in some non-limiting examples, substantially non-uniform. Additionally, although the at least one particle structure 150 are illustrated as having a given profile, this is intended to be illustrative only, and not determinative of at least one of: a size, height, weight, thickness, shape, profile, and spacing, thereof.

In some non-limiting examples, the at least one particle structure 150 may have a characteristic dimension of no more than about 200 nm. In some non-limiting examples, the at least one particle structure 150 may have a characteristic diameter that may be one of between about: 1-200, 1-160, 1-100, 1-50, and 1-30, nm.

In some non-limiting examples, the at least one particle structure 150 may comprise discrete metal plasmonic islands (clusters).

In some non-limiting examples, the at least one particle structure 150 may comprise a particle material.

In some non-limiting examples, such particle structures 150 may be formed by depositing a scant amount, in some non-limiting examples, having an average layer thickness that may be on the order of one of: a few, and a fraction of one, angstrom(s), of a particle material on an exposed layer surface 11 of the underlying layer 1010. In some non-limiting examples, the exposed layer surface 11 may be of an NPC 1020.

In some non-limiting examples, the particle material may comprise at least one of: Ag, Yb, and Mg.

In some non-limiting examples, the formation of at least one of: the characteristic size, size distribution, shape, surface coverage, configuration, deposited density, and dispersity, of such discontinuous layer 160 may be controlled, in some non-limiting examples, by judicious selection of at least one of: at least one characteristic of the patterning material 711, an average film thickness $d_2$ of the patterning coating 110, the introduction of heterogeneities in at least one of: the patterning coating 110, and a deposition environment, including without limitation, a temperature, pressure, duration, deposition rate, and deposition process, for the patterning coating 110.

In some non-limiting examples, the formation of at least one of the characteristic size, size distribution, shape, surface coverage, configuration, deposited density, and dispersity, of such discontinuous layer 160 may be controlled, in some non-limiting examples, by judicious selection of at least one of: at least one characteristic of the particle material (which may be the deposited material 831), an extent to which the patterning coating 110 may be exposed to deposition of the particle material (which, in some non-limiting examples, may be specified in terms of a thickness of the corresponding discontinuous layer 160), and a deposition environment, including without limitation, at least one of: a temperature, pressure, duration, deposition rate, and method of deposition for the particle material.

In some non-limiting examples, the discontinuous layer 160 may be deposited in a pattern across the lateral extent of the patterning coating 110.

In some non-limiting examples, the discontinuous layer 160 may be disposed in a pattern that may be defined by at least one region therein that is substantially devoid of the at least one particle structure 150.

In some non-limiting examples, the characteristics of such discontinuous layer 160 may be assessed, in some non-limiting examples, somewhat arbitrarily, according to at least one of several criteria, including without limitation, at least one of: a characteristic size, size distribution, shape, configuration, surface coverage, deposited distribution, dispersity, and a presence, and an extent of aggregation instances, of the particle material, formed on a part of the exposed layer surface 11 of the underlying layer 1010.

In some non-limiting examples, an assessment of the discontinuous layer 160 according to such at least one criterion, may be performed on, including without limitation, by at least one of: measuring, and calculating, at least one attribute of the discontinuous layer 160, using a variety of imaging techniques, including without limitation, at least one of: transmission electron microscopy (TEM), atomic force microscopy (AFM), and scanning electron microscopy (SEM).

Those having ordinary skill in the relevant art will appreciate that such an assessment of the discontinuous layer 160 may depend upon an extent, of the exposed layer surface 11 under consideration, which, in some non-limiting examples, may comprise an area, including without limitation, a region thereof. In some non-limiting examples, the discontinuous layer 160 may be assessed across the entire extent, in at least one of: a first lateral aspect, and a second lateral aspect that is substantially transverse thereto, of the exposed layer surface 11. In some non-limiting examples, the discontinuous layer 160 may be assessed across an extent that comprises at least one observation window applied against (a part of) the discontinuous layer 160.

In some non-limiting examples, the at least one observation window may be located at at least one of: a perimeter, interior location, and grid coordinate, of the lateral aspect of the exposed layer surface 11. In some non-limiting examples, a plurality of the at least one observation windows may be used in assessing the discontinuous layer 160.

In some non-limiting examples, the observation window may correspond to a field of view of an imaging technique applied to assess the discontinuous layer 160, including without limitation, at least one of: TEM, AFM, and SEM. In some non-limiting examples, the observation window may correspond to a given level of magnification, including without limitation, one of: 2.00, and 1.00, μm, and 500, and 200, nm.

In some non-limiting examples, the assessment of the discontinuous layer 160, including without limitation, at least one observation window used, of the exposed layer surface 11 thereof, may involve at least one of: calculating, and measuring, by any number of mechanisms, including without limitation, at least one of: manual counting, and known estimation techniques, which may, in some non-limiting examples, may comprise at least one of: curve, polygon, and shape, fitting techniques.

In some non-limiting examples, the assessment of the discontinuous layer 160, including without limitation, at least one observation window used, of the exposed layer surface 11 thereof, may involve at least one of: calculating, and measuring, at least one of: an average, median, mode, maximum, minimum, and other at least one of: probabilistic, statistical, and data, manipulation, of a value of the at least one of: calculation, and measurement.

In some non-limiting examples, one of the at least one criterion by which such discontinuous layer 160 may be assessed, may be a surface coverage of the particle material on such (part of the) discontinuous layer 160. In some non-limiting examples, the surface coverage may be represented by a (non-zero) percentage coverage by such particle material of such (part of the) discontinuous layer 160. In some non-limiting examples, the percentage coverage may be compared to a maximum threshold percentage coverage.

In some non-limiting examples, a (part of a) discontinuous layer 160 having a surface coverage that may be substantially no more than the maximum threshold percentage coverage, may result in a manifestation of different optical characteristics that may be imparted by such part of the discontinuous layer 160, to EM radiation passing therethrough, whether at least one of: transmitted entirely through the device 100, and emitted thereby, relative to EM radiation passing through a part of the discontinuous layer 160 having a surface coverage that substantially exceeds the maximum threshold percentage coverage.

In some non-limiting examples, one measure of a surface coverage of an amount of an electrically conductive material on a surface may be a (EM radiation) transmittance, since in some non-limiting examples, electrically conductive materials, including without limitation, metals, including without limitation: Ag, Mg, and Yb, may at least one of: attenuate, and absorb, EM radiation.

Those having ordinary skill in the relevant art will appreciate that in some non-limiting examples, surface coverage may be understood to encompass at least one of: particle size, and deposited density. Thus, in some non-limiting examples, a plurality of these three criteria may be positively correlated. Indeed, in some non-limiting examples, a criterion of low surface coverage may comprise some combination of a criterion of low deposited density with a criterion of low particle size.

In some non-limiting examples, one of the at least one criterion by which such discontinuous layer 160 may be assessed, may be a characteristic size of the constituent particle structures 150.

In some non-limiting examples, the at least one particle structure 150 of the discontinuous layer 160, may have a characteristic size that is no more than a maximum threshold size. In some non-limiting examples, the characteristic size may comprise at least one of: height, width, length, and diameter.

In some non-limiting examples, substantially all of the particle structures 150 of the discontinuous layer 160 may have a characteristic size that lies within a specified range.

In some non-limiting examples, such characteristic size may be characterized by a characteristic length, which in some non-limiting examples, may be considered a maximum value of the characteristic size. In some non-limiting examples, such maximum value may extend along a major axis of the particle structure 150. In some non-limiting examples, the major axis may be understood to be a first dimension extending in a plane defined by the plurality of lateral axes. In some non-limiting examples, a characteristic width may be identified as a value of the characteristic size of the particle structure 150 that may extend along a minor axis of the particle structure 150. In some non-limiting examples, the minor axis may be understood to be a second dimension extending in the same plane but substantially transverse to the major axis.

In some non-limiting examples, the characteristic length of the at least one particle structure 150, along the first dimension, may be no more than the maximum threshold size.

In some non-limiting examples, the characteristic width of the at least one particle structure 150, along the second dimension, may be no more than the maximum threshold size.

In some non-limiting examples, a size of the constituent particle structures 150, in the (part of the) discontinuous layer 160, may be assessed by at least one of: calculating, and measuring a characteristic size of such at least one particle structure 150, including without limitation, at least one of: a mass, volume, length of a diameter, perimeter, major, and minor axis, thereof.

In some non-limiting examples, one of the at least one criterion by which such discontinuous layer 160 may be assessed, may be a deposited density thereof.

In some non-limiting examples, the characteristic size of the particle structure 150 may be compared to a maximum threshold size.

In some non-limiting examples, the deposited density of the particle structures 150 may be compared to a maximum threshold deposited density.

In some non-limiting examples, at least one of such criteria may be quantified by a numerical metric. In some non-limiting examples, such a metric may be a calculation of a dispersity D that describes the distribution of particle (area) sizes in a deposited layer 130 of particle structures 150, in which:

$$D = \frac{\overline{S_s}}{\overline{S_n}} \tag{1}$$

where:

$$\overline{S_s} = \frac{\sum_{i=1}^{n} S_i^2}{\sum_{i=1}^{n} S_i}, \overline{S_n} = \frac{\sum_{i=1}^{n} S_i}{n}, \tag{2}$$

n is the number of particle structures 150 in a sample area, $S_i$ is the (area) size of the $i^{th}$ particle structure 150, $\overline{S_n}$ is the number average of the particle (area) sizes and $\overline{S_s}$ is the (area) size average of the particle (area) sizes.

Those having ordinary skill in the relevant art will appreciate that the dispersity is roughly analogous to a polydispersity index (PDI) and that these averages are roughly analogous to the concepts of number average molecular weight and weight average molecular weight familiar in organic chemistry, but applied to an (area) size, as opposed to a molecular weight of a sample particle structure 150.

Those having ordinary skill in the relevant will also appreciate that while the concept of dispersity may, in some non-limiting examples, be considered a three-dimensional volumetric concept, in some non-limiting examples, the dispersity may be considered to be a two-dimensional concept. As such, the concept of dispersity may be used in connection with viewing and analyzing two-dimensional images of the deposited layer 130, such as may be obtained by using a variety of imaging techniques, including without limitation, at least one of: TEM, AFM, and SEM. It is in such a two-dimensional context, that the equations set out above are defined.

In some non-limiting examples, at least one of: the dispersity, and the number average, of the particle (area) size and the (area) size average of the particle (area) size may involve a calculation of at least one of: the number average of the particle diameters and the (area) size average of the particle diameters:

$$\overline{d_n} = 2\sqrt{\frac{\overline{S_n}}{\pi}}, \overline{d_s} = 2\sqrt{\frac{\overline{S_s}}{\pi}} \quad (3)$$

In some non-limiting examples, the particle material, including without limitation as particle structures 150, of the at least one deposited layer 130, may be deposited by one of: an open mask, and mask-free, deposition process.

In some non-limiting examples, the particle structures 150 may have a substantially round shape. In some non-limiting examples, the particle structures 150 may have a substantially spherical shape.

For purposes of simplification, in some non-limiting examples, it may be assumed that a longitudinal extent of each particle structure 150 may be substantially the same (and, in any event, may not be directly measured from a plan view SEM image) so that the (area) size of the particle structure 150 may be represented as a two-dimensional area coverage along the pair of lateral axes. In the present disclosure, a reference to an (area) size may be understood to refer to such two-dimensional concept, and to be differentiated from a size (without the prefix "area") that may be understood to refer to a one-dimensional concept, such as a linear dimension.

Indeed, in some early investigations, it appears that, in some non-limiting examples, the longitudinal extent, along the longitudinal axis, of such particle structures 150, may tend to be small relative to the lateral extent (along at least one of the lateral axes), such that the volumetric contribution of the longitudinal extent thereof may be much less than that of such lateral extent. In some non-limiting examples, this may be expressed by an aspect ratio (a ratio of a longitudinal extent to a lateral extent) that may be no more than 1. In some non-limiting examples, such aspect ratio may be one of about: 1:10, 1:20, 1:50, 1:75, and 1:300.

In this regard, the assumption set out above (that the longitudinal extent is substantially the same and can be ignored) to represent the particle structure 150 as a two-dimensional area coverage may be appropriate.

Those having ordinary skill in the relevant art will appreciate, having regard to the non-determinative nature of the deposition process, especially in the presence of at least one of: defects, and anomalies, on the exposed layer surface 11 of the underlying layer 1010, including without limitation, heterogeneities, including without limitation, at least one of: a step edge, a chemical impurity, a bonding site, a kink, and a contaminant, thereon, and consequently the formation of particle structures 150 thereon, the non-uniform nature of coalescence thereof as the deposition process continues, and in view of the uncertainty in the at least one of: size, and position, of observation windows, as well as the intricacies and variability inherent in at least one of: the calculation, and measurement, of their characteristic size, spacing, deposited density, degree of aggregation, and the like, there may be considerable variability in terms of the features (topology) within observation windows.

In the present disclosure, for purposes of simplicity of illustration, certain details of particle materials, including without limitation, at least one of: thickness profiles, and edge profiles, of layer(s) have been omitted.

Those having ordinary skill in the relevant art will appreciate that certain metal NPs, whether as part of a discontinuous layer 160 of particle material, including without limitation, at least one particle structure 150, may exhibit at least one of: surface plasmon (SP) excitations, and coherent oscillations of free electrons, with the result that such NPs may one of: absorb, and scatter, light in a range of the EM spectrum, including without limitation, (a sub-range of) the visible spectrum. The optical response, including without limitation, at least one of: the (sub-) range of the EM spectrum over which absorption may be concentrated (absorption spectrum), refractive index, and extinction coefficient, of such one of: LSP excitations, and coherent oscillations, may be tailored by varying properties of such NPs, including without limitation, at least one of: a characteristic size, size distribution, shape, surface coverage, configuration, deposition density, dispersity, and property, including without limitation, at least one of: material, and degree of aggregation, of at least one of: the nanostructures, and a medium proximate thereto.

Such optical response, in respect of photon-absorbing coatings, may include absorption of photons incident thereon, thereby reducing reflection. In some non-limiting examples, the absorption may be concentrated in a range of the EM spectrum, including without limitation, (a sub-range of) the visible spectrum. While the at least one particle structure 150 may absorb EM radiation incident thereon from beyond the layered semiconductor device 100, thus reducing reflection, those having ordinary skill in the relevant art will appreciate that, in some non-limiting examples, the at least one particle structure 150 may absorb EM radiation incident thereon that is emitted by the device 100. In some non-limiting examples, employing a photon-absorbing layer as part of an opto-electronic device 200 may reduce reliance on a polarizer therein.

It has been reported in Fusella et al., "Plasmonic enhancement of stability and brightness in organic light-emitting devices", *Nature* 2020, 585, at 379-382, that the stability of an OLED device may be enhanced by incorporating an NP-based outcoupling layer above the cathode layer to extract energy from the plasmon modes. The NP-based outcoupling layer was fabricated by spin-casting cubic Ag NPs on top of an organic layer on top of a cathode. However, since most commercial OLED devices are fabricated using vacuum-based processing, spin-casting from solution may not constitute an appropriate mechanism for forming such an NP-based outcoupling layer above the cathode.

It has been discovered that such an NP-based outcoupling layer above the cathode may be fabricated in vacuum (and thus, may have applicability for use in a commercial OLED fabrication process), by depositing a metal particle material in a discontinuous layer 160 onto a patterning coating 110, which in some non-limiting examples, may at least one of: be, and be deposited on, the cathode. Such process may avoid the use of one of: solvents, and other wet chemicals, that may at least one of: cause damage to the OLED device 200 and may adversely impact device reliability.

In some non-limiting examples, the presence of such a discontinuous layer 160 of particle material, including without limitation, at least one particle structure 150, may contribute to enhanced extraction of at least one of: EM radiation, performance, stability, reliability, and lifetime of the device 100.

In some non-limiting examples, the existence, in a layered device 100, of at least one discontinuous layer 160, proximate to at least one of: the exposed layer surface 11 of a patterning coating 110, and, in some non-limiting examples, proximate to the interface of such patterning 110 with at least one overlying layer 170, may impart optical effects to signals, including without limitation, photons, that are one of: emitted by the device 100, and transmitted therethrough.

Those having ordinary skill in the relevant art will appreciate that, while a simplified model of the optical effects is presented herein, at least one of: other models, and other explanations, may be applicable.

In some non-limiting examples, the presence of such a discontinuous layer 160 of the particle material, including without limitation, at least one particle structure 150, may reduce (mitigate) crystallization of thin film coatings disposed adjacent in the longitudinal aspect, including without limitation, at least one of: the patterning coating 110, and at least one overlying layer 170, thereby stabilizing the property of the thin film(s) disposed adjacent thereto, and, in some non-limiting examples, reducing scattering. In some non-limiting examples, such thin film may comprise at least one layer of at least one of: an outcoupling, and an encapsulating coating (not shown) of the device 100, including without limitation, a capping layer (CPL).

In some non-limiting examples, the presence of such a discontinuous layer 160 of particle material, including without limitation, at least one particle structure 150, may provide an enhanced absorption in at least a part of the UV spectrum. In some non-limiting examples, controlling the characteristics of such particle structures 150, including without limitation, at least one of: characteristic size, size distribution, shape, surface coverage, configuration, deposited density, dispersity, particle material, and refractive index, of the particle structures 150, may facilitate controlling the degree of absorption, wavelength range and peak wavelength of the absorption spectrum, including in the UV spectrum. Enhanced absorption of EM radiation in at least a part of the UV spectrum may have applicability in certain scenarios calling for improving at least one of: device performance, stability, reliability, and lifetime.

In some non-limiting examples, the optical effects may be described in terms of its impact on at least one of: the transmission, and absorption wavelength spectrum, including at least one of: a wavelength range, and peak intensity thereof.

Additionally, while the model presented may suggest certain effects imparted on at least one of: the transmission, and absorption, of photons passing through such discontinuous layer 160, in some non-limiting examples, such effects may reflect local effects that may not be reflected on a broad, observable basis.

FIGS. 11A-11H illustrate non-limiting examples of possible interactions between the particle structure patterning coating $\mathbf{110}_p$ and the at least one particle structure 150 in contact therewith.

Thus, as shown in FIGS. 11A-11H, the particle material may be in physical contact with the patterning material 711, including without limitation, as shown in the various figures, being one of: deposited thereon, and being substantially surrounded thereby.

Figure 11B:
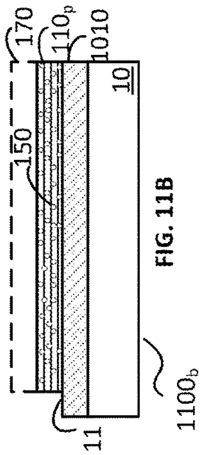
FIGS. 11A-11H are simplified block diagrams from a cross-sectional aspect, of example versions of the device of FIG. 1, showing various examples of possible interactions between the particle structure patterning coating and the particle structures according to examples in the present disclosure.
Figure 11D:
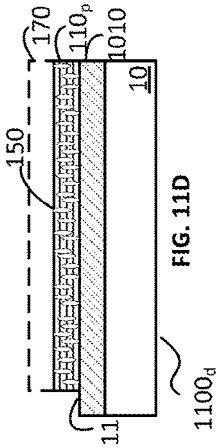
Figure 11F:
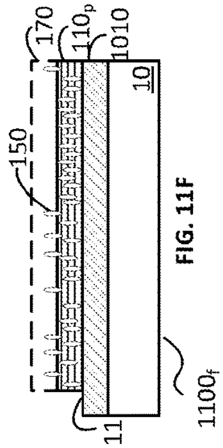
Figure 11H:
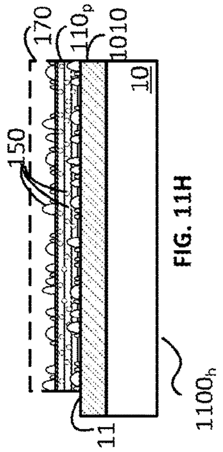
Figure 11A:
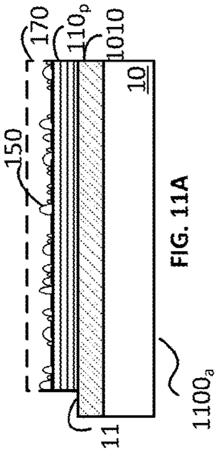

In FIG. 11A, the particle material may be in physical contact with the particle structure patterning coating $\mathbf{110}_p$ in that it is deposited thereon.

In FIG. 11B, the particle material may be substantially surrounded by the particle structure patterning coating $\mathbf{110}_p$. In some non-limiting examples, the at least one particle structure 150 may be distributed throughout at least one of: the lateral, and longitudinal, extent of the particle structure patterning coating $\mathbf{110}_p$.

In some non-limiting examples, the distribution of the at least one particle structure 150 throughout the particle structure patterning coating $\mathbf{110}_p$ may be achieved by causing the particle structure patterning coating $\mathbf{110}_p$ to be at least one of: deposited, and to remain, in a substantially viscous state at the time of deposition of the particle material thereon, such that the at least one particle structure 150 may tend to penetrate (settle) within the particle structure patterning coating $\mathbf{110}_p$.

In some non-limiting examples, the viscous state of the particle structure patterning coating $\mathbf{110}_p$ may be achieved in a number of manners, including without limitation, conditions during deposition of the patterning material 711, including without limitation, at least one of: a time, temperature, and pressure, of the deposition environment thereof, a composition of the patterning material 711, a characteristic of the patterning material 711, including without limitation, a melting point, a freezing temperature, a sublimation temperature, a viscosity, and a surface energy, thereof, conditions during deposition of the particle material, including without limitation, at least one of: a time, temperature, and pressure, of the deposition environment thereof, a composition of the particle material, and a characteristic of the particle material, including without limitation, a melting point, a freezing temperature, a sublimation temperature, a viscosity, and a surface energy thereof.

In some non-limiting examples, the distribution of the at least one particle structure 150 throughout the particle structure patterning coating $\mathbf{110}_p$ may be achieved through the presence of small apertures, including without limitation, at least one of: pin-holes, tears, and cracks, therein. Those having ordinary skill in the relevant art will appreciate that such apertures may be formed during the deposition of a thin film of the patterning structure patterning coating $\mathbf{110}_p$, using various techniques and processes, including without limitation, those described herein, due to inherent variability in the deposition process, and in some non-limiting examples, to the existence of impurities in at least one of the particle material and the exposed layer surface 11 of the patterning material 711.

Figure 11C:
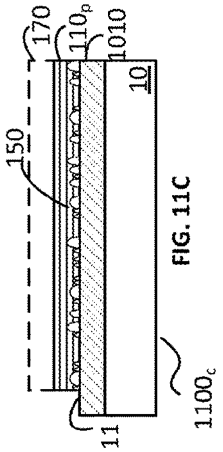

In FIG. 11C, the particle material of which the at least one particle structure 150 may be comprised may settle at a bottom of the particle structure patterning coating $\mathbf{110}_p$ such that it is effectively disposed on the exposed layer surface 11 of the underlying layer 1010.

In some non-limiting examples, the distribution of the at least one particle structure 150 at a bottom of the particle structure patterning coating $\mathbf{110}_p$ may be achieved by causing the particle structure patterning coating $\mathbf{110}_p$ to be at least one of: deposited, and to remain, in a substantially viscous state at the time of deposition of the particle material thereon, such that the at least one particle structure 150 may tend to settle to the bottom of the particle structure patterning coating 110$_p$. In some non-limiting examples, the viscosity of the patterning material 711 used in FIG. 11C may be no more than the viscosity of the patterning material 711 used in FIG. 11B, allowing the at least one particle structure 150 to settle further within the particle structure patterning coating 110$_p$, eventually descending to the bottom thereof.

Figure 11E:
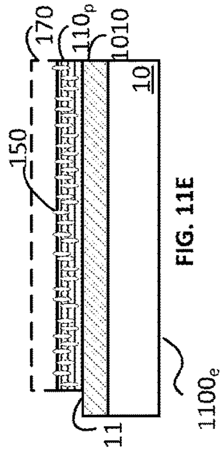

In FIGS. 11D-11F, a shape of the at least one particle structure 150 is shown as being longitudinally elongated relative to a shape of the at least one particle structure 150 of FIG. 11B.

In some non-limiting examples, the longitudinally elongated shape of the at least one particle structure 150 may be achieved in a number of manners, including without limitation, conditions during deposition of the patterning material 711, including without limitation, at least one of: a time, temperature, and pressure, of the deposition environment thereof, a composition of the patterning material 711, a characteristic of the patterning material 711, including without limitation, a melting point, a freezing temperature, a sublimation temperature, a viscosity, and a surface energy thereof, conditions during deposition of the particle material, including without limitation, a time, temperature, and pressure, of the deposition environment thereof, a composition of the particle material, and a characteristic of the particle material, including without limitation, a melting point, a freezing temperature, a sublimation temperature, a viscosity, and a surface energy thereof, that may tend to facilitate the deposition of such longitudinally elongated particle structures 150.

In FIG. 11D, the longitudinally elongated particle structures 150 are shown to remain substantially entirely within the particle structure patterning coating 110$_p$. By contrast, in FIG. 11E, at least one of the longitudinally elongated particle structures 150 may be shown to protrude at least partially beyond the exposed layer surface 11 of the particle structure patterning coating 110$_p$. Further, in FIG. 11F, at least one of the longitudinally elongated particle structures 150 may be shown to protrude substantially beyond the exposed layer surface 11 of the particle structure patterning coating 110$_p$, to the extent that such protruding particle structures 150 may begin to be considered to be substantially deposited on the exposed layer surface 11 of the particle structure patterning coating 110$_p$.

Figure 11G:
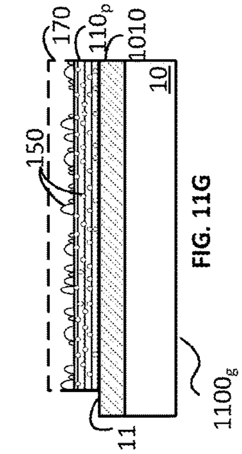

Thus, as shown in FIG. 11G, there may be a scenario in which at least one particle structure 150 may be deposited on the exposed layer surface 11 of the particle structure patterning coating 110$_p$ and at least one particle structure 150 may settle within the particle structure patterning coating 110$_p$. Although the at least one particle structure 150 shown within the particle structure patterning coating 110$_p$ is shown as having a shape such as is shown in FIG. 11B, those having ordinary skill in the relevant art will appreciate that, although not shown, such particle structures 150 may have a longitudinally elongated shape such as is shown in FIGS. 11D-11F.

Further, FIG. 11H shows a scenario in which at least one particle structure 150 may be deposited on the exposed layer surface 11 of the particle structure patterning coating 110$_p$, at least one particle structure 150 may penetrate (settle within) the particle structure patterning coating 110$_p$, and at least one particle structure 150 may settle to the bottom of the particle structure patterning coating 110$_p$.

Auxiliary Electrode

Those having ordinary skill in the relevant art will appreciate that the process of depositing a deposited layer 130 to form the second electrode 240 may, in some non-limiting examples, be used in similar fashion to form an auxiliary electrode 1250 for the device 200.

In some non-limiting examples, particularly in a top-emission device 200, the second electrode 240 may be formed by depositing a substantially thin conductive film layer in order, in some non-limiting examples, to reduce optical interference (including, without limitation, at least one of: attenuation, reflections, and diffusion) related to the presence of the second electrode 240.

In some non-limiting examples, particularly in at least one of: a bottom-emission, and double-sided emission, device 200, the second electrode 240 may be formed as a substantially thick conductive layer without substantially affecting optical characteristics of such a device 200. Nevertheless, even in such scenarios, the second electrode 240 may nevertheless be formed as a substantially thin conductive film layer, in some non-limiting examples, so that the device 200 may be substantially transmissive relative to EM radiation incident on an external surface thereof, such that a substantial part of such externally-incident EM radiation may be transmitted through the device 200, in addition to the emission of EM radiation generated internally within the device 200 as disclosed herein.

In some non-limiting examples, a device 200 having at least one electrode 220, 240 with a high sheet resistance may create a large current resistance (IR) drop when coupled with the power source 204, in operation. In some non-limiting examples, such an IR drop may be compensated for, to some extent, by increasing a level of the power source 204. However, in some non-limiting examples, increasing the level of the power source 204 to compensate for the IR drop due to high sheet resistance, for at least one (sub-) pixel 615/216 may call for increasing the level of a voltage to be supplied to other components to maintain effective operation of the device 200.

In some non-limiting examples, as discussed elsewhere, a reduced thickness of the second electrode 240, may generally increase a sheet resistance of the second electrode 240, which may, in some non-limiting examples, reduce at least one of: the performance, and efficiency, of the device 200. By providing the auxiliary electrode 1250 that may be electrically coupled with the second electrode 240, the sheet resistance and thus, the IR drop associated with the second electrode 240, may, in some non-limiting examples, be decreased.

In some non-limiting examples, to reduce power supply demands for a device 200 without significantly impacting an ability to make an electrode 220, 240 substantially thin, an auxiliary electrode 1250 may be formed on the device 200 to allow current to be carried more effectively to various emissive region(s) 210 of the device 200, while at the same time, reducing the sheet resistance and its associated IR drop of the transmissive electrode 220, 240.

In some non-limiting examples, a sheet resistance specification, for a common electrode 220, 240 of a display device 200, may vary according to several parameters, including without limitation, at least one of: a (panel) size of the device 200, and a tolerance for voltage variation across the device 200. In some non-limiting examples, the sheet resistance specification may increase (that is, a lower sheet resistance is specified) as the panel size increases. In some non-limiting examples, the sheet resistance specification may increase as the tolerance for voltage variation decreases.

In some non-limiting examples, a sheet resistance specification may be used to derive an example thickness of an auxiliary electrode 1250 to comply with such specification for various panel sizes.

In some non-limiting examples, the auxiliary electrode 1250 may be electrically coupled with the second electrode 240 to reduce a sheet resistance thereof. In some non-limiting examples, the auxiliary electrode 1250 may be in physical contact, including without limitation, being deposited over at least a part thereof, with the second electrode 240 to reduce a sheet resistance thereof. In some non-limiting examples, the auxiliary electrode 1250 may not be in physical contact with the second electrode 240 but may be electrically coupled with the second electrode 240 by several well-understood mechanisms. In some non-limiting examples, the presence of a substantially thin film (in some non-limiting examples, of up to about 50 nm) of a patterning coating 110 extending between and separating the auxiliary electrode 1250 and the second electrode 240, may still allow a current to pass therethrough, thus allowing a sheet resistance of the second electrode 240 to be reduced.

The auxiliary electrode 1250 may be electrically conductive. In some non-limiting examples, the auxiliary electrode 1250 may be formed by at least one of: a metal, and a metal oxide. In some non-limiting examples, such metals may comprise at least one of: Cu, Al, molybdenum (Mo), and Ag. In some non-limiting examples, the auxiliary electrode 1250 may comprise a multi-layer metallic structure, including without limitation, one formed by Mo/Al/Mo. In some non-limiting examples, such metal oxides may comprise at least one of: ITO, ZnO, IZO, and other oxides comprising In, and Zn. In some non-limiting examples, the auxiliary electrode 1250 may comprise a multi-layer structure formed by a combination of at least one metal and at least one metal oxide, including without limitation, Ag/ITO, Mo/ITO, ITO/Ag/ITO, and ITO/Mo/ITO. In some non-limiting examples, the auxiliary electrode 1250 may comprise a plurality of such electrically conductive materials.

Because of the nucleation-inhibiting properties of those portions 101 where the patterning coating 110 was disposed, the deposited material 831 disposed in the first portion 101 may tend to not remain, resulting in a pattern of selective deposition of the deposited layer 130, that may correspond substantially to at least one second portion 102, leaving the first portion 101 substantially devoid of a closed coating 140 of the deposited layer 130.

In other words, the deposited layer 130 that may form the auxiliary electrode 1250 may be selectively deposited substantially only on a second portion 102 comprising those regions of the at least one semiconducting layer 230, that surround but do not occupy the first portion 101.

In some non-limiting examples, selectively depositing the auxiliary electrode 1250 to cover only certain portions 102 of the lateral aspect of the device 200, while other portions 101 thereof remain uncovered, may one of: control, and reduce, optical interference related to the presence of the auxiliary electrode 1250.

In some non-limiting examples, the auxiliary electrode 1250 may be selectively deposited in a pattern that may not be readily detected by the naked eye from a typical viewing distance.

In some non-limiting examples, the auxiliary electrode 1250 may be formed in devices 100 other than OLED devices 200, including for decreasing an effective resistance of the electrodes of such devices 200.

Figure 12:
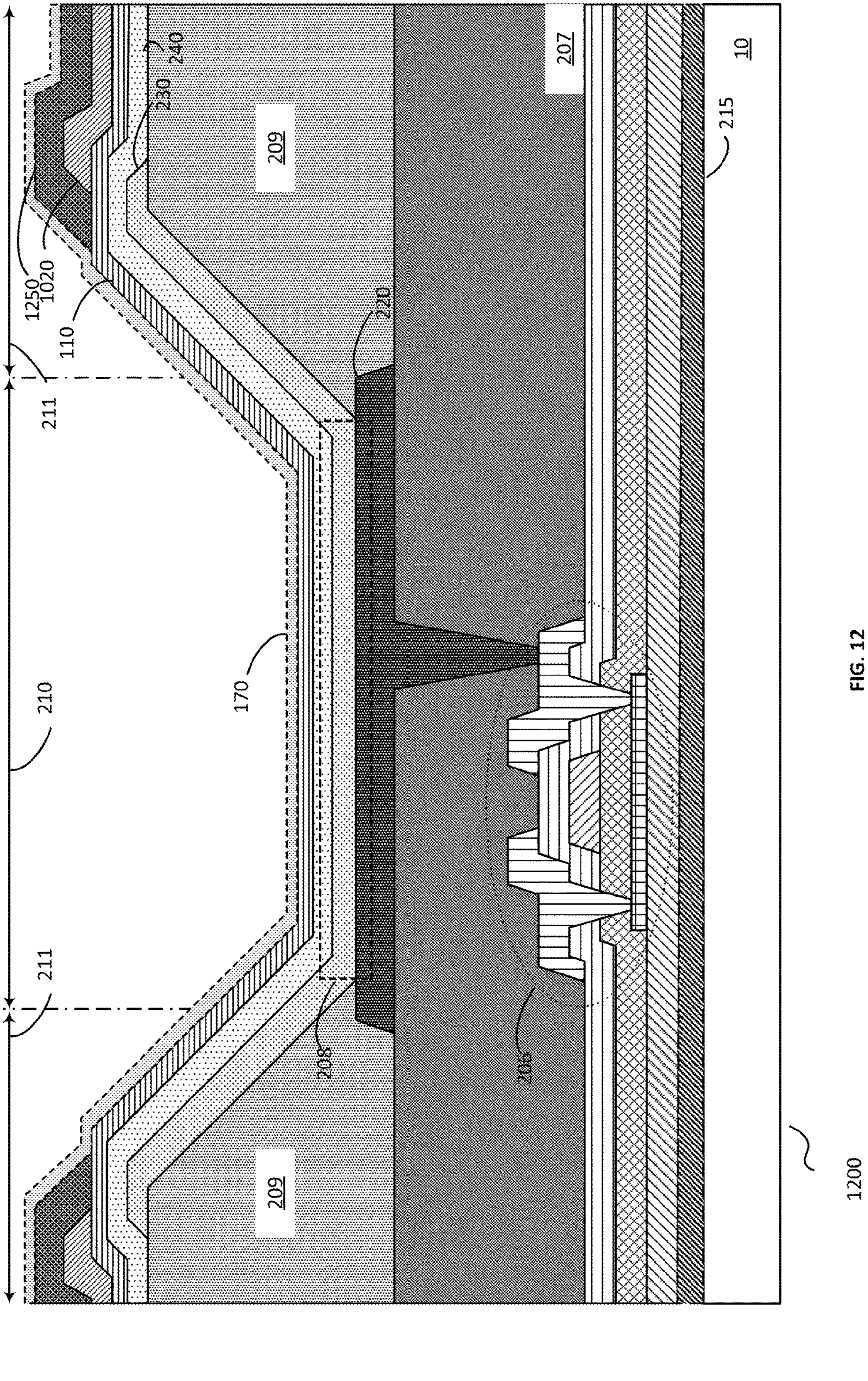
FIG. 12 is a schematic diagram illustrating an example cross-sectional view of an example version of the device of FIG. 2 with additional example deposition steps according to an example in the present disclosure.

Turning now to FIG. 12, there may be shown an example version 1200 of the device 200, which may encompass the device 200 shown in cross-sectional view in FIG. 2, but with additional deposition steps that are described herein.

The device 1200 may show a patterning coating 110 deposited over the exposed layer surface 11 of the underlying layer 1010, in some non-limiting examples, as shown, the second electrode 240.

The patterning coating 110 may provide an exposed layer surface 11 with a substantially low initial sticking probability against deposition of a deposited material 831 to be thereafter deposited as a deposited layer 130 to form an auxiliary electrode 1250.

In some non-limiting examples, after deposition of the patterning coating 110, an NPC 1020 may be selectively deposited over the exposed layer surface 11 of the underlying layer 1010, in some non-limiting examples, as shown, the patterning coating 110.

In some non-limiting examples, the NPC 1020 may be disposed between the auxiliary electrode 1250 and the second electrode 240.

In some non-limiting examples, the NPC 1020 may be selectively deposited using a shadow mask 715, in a second portion 102 of the lateral aspect of the device 1200.

The NPC 1020 may provide an exposed layer surface 11 with a substantially high initial sticking probability against deposition of a deposited material 831 to be thereafter deposited as a deposited layer 130 to form an auxiliary electrode 1250.

After selective deposition of the NPC 1020, the deposited material 831 may be deposited over the device 1200 but may remain substantially where the patterning coating 110 has been overlaid with the NPC 1020, to form the auxiliary electrode 1250, that is, substantially only the second portion 102.

In some non-limiting examples, the deposited layer 130 may be deposited using one of: an open mask, and a mask-free, deposition process.

Transparent OLED

Because the OLED device 200 may emit EM radiation through at least one of: the first electrode 220 (in the case of one of: a bottom-emission, and a double-sided emission, device 200), as well as the substrate 10, and the second electrode 240 (in the case of one of: a top-emission, and double-sided emission, device 200), there may be an aim to make at least one of: the first electrode 220, and the second electrode 240, substantially EM radiation-(light-) transmissive ("transmissive"), in some non-limiting examples, at least across a substantial part of the lateral aspect of the emissive region(s) 210 of the device 200. In the present disclosure, such a transmissive element, including without limitation, an electrode 220, 240, at least one of: a material from which such element may be formed, and a property thereof, may comprise at least one of: an element, material, and property thereof, that is one of: substantially transmissive ("transparent"), and, in some non-limiting examples, partially transmissive ("semi-transparent"), in some non-limiting examples, in at least one wavelength range.

A variety of mechanisms may be adopted to impart transmissive properties to the device 200, at least across a substantial part of the lateral aspect of the emissive region(s) 210 thereof.

In some non-limiting examples, including without limitation, where the device 200 is at least one of: a bottom-emission, and a double-sided emission, device, the TFT structure(s) 206 of the driving circuit associated with an emissive region 210 of a (sub-) pixel 615/216, which may at least partially reduce the transmissivity of the surrounding substrate 10, may be located within the lateral aspect of the surrounding non-emissive region(s) 211 to avoid impacting the transmissive properties of the substrate 10 within the lateral aspect of the emissive region 210.

In some non-limiting examples, where the device 200 is a double-sided emission device 200, in respect of the lateral aspect of an emissive region 210 of a (sub-) pixel 615/216, a first one of the electrodes 220, 240 may be made substantially transmissive, including without limitation, by at least one of the mechanisms disclosed herein, in respect of the lateral aspect of neighbouring (sub-) pixel(s) 615/216, a second one of the electrodes 220, 240 may be made substantially transmissive, including without limitation, by at least one of the mechanisms disclosed herein. Thus, the lateral aspect of a first emissive region 210 of a (sub-) pixel 615/216 may be made substantially top-emitting while the lateral aspect of a second emissive region 210 of a neighbouring (sub-) pixel 615/216 may be made substantially bottom-emitting, such that a subset of the (sub-) pixel(s) 615/216 may be substantially top-emitting and a subset of the (sub-) pixel(s) 615/216 may be substantially bottom-emitting, in an alternating (sub-) pixel 615/216 sequence, while only a single electrode 220, 240 of each (sub-) pixel 615/216 may be made substantially transmissive.

In some non-limiting examples, a mechanism to make an electrode 220, 240, in the case of at least one of: a bottom-emission device 200, and a double-sided emission device 200, the first electrode 220, and in the case of at least one of: a top-emission device 200, and a double-sided emission device 200, the second electrode 240, transmissive, may be to form such electrode 220, 240 of a transmissive thin film.

In some non-limiting examples, an electrically conductive deposited layer 130, in a thin film, including without limitation, those formed by depositing a thin conductive film layer of at least one of: a metal, including without limitation, Ag, Al, and a metallic alloy, including without limitation, at least one of: an Mg:Ag alloy, and a Yb:Ag alloy, may exhibit transmissive characteristics. In some non-limiting examples, the alloy may comprise a composition ranging from between about 1:9-9:1 by volume. In some non-limiting examples, the electrode 220, 240 may be formed of a plurality of thin conductive film layers of any combination of deposited layers 130, any at least one of which may be comprised of at least one of: TCOs, thin metal films, and thin metallic alloy films.

In some non-limiting examples, especially in the case of such thin conductive films, a substantially thin layer thickness may be up to substantially a few tens of nm to contribute to enhanced transmissive qualities but also favorable optical properties (including without limitation, reduced microcavity effects) for use in an OLED device 200.

Thus, in some non-limiting examples, an average layer thickness of the second electrode 240 may be no more than about 40 nm, including without limitation, one of between about: 5-30, $10^{-25}$, and 15-25, nm.

In some non-limiting examples, a reduction in the thickness of an electrode 220, 240 to promote transmissive qualities may be accompanied by an increase in the sheet resistance of the electrode 220, 240.

In some non-limiting examples, the auxiliary electrode 1250 may be electrically coupled with the second electrode 240 to reduce a sheet resistance of thin, and concomitantly, (substantially) transmissive, second electrode 240.

In some non-limiting examples, the auxiliary electrode 1250 may not be substantially transmissive but may be electrically coupled with the second electrode 240, including without limitation, by deposition of a conductive deposited layer 130 therebetween, to reduce an effective sheet resistance of the second electrode 240.

In some non-limiting examples, such auxiliary electrode 1250 may be one of: positioned, and shaped, in at least one of: a lateral aspect, and longitudinal aspect, to not interfere with the emission of photons from the lateral aspect of the emissive region 210 of a (sub-) pixel 615/216.

In some non-limiting examples, a mechanism to make at least one of: the first electrode 220, and the second electrode 240, may be to form such electrode 220, 240 in a pattern across at least one of: at least a part of the lateral aspect of the emissive region(s) 210 thereof, and in some non-limiting examples, across at least a part of the lateral aspect of the non-emissive region(s) 211 surrounding them. In some non-limiting examples, such mechanism may be employed to form the auxiliary electrode 1250 in one of: a position, and shape, in at least one of: a lateral aspect, and longitudinal aspect to not interfere with the emission of photons from the lateral aspect of the emissive region 210 of a (sub-) pixel 615/216, as discussed above.

In some non-limiting examples, the device 200 may be configured such that it may be substantially devoid of a conductive oxide material in an optical path of EM radiation emitted by the device 200. In some non-limiting examples, in the lateral aspect of at least one emissive region 210 corresponding to a (sub-) pixel 615/216, at least one of the coatings deposited after the at least one semiconducting layer 230, including without limitation, at least one of: the second electrode 240, the patterning coating 110, and any other coatings deposited thereon, may be substantially devoid of any conductive oxide material. In some non-limiting examples, being substantially devoid of any conductive oxide material may reduce at least one of: absorption, and reflection, of EM radiation emitted by the device 200. In some non-limiting examples, conductive oxide materials, including without limitation, at least one of: ITO, and IZO, may absorb EM radiation in at least the B(lue) region of the visible spectrum, which may, in generally, reduce at least one of: efficiency, and performance, of the device 200.

In some non-limiting examples, a combination of these mechanisms may be employed.

Additionally, in some non-limiting examples, in addition to rendering at least one of the first electrode 220, the second electrode 240, and the auxiliary electrode 1250, substantially transmissive across at least a substantial part of the lateral aspect of the emissive region 210 corresponding to the (sub-) pixel(s) 615/216 of the device 200, to allow EM radiation to be emitted substantially across the lateral aspect thereof, there may be an aim to make at least one of the lateral aspect(s) of the surrounding non-emissive region(s) 211 of the device 200 substantially transmissive in both the bottom and top directions, to render the device 200 substantially transmissive relative to EM radiation incident on an external surface thereof, such that a substantial part of such externally-incident EM radiation may be transmitted through the device 200, in addition to the emission (in at least one of: a top-emission, bottom-emission, and double-sided emission) of EM radiation generated internally within the device 200 as disclosed herein.

In some non-limiting examples, the transmissive region 212 of the device 200 may remain substantially devoid of any materials that may substantially affect the transmission of EM radiation therethrough, including without limitation, signals, including without limitation, in at least one of: the IR, and the NIR, spectrum. In some non-limiting examples, the TFT structure(s) 206 and the first electrode 220 may be positioned, in a longitudinal aspect, below the (sub-) pixel 615/216 corresponding thereto, and together with the auxiliary electrode 1250, may lie beyond the transmissive region 212. As a result, these components may not impede, including without limitation, attenuate EM radiation, including without limitation, light, from being transmitted through the transmissive region 212. In some non-limiting examples, such arrangement may allow a viewer viewing the device 200 from a typical viewing distance to see through the device 200, in some non-limiting examples, when all the (sub-) pixel(s) 615/216 may not be emitting, thus creating a transparent device 200.

In some non-limiting examples, a patterning coating 110 may be selectively deposited over first portion(s) 101 of the device 200, comprising a transmissive region 212.

In some non-limiting examples, at least one particle structure 150 may be disposed on an exposed layer surface 11 within the transmissive region 212, to facilitate absorption of EM radiation therein in at least a part of the visible spectrum, while allowing signals having a wavelength in at least a part of at least one of: the IR, and NIR, spectrum to be exchanged through the device 200 in the transmissive region 212.

Those having ordinary skill in the relevant art will appreciate that in some non-limiting examples, various other coatings, including without limitation those forming at least one of: the at least one semiconducting layer(s) 230, and the second electrode 240, may cover a part of the transmissive region 212, especially if such coatings are substantially transparent. In some non-limiting examples, the PDL(s) 209 may have a reduced thickness, including without limitation, by forming a well therein, which, in some non-limiting examples, may be similar to the well defined for emissive region(s) 210, to further facilitate transmission of EM radiation through the transmissive region 212.

In some non-limiting examples, the transmissive region 212 of the device 200 may remain substantially devoid of any materials that may substantially inhibit the transmission of EM radiation, including without limitation, signals, including without limitation, in at least one of: the IR spectrum, and the NIR spectrum, therethrough. In some non-limiting examples, at least one of: the TFT structure 206, and the first electrode 220, may be positioned, in a longitudinal aspect below the (sub-) pixel 615/216 corresponding thereto and beyond the transmissive region 212. As a result, these components may not impede, including without limitation, attenuate, EM radiation from being transmitted through the transmissive region 212. In some non-limiting examples, such arrangement may allow a viewer viewing the device 200 from a typical viewing distance to see through the device 200, in some non-limiting examples, when the (sub-) pixel(s) 615/216 are not emitting, thus creating a transparent AMOLED device 200.

In some non-limiting examples, such arrangement may also allow at least one of: an IR emitter $330_e$, and an IR detector $330_d$, to be arranged behind the device 200 such that signals, including without limitation, in at least one of: the IR, and NIR, spectrum, to be exchanged through the device 200 by such under-display components 330.

In some non-limiting examples, as discussed herein, the patterning coating 110 may be formed concurrently with the at least one semiconducting layer(s) 230. In some non-limiting examples, at least one material used to form the patterning coating 110 may also be used to form the at least one semiconducting layer(s) 230. In such non-limiting example, several stages for fabricating the device 200 may be reduced, which may, in some non-limiting examples, facilitate making the transmissive region 212 (substantially) transmissive.

Figure 13:
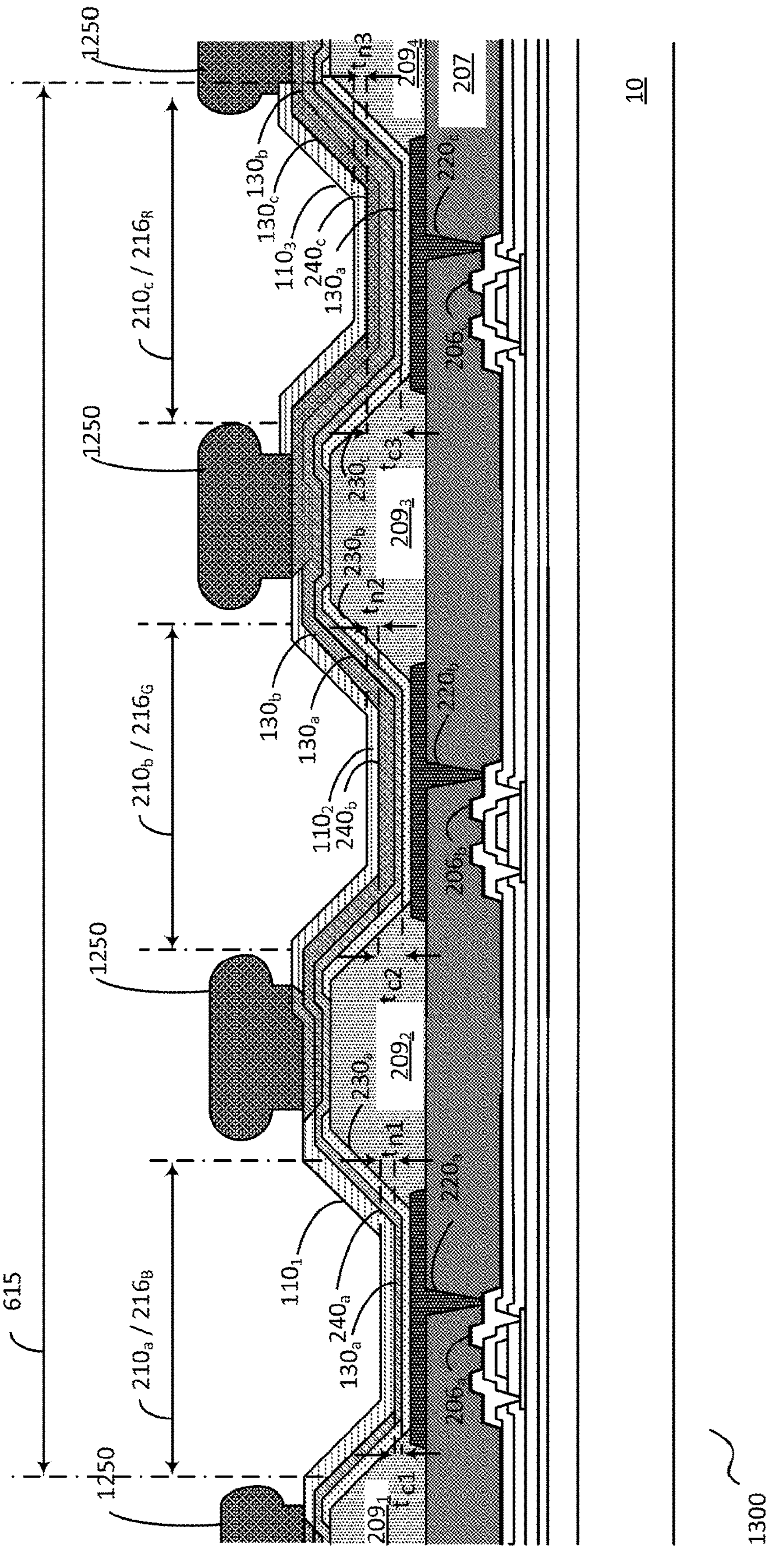
FIG. 13 is a schematic diagram that may show example stages of an example process for manufacturing an example version of an OLED device having sub-pixel regions having a second electrode of different thickness according to an example in the present disclosure.

Turning now to FIG. 13, there is shown an example cross-sectional view of a fragment of an example version 1300 of the opto-electronic device 200 according to the present disclosure. In the fragment shown, emissive regions 210 corresponding to each of three sub-pixels 216, of a single pixel 615, are shown, which in some non-limiting examples, may correspond to a B(lue) sub-pixel 216B, a G(reen) sub-pixel 216G, and a R(ed) sub-pixel 216R. In some non-limiting examples, each sub-pixel 216 may have a first electrode 220, with which an associated TFT structure 206 may be electrically coupled, a second electrode 240, and at least one semiconducting layer 230 deposited between the first electrode 220 and the second electrode 240.

In some non-limiting examples, the at least one semiconducting layer 230 may comprise at least one R(ed) EML material within at least the lateral aspect of the R(ed) sub-pixel 216R. In some non-limiting examples, the at least one semiconducting layer 230 may comprise at least one G(reen) EML material within at least the lateral aspect of the G(reen) sub-pixel 216G. In some non-limiting examples, the at least one semiconducting layer 230 may comprise at least one B(lue) EML material within at least the lateral aspect of the B(lue) sub-pixel 216B.

In some non-limiting examples, at least one characteristic of at least one of the at least one semiconducting layer 230, including without limitation, at least one of: the HIL 231, HTL 233, EML 235, ETL 237, and EIL 239, including without limitation, a presence thereof, an absence thereof, a thickness thereof, a composition thereof, and an order thereof, in the longitudinal aspect, may be varied within at least a lateral aspect of one of the (sub-) pixels 216, to facilitate emission therefrom of EM radiation having a wavelength spectrum corresponding to the colour by which such sub-pixel 216 may be denoted, including without limitation, at least one of: R(ed), G(reen), and B(lue), such that such at least one characteristic may be varied across substantially its entire lateral extent.

In some non-limiting examples, neighboring sub-pixels 216 may be separated by a non-emissive region 211 having a corresponding PDL 209, that covers at least a part of an extremity of the corresponding first electrodes 220. In some non-limiting examples, although not shown, the PDL 209 may be truncated in at least one of: a lateral aspect, and a longitudinal aspect. In some non-limiting examples, truncation of the PDL 209 in the lateral aspect may cause the lateral extent of the neighboring emissive regions 210 to be at least, and in some non-limiting examples, exceed, including without limitation, be a multiple of, the lateral extent of the non-emissive region 211 interposed therebetween.

In some non-limiting examples, although not shown, at least one PDL 209 between neighboring emissive regions 210 may be truncated to a greater extent than shown, until the emissive regions 210 may be considered to be substantially immediately adjacent to one another, substantially without a non-emissive region 211 therebetween.

In some non-limiting examples, although not shown, neighboring emissive regions 210 may not have a PDL 209 interposed therebetween, although, in such scenario, alternative measures may be called for to electrically isolate a first electrode 220 corresponding to a first emissive region 210 from a first electrode 220 corresponding to a second emissive region 210 immediately adjacent thereto.

In some non-limiting examples, the at least one semiconducting layer 230 may extend across substantially the lateral extent of each of the first electrodes 220 and across substantially the lateral extent of each of the non-emissive regions 211 corresponding to the PDLs 209 separating them. In some non-limiting examples, the at least one semiconducting layer 230 may extend across substantially the entire lateral aspect of the device 200.

Selective Deposition to Modulate Electrode Thickness over Emissive Region(s)

In some non-limiting examples, the output, including without limitation, the emission spectrum, of a given (sub-) pixel 615/216 may be impacted, according to at least one of: its associated color, and wavelength range, including without limitation, by at least one of: controlling, modulating, and tuning, optical microcavity effects, including without limitation, at least one of: an emission spectrum, a (n) (luminous) intensity, and an angular distribution of at least one of: a brightness, and a color shift, of emitted light in each emissive region 210 corresponding each (sub-) pixel 615/216.

Some factors that may impact an observed microcavity effect in a device 200 include, without limitation, a total path length (which, in some non-limiting examples, may correspond to a total thickness (in the longitudinal aspect) of the device 200 through which EM radiation emitted therefrom will travel before being outcoupled) and the refractive indices of various layers and coatings.

Since the wavelength of (sub-) pixels 615/216 of different colours may be different, the optical characteristics of such (sub-) pixels 615/216 may differ, especially if a common electrode 220, 240 having a substantially uniform thickness profile may be employed for (sub-) pixels 615/216 of different colours.

In some non-limiting examples, a separation distance between the pair of electrodes 220, 240 within an emissive region 210 corresponding to a (sub-) pixel 615/216, may be varied to reflect a (half-) integer multiple of a wavelength range associated with an emitted colour of the (sub-) pixel 615/216.

In some non-limiting examples, such tuning may be achieved, at least in part, by varying the thickness of the at least one semiconducting layer 230 extending between the electrodes 220, 240.

In some non-limiting examples, where (substantially all) the at least one semiconducting layer 230 comprise(s) a common layer extending across all of the (sub-) pixels 615/216, such measures may be incomplete.

In some non-limiting examples, irrespective of whether a thickness of the at least one semiconducting layer 230 may be varied, at least one of: across the device 300, and as between (sub-) pixels 615/216 thereof, the separation distance between the pair of electrodes 220, 240 within an emissive region 210 corresponding to a (sub-) pixel 615/216 may be further varied by modulating the thickness of an electrode 220, 240 in, and across a lateral aspect of emissive region(s) 210 of such (sub-) pixel 615/216.

The second electrode 240 used in such devices 200 may in some non-limiting examples, be a common electrode 220, 240 coating a plurality of (sub-) pixels 615/216. In some non-limiting examples, such common electrode 220, 240 may be a substantially thin conductive film having a substantially uniform thickness across the device 200. When a common electrode 220, 240 having a substantially uniform thickness may be provided as the second electrode 240 in a device 200, the optical performance of the device 200 may not be readily be fine-tuned according to an emission spectrum associated with each (sub-) pixel 615/216.

In some non-limiting examples, modulating a thickness of an electrode 220, 240 in and across a lateral aspect of emissive region(s) 210 of a (sub-) pixel 615/216 may impact the microcavity effect observable. In some non-limiting examples, such impact may be attributable to a change in the total optical path length.

In some non-limiting examples, modulating a thickness of an electrode 220, 240 in and across a lateral aspect of emissive region(s) 210 of a (sub-) pixel 615/216 may impact the microcavity effect observable. In some non-limiting examples, such impact may be attributable to a change in the total optical path length.

In some non-limiting examples, a change in a thickness of the electrode 220, 240 may also change the refractive index of EM radiation passing therethrough, in some non-limiting examples, in addition to a change in the total optical path length. In some non-limiting examples, this may be particularly the case where the electrode 220, 240 may be formed of at least one deposited layer 130.

Thus, in some non-limiting examples, the presence of optical interfaces created by a plurality of thin-film coatings with different refractive indices, such as may, in some non-limiting examples, be used to construct opto-electronic devices 200 including without limitation devices 200, may create different optical microcavity effects for (sub-) pixels 615/216 of different colours.

In some non-limiting examples, selective deposition of at least one deposited layer 130 through deposition of at least one patterning coating 110, including without limitation, at least one of: an NIC, and an NPC 1020, in the lateral aspects of emissive region(s) 210 corresponding to different (sub-) pixel(s) 615/216, may allow the thickness of at least one electrode 220, 240, of each (sub-) pixel 615/216 to be varied, and concomitantly, for the optical microcavity effect in each emissive region 210 corresponding thereto, to be at least one of: controlled, and modulated, to optimize desirable optical microcavity effects on a (sub-) pixel 615/216 basis.

The thickness of the at least one electrode 220, 240 may be varied by independently modulating at least one of: an average layer thickness, and a number, of the deposited layer(s) 130, disposed in each emissive region 210 of the (sub-) pixel(s) 615/216. By way of non-limiting example, the average layer thickness of a second electrode 240 disposed over, and corresponding to, a B(lue) sub-pixel 216B may be no more than the average layer thickness of a second electrode 240 disposed over, and corresponding to, a G(reen) sub-pixel 216G, and the average layer thickness of a second electrode 240 disposed over, and corresponding to, a G(reen) sub-pixel 216G may be no more than the average layer thickness of a second electrode 240 disposed over, and corresponding to, a R(ed) sub-pixel 216R.

Turning now to FIG. 13, in some non-limiting examples, including without limitation, in versions 1300 of an OLED display device 200 there may be deposited layer(s) 130 of varying average layer thickness selectively deposited for emissive region(s) 210 corresponding to sub-pixel(s) 216, having different emission spectra. In some non-limiting examples, a first emissive region $\mathbf{210}_a$ may correspond to a (sub-) pixel 615/216 configured to emit EM radiation of a first at least one of: a wavelength, and an emission spectrum. In some non-limiting examples, a device 1300 may comprise a second emissive region $\mathbf{210}_b$ that may correspond to a (sub-) pixel 615/216 configured to emit EM radiation of a second at least one of: a wavelength, and an emission spectrum. In some non-limiting examples, a device 1300 may comprise a third emissive region $\mathbf{210}_c$ that may correspond to a (sub-) pixel 615/216 configured to emit EM radiation of a third at least one of: a wavelength, and an emission spectrum.

In some non-limiting examples, the first wavelength may be one of: no more than, greater than, and equal to, at least one of: the second wavelength, and the third wavelength. In some non-limiting examples, the second wavelength may be one of: no more than, greater than, and equal to, at least one of: the first wavelength, and the third wavelength. In some non-limiting examples, the third wavelength may be at least one of: no more than, greater than, and equal to, at least one of: the first wavelength, and the second wavelength.

As shown by way of non-limiting example in FIG. 13, there may be deposited layer(s) 130 of varying at least one of: number, and average layer thickness, selectively deposited for various emissive region(s) 210 corresponding to various (sub-) pixel(s) 615/216, in some non-limiting examples, in the device 1300, having different emission spectra. In some non-limiting examples, the device 1300 may comprise a first emissive region $\mathbf{210}_a$ corresponding to a sub-pixel 216B configured to emit EM radiation of at least one of: a first wavelength, and emission spectrum, which in some non-limiting examples, may be associated with a B(lue) emitted colour. In some non-limiting examples, the device 1300 may comprise a second emissive region $\mathbf{210}_b$ corresponding to a sub-pixel 216G configured to emit EM radiation of at least one of: a second wavelength, and emission spectrum, which in some non-limiting examples, may be associated with a G(reen) emitted colour. In some non-limiting examples, the device 1300 may comprise a third emissive region $\mathbf{210}_c$ corresponding to a sub-pixel 216R configured to emit EM radiation of at least one of: a third wavelength, and emission spectrum, which in some non-limiting examples, may be associated with a R(ed) emitted colour.

In some non-limiting examples, the first wavelength may be one of: equal to, at least, and no more than, at least one of: the second wavelength, and the third wavelength. In some non-limiting examples, the second wavelength may be one of: equal to, at least, and no more than, at least one of: the first wavelength, and the third wavelength. In some non-limiting examples, the third wavelength may be one of: equal to, at least, and no more than, at least one of: the first wavelength, and the second wavelength.

In some non-limiting examples, although not shown, the device 1300 may comprise at least one additional emissive region 210 that may, in some non-limiting examples, be configured to emit EM radiation having at least one of: a wavelength, and emission spectrum, that may be substantially identical to at least one of: the first emissive region $\mathbf{210}_a$, the second emissive region $\mathbf{210}_b$, and the third emissive region $\mathbf{210}_c$, including without limitation, the second emissive region $\mathbf{210}_b$.

In some non-limiting examples, the device 1300 may also comprise any number of emissive regions 210, and (sub-) pixel(s) 615/216 thereof.

In some non-limiting examples, the plurality of sub-pixels 216 may correspond to a single pixel 615. In some non-limiting examples, the device 1300 may comprise a plurality of pixels 615, wherein each pixel 615 comprises a plurality of sub-pixel(s) 216.

Those having ordinary skill in the relevant art will appreciate that the specific arrangement of (sub-) pixel(s) 615/216 may be varied depending on the device design. In some non-limiting examples, the sub-pixel(s) 216 may be arranged according to known arrangement schemes, including without limitation, RGB side-by-side, diamond, and PenTile®.

In some non-limiting examples, the device 1300 may be shown as comprising a substrate 10, and a plurality of emissive regions 210, each having a corresponding at least one TFT structure 206, covered by at least one TFT insulating layer 207, and a corresponding first electrode 220, formed on an exposed layer surface 11 of the TFT insulating layer 207.

In some non-limiting examples, the substrate 10 may comprise the base substrate 215.

In some non-limiting examples, each at least one TFT structure 206 may be longitudinally aligned below and within the lateral extent of its corresponding emissive region 210, for driving the corresponding (sub-) pixel 615/216 and electrically coupled with its associated first electrode 220.

In some non-limiting examples, neighboring first electrodes 220 may be separated by a non-emissive region 211 having a corresponding PDL 209, formed over the TFT insulating layer 207, that may, in some non-limiting examples, cover at least a part of an extremity of the corresponding first electrodes 200.

In the present disclosure, each of the various emissive region layers of the device 200, including without limitation, at least one of: the first electrode 220, the second electrode 240, and the at least one semiconducting layer 230 therebetween, may be formed by depositing a respective constituent emissive region layer material in a desired pattern in a manufacturing process. In some non-limiting examples, such deposition may take place in a deposition process, in combination with a shadow mask 715, which may, in some non-limiting examples, may be at least one of: an open mask, and a fine metal mask (FMM), having apertures to achieve such desired pattern by at least one of: masking, and precluding deposition of, the emissive region layer material on certain parts of an exposed layer surface of an underlying material exposed thereto.

The device 1300 may be shown as comprising a substrate 10, a TFT insulating layer 207 and a plurality of first electrodes 220, formed on an exposed layer surface 11 of the TFT insulating layer 207.

In some non-limiting examples, the substrate 10 may comprise the base substrate 215 (not shown for purposes of simplicity of illustration), and in some non-limiting examples, at least one TFT structure 206 corresponding to, and for driving, a corresponding emissive region 210, each having a corresponding (sub-) pixel 615/216, positioned substantially thereunder and electrically coupled with its associated first electrode 220. PDL(s) 209 may be formed over the substrate 10, to define emissive region(s) 210. In some non-limiting examples, the PDL(s) 209 may cover edges of their respective first electrode 220.

In some non-limiting examples, at least one semiconducting layer 230 may be deposited over exposed region(s) of the first electrodes 210 corresponding to the emissive region 210 of each (sub-) pixel 615/216 and, in some non-limiting examples, at least parts of corresponding at least one of: non-emissive regions 211, and corresponding PDLs 209, interposed therebetween.

In some non-limiting examples, a first deposited layer $\mathbf{130}_a$ may be deposited over the exposed layer surface 11 of the at least one semiconducting layer(s) 230. In some non-limiting examples, such deposition may be effected by exposing the entire exposed layer surface 11 of the device 1300 to a vapor flux 832 of deposited material 831, using one of: an open mask, and a mask-free, deposition process, to deposit the first deposited layer $130_a$ over the at least one semiconducting layer(s) 230 to form a first layer of a second electrode 240 for a first emissive region $210_a$ so that such second electrode 240 is designated as a second electrode $240_a$. Such second electrode $240_a$ may have a first thickness the in the first emissive region $210_a$. In some non-limiting examples, the first thickness the may correspond to a thickness of the first deposited layer $130_a$.

In some non-limiting examples, a first patterning coating $110_1$ may be selectively deposited over first portions 101 of the device 1300, comprising the first emissive region $210_a$.

In some non-limiting examples, the patterning coating $110_1$ may be selectively deposited using a shadow mask 715 that may also have been used to deposit the at least one semiconducting layer $230_a$ of the first emissive region $210_a$ to reduce a number of stages for fabricating the device 1300.

In some non-limiting examples, a second deposited layer $130_b$ may be deposited over an exposed layer surface 11 of the device 1300 that is substantially devoid of the patterning coating 110, namely the exposed layer surface 11 of the first deposited layer $130_a$ in both of the second emissive region $210_b$, and the third emissive region $210_c$ and, in some non-limiting examples, at least part(s) of the non-emissive region(s) 211 interposed therebetween, in which the PDLs 209 (if any) may lie. In some non-limiting examples, such deposition may be effected by exposing the entire exposed layer surface 11 of the device 1300 to a vapor flux 832 of deposited material 831, using one of: an open mask, and a mask-free deposition process, to deposit the second deposited layer $130_b$ over the first deposited layer $130_a$ to the extent that it is substantially devoid of the first patterning coating $110_1$, such that the second deposited layer $130_b$ may be deposited on the second portion(s) 102 of the first deposited layer $130_a$ that are substantially devoid of the first patterning coating $110_1$ to form a second layer of a second electrode 240 for the second emissive region $210_b$, so that such second electrode 240 may be designated as a second electrode $240_b$. Such second electrode $240_b$ may have a second thickness $t_{c2}$ in the second emissive region $210_b$. In some non-limiting examples, the second thickness $t_{c2}$ may correspond to a combined average layer thickness of the first deposited layer $130_a$ and of the second deposited layer $130_b$ and may, in some non-limiting examples, be at least the first thickness tel.

In some non-limiting examples, a second patterning coating $110_2$ may be selectively deposited over further first portions 101 of the device 1300, comprising the second emissive region $210_b$.

In some non-limiting examples, a third deposited layer $130_c$ may be deposited over an exposed layer surface 11 of the device 1300, namely the exposed layer surface 11 of the second deposited layer $130_b$ in the third emissive region $210_c$. In some non-limiting examples, such deposition may be effected by exposing the entire exposed layer surface 11 of the device 1300 to a vapor flux 832 of deposited material 831, In some non-limiting examples, the third deposited layer $130_c$ may be deposited using one of: an open mask, and a mask-free, deposition process, to deposit the third deposited layer $130_c$ over the second deposited layer $130_b$ to the extent that it is substantially devoid of any of: the first patterning coating $110_1$, and the second patterning coating $110_2$ to form a third layer of a second electrode 240 for the third emissive region $210_c$, so that such second electrode 240 may be designated as a second electrode $240_c$. Such second electrode $240_c$ may have a third thickness $t_{c3}$ in the third emissive region $210_c$. In some non-limiting examples, the third thickness $t_{c3}$ may correspond to a combined average layer thickness of the first deposited layer $130_a$, the second deposited layer $130_b$, and the third deposited layer $130_c$ and may, in some non-limiting examples, be at least one of: the first thickness $t_{c1}$, and the second thickness $t_{c2}$.

In some non-limiting examples, a third patterning coating $110_3$ may be selectively deposited over additional first portions 101 of the device 1300, comprising the third emissive region $210_c$.

In some non-limiting examples, at least one auxiliary electrode 1250 may be disposed in the non-emissive region (s) 211 of the device 1300 between neighbouring emissive regions 210 thereof and in some non-limiting examples, over the PDLs 209. In some non-limiting examples, the deposited layer 130 used to deposit the at least one auxiliary electrode 1250 may be deposited using one of: an open mask, and a mask-free, deposition process, to deposit a deposited material 831 over the first deposited layer $130_a$, the second deposited layer $130_b$, and the third deposited layer $130_c$, to the extent that it is substantially devoid of any of: the first patterning coating, $110_1$, the second patterning coating $110_2$, and the third patterning coating $110_3$ to form the at least one auxiliary electrode 1250. In some non-limiting examples, each of the at least one auxiliary electrodes 1250 may be electrically coupled with a respective at least one of the second electrodes 240.

In some non-limiting examples, at least one of: the first deposited layer $130_a$, the second deposited layer $130_b$, and the third deposited layer $130_c$ may be at least one of: transmissive, and substantially transparent, in at least a part of the visible spectrum. Thus, in some non-limiting examples, at least one of: the second deposited layer $130_b$, and the third deposited layer $130_c$ (and any additional deposited layer(s) 130 (not shown) may be disposed on top of the first deposited layer $130_a$ to form a multi-coating electrode 220, 240 that may also be at least one of: transmissive, and substantially transparent, in at least a part of the visible spectrum. In some non-limiting examples, the transmittance of at least one of: at least one of: the first deposited layer $130_a$, the second deposited layer $130_b$, and the third deposited layer $130_c$, (and any additional deposited layer(s) 130), and the multi-coating electrode 220, 240 formed thereby, may exceed one of about: 30, 40, 45, 50, 60, 70, 75, and 80% in at least a part of the visible spectrum.

In some non-limiting examples, an average layer thickness of at least one of: the first deposited layer $130_a$, the second deposited layer $130_b$, and the third deposited layer $130_c$ may be made substantially thin to maintain a substantially high transmittance. In some non-limiting examples, an average layer thickness of the first deposited layer $130_a$ may be one of between about: 5-30, 8-25, and 10-20, nm. In some non-limiting examples, an average layer thickness of the second deposited layer $130_b$ may be one of between about: 1-25, 1-20, 1-15, 1-10, and 3-6, nm. In some non-limiting examples, an average layer thickness of the third deposited layer $130_c$ may be one of between about: 1-25, 1-20, 1-15, 1-10, and 3-6, nm. In some non-limiting examples, a thickness of a multi-coating electrode 220, 240 formed by a combination of the first deposited layer $130_a$, the second deposited layer $130_b$, and the third deposited layer $130_c$, (and any additional deposited layer(s) 130) may be one of between about: 6-35, 10-30, $10^{-25}$, and 12-18, nm.

The thickness of the at least one electrode 220, 240 may be varied to an even greater extent by independently modulating the average layer thickness, and a number, of at least one of: the patterning coating 110, and an NPC 1020, deposited in part(s) of each emissive region 210 of the (sub-) pixel(s) 216.

In some non-limiting examples, an average layer thickness of at least one of: the first patterning coating 110$_1$, the second patterning coating 110$_2$, and the third patterning coating 110$_3$ disposed in at least one of: the first emissive region 210$_a$, the second emissive region 210$_b$, and the third emissive region 210$_c$ respectively, may be varied according to at least one of: a colour, and emission spectrum of EM radiation, emitted by each emissive region 210. In some non-limiting examples, the first patterning coating 110$_1$ may have a first patterning coating thickness $t_{n1}$. In some non-limiting examples, the second patterning coating 110$_2$ may have a second patterning coating thickness $t_{n2}$. In some non-limiting examples, the third patterning coating 110$_3$ may have a third patterning coating thickness $t_{n3}$. In some non-limiting examples, at least one of: the first patterning coating thickness $t_{n1}$, the second patterning coating thickness $t_{n2}$, and the third patterning coating thickness $t_{n3}$, may be substantially the same. In some non-limiting examples, at least one of: the first patterning coating thickness $t_{n1}$, the second patterning coating thickness $t_{n2}$, and the third patterning coating thickness $t_{n3}$, may be different from one another.

In some non-limiting examples, an average layer thickness of the first deposited layer 130$_a$ may exceed an average layer thickness of at least one of: the second deposited layer 130$_b$, and the third deposited layer 130$_c$. In some non-limiting examples, the average layer thickness of the second deposited layer 130$_b$ may exceed the average layer thickness of at least one of: the first deposited layer 130$_a$, and the third deposited layer 130$_c$. In some non-limiting examples, the average layer thickness of the third deposited layer 130$_c$ may exceed the average layer thickness of at least one of: the first deposited layer 130$_a$, and the second deposited layer 130$_b$. In some non-limiting examples, the average layer thickness of the first deposited layer 130$_a$, the average layer thickness of the second deposited layer 130$_b$, and the average layer thickness of the third deposited layer 130$_c$, may be substantially the same.

In some non-limiting examples, at least one deposited material 831 used to form the first deposited layer 130$_a$ may be substantially the same as at least one deposited material 831 used to form at least one of: the second deposited layer 130$_b$, and the third deposited layer 130$_c$. In some non-limiting examples, such at least one deposited material 831 may be substantially as described herein in respect of at least one of: the first electrode 220, the second electrode 240, the auxiliary electrode 1250, and a deposited layer 130 thereof.

In some non-limiting examples, at least one of: the first emissive region 210$_a$, the second emissive region 210$_b$, and the third emissive region 210$_c$ may be substantially devoid of a closed coating 140 of the deposited material 831 used to form the at least one auxiliary electrode 1250.

In some non-limiting examples, at least one of the first deposited layer 130$_a$, the second deposited layer 130$_b$, and the third deposited layer 130$_c$, may be at least one of: transmissive, and substantially transparent, in at least a part of the visible spectrum. Thus, in some non-limiting examples, at least one of: the second deposited layer 130$_b$, and the third deposited layer 130$_c$ (and any additional deposited layer(s) 130) may be disposed on top of the first deposited layer 130$_a$ to form a multi-coating electrode 220, 240, 1250 that may also be at least one of: transmissive, and substantially transparent, in at least a part of the visible spectrum. In some non-limiting examples, the transmittance of any of the at least one of: the first deposited layer 130$_a$, the second deposited layer 130$_b$, the third deposited layer 130$_c$, any additional deposited layer(s) 130, and the multi-coating electrode 220, 240, 1250, may exceed one of about: 30, 40, 45, 50, 60, 70, 75, and 80% in at least a part of the visible spectrum.

In some non-limiting examples, an average layer thickness of at least one of: the first deposited layer 130$_a$, the second deposited layer 130$_b$, and the third deposited layer 130$_c$, may be made substantially thin to maintain a substantially high transmittance. In some non-limiting examples, an average layer thickness of the first deposited layer 130$_a$ may be one of between about: 5-30, 8-25, and 10-20, nm. In some non-limiting examples, an average layer thickness of the second deposited layer 130$_b$ may be one of between about: 1-25, 1-20, 1-15, 1-10, and 3-6, nm. In some non-limiting examples, an average layer thickness of the third deposited layer 130$_c$ may be one of between about: 1-25, 1-20, 1-15, 1-10, and 3-6, nm. In some non-limiting examples, a thickness of a multi-coating electrode formed by a combination of a plurality of: the first deposited layer 130$_a$, the second deposited layer 130$_b$, the third deposited layer 130$_c$, and any additional deposited layer(s) 130, may be one of between about: 6-35, $10^{-30}$, $10^{-25}$, and 12-18, nm.

In some non-limiting examples, a thickness of the at least one auxiliary electrode 1250 may exceed an average layer thickness of at least one of: the first deposited layer 130$_a$, the second deposited layer 130$_b$, the third deposited layer 130$_c$, and a common electrode. In some non-limiting examples, the thickness of the at least one auxiliary electrode 1250 may be at least one of about: 50, 80, 100, 150, 200, 300, 400, 500, 700, and 800, nm, and 1, 1.2, 1.5, 2, 2.5, and 3, µm.

In some non-limiting examples, the at least one auxiliary electrode 1250 may be substantially at least one of: non-transparent, and opaque. However, since the at least one auxiliary electrode 1250 may be, in some non-limiting examples, provided in a non-emissive region 211 of the device 1300, the at least one auxiliary electrode 1250 may not contribute to significant optical interference. In some non-limiting examples, the transmittance of the at least one auxiliary electrode 1250 may be one of no more than about: 50, 70, 80, 85, 90, and 95% in at least a part of the visible spectrum.

In some non-limiting examples, the at least one auxiliary electrode 1250 may absorb EM radiation in at least a part of the visible spectrum.

Removal of Selective Coating

In some non-limiting examples, the patterning coating 110 may be removed after deposition of the deposited layer 130, such that at least a part of a previously exposed layer surface 11 of an underlying layer 1010 of a device 200, covered by the patterning coating 110 may become exposed once again. In some non-limiting examples, the patterning coating 110 may be selectively removed by at least one of: etching, dissolving the patterning coating 110, and by employing at least one of: plasma, and solvent, processing techniques that do not substantially affect (erode) the deposited layer 130.

In some non-limiting examples, at an initial deposition stage, a patterning coating 110 may have been selectively deposited on a first portion 101 of an exposed layer surface 11 of an underlying layer 1010, including without limitation, the substrate 10.

In some non-limiting examples, at a further deposition stage, a deposited layer 130 may be deposited on the exposed layer surface 11 of the underlying layer 1010, that is, on both the exposed layer surface 11 of the patterning coating 110 where the patterning coating 110 may have been deposited during the initial deposition stage, as well as the exposed layer surface 11 of the substrate 10 where that patterning coating 110 may not have been deposited during the initial deposition stage. Because of the nucleation-inhibiting properties of the first portion 101 where the patterning coating 110 may have been disposed, the deposited layer 130 disposed thereon may tend to not remain, resulting in a pattern of selective deposition of the deposited layer 130, that may correspond to a second portion 102, leaving the first portion 101 substantially devoid of the deposited layer 130.

In some non-limiting examples, at a final deposition stage, the patterning coating 110 may have been removed from the first portion 101 of the exposed layer surface 11 of the substrate 10, such that the deposited layer 130 deposited during the further deposition stage may remain on the substrate 10 and regions of the substrate 10 on which the patterning coating 110 may have been deposited during the initial deposition stage may now be exposed (uncovered).

In some non-limiting examples, the removal of the patterning coating 110 in the final deposition stage may be effected by exposing the device 200 to at least one of: a solvent, and a plasma that etches away(reacts with) the patterning coating 110 without substantially impacting the deposited layer 130.

Thin Film Formation

The formation of thin films during vapor deposition on an exposed layer surface 11 of an underlying layer 1010 may involve processes of nucleation and growth.

During initial stages of film formation, a sufficient number of vapor monomers, which, in some non-limiting examples, may be at least one of: molecules, and atoms of a deposited material 831 in vapor form) may typically condense from a vapor phase to form initial nuclei on the exposed layer surface 11 presented of an underlying layer 1010. As vapor monomers may impinge on such surface, at least one of: a characteristic size, and deposited density, of these initial nuclei may increase to form small particle structures 150. In some non-limiting examples, a dimension to which such characteristic size refers may comprise at least one of: a height, width, length, and diameter, of such particle structure 150.

After reaching a saturation island density, adjacent particle structures 150 may typically start to coalesce, increasing an average characteristic size of such particle structures 150, while decreasing a deposited density thereof.

With continued vapor deposition of monomers, coalescence of adjacent particle structures 150 may continue until a substantially closed coating 140 may eventually be deposited on an exposed layer surface 11 of an underlying layer 1010. The behaviour, including optical effects caused thereby, of such closed coatings 140 may be generally substantially uniform, and consistent.

There may be at least three basic growth modes for the formation of thin films, in some non-limiting examples, culminating in a closed coating 140: 1) island (Volmer-Weber), 2) layer-by-layer (Frank-van der Merwe), and 3) Stranski-Krastanov.

Island growth may typically occur when stale clusters of monomers nucleate on an exposed layer surface 11 and grow to form discrete islands. This growth mode may occur when the interaction between the monomers is stronger than that between the monomers and the surface.

The nucleation rate may describe how many nuclei of a given size (where the free energy does not push a cluster of such nuclei to one of: grow, and shrink) ("critical nuclei") may be formed on a surface per unit time. During initial stages of film formation, it may be unlikely that nuclei will grow from direct impingement of monomers on the surface, since the deposited density of nuclei is low, and thus the nuclei may cover a substantially small fraction of the surface (e.g., there are large gaps/spaces between neighboring nuclei). Therefore, the rate at which critical nuclei may grow may typically depend on the rate at which adatoms (e.g., adsorbed monomers) on the surface migrate and attach to nearby nuclei.

Figure 14:
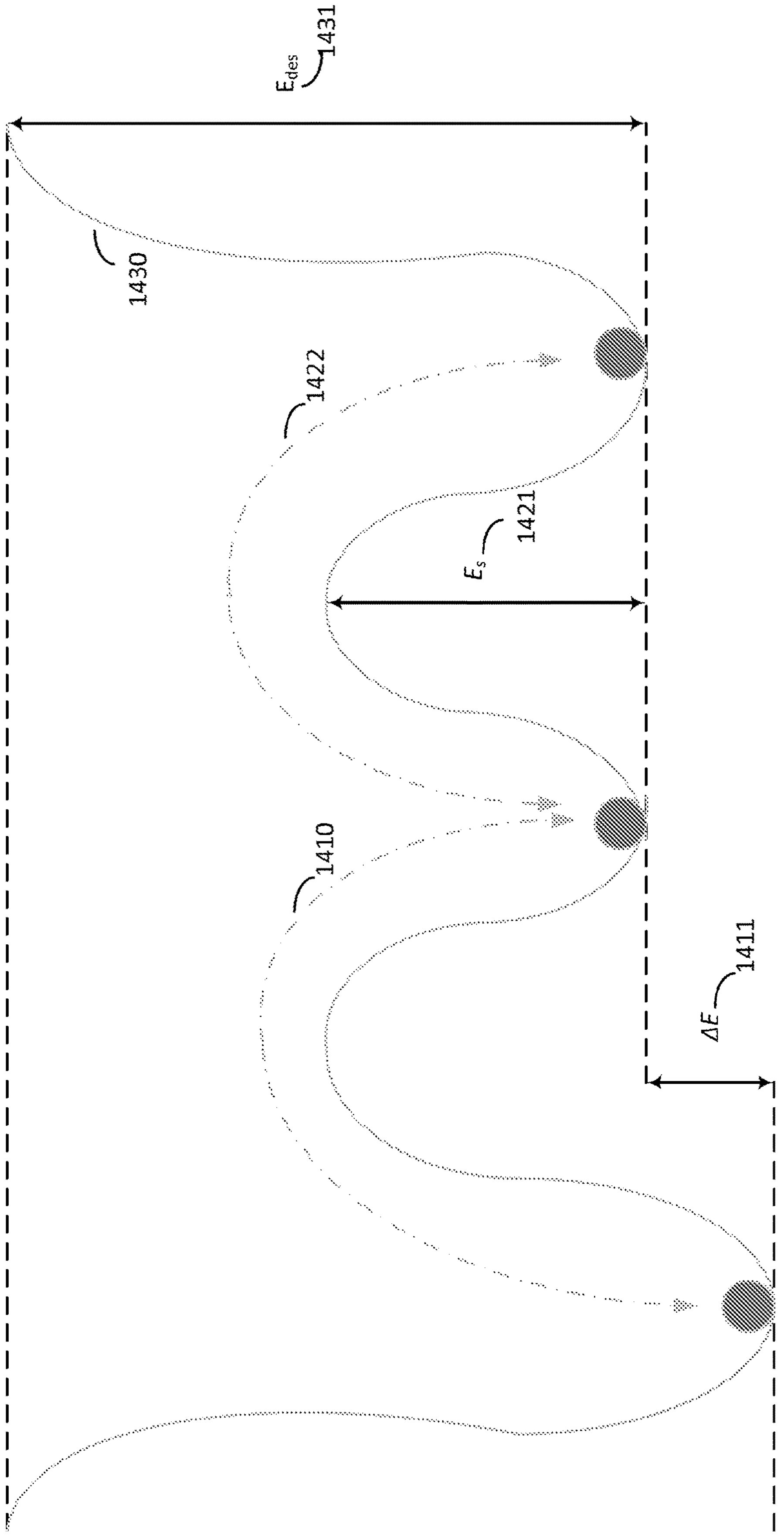
FIG. 14 is an example energy profile illustrating energy states of an adatom absorbed onto a surface according to an example in the present disclosure.

An example of an energy profile of an adatom adsorbed onto an exposed layer surface 11 of an underlying layer 1010 is illustrated in FIG. 14. Specifically, FIG. 14 may illustrate example qualitative energy profiles corresponding to: an adatom escaping from a local low energy site (1410); diffusion of the adatom on the exposed layer surface 11 (1420); and desorption of the adatom (1430).

In 1410, the local low energy site may be any site on the exposed layer surface 11 of an underlying layer 1010, onto which an adatom will be at a lower energy. Typically, the nucleation site may comprise at least one of: a defect, and an anomaly, on the exposed layer surface 11, including without limitation, at least one of: a ledge, a step edge, a chemical impurity, a bonding site, and a kink ("heterogeneity").

Sites of substrate heterogeneity may increase an energy involved to desorb the adatom from the surface $E_{des}$ 1431, leading to a higher deposited density of nuclei observed at such sites. Also, impurities, including without limitation, contamination, on a surface may also increase $E_{des}$ 1431, leading to a higher deposited density of nuclei. For vapor deposition processes, conducted under high vacuum conditions, the type and deposited density of contaminants on a surface may be affected by a vacuum pressure and a composition of residual gases that make up that pressure.

Once the adatom is trapped at the local low energy site, there may typically, in some non-limiting examples, be an energy barrier before surface diffusion takes place. Such energy barrier may be represented as ΔE 1411 in FIG. 14. In some non-limiting examples, if the energy barrier ΔEF 1411 to escape the local low energy site is substantially large, the site may act as a nucleation site.

In 1420, the adatom may diffuse on the exposed layer surface 11. In some non-limiting examples, in the case of localized absorbates, adatoms may tend to oscillate near a minimum of the surface potential and migrate to various neighboring sites until the adatom is either one of: desorbed, and is incorporated into growing islands 150 formed by at least one of: a cluster of adatoms, and a growing film. In FIG. 14, the activation energy associated with surface diffusion of adatoms may be represented as $E_s$ 1421.

In 1430, the activation energy associated with desorption of the adatom from the surface may be represented as $E_{des}$ 1431. Those having ordinary skill in the relevant art will appreciate that any adatoms that are not desorbed may remain on the exposed layer surface 11. In some non-limiting examples, such adatoms may diffuse on the exposed layer surface 11, become part of a cluster of adatoms that at least one of: form islands 150 on the exposed layer surface 11, and be incorporated as part of a growing coating.

After adsorption of an adatom on a surface, the adatom may one of: desorb from the surface, and may migrate some distance on the surface before either desorbing, interacting with other adatoms to one of: form a small cluster, attach to a growing nucleus. An average amount of time that an adatom may remain on the surface after initial adsorption may be given by Equation (4):

$$\tau_s = \frac{1}{\nu}\exp\left(\frac{E_{des}}{kT}\right) \tag{4}$$

In the above Equation (4):

v is a vibrational frequency of the adatom on the surface, k is the Botzmann constant, and T is temperature.

From Equation (4) it may be noted that the lower the value of $E_{des}$ 1431, the easier it may be for the adatom to desorb from the surface, and hence the shorter the time the adatom may remain on the surface. A mean distance an adatom can diffuse may be given by Equation (5):

$$X = a_0 \exp\left(\frac{E_{des} - E_s}{2kT}\right) \tag{5}$$

where:

$\alpha_0$ is a lattice constant.

For at least one of: low values of $E_{des}$ 1431, and high values of $E_s$ 1421, the adatom may diffuse a shorter distance before desorbing, and hence may be less likely to at least one of: attach to growing nuclei, and interact with another one of: adatom, and cluster of adatoms.

During initial stages of formation of a deposited layer of particle structures 150, adsorbed adatoms may interact to form particle structures 150, with a critical concentration of particle structures 150 per unit area being given by Equation (6):

$$\frac{N_i}{n_0} = \left|\frac{N_1}{n_0}\right|^i \exp\left(\frac{E_i}{kT}\right) \tag{6}$$

where:

$E_i$ is an energy involved to dissociate a critical cluster comprising/adatoms into separate adatoms, $n_0$ is a total deposited density of adsorption sites, and $N_1$ is a monomer deposited density given by Equation (7):

$$N_1 = \dot{R}\tau_S \tag{7}$$

where:

$\dot{R}$ is a vapor impingement rate.

Typically, i may depend on a crystal structure of a material being deposited and may determine a critical size of particle structures 150 to form a stable nucleus.

A critical monomer supply rate for growing particle structures 150 may be given by the rate of vapor impingement and an average area over which an adatom can diffuse before desorbing:

$$\dot{R}X^2 = \alpha_0^2 \exp\left(\frac{E_{des} - E_s}{kT}\right) \tag{8}$$

The critical nucleation rate may thus be given by the combination of the above equations to form Equation (9):

$$\dot{N}_i = \dot{R}\,\alpha_0^2\, n_0 \left(\frac{\dot{R}}{v n_0}\right)^i \exp\left(\frac{(i+1)E_{des} - E_s + E_i}{kT}\right) \tag{9}$$

From Equation (9), it may be noted that the critical nucleation rate may be suppressed for surfaces that have a low desorption energy for adsorbed adatoms, a high activation energy for diffusion of an adatom, are at least one of: at high temperatures, and are subjected to vapor impingement rates.

Under high vacuum conditions, a flux of molecules that may impinge on a surface (per $cm^2$-sec) may be given by Equation (10):

$$\phi = 3.513 \times 10^{22} \frac{P}{MT} \tag{10}$$

where:

P is pressure, and

M is molecular weight.

Therefore, a higher partial pressure of a reactive gas, such as $H_2O$, may lead to a higher deposited density of contamination on a surface during vapor deposition, leading to an increase in $E_{des}$ 1431 and hence a higher deposited density of nuclei.

In the present disclosure, "nucleation-inhibiting" may refer to at least one of: a coating, material, and a layer thereof, that may have a surface that exhibits an initial sticking probability against deposition of a deposited material 831 thereon, that may be close to 0, including without limitation, less than about 0.3, such that the deposition of the deposited material 831 on such surface may be inhibited.

In the present disclosure, "nucleation-promoting" may refer to at least one of: a coating, material, and a layer thereof, that has a surface that exhibits an initial sticking probability against deposition of a deposited material 831 thereon, that may be close to 1, including without limitation, greater than about 0.7, such that the deposition of the deposited material 831 on such surface may be facilitated.

Without wishing to be bound by a particular theory, it may be postulated that the shapes and sizes of such nuclei and the subsequent growth of such nuclei into islands 150 and thereafter into a thin film may depend upon various factors, including without limitation, interfacial tensions between at least one of: the vapor, the surface, and the condensed film nuclei.

One measure of at least one of: a nucleation-inhibiting, and nucleation-promoting, property of a surface may be the initial sticking probability of the surface against the deposition of a given deposited material 831.

In some non-limiting examples, the sticking probability S may be given by Equation (11):

$$S = \frac{N_{ads}}{N_{total}} \tag{11}$$

where:

$N_{ads}$ is a number of adatoms that remain on an exposed layer surface 11 (that is, are incorporated into a film), and $N_{total}$ is a total number of impinging monomers on the surface.

A sticking probability S equal to 1 may indicate that all monomers that impinge on the surface are adsorbed and subsequently incorporated into a growing film. A sticking probability S equal to 0 may indicate that all monomers that impinge on the surface are desorbed and subsequently no film may be formed on the surface.

A sticking probability S of a deposited material 831 on various surfaces may be evaluated using various techniques of measuring the sticking probability S, including without limitation, a dual quartz crystal microbalance (QCM) technique as described by Walker et al., *J. Phys. Chem.* C 2007, 111, 765 (2006).

As the deposited density of a deposited material 831 may increase (e.g., increasing average film thickness), a sticking probability S may change.

An initial sticking probability $S_0$ may therefore be specified as a sticking probability S of a surface prior to the formation of any significant number of critical nuclei. One measure of an initial sticking probability $S_0$ may involve a sticking probability S of a surface against the deposition of a deposited material 831 during an initial stage of deposition thereof, where an average film thickness of the deposited material 831 across the surface is at, including without limitation, below, a threshold value. In the description of some non-limiting examples, a threshold value for an initial sticking probability may be specified as, in some non-limiting examples, 1 nm. An average sticking probability S may then be given by Equation (12):

$$\overline{S} = S_0(1 - A_{nuc}) + S_{nuc}(A_{nuc}) \qquad (12)$$

where:

$S_{nuc}$ is a sticking probability S of an area covered by particle structures 150, and $A_{nuc}$ is a percentage of an area of a substrate surface covered by particle structures 150.

In some non-limiting examples, a low initial sticking probability may increase with increasing average film thickness. This may be understood based on a difference in sticking probability between an area of an exposed layer surface 11 with no particle structures 150, in some non-limiting examples, a bare substrate 10, and an area with a high deposited density. In some non-limiting examples, a monomer that may impinge on a surface of a particle structure 150 may have a sticking probability that may approach 1.

Based on the energy profiles 1410, 1420, 1430 shown in FIG. 14, it may be postulated that materials that exhibit at least one of: substantially low activation energy for desorption ($E_{des}$ 1431), and substantially high activation energy for surface diffusion ($E_s$ 1421), may be deposited as a patterning coating 110, and may have applicability for use in various applications.

Without wishing to be bound by a particular theory, it may be postulated that, in some non-limiting examples, the relationship between various interfacial tensions present during nucleation and growth may be dictated according to Young's equation in capillarity theory (Equation (13)):

$$\gamma_{sv} = \gamma_{fs} + \gamma_{vf}\cos\theta \qquad (13)$$

where:

$\gamma_{sv}$ (FIG. 15) corresponds to the interfacial tension between the substrate 10 and vapor 532, $\gamma_{fs}$ (FIG. 15) corresponds to the interfacial tension between the deposited material 831 and the substrate 10, $\gamma_{vf}$ (FIG. 15) corresponds to the interfacial tension between the vapor flux and the film, and θ is the film nucleus contact angle.

Figure 15:
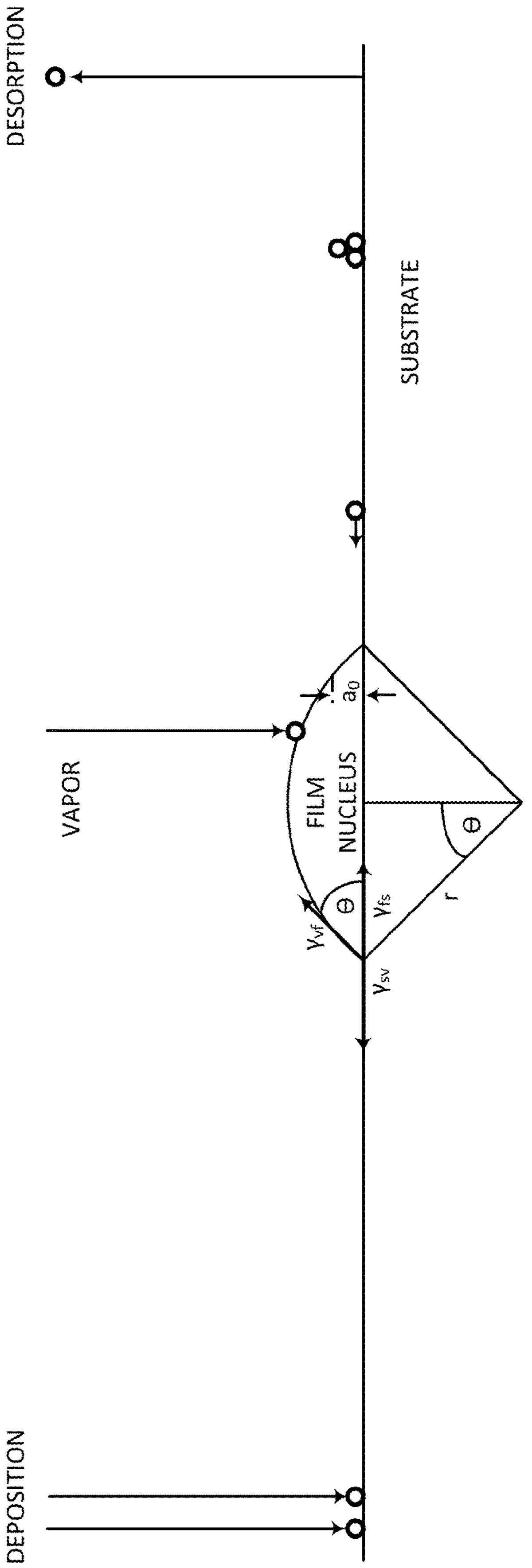
FIG. 15 is a schematic diagram illustrating the formation of a film nucleus according to an example in the present disclosure.

FIG. 15 may illustrate the relationship between the various parameters represented in this equation.

On the basis of Young's equation (Equation (13)), it may be derived that, for island growth, the film nucleus contact angle may exceed 0 and therefore: $\gamma_{sv}<\gamma_{fs}+\gamma_{vf}$.

For layer growth, where the deposited material 831 may "wet" the substrate 10, the nucleus contact angle θ may be equal to 0, and therefore: $\gamma_{sv}=\gamma_{fs}+\gamma_{vf}$.

For Stranski-Krastanov growth, where the strain energy per unit area of the film overgrowth may be large with respect to the interfacial tension between the vapor 732 and the deposited material 831: $\gamma_{sv}>\gamma_{fs}+\gamma_{vf}$.

Without wishing to be bound by any particular theory, it may be postulated that the nucleation and growth mode of a deposited material 831 at an interface between the patterning coating 110 and the exposed layer surface 11 of the substrate 10, may follow the island growth model, where θ>0.

Particularly in cases where the patterning coating 110 may exhibit a substantially low initial sticking probability (in some non-limiting examples, under the conditions identified in the dual QCM technique described by Walker et. al) against deposition of the deposited material 831, there may be a substantially high thin film contact angle of the deposited material 831.

On the contrary, when a deposited material 831 may be selectively deposited on an exposed layer surface 11 without the use of a patterning coating 110, in some non-limiting examples, by employing a shadow mask 715, the nucleation and growth mode of such deposited material 831 may differ. In some non-limiting examples, it has been observed that a coating formed using a shadow mask 715 patterning process may, at least in some non-limiting examples, exhibit a substantially low thin film contact angle of no more than about 10°.

It has now been found, that in some non-limiting examples, a patterning coating 110 (including without limitation, the patterning material 711 of which it is comprised) may exhibit a substantially low critical surface tension.

Those having ordinary skill in the relevant art will appreciate that a "surface energy" of at least one of: a coating, layer, and a material constituting such at least one of: a coating, and layer, may generally correspond to a critical surface tension of the at least one of: coating, layer, and material. According to some models of surface energy, the critical surface tension of a surface may correspond substantially to the surface energy of such surface.

Generally, a material with a low surface energy may exhibit low intermolecular forces. Generally, a material with low intermolecular forces may readily one of: crystallize, and undergo other phase transformation, at a lower temperature in comparison to another material with high intermolecular forces. In at least some applications, a material that may readily one of: crystallize, and undergo other phase transformations, at substantially low temperatures may be detrimental to at least one of: the long-term performance, stability, reliability, and lifetime, of the device 100.

Without wishing to be bound by a particular theory, it may be postulated that certain low energy surfaces may exhibit substantially low initial sticking probabilities and may thus have applicability for forming the patterning coating 110.

Without wishing to be bound by any particular theory, it may be postulated that, especially for low surface energy surfaces, the critical surface tension may be positively correlated with the surface energy. In some non-limiting examples, a surface exhibiting a substantially low critical surface tension may also exhibit a substantially low surface energy, and a surface exhibiting a substantially high critical surface tension may also exhibit a substantially high surface energy.

In reference to Young's equation (Equation (13)), a lower surface energy may result in a greater contact angle, while also lowering the $\gamma_{sv}$, thus enhancing the likelihood of such surface having low wettability and low initial sticking probability with respect to the deposited material 831.

The critical surface tension values, in various non-limiting examples, herein may correspond to such values measured at around normal temperature and pressure (NTP), which in some non-limiting examples, may correspond to a temperature of 20° C., and an absolute pressure of 1 atm. In some non-limiting examples, the critical surface tension of a surface may be determined according to the Zisman method, as further detailed in Zisman, W. A., "*Advances in Chemistry*" 43 (1964), p. 1-51.

In some non-limiting examples, the exposed layer surface 11 of the patterning coating 110 may exhibit a critical surface tension of one of no more than about: 20, 19, 18, 17, 16, 15, 13, 12, and 11, dynes/cm.

In some non-limiting examples, the exposed layer surface 11 of the patterning coating 110 may exhibit a critical surface tension of one of at least about: 6, 7, 8, 9, and 10, dynes/cm.

Those having ordinary skill in the relevant art will appreciate that various methods and theories for determining the surface energy of a solid may be known. In some non-limiting examples, the surface energy may be calculated (derived) based on a series of measurements of contact angle, in which various liquids are brought into contact with a surface of a solid to measure the contact angle between the liquid-vapor interface and the surface. In some non-limiting examples, the surface energy of a solid surface may be equal to the surface tension of a liquid with the highest surface tension that completely wets the surface. In some non-limiting examples, a Zisman plot may be used to determine the highest surface tension value that would result in a contact angle of 0° with the surface. According to some theories of surface energy, various types of interactions between solid surfaces and liquids may be considered in determining the surface energy of the solid. In some non-limiting examples, according to some theories, including without limitation, at least one of: the Owens/Wendt theory, and Fowkes' theory, the surface energy may comprise a dispersive component and a non-dispersive ("polar") component.

Without wishing to be bound by a particular theory, it may be postulated that, in some non-limiting examples, the contact angle of a coating of deposited material 831 may be determined, based at least partially on the properties (including, without limitation, initial sticking probability) of the patterning coating 110 onto which the deposited material 831 is deposited. Accordingly, patterning materials 711 that allow selective deposition of deposited materials 831 exhibiting substantially high contact angles may provide some benefit.

Those having ordinary skill in the relevant art will appreciate that various methods may be used to measure a contact angle θ, including without limitation, at least one of: the static, and dynamic, sessile drop method and the pendant drop method.

In some non-limiting examples, the activation energy for desorption (Edes 1731) (in some non-limiting examples, at a temperature T of about 300K) may be one of no more than about: 2, 1.5, 1.3, 1.2, 1.0, 0.8, and 0.5, times, the thermal energy. In some non-limiting examples, the activation energy for surface diffusion ($E_s$ 1421) (in some non-limiting examples, at a temperature of about 300K) may exceed one of about: 1.0, 1.5, 1.8, 2, 3, 5, 7, and 10, times the thermal energy.

Without wishing to be bound by a particular theory, it may be postulated that, during thin film nucleation and growth of a deposited material 831 proximate to an interface between the exposed layer surface 11 of the underlying layer 1010 and the patterning coating 110, a substantially high contact angle between the edge of the deposited material 831 and the underlying layer 1010 may be observed due to the inhibition of nucleation of the solid surface of the deposited material 831 by the patterning coating 110. Such nucleation inhibiting property may be driven by minimization of surface energy between the underlying layer 1010, thin film vapor and the patterning coating 110.

One measure of at least one of: a nucleation-inhibiting, and nucleation-promoting, property of a surface may be an initial deposition rate of a given (electrically conductive) deposited material 831, on the surface, relative to an initial deposition rate of the same deposited material 831 on a reference surface, where both surfaces are subjected to, (including without limitation, exposed to) an evaporation flux of the deposited material 831.

Computer Device for Performing Method Actions

Figure 16:
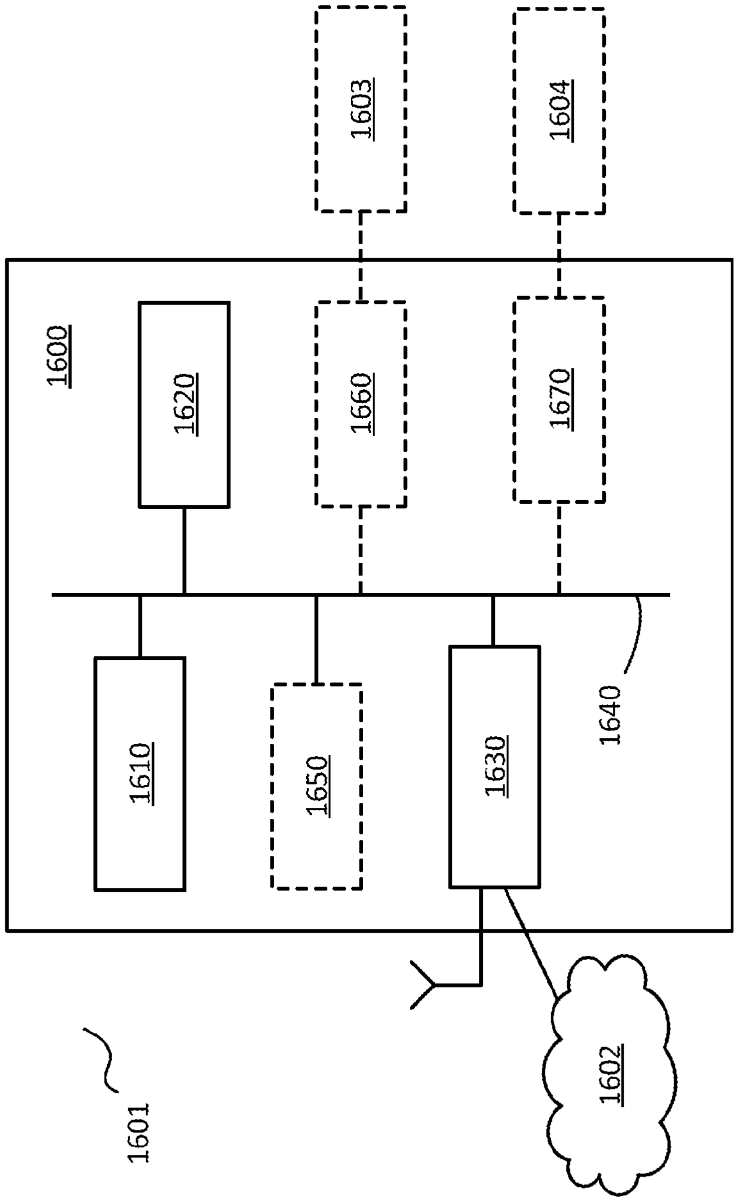
FIG. 16 is a block diagram of an example computer device within a computing and communications environment that may be used for implementing devices and methods in accordance with representative examples of the present disclosure.

FIG. 16 is a simplified block diagram of a computing device 1600 illustrated within a computing and communications environment 1601, according to an example, that may be used for implementing the devices and methods disclosed herein.

In some non-limiting examples, the device 1600 may comprise a processor 1610, a memory 1620, a network interface 1630, and a bus 1640. In some non-limiting examples, the device 1600 may comprise a storage unit 1650, a video adapter 1660 and a peripheral interface 1670.

In some non-limiting examples, the device 1600 may utilize one of: all of the components shown, and only a subset thereof, and levels of integration may vary from device to device.

In some non-limiting examples, the device 1600 may comprise a plurality of instances of a component.

In some non-limiting examples, the processor 1610 may comprise a central processing unit (CPU), which in some non-limiting examples, may be one of: a single core processor, a multiple core processor, and a plurality of processors for parallel processing, and in some non-limiting examples, may comprise at least one of: a general-purpose processor, a dedicated application-specific specialized processor, including without limitation, a multiprocessor, a microcontroller, a reduced instruction set computer (RISC), a digital signal processor (DSP), a graphics processing unit (GPU), and the like, and a shared-purpose processor. In some non-limiting examples, the processor 1610 may comprise at least one of: dedicated hardware, and hardware capable of executing software. In some non-limiting examples, the processor 1610 may be part of a circuit, including without limitation, an integrated circuit. In some non-limiting examples, at least one other component of the device 1600 may be embodied in the circuit. In some non-limiting examples, the circuit may be one of: an application-specific integrated circuit (ASIC), and a floating-point gate array (FPGA).

In some non-limiting examples, the processor 1610 may control the general operation of the device 1600, in some non-limiting examples, by sending at least one of: data, and control signals, to at least one of: the memory 1620, the network interface 1630, the storage unit 1650, the video adapter 1660, and the peripheral interface 1670, and by retrieving at least one of: data, and instructions, from at least one of: the memory 1620, and the storage unit 1650, to execute methods disclosed herein. In some non-limiting examples, such instructions may be executed in at least one of: simultaneous, serial, and distributed fashion, by at least one processor 1610.

In some non-limiting examples, the processor 1610 may execute a sequence of one of: machine-readable, and machine-executable, instructions, which may be embodied in one of: a program, and software. In some non-limiting examples, the program may be stored in one of: the memory 1620, and the storage unit 1650. In some non-limiting examples, the program may be retrieved from one of: the memory 1620, and the storage unit 1650, and stored in the memory 1620 for ready access, and execution, by the processor 1610. In some non-limiting examples, the program may be directed to the processor 1610, which may subsequently configure the processor 1610 to implement methods of the present disclosure. In some non-limiting examples, operations performed by the processor 1610 may comprise at least one of: fetch, decode, execute, and write-back.

In some non-limiting examples, the program may be one of: pre-compiled, and configured for use with a machine having a processor adapted to execute the instructions and may be compiled during run-time. In some non-limiting examples, the program may be supplied in a programming language that may be selected to enable the instructions to execute in one of: a pre-compiled, interpreted, and an as-compiled, fashion.

However configured, the hardware of the processor 1610 may be configured so as to be capable of operating with sufficient software, processing power, memory resources, and network throughput capability, to handle any workload placed upon it.

In some non-limiting examples, the memory 1620 may be a storage device configured to store data, programs, in the form of one of: machine-readable, and machine-executable, instructions, and other information accessible within the device 1600, along the bus 1640.

In some non-limiting examples, the memory 1620 may comprise any type of transitory and non-transitory memory, including without limitation, at least one of: persistent, non-persistent, and volatile storage, including without limitation, system memory, readable by the processor 1610, including without limitation, semiconductor memory devices, including without limitation, random access memory (RAM), static RAM (SRAM), dynamic RAM (DRAM), synchronous DRAM (SDRAM), read-only memory (ROM), programmable ROM (PROM), erasable PROM (EPROM), and electrically erasable PROM (EEPROM), and at least one buffer circuit including without limitation, at least one of: latches and flip flops. In some non-limiting examples, the memory 1620 may comprise a plurality of types of memory, including without limitation, ROM for use at boot-up, and DRAM for program and data storage for use while executing programs.

In some non-limiting examples, the network interface 1630 may allow the device 1600 to communicate with remote entities, across at least one of: a telecommunications network, and a data network (network) 1602, including without limitation, at least one of: the Internet, an intranet, including without limitation, one in communication with the Internet, and an extranet, including without limitation, one in communication with the Internet, and may comprise at least one of: a network adapter, a wired network interface, including without limitation, a local area network (LAN) card, including without limitation, an ethernet card, a token ring card, and a fiber distributed data interface (FDDI) card, and a wireless network interface, including without limitation, a WIFI network interface, a modem, a modem bank, and a wireless LAN (WLAN) card, and a radio access network (RAN) interface, including without limitation, a radio transceiver card, to connect to other devices over a radio link.

In some non-limiting examples, the network 1602 may comprise at least one computer server, which may, in some non-limiting examples, comprise a device 1600, and which, in some non-limiting examples, may enable distributed computing, including without limitation, cloud computing. In some non-limiting examples, the network 1602, with the aid of the device 1600, may implement a peer-to-peer network, which may enable devices coupled with the device 1600, to behave as one of: a client, and a server.

In some non-limiting examples, the device 1600 may be a stand-alone device, while in some non-limiting examples, the device 1600 may be resident within a data centre. In some non-limiting examples, a data centre, as will be apparent to those having ordinary skill in the relevant art, may be a collection of computing resources (typically in the form of services) that may be used as a collective computing and storage resource. In some non-limiting examples, within a data centre, a plurality of services may be coupled together to provide a computing resource pool upon which virtualized entities may be instantiated. In some non-limiting examples, data centres may be coupled with each other to form networks comprising pooled computing and storage resources coupled with each other by connectivity resources. In some non-limiting examples, the connectivity resources may take the form of physical connections, including without limitation, Ethernet and optical communication links, and in some non-limiting examples, may comprise wireless communication channels as well. In some non-limiting examples, if a plurality of different data centres are coupled by a plurality of different communication channels, the links may be combined using any number of techniques, including without limitation, the formation of link aggregation groups (LAGs).

In some non-limiting examples, at least some of the computing, storage, and connectivity resources (along with other resources within the network 1602) may be divided between different sub-networks, in some cases in the form of a resource slice. In some non-limiting examples, if the resources across a number of connected at least one of: data centres, and collections of nodes, are sliced, different network slices may be created.

The device 1600 may, in some non-limiting examples, be schematically thought of, and described, in terms of a number of functional units, each of which has been described in the present disclosure.

In some non-limiting examples, the device 1600 may communicate with at least one remote device 1600, through the network 1602. In some non-limiting examples, the remote device 1600 may access the device 1600, via the network 1602.

In some non-limiting examples, the bus 1640 may couple the components of the device 1600 to facilitate the exchange of data, programs, and other information, within the device 1600 between components thereof. The bus 1640 may comprise at least one type of bus architecture, including without limitation, a memory bus, a memory controller, a peripheral bus, a video bus, and a motherboard.

In some non-limiting examples, the storage unit 1650 may be one of: a storage device that may, in some non-limiting examples, comprise at least one of: a solid-state memory device, a FLASH memory device, a solid-state drive, a hard disk drive, a magnetic disk drive, a magneto-optical disk, an optical memory, and an optical disk drive, and a data repository, for storing at least one of: data, including without limitation, user data, including without limitation, at least one of: user preferences, and user programs, and files, including without limitation, at least one of: drivers, libraries, and saved programs.

In some non-limiting examples, the storage unit 1650 may be distinguished from the memory 1620 in that it may perform storage tasks compatible with at least one of: higher latency, and lower volatility. In some no-limiting examples, the storage unit 1650 may be integrated with a heterogeneous memory 1620. In some non-limiting examples, the storage unit 1650 may be external to, and remote from, the device 1600, and accessible through use of the network interface 1630.

In some non-limiting examples, the video adapter 1660, including without limitation, an electronic display adapter, may provide interfaces to couple the device 1600 to external input and output (I/O) devices, including without limitation, one of: a display 1603, a monitor, a liquid crystal display (LCD), and a light-emitting diode (LED), coupled therewith.

In some non-limiting examples, the display 1603 may comprise a user interface (UI) 1604, including without limitation, a graphical user interface (GUI), and a web-based UI, for managing and organizing at least one of: inputs provided to, and outputs generated by the display 1603, including without limitation, at least one of: results, and solutions to the problems described herein.

In some non-limiting examples, the peripheral interface 1670, including without limitation, at least one of: a parallel interface, and a serial interface, including without limitation, a universal serial bus (USB) interface, may be coupled with other I/O devices 1604, including without limitation, an input part of the display 1603, a touch screen, a printer, a keyboard, a keypad, a switch, a dial, a mouse, a trackball, a track pad, a biometric recognition (and input) device, a card reader, a paper tape reader, a camera, a sensor, a peripheral device, and a memory 1620, coupled therewith.

In some non-limiting examples, the device 1600 may be embodied as at least (part of) one of: a personal computer (PC), a desktop computer, a computer workstation, a mini computer, a mainframe computer, a laptop, and a mobile electronic device, including without limitation, a tablet (slate) PC (including without limitation, at least one of: Apple® iPad and Samsung® Galaxy Tab), a mobile telephone (including without limitation, a smartphone (including without limitation, at least one of: Apple® iPhone, Android-enabled device, and Blackberry® device), an e-reader, and a personal digital assistant).

Other components, as well as related functionality, of the device 1600, may have been omitted in order not to obscure the concepts presented herein.

In general terms each functional unit of the present disclosure may be implemented in at least one of: hardware, software, and firmware, as the context dictates. In some non-limiting examples, the processor 1610 may thus be arranged to fetch instructions from at least one of: the memory 1620, and the storage unit 1650, as provided by a functional unit of the present disclosure, to execute these instructions, thereby performing any of at least one of: an action, and an operation, as were described herein.

Aspects of the systems and methods provided herein, including without limitation, the device 1600, may be embodied in programming. Various aspects of the technology may be thought of as one of: "products", and "articles of manufacture", typically in the form of at least one of: machine-executable instructions, including without limitation, processor-executable instructions, and associated data, that is one of: carried on, and embodied in, a type of machine-readable medium.

In some non-limiting examples, "storage"-type media may include at least one of: the tangible memory of the device 1600, including without limitation, the processor 1610, and associated modules thereof, including without limitation, at least one of: various semiconductor memories, tape drives, and disk drives, of at least one of the memory 1620, and the storage unit 1650, which may provide non-transitory storage at any time for the software programming. In some non-limiting examples, one of: all, and parts, of the software may at times be communicated through the network 1602. In some non-limiting examples, such communications may enable loading of the software from one computer, including without limitation, the device 1600, including without limitation, a processor 1610 thereof, into another computer, including without limitation, a processor 1610 thereof, including without limitation, from one of: a management server, and a host computer, into the computer platform of an application server.

In some non-limiting examples, "storage"-type media that may bear the software elements of at least one functional unit of the present disclosure, may include at least one of: optical, electrical, and electromagnetic (EM) signals, including without limitation, such signals, including without limitation, waves, used across physical interfaces between local devices, through at least one of: wired, including without limitation a baseband signal, and optical, landline networks, and over various air-links, including without limitation, a signal embodied in a carrier wave. The physical elements that carry such signals, including without limitation, at least one of: the wired links, including without limitation, electrical conductors, including without limitation, coaxial cables, and waveguides, wireless links, including without limitation, those propagating through at least one of: the air, and free space, and optical links, including without limitation, optical media, including without limitation, optical fibre, also may be considered as "storage"-type media bearing the software.

As used herein, unless expressly restricted to non-transitory, tangible "storage" media, terms, including without limitation, one of: "computer-readable medium", and "machine-readable medium" may refer to any medium that participates in providing instructions to a processor 1610 for execution. Such signals, including without limitation, other types of signals, including without limitation, those currently used and hereafter developed, referred to herein as the transmission medium, may be generated according to several well-known methods.

In some non-limiting examples, the information contained in such signals may be ordered according to different sequences, with applicability for at least one of: processing, and generating the information, and receiving the information.

In some non-limiting examples, a machine-readable medium, including without limitation, computer-executable code, may take many forms, including without limitation, at least one of: a tangible storage medium, a carrier wave medium, and a physical transmission medium.

In some non-limiting examples, non-volatile storage media may comprise one of: optical, and magnetic, disks, including without limitation, any of the storage devices 1620, 1650 in any device(s) 1600, including without limitation, one that may be used to implement the databases and at least some other associated components shown in the drawings.

In some non-limiting examples, volatile storage media may comprise dynamic memory, including without limitation, main memory 1620 of such a computer system 1600.

In some non-limiting examples, tangible transmission media may comprise at least one of: coaxial cables, copper wire, and fiber optics, including without limitation, the wires that comprise a bus 1640 within a computer system 1600.

In some non-limiting examples, carrier-wave transmission media may take the form of one of: electric signals, electromagnetic signals, acoustic waves, and light waves, including without limitation, those generated during radio frequency (RF) and infrared (IR) data communication.

Non-limiting example forms of computer-readable media include at least one of: a floppy disk, a flexible disk, a hard disk, a magnetic tape, any other magnetic medium, a CD-ROM, a DVD, a DVD-ROM, any other optical medium, punch cards, paper tape, any other physical storage medium with patterns of holes, a RAM, a ROM, a PROM, an EPROM, an EEPROM, a FLASH-EPROM, any other one of: a memory chip, and cartridge, a carrier wave transporting one of: data, and instructions, one of: cables, and links, transporting such a carrier wave, and any other medium from which a computer system 1900 may read one of: programming code, and data. In some non-limiting examples, many of these forms of computer-readable media may be involved in carrying at least one sequence of at least one instruction to a processor 1610 for execution.

Definitions

In some non-limiting examples, the opto-electronic device may be an electro-luminescent device. In some non-limiting examples, the electro-luminescent device may be an organic light-emitting diode (OLED) device. In some non-limiting examples, the electro-luminescent device may be part of an electronic device. In some non-limiting examples, the electro-luminescent device may be an OLED lighting panel, including without limitation, a module thereof, including without limitation, an OLED display, including without limitation, a module thereof, of a computing device, such as a smartphone, a tablet, a laptop, an e-reader, a monitor, and a television set.

In some non-limiting examples, the opto-electronic device may be an organic photo-voltaic (OPV) device that converts photons into electricity. In some non-limiting examples, the opto-electronic device may be an electro-luminescent QD device.

In the present disclosure, unless specifically indicated to the contrary, reference will be made to OLED devices, with the understanding that such disclosure could, in some examples, equally be made applicable to other opto-electronic devices, including without limitation, at least one of: an OPV, and QD device, in a manner apparent to those having ordinary skill in the relevant art.

The structure of such devices may be described from each of two aspects, namely from at least one of: a longitudinal aspect, and from a lateral (plan view) aspect.

In the present disclosure, a directional convention may be followed, extending substantially normally to the lateral aspect described above, in which the substrate may be the "bottom" of the device, and the layers may be disposed on "top" of the substrate. Following such convention, the second electrode may be at the top of the device shown, even if (as may be the case in some examples, including without limitation, during a manufacturing process, in which at least one layers may be introduced by means of a vapor deposition process), the substrate may be physically inverted, such that the top surface, in which one of the layers, such as, without limitation, the first electrode, may be disposed, may be physically below the substrate, to allow the deposition material (not shown) to move upward and be deposited upon the top surface thereof as a thin film.

In the context of introducing the longitudinal aspect herein, the components of such devices may be shown in substantially planar lateral strata. Those having ordinary skill in the relevant art will appreciate that such substantially planar representation may be for purposes of illustration only, and that across a lateral extent of such a device, there may be localized substantially planar strata of different thicknesses and dimension, including, in some non-limiting examples, the substantially complete absence of a layer(s) separated by non-planar transition regions (including lateral gaps and even discontinuities). Thus, while for illustrative purposes, the device may be shown below in its longitudinal aspect as a substantially stratified structure, in the plan view aspect discussed below, such device may illustrate a diverse topography to define features, each of which may substantially exhibit the stratified profile discussed in the longitudinal aspect.

In the present disclosure, the terms "layer" and "strata" may be used interchangeably to refer to similar concepts.

The thickness of each layer shown in the figures may be illustrative only and not necessarily representative of a thickness relative to another layer.

In the present disclosure, a first layer may be said to be deposited on an exposed layer surface of a second layer to form a layer interface therebetween. Those having ordinary skill in the relevant art will appreciate that at the time of deposition of the first layer, the material from which the first layer will be comprised is deposited on a surface of the second layer that is one of: "presented", and "exposed", in that there is substantially no material deposited thereon, such that it is available to accept deposition thereon of the material from which the first layer will be composed.

Accordingly, as used herein, the surface of the second layer presented, at the time of deposition, for deposition thereon of the material from which the first layer will be composed, may be said to be an "exposed layer surface" of the second layer, even if, in a device in which deposition has proceeded further, including without limitation, to completion, such surface may no longer be "exposed", because of the deposition thereon of the material from which the first layer may be composed.

Those having ordinary skill in the relevant art will appreciate that a third layer may be said to be deposited on an exposed layer surface of the first layer to form a layer interface therein. Thus, after deposition of the first layer onto the exposed layer surface of the second layer, and after deposition of the third layer onto the exposed layer surface of the first layer, the first layer may be said to extend between the second layer and the third layer, and concomitantly, the first layer may be said to extend between the layer interface between the first layer and the second layer, and the layer interface between the third layer and the first layer.

For purposes of simplicity of description, in the present disclosure, a combination of a plurality of elements in a single layer may be denoted by a colon ":", while a plurality of (combination(s) of) elements comprising a plurality of layers in a multi-layer coating may be denoted by separating two such layers by a slash "/". In some non-limiting examples, the layer after the slash may be deposited at least one of: after, and on, the layer preceding the slash.

For purposes of illustration, an exposed layer surface of an underlying layer, onto which at least one of: a coating, layer, and material, may be deposited, may be understood to be a surface of such underlying layer that may be presented for deposition of at least one of: the coating, layer, and material, thereon, at the time of deposition.

Those having ordinary skill in the relevant art will appreciate that when one of: a component, a layer, a region, and a portion thereof, is referred to as being at least one of: "formed", "disposed", and "deposited" on, and "deposited" over another underlying at least one of: a material, component, layer, region, and/portion, such at least one of: formation, disposition, and deposition, may be one of: directly, and indirectly, on an exposed layer surface (at the time of such at least one of: formation, disposition, and deposition) of such underlying at least one of: material, component, layer, region, and portion, with the potential of intervening at least one of: material(s), component(s), layer(s), region(s), and portion(s) therebetween.

In the present disclosure, the terms "overlap", and "overlapping" may refer generally to a plurality of at least one of: layers, and structures, arranged to intersect a cross-sectional axis extending substantially normally away from a surface onto which such at least one of: layers, and structures, may be disposed.

While the present disclosure discusses thin film formation, in reference to at least one layer (coating), in terms of vapor deposition, those having ordinary skill in the relevant art will appreciate that, in some non-limiting examples, various components of the device may be selectively deposited using a wide variety of techniques, including without limitation, evaporation (including without limitation, at least one of: thermal, and electron beam, evaporation), photolithography, printing (including without limitation, ink jet, and vapor jet, printing, reel-to-reel printing, and micro-contact transfer printing), PVD (including without limitation, sputtering), chemical vapor deposition (CVD) (including without limitation, at least one of: plasma-enhanced CVD (PECVD), and organic vapor phase deposition (OVPD)), laser annealing, laser-induced thermal imaging (LITI) patterning, atomic-layer deposition (ALD), coating (including without limitation, spin-coating, di coating, line coating, and spray coating) (collectively "deposition process").

Some processes may be used in combination with a shadow mask, which may, in some non-limiting examples, may be one of: an open mask, and fine metal mask (FMM), during deposition of any of various at least one of: layers, and coatings, to achieve various patterns by at least one of: masking, and precluding deposition of, a deposited material on certain parts of a surface of an underlying layer exposed thereto.

In the present disclosure, the terms "evaporation", and "sublimation" may be used interchangeably to refer generally to deposition processes in which a source material is converted into a vapor, including without limitation, by heating, to be deposited onto a target surface in, without limitation, a solid state. As will be understood, an evaporation deposition process may be a type of PVD process where at least one source material is sublimed under a low pressure (including without limitation, a vacuum) environment to form vapor monomers, and deposited on a target surface through de-sublimation of the at least one evaporated source material. A variety of different evaporation sources may be used for heating a source material, and, as such, it will be appreciated by those having ordinary skill in the relevant art, that the source material may be heated in various ways. In some non-limiting examples, the source material may be heated by at least one of: an electric filament, electron beam, inductive heating, and by resistive heating. In some non-limiting examples, the source material may be loaded into at least one of: a heated crucible, a heated boat, a Knudsen cell (which may be an effusion evaporator source), and any other type of evaporation source.

In some non-limiting examples, a deposition source material may be a mixture. In some non-limiting examples, at least one component of a mixture of a deposition source material may not be deposited during the deposition process (in some non-limiting examples, be deposited in a substantially small amount compared to other components of such mixture).

In the present disclosure, a reference to at least one of: a layer thickness, a film thickness, and an average one of: layer, and film, thickness, of a material, irrespective of the mechanism of deposition thereof, may refer to an amount of the material deposited on a target exposed layer surface, which corresponds to an amount of the material to cover the target surface with a uniformly thick layer of the material having the referenced layer thickness. In some non-limiting examples, depositing a layer thickness of 10 nm of material may indicate that an amount of the material deposited on the surface may correspond to an amount of the material to form a uniformly thick layer of the material that may be 10 nm thick. It will be appreciated that, having regard to the mechanism by which thin films are formed discussed above, in some non-limiting examples, due to possible at least one of: stacking, and clustering, of monomers, an actual thickness of the deposited material may be non-uniform. In some non-limiting examples, depositing a layer thickness of 10 nm may yield one of: some parts of the deposited material having an actual thickness of at least 10 nm, and other parts of the deposited material having an actual thickness of no more than 10 nm. A certain layer thickness of a material deposited on a surface may thus correspond, in some non-limiting examples, to an average thickness of the deposited material across the target surface.

In the present disclosure, a reference to a reference layer thickness may refer to a layer thickness of the deposited material (such as Mg), that may be deposited on a reference surface exhibiting one of: a high initial sticking probability, and initial sticking coefficient, (that is, a surface having an initial sticking probability that is about 1.0). The reference layer thickness may not indicate an actual thickness of the deposited material deposited on a target surface (such as, without limitation, a surface of a patterning coating). Rather, the reference layer thickness may refer to a layer thickness of the deposited material that would be deposited on a reference surface, in some non-limiting examples, a surface of a quartz crystal, positioned inside a deposition chamber for monitoring a deposition rate and the reference layer thickness, upon subjecting the target surface and the reference surface to identical vapor flux of the deposited material for the same deposition period. Those having ordinary skill in the relevant art will appreciate that in the event that the target surface and the reference surface are not subjected to identical vapor flux simultaneously during deposition, an appropriate tooling factor may be used to determine (monitor) the reference layer thickness.

In the present disclosure, a reference deposition rate may refer to a rate at which a layer of the deposited material would grow on the reference surface, if it were identically positioned and configured within a deposition chamber as the sample surface.

In the present disclosure, a reference to depositing a number X of monolayers of material may refer to depositing an amount of the material to cover a given area of an exposed layer surface with X single layer(s) of constituent monomers of the material, such as, without limitation, in a closed coating.

In the present disclosure, a reference to depositing a fraction of a monolayer of a material may refer to depositing an amount of the material to cover such fraction of a given area of an exposed layer surface with a single layer of constituent monomers of the material. Those having ordinary skill in the relevant art will appreciate that due to, in some non-limiting examples, possible at least one of: stacking, and clustering, of monomers, an actual local thickness of a deposited material across a given area of a surface may be non-uniform. In some non-limiting examples, depositing 1 monolayer of a material may result in some local regions of the given area of the surface being uncovered by the material, while other local regions of the given area of the surface may have multiple at least one of: atomic, and molecular, layers deposited thereon.

In the present disclosure, a target surface (including without limitation, target region(s) thereof) may be considered to be at least one of: "substantially devoid of", "substantially free of", and "substantially uncovered by", a material if there may be a substantial absence of the material on the target surface as determined by any applicable determination mechanism.

In the present disclosure, the terms "sticking probability" and "sticking coefficient" may be used interchangeably.

In the present disclosure, the term "nucleation" may reference a nucleation stage of a thin film formation process, in which monomers in a vapor phase condense onto a surface to form nuclei.

In the present disclosure, in some non-limiting examples, as the context dictates, the terms "patterning coating" and "patterning material" may be used interchangeably to refer to similar concepts, and references to a patterning coating herein, in the context of being selectively deposited to pattern a deposited layer may, in some non-limiting examples, be applicable to a patterning material in the context of selective deposition thereof to pattern at least one of: a deposited material, and an electrode coating material.

Similarly, in some non-limiting examples, as the context dictates, the term "patterning coating" and "patterning material" may be used interchangeably to refer to similar concepts, and reference to an NPC herein, in the context of being selectively deposited to pattern a deposited layer may, in some non-limiting examples, be applicable to an NPC in the context of selective deposition thereof to pattern at least one of: a deposited material, and an electrode coating.

While a patterning material may be one of: nucleation-inhibiting, and nucleation-promoting, in the present disclosure, unless the context dictates otherwise, a reference herein to a patterning material is intended to be a reference to an NIC.

In some non-limiting examples, reference to a patterning coating may signify a coating having an specific composition as described herein.

In the present disclosure, the terms "deposited layer", "conductive coating", and "electrode coating" may be used interchangeably to refer to similar concepts and references to a deposited layer herein, in the context of being patterned by selective deposition of at least one of: a patterning coating, and an NPC, may, in some non-limiting examples, be applicable to a deposited layer in the context of being patterned by selective deposition of a patterning material. In some non-limiting examples, reference to an electrode coating may signify a coating having an specific composition as described herein. Similarly, in the present disclosure, the terms "deposited layer material", "deposited material", "conductive coating material", and "electrode coating material" may be used interchangeably to refer to similar concepts and references to a deposited material herein.

In the present disclosure, as used herein, molecular formulae showing fragment(s) of a compound may comprise at least one bond connected to symbols, including without limitation, an asterisk symbol (denoted "*"), and those denoted -ξ, which symbols may be used to indicate the bonds to another atom (not shown) of the compound to which such fragment(s) may be attached.

In the present disclosure, it will be appreciated by those having ordinary skill in the relevant art that an organic material may comprise, without limitation, a wide variety of organic at least one of: molecules, and polymers. Further, it will be appreciated by those having ordinary skill in the relevant art that organic materials that are doped with various inorganic substances, including without limitation, elements, and inorganic compounds, may still be considered organic materials. Still further, it will be appreciated by those having ordinary skill in the relevant art that various organic materials may be used, and that the processes described herein are generally applicable to an entire range of such organic materials. Still further, it will be appreciated by those having ordinary skill in the relevant art that organic materials that comprise at least one of: metals, and other organic elements, may still be considered as organic materials. Still further, it will be appreciated by those having ordinary skill in the relevant art that various organic materials may be at least one of: molecules, oligomers, and polymers.

An organic opto-electronic device may encompass any opto-electronic device where at least one active layers (strata) thereof are formed primarily of an organic (carbon-containing) material, and more specifically, an organic semiconductor material.

In the present disclosure, the term "organic-inorganic hybrid material", as used herein, may generally refer to a material that comprises both an organic component and an inorganic component. In some non-limiting examples, such organic-inorganic hybrid material may comprise an organic-inorganic hybrid compound that comprises an organic moiety and an inorganic moiety. In some non-limiting examples, such organic-inorganic hybrid compounds may include those in which an inorganic scaffold may be functionalized with at least one organic functional group.

In some non-limiting examples, such organic-inorganic hybrid materials may comprise those comprising at least one of: a siloxane group, a silsesquioxane group, a polyhedral oligomeric silsesquioxane (POSS) group, a phosphazene group, and a metal complex.

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials thus generally exhibit electrical conductivity that is no more than that of a conductive material (including without limitation, a metal), but that is greater than that of an insulating material (including without limitation, a glass). In some non-limiting examples, the semiconductor material may comprise an organic semiconductor material. In some non-limiting examples, the semiconductor material may comprise an inorganic semiconductor material.

As used herein, an oligomer may generally refer to a material which includes at least two monomer (units). As would be appreciated by a person skilled in the art, an oligomer may differ from a polymer in at least one aspect, including, without limitation: (1) the number of monomer units contained therein; (2) the molecular weight; and (3) other material properties (characteristics). In some non-limiting examples, further description of polymers and oligomers may be found in Naka K. (2014) *Monomers, Oligomers, Polymers, and Macromolecules* (*Overview*), and in Kobayashi S., Müllen K.(eds.) *Encyclopedia of Polymeric Nanomaterials*, Springer, Berlin, Heidelberg.

One of: an oligomer, and a polymer, may generally include monomer units that may be chemically bonded together to form a molecule. Such monomer units may be substantially identical to one another such that one of: the molecule is primarily formed by repeating monomer units, and the molecule may include a plurality of different monomer units. Additionally, the molecule may include at least one terminal unit, which may be different from the monomer units of the molecule. One of: an oligomer, and a polymer, may be at least one of: linear, branched, cyclic, cyclo-linear, and cross-linked. One of: an oligomer, and a polymer, may include a plurality of different monomer units which are arranged in a repeating pattern, including without limitation, in alternating blocks, of different monomer units.

In the present disclosure, the term “semiconducting layer(s)” may be used interchangeably with “organic layer(s)” since the layers in an OLED device may in some non-limiting examples, may comprise organic semiconducting materials.

In the present disclosure, an inorganic substance may refer to a substance that primarily includes an inorganic material. In the present disclosure, an inorganic material may comprise any material that is not considered to be an organic material, including without limitation, metals, glasses, and minerals.

In the present disclosure, the term “aperture ratio”, as used herein, generally refers to a percentage of area within a (part of a) display panel, in plan, occupied by, including without limitation, attributed to, at least one feature present in such (part of a) display panel.

In the present disclosure, the terms “electromagnetic radiation”, “EM radiation”, “photon”, and “light” may be used interchangeably to refer to similar concepts. In the present disclosure, EM radiation may have a wavelength that lies in at least one of: the visible spectrum, infrared (IR) region (IR spectrum), near IR region (NIR spectrum), ultraviolet (UV) region (UV spectrum), UVA region (UVAn spectrum) (which may correspond to a wavelength range between about 315-400 nm) thereof, and UVB region (UVB spectrum) (which may correspond to a wavelength between about 280-315 nm) thereof.

In the present disclosure, the term “visible spectrum” as used herein, generally refers to at least one wavelength in the visible part of the EM spectrum.

As would be appreciated by those having ordinary skill in the relevant art, such visible part may correspond to any wavelength between about 380-740 nm. In general, electroluminescent devices may be configured to at least one of: emit, and transmit, EM radiation having wavelengths in a range of between about 425-725 nm, and more specifically, in some non-limiting examples, EM radiation having peak emission wavelengths of 456, 528, and 624, nm, corresponding to B(lue), G(reen), and R(ed) sub-pixels, respectively. Accordingly, in the context of such electro-luminescent devices, the visible part may refer to any wavelength that is one of between about: 425-725, and 456-624, nm. EM radiation having a wavelength in the visible spectrum may, in some non-limiting examples, also be referred to as “visible light” herein.

In the present disclosure, the term “emission spectrum” as used herein, generally refers to an electroluminescence spectrum of light emitted by an opto-electronic device. In some non-limiting examples, an emission spectrum may be detected using an optical instrument, such as, in some non-limiting examples, an spectrophotometer, which may measure an intensity of EM radiation across a wavelength range.

In the present disclosure, the term “onset wavelength”, as used herein, may generally refer to a lowest wavelength at which an emission is detected within an emission spectrum.

In the present disclosure, the term “peak wavelength”, as used herein, may generally refer to a wavelength at which a maximum luminous intensity is detected within an emission spectrum.

In some non-limiting examples, the onset wavelength may be less than the peak wavelength. In some non-limiting examples, the onset wavelength $\lambda_{onset}$ may correspond to a wavelength at which a luminous intensity is one of no more than about: 10, 5, 3, 1, 0.5, 0.1, and 0.01%, of the luminous intensity at the peak wavelength.

In some non-limiting examples, an emission spectrum that lies in the R(ed) part of the visible spectrum may be characterized by a peak wavelength that may lie in a wavelength range of about 600-640 nm and in some non-limiting examples, may be substantially about 620 nm.

In some non-limiting examples, an emission spectrum that lies in the G(reen) part of the visible spectrum may be characterized by a peak wavelength that may lie in a wavelength range of about 510-540 nm and in some non-limiting examples, may be substantially about 530 nm.

In some non-limiting examples, an emission spectrum that lies in the B(lue) part of the visible spectrum may be characterized by a peak wavelength Amax that may lie in a wavelength range of about 450-460 nm and in some non-limiting examples, may be substantially about 455 nm.

In the present disclosure, the term “IR signal” as used herein, may generally refer to EM radiation having a wavelength in an IR subset (IR spectrum) of the EM spectrum. In some non-limiting examples, an IR signal may have a wavelength of one of between about: 700-1,000, 750-5,000, 750-3,000, 750-1,400, and 850-1,200, nm.

An IR signal may, in some non-limiting examples, have a wavelength corresponding to a near-infrared (NIR) subset (NIR spectrum) thereof. In some non-limiting examples, an NIR signal may have a wavelength of one of between about: 750-1,400, 750-1,300, 800-1,300, 800-1,200, 850-1,300, and 900-1,300, nm.

In the present disclosure, the term “absorption spectrum”, as used herein, may generally refer to a wavelength (sub-) range of the EM spectrum over which absorption may be concentrated.

In the present disclosure, the terms “absorption edge”, “absorption discontinuity”, and “absorption limit” as used herein, may generally refer to a sharp discontinuity in the absorption spectrum of a substance. In some non-limiting examples, an absorption edge may tend to occur at wavelengths where the energy of absorbed EM radiation may correspond to at least one of: an electronic transition, and ionization potential.

In the present disclosure, the term "extinction coefficient" as used herein, may generally refer to a degree to which an EM coefficient may be attenuated when propagating through a material. In some non-limiting examples, the extinction coefficient may be understood to correspond to the imaginary component k of a complex refractive index. In some non-limiting examples, the extinction coefficient of a material may be measured by a variety of methods, including without limitation, by ellipsometry.

In the present disclosure, the terms "refractive index", and "index", as used herein to describe a medium, may refer to a value calculated from a ratio of the speed of light in such medium relative to the speed of light in a vacuum. In the present disclosure, particularly when used to describe the properties of substantially transparent materials, including without limitation, thin film layers (coatings), the terms may correspond to the real part, n, in the expression N=n+ik, in which N may represent the complex refractive index and k may represent the extinction coefficient.

As would be appreciated by those having ordinary skill in the relevant art, substantially transparent materials, including without limitation, thin film layers (coatings), may generally exhibit a substantially low extinction coefficient value in the visible spectrum, and therefore the imaginary component of the expression may have a negligible contribution to the complex refractive index. On the other hand, light-transmissive electrodes formed, for example, by a metallic thin film, may exhibit a substantially low refractive index value and a substantially high extinction coefficient value in the visible spectrum. Accordingly, the complex refractive index, N, of such thin films may be dictated primarily by its imaginary component k.

In the present disclosure, unless the context dictates otherwise, reference without specificity to a refractive index may be intended to be a reference to the real part n of the complex refractive index N.

In some non-limiting examples, there may be a generally positive correlation between refractive index and transmittance, in other words, a generally negative correlation between refractive index and absorption. In some non-limiting examples, the absorption edge of a substance may correspond to a wavelength at which the extinction coefficient approaches 0.

In the present disclosure, the concept of a pixel may be discussed on conjunction with the concept of at least one sub-pixel thereof. For simplicity of description only, such composite concept may be referenced herein as a "(sub-) pixel" and such term may be understood to suggest at least one of: a pixel, and at least one sub-pixel thereof, unless the context dictates otherwise.

In some nonlimiting examples, one measure of an amount of a material on a surface may be a percentage coverage of the surface by such material. In some non-limiting examples, surface coverage may be assessed using a variety of imaging techniques, including without limitation, at least one of: TEM, AFM, and SEM.

In the present disclosure, the terms "particle", "island", and "cluster" may be used interchangeably to refer to similar concepts.

In the present disclosure, for purposes of simplicity of description, the terms "coating film", "closed coating", and "closed film", as used herein, may refer to a thin film structure (coating) of a deposited material used for a deposited layer, in which a relevant part of a surface may be substantially coated thereby, such that such surface may be not substantially exposed by (through) the coating film deposited thereon.

In the present disclosure, unless the context dictates otherwise, reference without specificity to a thin film may be intended to be a reference to a substantially closed coating.

In some non-limiting examples, a closed coating, in some non-limiting examples, of at least one of: a deposited layer, and a deposited material, may be disposed to cover a part of an underlying layer, such that, within such part, one of no more than about: 40, 30, 25, 20, 15, 10, 5, 3, and 1% of the underlying layer therewithin may be exposed by (through), the closed coating.

Those having ordinary skill in the relevant art will appreciate that a closed coating may be patterned using various techniques and processes, including without limitation, those described herein, to deliberately leave a part of the exposed layer surface of the underlying layer to be exposed after deposition of the closed coating. In the present disclosure, such patterned films may nevertheless be considered to constitute a closed coating, if, in some non-limiting examples, the thin film (coating) that is deposited, within the context of such patterning, and between such deliberately exposed parts of the exposed layer surface of the underlying layer, itself substantially comprises a closed coating.

Those having ordinary skill in the relevant art will appreciate that, due to inherent variability in the deposition process, and in some non-limiting examples, to the existence of impurities in at least one of the deposited materials, in some non-limiting examples, the deposited material, and the exposed layer surface of the underlying layer, deposition of a thin film, using various techniques and processes, including without limitation, those described herein, may nevertheless result in the formation of small apertures, including without limitation, at least one of: pin-holes, tears, and cracks, therein. In the present disclosure, such thin films may nevertheless be considered to constitute a closed coating, if, in some non-limiting examples, the thin film (coating) that is deposited substantially comprises a closed coating and meets any specified percentage coverage criterion set out, despite the presence of such apertures.

In the present disclosure, for purposes of simplicity of description, the term "discontinuous layer" as used herein, may refer to a thin film structure (coating) of a material used for a deposited layer, in which a relevant part of a surface coated thereby, may be neither substantially devoid of such material, nor forms a closed coating thereof. In some non-limiting examples, a discontinuous layer of a deposited material may manifest as a plurality of discrete islands disposed on such surface.

In the present disclosure, for purposes of simplicity of description, the result of deposition of vapor monomers onto an exposed layer surface of an underlying layer, that has not (yet) reached a stage where a closed coating has been formed, may be referred to as a "intermediate stage layer". In some non-limiting examples, such an intermediate stage layer may reflect that the deposition process has not been completed, in which such an intermediate stage layer may be considered as an interim stage of formation of a closed coating. In some non-limiting examples, an intermediate stage layer may be the result of a completed deposition process, and thus constitute a final stage of formation in and of itself.

In some non-limiting examples, an intermediate stage layer may more closely resemble a thin film than a discontinuous layer but may have apertures (gaps) in the surface coverage, including without limitation, at least one of: a dendritic projection, and a dendritic recess. In some non-limiting examples, such an intermediate stage layer may comprise a fraction of a single monolayer of the deposited material such that it does not form a closed coating.

In the present disclosure, for purposes of simplicity of description, the term "dendritic", with respect to a coating, including without limitation, the deposited layer, may refer to feature(s) that resemble a branched structure when viewed in a lateral aspect. In some non-limiting examples, the deposited layer may comprise at least one of: a dendritic projection, and a dendritic recess. In some non-limiting examples, a dendritic projection may correspond to a part of the deposited layer that exhibits a branched structure comprising a plurality of short projections that are physically connected and extend substantially outwardly. In some non-limiting examples, a dendritic recess may correspond to a branched structure of at least one of: gaps, openings, and uncovered parts, of the deposited layer that are physically connected and extend substantially outwardly. In some non-limiting examples, a dendritic recess may correspond to, including without limitation, a mirror image (inverse pattern) to the pattern of a dendritic projection. In some non-limiting examples, at least one of: a dendritic projection, and a dendritic recess may have a configuration that exhibits, (mimics) at least one of: a fractal pattern, a mesh, a web, and an interdigitated structure.

In some non-limiting examples, sheet resistance may be a property of at least one of: a component, layer, and part, that may alter a characteristic of an electric current passing through at least one of: such component, layer, and part. In some non-limiting examples, a sheet resistance of a coating may generally correspond to a characteristic sheet resistance of the coating, measured (determined) in isolation from other at least one of: components, layers, and parts, of the device.

In the present disclosure, a deposited density may refer to a distribution, within a region, which, in some non-limiting examples, may comprise at least one of: an area, and a volume, of a deposited material therein. Those having ordinary skill in the relevant art will appreciate that such deposited density may be unrelated to a density of mass (material) within a particle structure itself that may comprise such deposited material. In the present disclosure, unless the context dictates otherwise, reference to a (deposited) density, may be intended to be a reference to a distribution of such deposited material, including without limitation, as at least one particle, within an area.

In some non-limiting examples, a bond dissociation energy of a metal may correspond to a standard-state enthalpy change measured at 298 K from the breaking of a bond of a diatomic molecule formed by two identical atoms of the metal. Bond dissociation energies may, in some non-limiting examples, be determined based on known literature including without limitation, Luo, Yu-Ran, "*Bond Dissociation Energies*" (2010).

Without wishing to be bound by a particular theory, it is postulated that providing an NPC may facilitate deposition of the deposited layer onto certain surfaces.

In some non-limiting examples, materials having applicability for forming an NPC may comprise, without limitation, at least one metal, including without limitation, alkali metals, alkaline earth metals, transition metals, post-transition metals, metal fluorides, metal oxides, and fullerene.

In some non-limiting examples, such materials may comprise at least one of: Ca, Ag, Mg, Yb, ITO, IZO, ZnO, ytterbium fluoride ($YbF_3$), magnesium fluoride ($MgF_2$), and cesium fluoride (CsF).

In the present disclosure, the term "fullerene" may refer generally to a material including carbon molecules. In some non-limiting examples, fullerene molecules may comprise carbon cage molecules, including without limitation, a three-dimensional skeleton that includes multiple carbon atoms that form a closed shell, and which may be, without limitation, (semi-)spherical in shape. In some non-limiting examples, a fullerene molecule may be designated as $C_n$, where n may be an integer corresponding to several carbon atoms included in a carbon skeleton of the fullerene molecule. In some non-limiting examples, fullerene molecules may comprise $C_n$, where n may be in the range of 50-250, such as, without limitation, $C_{60}$, $C_{70}$, $C_{72}$, $C_{74}$, $C_{76}$, $C_{78}$, $C_{80}$, $C_{82}$, and $C_{84}$. Additional non-limiting examples of fullerene molecules include carbon molecules in at least one of: a tube, and a cylindrical shape, including without limitation, single-walled carbon nanotubes, and multi-walled carbon nanotubes.

Based on findings and experimental observations, it may be postulated that nucleation promoting materials, including without limitation, fullerenes, metals, including without limitation, at least one of: Ag, and Yb, and metal oxides, including without limitation, ITO, and IZO, as discussed further herein, may act as nucleation sites for the deposition of a deposited layer, including without limitation Mg.

In some non-limiting examples, applicable materials for use to form an NPC, may include those exhibiting (characterized) as having an initial sticking probability for a material of a deposited layer of one of at least about: 0.4, 0.5, 0.6, 0.7, 0.75, 0.8, 0.9, 0.93, 0.95, 0.98, and 0.99.

In some non-limiting examples, in scenarios where Mg is deposited using without limitation, an evaporation process on a fullerene-treated surface, in some non-limiting examples, the fullerene molecules may act as nucleation sites that may promote formation of stable nuclei for Mg deposition.

In some non-limiting examples, no more than a monolayer of an NPC, including without limitation, fullerene, may be provided on the treated surface to act as nucleation sites for deposition of Mg.

In some non-limiting examples, treating a surface by depositing several monolayers of an NPC thereon may result in a higher number of nucleation sites and accordingly, a higher initial sticking probability.

Those having ordinary skill in the relevant art will appreciate than an amount of material, including without limitation, fullerene, deposited on a surface, may be one of: more, and less than, one monolayer. In some non-limiting examples, such surface may be treated by depositing one of about: 0.1, 1, 10, and more monolayers of at least one of: a nucleation promoting, and a nucleation inhibiting, material.

In some non-limiting examples, an average layer thickness of the NPC deposited on an exposed layer surface of underlying layer(s) may be one of between about: 1-5 nm, and 1-3 nm.

Where features and aspects of the present disclosure may be described in terms of Markush groups, it will be appreciated by those having ordinary skill in the relevant art that the present disclosure may also be thereby described in terms of any individual member of sub-group of members of such Markush group.

Terminology

References in the singular form may include the plural and vice versa, unless otherwise noted.

As used herein, relational terms, such as “first” and “second”, and numbering devices such as “a”, “b” and the like, may be used solely to distinguish one entity/element from another entity/element, without necessarily requiring/implying any physical/logical relationship/order between such entities/elements.

The terms “including” and “comprising” may be used expansively and in an open-ended fashion, and thus should be interpreted to mean “including, but not limited to”. The terms “example” and “exemplary” may be used simply to identify instances for illustrative purposes and should not be interpreted as limiting the scope of the invention to the stated instances. In some non-limiting examples, the term “exemplary” should not be interpreted to denote/confer any laudatory, beneficial, and other quality to the expression with which it is used, whether in terms of design, performance and otherwise.

Further, the term “critical”, especially when used in the expressions “critical nuclei”, “critical nucleation rate”, “critical concentration”, “critical cluster”, “critical monomer”, “critical particle structure size”, and “critical surface tension” may be a term familiar to those having ordinary skill in the relevant art, including as relating to/being in a state in which a measurement/point at which some at least one of: quality, property and phenomenon undergoes a definite change. As such, the term “critical” should not be interpreted to denote/confer any significance/importance to the expression with which it is used, whether in terms of design, performance, and otherwise.

The term “common”, especially when used in the expressions “common electrode”, “common conductive coating”, and “common layer” may be intended to mean an electrode, conductive coating, and layer, as the case may be, that is one of: deposited as, and acts as it was deposited as, a single continuous single structure.

The terms “couple” and “communicate” in any form may be intended to mean either one of: a direct, and indirect, connection through some one of: an interface, device, intermediate component, connection, whether optically, electrically, mechanically, chemically, and otherwise.

The terms “on” and “over”, when used in reference to a first component relative to another component, and at least one of: “covering” and which “covers” another component, may encompass situations where the first component is directly on (including without limitation, in physical contact with) the other component, as well as cases where at least one intervening component is positioned between the first component and the other component.

Directional terms such as “upward”, “downward”, “left” and “right” may be used to refer to directions in the drawings to which reference is made unless otherwise stated. Similarly, words such as “inward” and “outward” may be used to refer to directions toward and away from, respectively, the geometric center of the device, area, volume and designated parts thereof. Moreover, all dimensions described herein may be intended solely to be by way of example of purposes of illustrating certain examples and may not be intended to limit the scope of the disclosure to any examples that may depart from such dimensions as may be specified.

As used herein, the terms “substantially”, “substantial”, “approximately”, and “about” may be used to denote and account for small variations. When used in conjunction with an event/circumstance, such terms may refer to instances in which the event/circumstance occurs precisely, as well as instances in which the event/circumstance occurs to a close approximation. In some non-limiting examples, when used in conjunction with a numerical value, such terms may refer to a range of variation of no more than about ±10% of such numerical value, such as at least one of no more than about: ±5, ±4, ±3, ±2, ±1, ±0.5, ±0.1, and ±0.05%.

As used herein, the phrase “consisting substantially of” may be understood to include those elements specifically recited and any additional elements that do not materially affect the basic and novel characteristics of the described technology, while the phrase “consisting of” without the use of any modifier, may exclude any element not specifically recited.

Whenever the term “at least” precedes the first numerical value in a series of a plurality numerical values, the term “at least” may apply to each of the numerical values in that series of numerical values. In some non-limiting examples, at least one of: 1, 2, and 3 may be equivalent to at least one of: at least 1, at least 2, and at least 3.

Whenever the term “no more than” precedes the first numerical value in a series of a plurality of numerical values, the term “no more than” may apply to each of the numerical values in that series of numerical values. In some non-limiting examples, no more than: 3, 2, and 1 may be equivalent to no more than 3, no more than 2, and no more than 1.

Certain examples herein contemplate numerical ranges. When ranges are present, the ranges may include the range endpoints. Additionally, every sub-range and value within the range may be present as if explicitly written out. The terms “about” and “approximately” may mean within an acceptable error range for the particular value, which will depend in part on how the value is measured (determined), including without limitation, the limitations of the measurement system. In some non-limiting examples, “about” may mean within one of: 1, and more than 1, standard deviation, per the practice in the relevant art. In some non-limiting examples, “about” may mean a range of one of no more than about: 20, 10, 5, and 1% of a given value. Where particular values are described in the application and claims, unless otherwise stated the term “about” meaning within an acceptable error range for the particular value may be assumed.

As will be understood by those having ordinary skill in the relevant art, for any and all purposes, particularly in terms of providing a written description, all ranges disclosed herein may also encompass any and all possible sub-ranges, and combinations of sub-ranges thereof. Any listed range may be easily recognized as substantially describing,/enabling the same range being broken down at least into equal fractions thereof, including without limitation, halves, thirds, quarters, fifths, tenths etc. As a non-limiting example, each range discussed herein may be readily be broken down into a lower third, middle third, and upper third, etc.

As will be understood by those having ordinary skill in the relevant art, for any and all purposes, particularly in terms of providing a written description, all values/ranges disclosed herein that are described in terms of at least one decimal value, should be interpreted as encompassing a value/range that includes rounding error as would be understood by those having ordinary skill in the art, as determined based on the number of significant digits expressed by such decimal value. For greater certainty, the presence/absence of any additional decimal value, in the present disclosure, the same paragraph, and even the same sentence, as the first decimal value, which may have a greater/lesser number of significant digits than the first decimal value, should not be used to limit the value/range encompassed by such first decimal value, in any fashion that limits the value/range so encompassed, to a value/range that is no more than one that includes rounding error based on the number of significant digits expressed thereby.

As will also be understood by those having ordinary skill in the relevant art, all language,/terminology such as “up to”, “at least”, “at least”, “no more than”, “no more than”, and the like, may include,/refer the recited range(s) and may also refer to ranges that may be subsequently broken down into sub-ranges as discussed herein.

As will be understood by those having ordinary skill in the relevant art, a range may include each individual member of the recited range.

General

The purpose of the Abstract is to enable the relevant patent office and the public generally, and specifically, persons of ordinary skill in the art who are not familiar with patent/legal terms/phraseology, to quickly determine from a cursory inspection, the nature of the technical disclosure. The Abstract is neither intended to define the scope of this disclosure, nor is it intended to be limiting as to the scope of this disclosure in any way.

All publications, patents, and patent applications mentioned in this specification are herein incorporated by reference to the same extent as if each individual one of: a publication, patent, and patent application, was specifically and individually indicated to be incorporated by reference. To the extent publications, patents, and patent applications incorporated by reference contradict the disclosure contained in the specification, the specification is intended to one of: supersede, and take precedence over, any such contradictory material.

Incorporation by reference is expressly limited to the technical aspects of the materials, systems, and methods described in the mentioned publications, patents, and patent applications and may not extend to any lexicographical definitions from the publications, patents, and patent applications. Any lexicographical definition appearing in the publications, patents, and patent applications that is not also expressly repeated in the instant disclosure should not be treated as such and should not be read as defining any terms appearing in the accompanying claims.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are merely illustrative of the scope of the present disclosure.

It should be appreciated that the present disclosure, which is described by the claims and not by the implementation details provided, and which can be modified by varying, omitting, adding, replacing, and in the absence of, any element(s), at least one of: limitation(s) with alternatives, and equivalent functional elements, whether specifically disclosed herein, will be apparent to those having ordinary skill in the relevant art, and may be made to the examples disclosed herein, and may provide many applicable inventive concepts that may be embodied in a wide variety of specific contexts, without straying from the present disclosure.

In some non-limiting examples, features, techniques, systems, sub-systems and methods described and illustrated in at least one of the above-described examples, whether described and illustrated as discrete/separate, may be combined/integrated in another system without departing from the scope of the present disclosure, to create alternative examples comprised of a (sub-) combination of features that may not be explicitly described above, including without limitation, where certain features may be omitted/not implemented. Features having applicability for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects, and examples of the disclosure, as well as specific examples thereof, are intended to encompass both structural and functional equivalents thereof and to cover and embrace all applicable changes in technology. Additionally, it is intended that such equivalents include both currently known equivalents as well as equivalents developed in the future, i.e., any elements developed that perform the same function, regardless of structure.

CLAUSES

The present disclosure includes, without limitation, the following clauses:

The device according to at least one clause herein wherein the patterning coating comprises a patterning material.

The device according to at least one clause herein, wherein an initial sticking probability against deposition of the deposited material of the patterning coating is no more than an initial sticking probability against deposition of the deposited material of the exposed layer surface.

The device according to at least one clause herein, wherein the patterning coating is substantially devoid of a closed coating of the deposited material.

The device according to at least one clause herein, wherein at least one of the patterning coating and the patterning material has an initial sticking probability against deposition of the deposited material that is one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

The device according to at least one clause herein, wherein at least one of the patterning coating and the patterning material has an initial sticking probability against deposition of at least one of silver (Ag) and magnesium (Mg) that is one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

The device according to at least one clause herein, wherein at least one of the patterning coating and the patterning material has an initial sticking probability against deposition of the deposited material of one of between about: 0.15-0.0001, 0.1-0.0003, 0.08-0.0005, 0.08-0.0008, 0.05-0.001, 0.03-0.0001, 0.03-0.0003, 0.03-0.0005, 0.03-0.0008, 0.03-0.001, 0.03-0.005, 0.03-0.008, 0.03-0.01, 0.02-0.0001, 0.02-0.0003, 0.02-0.0005, 0.02-0.0008, 0.02-0.001, 0.02-0.005, 0.02-0.008, 0.02-0.01, 0.01-0.0001, 0.01-0.0003, 0.01-0.0005, 0.01-0.0008, 0.01-0.001, 0.01-0.005, 0.01-0.008, 0.008-0.0001, 0.008-0.0003, 0.008-0.0005, 0.008-0.0008, 0.008-0.001, 0.008-0.005, 0.005-0.0001, 0.005-0.0003, 0.005-0.0005, 0.005-0.0008, and 0.005-0.001.

The device according to at least one clause herein, wherein at least one of the patterning coating and the patterning material has an initial sticking probability against deposition of the deposited material that is no more than a threshold value that is one of about: 0.3, 0.2, 0.18, 0.15, 0.13, 0.1, 0.08, 0.05, 0.03, 0.02, 0.01, 0.008, 0.005, 0.003, and 0.001.

The device according to at least one clause herein, wherein at least one of the patterning coating and the patterning material has an initial sticking probability against the deposition of one of: Ag, Mg, ytterbium (Yb), cadmium (Cd), and zinc (Zn), that is no more than the threshold value.

The device according to at least one clause herein, wherein the threshold value has a first threshold value against the deposition of a first deposited material and a second threshold value against the deposition of a second deposited material.

The device according to at least one clause herein, wherein the first deposited material is Ag and the second deposited material is Mg.

The device according to at least one clause herein, wherein the first deposited material is Ag and the second deposited material is Yb.

The device according to at least one clause herein, wherein the first deposited material is Yb and the second deposited material is Mg.

The device according to at least one clause herein, wherein the first threshold value exceeds the second threshold value.

The device according to at least one clause herein, wherein at least one of the patterning coating and the patterning material has a transmittance for EM radiation of at least a threshold transmittance value after being subjected to a vapor flux of the deposited material.

The device according to at least one clause herein, wherein the threshold transmittance value is measured at a wavelength in the visible spectrum.

The device according to at least one clause herein, wherein the threshold transmittance value is one of at least about 60, 65, 70, 75, 80, 85, and 90% of incident EM power transmitted therethrough.

The device according to at least one clause herein, wherein at least one of the patterning coating and the patterning material has a surface energy of one of no more than about: 24, 22, 20, 18, 16, 15, 13, 12 m, and 11, dynes/cm.

The device according to at least one clause herein, wherein at least one of the patterning coating and the patterning material has a surface energy that is one of at least about: 6, 7, and 8, dynes/cm.

The device according to at least one clause herein, wherein at least one of the patterning coating and the patterning material has a surface energy that is one of between about: $10^{-20}$, and 13-19, dynes/cm.

The device according to at least one clause herein, wherein at least one of the patterning coating and the patterning material has a refractive index for EM radiation at a wavelength of 550 nm that is one of no more than about: 1.55, 1.5, 1.45, 1.43, 1.4, 1.39, 1.37, 1.35, 1.32, and 1.3

The device according to at least one clause herein, wherein at least one of the patterning coating and the patterning material has an extinction coefficient that is no more than about 0.01 for photons at a wavelength that exceeds one of about: 600, 500, 460, 420, and 410, nm.

The device according to at least one clause herein, wherein at least one of the patterning coating and the patterning material has an extinction coefficient that is one of at least about: 0.05, 0.1, 0.2, 0.5 for EM radiation at a wavelength shorter than one of at least about: 400, 390, 380, and 370, nm.

The device according to at least one clause herein, wherein at least one of the patterning coating and the patterning material has a glass transition temperature that is that is one of: (i) one of at least about: 300, 150, 130, 120, and 100° C., and (ii) one of no more than about: 30, 0,–30, and –50° C. . . .

The device according to at least one clause herein, wherein the patterning material has a sublimation temperature of one of between about: 100-320, 120-300, 140-280, and 150-250° C.

The device according to at least one clause herein, wherein at least one of the patterning coating and the patterning material comprises at least one of a fluorine atom and a silicon atom.

The device according to at least one clause herein, wherein the patterning coating comprises fluorine and carbon.

The device according to at least one clause herein, wherein an atomic ratio of a quotient of fluorine by carbon is one of about: 1, 1.5, and 2.

The device according to at least one clause herein, wherein the patterning coating comprises an oligomer.

The device according to at least one clause herein, wherein the patterning coating comprises a compound having a molecular structure comprising a backbone and at least one functional group bonded thereto.

The device according to at least one clause herein, wherein the compound comprises at least one of: a siloxane group, a silsesquioxane group, an aryl group, a heteroaryl group, a fluoroalkyl group, a hydrocarbon group, a phosphazene group, a fluoropolymer, and a metal complex.

The device according to at least one clause herein, wherein a molecular weight of the compound is one of no more than about: 5,000, 4,500, 4,000, 3,800, and 3,500, g/mol.

The device according to at least one clause herein, wherein the molecular weight is about: 1,500, 1,700, 2,000, 2,200, and 2,500, g/mol.

The device according to at least one clause herein, wherein the molecular weight is one of between about: 1,500-5,000, 1,500-4,500, 1,700-4,500, 2,000-4,000, 2,200-4,000, and 2,500-3,800, g/mol.

The device according to at least one clause herein, wherein a percentage of a molar weight of the compound that is attributable to a presence of fluorine atoms, is one of between about: 40-90, 45-85, 50-80, 55-75, and 60-75%.

The device according to at least one clause herein, wherein fluorine atoms comprise a majority of the molar weight of the compound.

The device according to at least one clause herein, wherein the patterning material comprises an organic-inorganic hybrid material.

The device according to at least one clause herein, wherein the patterning coating has at least one nucleation site for the deposited material.

The device according to at least one clause herein, wherein the patterning coating is supplemented with a seed material that acts as a nucleation site for the deposited material.

The device according to at least one clause herein, wherein the seed material comprises at least one of: a nucleation promoting coating (NPC) material, an organic material, a polycyclic aromatic compound, and a material comprising a non-metallic element selected from one of oxygen (O), sulfur(S), nitrogen (N), I carbon (C).

The device according to at least one clause herein, wherein the patterning coating acts as an optical coating.

The device according to at least one clause herein, wherein the patterning coating modifies at least one of a property and a characteristic of EM radiation emitted by the device.

The device according to at least one clause herein, wherein the patterning coating comprises a crystalline material.

The device according to at least one clause herein, wherein the patterning coating is deposited as a non-crystalline material and becomes crystallized after deposition.

The device according to at least one clause herein, wherein the deposited layer comprises a deposited material.

The device according to at least one clause herein, wherein the deposited material comprises an element selected from at least one of: potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), nickel (Ni), and yttrium (Y)

The device according to at least one clause herein, wherein the deposited material comprises a pure metal.

The device according to at least one clause herein, wherein the deposited material is selected from one of pure Ag and substantially pure Ag.

The device according to at least one clause herein, wherein the substantially pure Ag has a purity of one of at least about: 95, 99, 99.9, 99.99, 99.999, and 99.9995%.

The device according to at least one clause herein, wherein the deposited material is selected from one of pure Mg and substantially pure Mg.

The device according to at least one clause herein, wherein the substantially pure Mg has a purity of one of at least about: 95, 99, 99.9, 99.99, 99.999, and 99.9995%.

The device according to at least one clause herein, wherein the deposited material comprises an alloy.

The device according to at least one clause herein, wherein the deposited material comprises at least one of: an Ag-containing alloy, an Mg-containing alloy, and an AgMg-containing alloy.

The device according to at least one clause herein, wherein the AgMg-containing alloy has an alloy composition that ranges from 1:10 (Ag:Mg) to about 10:1 by volume.

The device according to at least one clause herein, wherein the deposited material comprises at least one metal other than Ag.

The device according to at least one clause herein, wherein the deposited material comprises an alloy of Ag with at least one metal.

The device according to at least one clause herein, wherein the at least one metal is selected from at least one of Mg and Yb.

The device according to at least one clause herein, wherein the alloy is a binary alloy having a composition between about 5-95 vol. % Ag.

The device according to at least one clause herein, wherein the alloy comprises a Yb:Ag alloy having a composition between about 1:20-10:1 by volume.

The device according to at least one clause herein, wherein the deposited material comprises an Mg:Yb alloy.

The device according to at least one clause herein, wherein the deposited material comprises an Ag:Mg:Yb alloy.

The device according to at least one clause herein, wherein the deposited layer comprises at least one additional element.

The device according to at least one clause herein, wherein the at least one additional element is a non-metallic element.

The device according to at least one clause herein, wherein the non-metallic element is selected from at least one of O, S, N, and C.

The device according to at least one clause herein, wherein a concentration of the non-metallic element is one of no more than about: 1, 0.1, 0.01, 0.001, 0.0001, 0.00001, 0.000001, and 0.0000001%.

The device according to at least one clause herein, wherein the deposited layer has a composition in which a combined amount of O and C is one of no more than about: 10, 5, 1, 0.1, 0.01, 0.001, 0.0001, 0.00001, 0.000001, and 0.0000001%.

The device according to at least one clause herein, wherein the non-metallic element acts as a nucleation site for the deposited material on the NIC.

The device according to at least one clause herein, wherein the deposited material and the underlying layer comprise a metal in common.

The device according to at least one clause herein, the deposited layer comprises a plurality of layers of the deposited material.

The device according to at least one clause herein, a deposited material of a first one of the plurality of layers is different from a deposited material of a second one of the plurality of layers.

The device according to at least one clause herein, wherein the deposited layer comprises a multilayer coating.

The device according to at least one clause herein, wherein the multilayer coating is one of: Yb/Ag, Yb/Mg, Yb/Mg:Ag, Yb/Yb:Ag, Yb/Ag/Mg, and Yb/Mg/Ag.

The device according to at least one clause herein, wherein the deposited material comprises a metal having a bond dissociation energy of one of no more than about: 300, 200, 165, 150, 100, 50, and 20, KJ/mol.

The device according to at least one clause herein, wherein the deposited material comprises a metal having an electronegativity of one of no more than about: 1.4, 1.3, and 1.2.

The device according to at least one clause herein, wherein a sheet resistance of the deposited layer is one of no more than about: 10, 5, 1, 0.5, 0.2, and 0.1 Ω/□.

The device according to at least one clause herein, wherein the deposited layer is disposed in a pattern defined by at least one region therein that is substantially devoid of a closed coating thereof.

The device according to at least one clause herein, wherein the at least one region separates the deposited layer into a plurality of discrete fragments thereof.

The device according to at least one clause herein, wherein at least two discrete fragments are electrically coupled.

The device according to at least one clause herein, wherein the patterning coating has a boundary defined by a patterning coating edge.

The device according to at least one clause herein, wherein the patterning coating comprises at least one patterning coating transition region and a patterning coating non-transition part.

The device according to at least one clause herein, wherein the at least one patterning coating transition region transitions from a maximum thickness to a reduced thickness.

The device according to at least one clause herein, wherein the at least one patterning coating transition region extends between the patterning coating non-transition part and the patterning coating edge.

The device according to at least one clause herein, wherein the patterning coating has an average film thickness in the patterning coating non-transition part that is in a range of one of between about: 1-100, 2-50, 3-30, 4-20, 5-15, 5-10, and 1-10, nm.

The device according to at least one clause herein, wherein a thickness of the patterning coating in the patterning coating non-transition part is within one of about: 95%, and 90% of the average film thickness of the NIC.

The device according to at least one clause herein, wherein the average film thickness is one of no more than about: 80, 60, 50, 40, 30, 20, 15, and 10, nm.

The device according to at least one clause herein, wherein the average film thickness exceeds one of about: 3, 5, and 8, nm.

The device according to at least one clause herein, wherein the average film thickness is no more than about 10 nm.

The device according to at least one clause herein, wherein the patterning coating has a patterning coating thickness that decreases from a maximum to a minimum within the patterning coating transition region.

The device according to at least one clause herein, wherein the maximum is proximate to a boundary between the patterning coating transition region and the patterning coating non-transition part.

The device according to at least one clause herein, wherein the maximum is a percentage of the average film thickness that is one of about: 100, 95, and 90%.

The device according to at least one clause herein, wherein the minimum is proximate to the patterning coating edge.

The device according to at least one clause herein, wherein the minimum is in a range of between about: 0-0.1 nm.

The device according to at least one clause herein, wherein a profile of the patterning coating thickness is one of sloped, tapered, and defined by a gradient.

The device according to at least one clause herein, wherein the tapered profile follows one of a linear, non-linear, parabolic, and exponential decaying profile.

The device according to at least one clause herein, wherein a non-transition width along a lateral axis of the patterning coating non-transition region exceeds a transition width along the axis of the patterning coating transition region.

The device according to at least one clause herein, wherein a quotient of the non-transition width by the transition width is one of at least about: 5, 10, 20, 50, 100, 500, 1,000, 1,500, 5,000, 10,000, 50,000, and 100,000.

The device according to at least one clause herein, wherein at least one of the non-transition width and the transition width exceeds an average film thickness of the underlying layer.

The device according to at least one clause herein, wherein at least one of the non-transition width and the transition width exceeds the average film thickness of the patterning coating.

The device according to at least one clause herein, wherein the average film thickness of the underlying layer exceeds the average film thickness of the patterning coating.

The device according to at least one clause herein, wherein the deposited layer has a boundary defined by a deposited layer edge.

The device according to at least one clause herein, wherein the deposited layer comprises at least one deposited layer transition region and a deposited layer non-transition part.

The device according to at least one clause herein, wherein the at least one deposited layer transition region transitions from a maximum thickness to a reduced thickness.

The device according to at least one clause herein, wherein the at least one deposited layer transition region extends between the deposited layer non-transition part and the deposited layer edge.

The device according to at least one clause herein, wherein the deposited layer has an average film thickness in the deposited layer non-transition part that is in a range of one of between about: 1-500, 5-200, 5-40, 10-30, and 10-100, nm.

The device according to at least one clause herein, wherein the average film thickness exceeds one of about: 10, 50, and 100, nm.

The device according to at least one clause herein, wherein the average film thickness of is substantially constant thereacross.

The device according to at least one clause herein, wherein the average film thickness exceeds an average film thickness of the underlying layer.

The device according to at least one clause herein, wherein a quotient of the average film thickness of the deposited layer by the average film thickness of the underlying layer is one of at least about: 1.5, 2, 5, 10, 20, 50, and 100.

The device according to at least one clause herein, wherein the quotient is in a range of one of between about: 0.1-10, and 0.2-40.

The device according to at least one clause herein, wherein the average film thickness of the deposited layer exceeds an average film thickness of the patterning coating.

The device according to at least one clause herein, wherein a quotient of the average film thickness of the deposited layer by the average film thickness of the patterning coating is one of at least about: 1.5, 2, 5, 10, 20, 50, and 100.

The device according to at least one clause herein, wherein the quotient is in a range of one of between about: 0.2-10, and 0.5-40.

The device according to at least one clause herein, wherein a deposited layer non-transition width along a lateral axis of the deposited layer non-transition part exceeds a patterning coating non-transition width along the axis of the patterning coating non-transition part.

The device according to at least one clause herein, wherein a quotient of the patterning coating non-transition width by the deposited layer non-transition width is one of between about: 0.1-10, 0.2-5, 0.3-3, and 0.4-2.

The device according to at least one clause herein, wherein a quotient of the deposited layer non-transition width by the patterning coating non-transition width is one of at least: 1, 2, 3, and 4.

The device according to at least one clause herein, wherein the deposited layer non-transition width exceeds the average film thickness of the deposited layer.

The device according to at least one clause herein, wherein a quotient of the deposited layer non-transition width by the average film thickness is at least one of about: 10, 50, 100, and 500.

The device according to at least one clause herein, wherein the quotient is no more than about 100,000.

The device according to at least one clause herein, wherein the deposited layer has a deposited layer thickness that decreases from a maximum to a minimum within the deposited layer transition region.

The device according to at least one clause herein, wherein the maximum is proximate to a boundary between the deposited layer transition region and the deposited layer non-transition part.

The device according to at least one clause herein, wherein the maximum is the average film thickness.

The device according to at least one clause herein, wherein the minimum is proximate to the deposited layer edge.

The device according to at least one clause herein, wherein the minimum is in a range of between about: 0-0.1 nm.

The device according to at least one clause herein, wherein the minimum is the average film thickness.

The device according to at least one clause herein, wherein a profile of the deposited layer thickness is one of sloped, tapered, and defined by a gradient.

The device according to at least one clause herein, wherein the tapered profile follows one of a linear, non-linear, parabolic, and exponential decaying profile.

The device according to at least one clause herein, wherein the deposited layer comprises a discontinuous layer in at least a part of the deposited layer transition region.

The device according to at least one clause herein, wherein the deposited layer overlaps the patterning coating in an overlap portion.

The device according to at least one clause herein, wherein the patterning coating overlaps the deposited layer in an overlap portion.

The device according to at least one clause herein, further comprising at least one particle structure disposed on an exposed layer surface of an underlying layer.

The device according to at least one clause herein, wherein the underlying layer is the patterning coating.

The device according to at least one clause herein, wherein the at least one particle structure comprises a particle material.

The device according to at least one clause herein, wherein the particle material is the same as the deposited material.

The device according to at least one clause herein, wherein at least two of the particle material, the deposited material, and a material of which the underlying layer is comprised, comprises a metal in common.

The device according to at least one clause herein, wherein the particle material comprises an element selected from at least one of: potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), nickel (Ni), and yttrium (Y).

The device according to at least one clause herein, wherein the particle material comprises a pure metal.

The device according to at least one clause herein, wherein the particle material is selected from one of pure Ag and substantially pure Ag.

The device according to at least one clause herein, wherein the substantially pure Ag has a purity of one of at least about: 95, 99, 99.9, 99.99, 99.999, and 99.9995%.

The device according to at least one clause herein, wherein the particle material is selected from one of pure Mg and substantially pure Mg.

The device according to at least one clause herein, wherein the substantially pure Mg has a purity of one of at least about: 95, 99, 99.9, 99.99, 99.999, and 99.9995%.

The device according to at least one clause herein, wherein the particle material comprises an alloy.

The device according to at least one clause herein, wherein the particle material comprises at least one of: an Ag-containing alloy, an Mg-containing alloy, and an AgMg-containing alloy.

The device according to at least one clause herein, wherein the AgMg-containing alloy has an alloy composition that ranges from 1:10 (Ag:Mg) to about 10:1 by volume.

The device according to at least one clause herein, wherein the particle material comprises at least one metal other than Ag.

The device according to at least one clause herein, wherein the particle material comprises an alloy of Ag with at least one metal.

The device according to at least one clause herein, wherein the at least one metal is selected from at least one of Mg and Yb.

The device according to at least one clause herein, wherein the alloy is a binary alloy having a composition between about 5-95 vol. % Ag.

The device according to at least one clause herein, wherein the alloy comprises a Yb:Ag alloy having a composition between about 1:20-10:1 by volume.

The device according to at least one clause herein, wherein the particle material comprises an Mg:Yb alloy.

The device according to at least one clause herein, wherein the particle material comprises an Ag:Mg:Yb alloy.

The device according to at least one clause herein, wherein the at least one particle structure comprises at least one additional element.

The device according to at least one clause herein, wherein the at least one additional element is a non-metallic element.

The device according to at least one clause herein, wherein the non-metallic element is selected from at least one of O, S, N, and C.

The device according to at least one clause herein, wherein a concentration of the non-metallic element is one of no more than about: 1, 0.1, 0.01, 0.001, 0.0001, 0.00001, 0.000001, and 0.0000001%.

The device according to at least one clause herein, wherein the at least one particle structure has a composition in which a combined amount of O and C is one of no more than about: 10, 5, 1, 0.1, 0.01, 0.001, 0.0001, 0.00001, 0.000001, and 0.0000001%.

The device according to at least one clause herein, wherein the at least one particle is disposed at an interface between the patterning coating and at least one overlying layer in the device.

The device according to at least one clause herein, wherein the at least one particle is in physical contact with an exposed layer surface of the patterning coating.

The device according to at least one clause herein, wherein the at least one particle structure affects at least one optical property of the device.

The device according to at least one clause herein, wherein the at least one optical property is controlled by selection of at least one property of the at least one particle structure selected from at least one of: a characteristic size, a length, a width, a diameter, a height, a size distribution, a shape, a surface coverage, a configuration, a deposited density, a dispersity, and a composition.

The device according to at least one clause herein, wherein the at least one property of the at least one particle structure is controlled by selection of at least one of: at least one characteristic of the patterning material, an average film thickness of the patterning coating, at least one heterogeneity in the patterning coating, and a deposition environment for the patterning coating, selected from at least one of a temperature, pressure, duration, deposition rate, and deposition process.

The device according to at least one clause herein, wherein the at least one property of the at least one particle structure is controlled by selection of at least one of: at least one characteristic of the particle material, an extent to which the patterning coating is exposed to deposition of the particle material, a thickness of the discontinuous layer, and a deposition environment for the particle material, selected from at least one of a temperature, pressure, duration, deposition rate, and deposition process.

The device according to at least one clause herein, wherein the at least one particle structures are disconnected from one another.

The device according to at least one clause herein, wherein the at least one particle structure forms a discontinuous layer.

The device according to at least one clause herein, wherein the discontinuous layer is disposed in a pattern defined by at least one region therein that is substantially devoid of the at least one particle structure.

The device according to at least one clause herein, wherein a characteristic of the discontinuous layer is determined by an assessment according to at least one criterion selected from one of: a characteristic size, length, width, diameter, height, size distribution, shape, configuration, surface coverage, deposited distribution, dispersity, presence of aggregation instances, and extent of such aggregation instances.

The device according to at least one clause herein, wherein the assessment is performed by determining at least one attribute of the discontinuous layer by an applied imaging technique selected from one of: electron microscopy, atomic force microscopy, and scanning electron microscopy.

The device according to at least one clause herein, wherein the assessment is performed across an extent defined by at least one observation window.

The device according to at least one clause herein, wherein the at least one observation window is located at one of: a perimeter, interior location, and grid coordinate of the lateral aspect.

The device according to at least one clause herein, wherein the observation window corresponds to a field of view of the applied imaging technique.

The device according to at least one clause herein, wherein the observation window corresponds to a magnification level selected from one of: 2.00, and 1.00, μm, and 500, and 200, nm.

The device according to at least one clause herein, wherein the assessment incorporates at least one of: manual counting, curve fitting, polygon fitting, shape fitting, and an estimation technique.

The device according to at least one clause herein, wherein the assessment incorporates a manipulation selected from one of: an average, median, mode, maximum, minimum, probabilistic, statistical, and data calculation.

The device according to at least one clause herein, wherein the characteristic size is determined from at least one of: a mass, volume, diameter, perimeter, major axis, and minor axis of the at least one particle structure.

The device according to at least one clause herein, wherein the dispersity is determined from:

$$ID = \frac{\overline{S_s}}{\overline{S_n}}$$

where:

$$\overline{S_s} = \frac{\sum_{i=1}^{n} S_i^2}{\sum_{i=1}^{n} S_i}, \overline{S_n} = \frac{\sum_{i=1}^{n} S_i}{n},$$

n is the number of particles in a sample area, $S_i$ is the (area) size of the/h particle, $\overline{S}_n$ is the number average of the particle (area) sizes; and $\overline{S}_s$ is the (area) size average of the particle (area) sizes.

Accordingly, the specification and the examples disclosed therein are to be considered illustrative only, with a true scope of the disclosure being disclosed by the following numbered claims:

What is claimed is:

1. An opto-electronic device having a plurality of layers deposited on a substrate and extending in at least one lateral aspect defined by a lateral axis thereof, comprising:

a first defining layer that substantially reduces transmission of EM radiation therethrough in at least one wavelength range of the EM spectrum, the first defining layer comprising at least one first layer aperture therein that is defined by a corresponding first layer aperture boundary that extends in the lateral aspect; and a second defining layer that substantially reduces transmission of EM radiation therethrough in at least one wavelength range of the EM spectrum, the second defining layer comprising at least one second layer aperture therein that is defined by a corresponding second layer aperture boundary that extends in the lateral aspect;

wherein:

a geometric intersection of overlap of: the at least one first layer aperture, and the at least one second layer aperture, substantially defines a corresponding aperture of a corresponding transmissive region disposed in at least one signal-exchanging part of the device that comprises at least one emissive region, each comprising a first electrode, a second electrode, and at least one semiconducting layer disposed between the first electrode and the second electrode, the first electrode disposed between the substrate and the second electrode;

the first defining layer and the second defining layer each comprise one of: a layer in a frontplane of the device, a layer in a backplane of the device, and an opaque coating disposed between the substrate and an exposed layer surface of the second electrode;

the first defining layer is disposed in a first lateral pattern, in which at least one of a: location, shape, spacing, size, orientation, and position, of the at least one first layer aperture boundary, is substantially regular;

the second defining layer is disposed in a second lateral pattern, in which at least one of a: location, shape, spacing, size, orientation, and position, of the at least one second layer aperture boundary, is substantially non-uniform; and at least one signal passing through the corresponding transmissive region is impacted by a diffraction characteristic of the corresponding aperture.

2. The device of claim 1, wherein at least one of: the first defining layer, and the second defining layer, reduces transmission of EM radiation therethrough by one of no less than about: 99, 95, 90, 80, 75, 70, 60, 50, 40, and 30%.

3. The device of claim 1, wherein at least one of: the first defining layer, and the second defining layer, is substantially opaque therethrough other than through at least one aperture therein.

4. The device of claim 1, wherein the at least one wavelength range is at least one of: a visible spectrum, an ultraviolet (UV) spectrum, an infrared (IR) spectrum, a near IR (NIR) spectrum, and a part thereof.

5. The device of claim 1, wherein the first lateral pattern is characterized by at least one of the: location, shape, spacing, size, orientation, and position, of the at least one first layer aperture boundary, being substantially repeating.

6. The device of claim 1, wherein the first lateral pattern is characterized by substantially all of the: location, shape, spacing, size, orientation, and position, of the at least one first layer aperture boundary, being substantially regular.

7. The device of claim 1, wherein at least one of the: location, shape, spacing, size, orientation, and position, of the at least one second layer aperture boundary, exhibits variability within the second lateral pattern.

8. The device of claim 1, wherein at least one of the: location, shape, spacing, size, orientation, and position, of substantially all of the at least one second layer aperture boundaries, exhibits variability within the second lateral pattern.

9. The device of claim 1, wherein substantially all of the: location, shape, spacing, size, orientation, and position, of the at least one second layer aperture boundary, exhibits variability within the second lateral pattern.

10. The device of claim 1, wherein the location of at least one of: the at least one first layer aperture boundary, and the at least one second layer aperture boundary, is defined by a centroid of at least one of: the corresponding one of: the at least one first layer aperture boundary, and the at least one second layer aperture boundary, and a pixel surrounding it.

11. The device of claim 1, wherein the size of at least one of: the at least one first layer aperture boundary, and the at least one second layer aperture boundary, is defined by a length of at least one of: a major axis, a minor axis, a side, and a diameter, thereof.

12. The device of claim 1, wherein the orientation of at least one of: the at least one first layer aperture boundary, and the at least one second layer aperture boundary, is defined by an angle of one of: a size, and a vertex, thereof.

13. The device of claim 1, wherein the diffraction characteristic is a function of at least one of: the lateral pattern of at least one boundary of the at least one aperture of the at least one transmissive region, and a shape of the at least one boundary.

14. The device of claim 1, wherein the shape of the at least one first layer aperture boundary is one that increases a length of a pattern boundary within a diffraction pattern between region(s) of high intensity of EM radiation and region(s) of low intensity of EM radiation, as a function of a pattern circumference of the diffraction pattern.

15. The device of claim 1, wherein the shape of the at least one first layer aperture boundary is substantially non-polygonal.

16. The device of claim 1, wherein the layer in the frontplane comprises at least one of: the first electrode, the second electrode, the at least one semiconducting layer, and a pixel definition layer.

17. The device of claim 1, wherein the layer in the backplane comprises at least one of: at least one TFT structure, a TFT insulating layer, a buffer layer, a gate insulating layer, the first electrode, and at least one conductive metal line coupled with the at least one TFT structure.

18. The device of claim 1, wherein the opaque coating reduces a likelihood that at least one of: the first layer aperture boundary, and the second layer aperture boundary, has a transition region proximate thereto, in which a reduced amount of EM radiation may be transmitted therethrough.

19. The device of claim 1, wherein the first defining layer comprises at least one of: the layer in the backplane, and the opaque coating disposed in the backplane.

20. The device of claim 1, wherein the second defining layer comprises at least one of: the layer in the frontplane, and the opaque coating disposed in the frontplane.

21. The device of claim 1, wherein at least one of: the at least one first layer aperture, and the at least one second layer aperture, comprises an absence of a material in a corresponding one of: the first defining layer, and the second defining layer, wherein the absence of the material is achieved by at least one of: removal of the material, and ensuring that the material fails to be deposited thereon.

22. The device of claim 21, wherein the removal of the material is performed by at least one of: photolithography, chemical etching, and laser ablation.

23. The device of claim 21, wherein the ensuring that the material fails to be deposited thereon is achieved by depositing a patterning material adapted to impact a propensity of an evaporated flux of the material to be deposited thereon, in at least one region, such that the at least one aperture is substantially devoid of a closed coating of the material.

24. The device of claim 1, wherein the shape of the at least one first layer aperture boundary is one that reduces a ratio of the pattern circumference relative to the length of the pattern boundary.

* * * * *